US012699348B2

(12) United States Patent
Kojima et al.

(10) Patent No.: US 12,699,348 B2
(45) Date of Patent: *Aug. 4, 2026

(54) IMAGE FORMING APPARATUS INCLUDING AN EXPOSURE HEAD THAT EXPOSES A PHOTOSENSITIVE MEMBER

(71) Applicant: CANON KABUSHIKI KAISHA, Tokyo (JP)

(72) Inventors: Nobuhisa Kojima, Chiba (JP); Ryo Abe, Chiba (JP); Yuta Okada, Ibaraki (JP); Hitoshi Iwai, Chiba (JP); Shinichiro Hosoi, Tokyo (JP); Ryota Fukumoto, Ibaraki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/955,150

(22) Filed: Nov. 21, 2024

(65) Prior Publication Data

US 2025/0199453 A1 Jun. 19, 2025

(30) Foreign Application Priority Data

Dec. 14, 2023 (JP) ................................. 2023-211011

(51) Int. Cl.
*G03G 15/00* (2006.01)
*G03G 15/04* (2006.01)
(Continued)

(52) U.S. Cl.
CPC ....... *G03G 15/80* (2013.01); *G03G 15/04054* (2013.01); *G03G 21/1652* (2013.01); *H05K 1/0281* (2013.01); *G03G 2215/0404* (2013.01)

(58) Field of Classification Search
USPC .......................................................... 399/90
See application file for complete search history.

(56) References Cited

U.S. PATENT DOCUMENTS 11,042,103 B2 6/2021 Aruga et al.
2020/0019084 A1* 1/2020 Aruga .............. G03G 15/04045

FOREIGN PATENT DOCUMENTS

JP 2020183047 A 11/2020
JP 2020183982 A 11/2020

OTHER PUBLICATIONS

Fukumoto et al. Copending U.S. Appl. No. 18/955,010, filed Nov. 21, 2024.

(Continued)

*Primary Examiner* — Quana Grainger
(74) *Attorney, Agent, or Firm* — ROSSI, KIMMS & McDOWELL LLP

(57) ABSTRACT

Disclosed is an image forming apparatus including: a flexible flat cable configured to electrically connect a connector with a control circuit board; and an exposure support member configured to support the exposure head in a posture where the light emitting elements are disposed on an upper side and the connector is disposed on a lower side of the image forming apparatus in upward and downward directions of the image forming apparatus. The flexible flat cable has a contact point that is provided on one surface and is electrically connected to the connector of the exposure head. The flexible flat cable is connected to the exposure head held by the exposure support member in the posture such that the contact point is disposed on a surface of a right side in leftward and rightward directions of the image forming apparatus.

9 Claims, 68 Drawing Sheets

(51) Int. Cl.
*G03G 21/16* (2006.01)
*H05K 1/02* (2006.01)

(56) References Cited

OTHER PUBLICATIONS

Quayle Action issued U.S. Appl. No. 18/955,010 mailed Oct. 22, 2025.
Office Action issued in U.S. Appl. No. 18/955,010 mailed on Mar. 20, 2026.

* cited by examiner

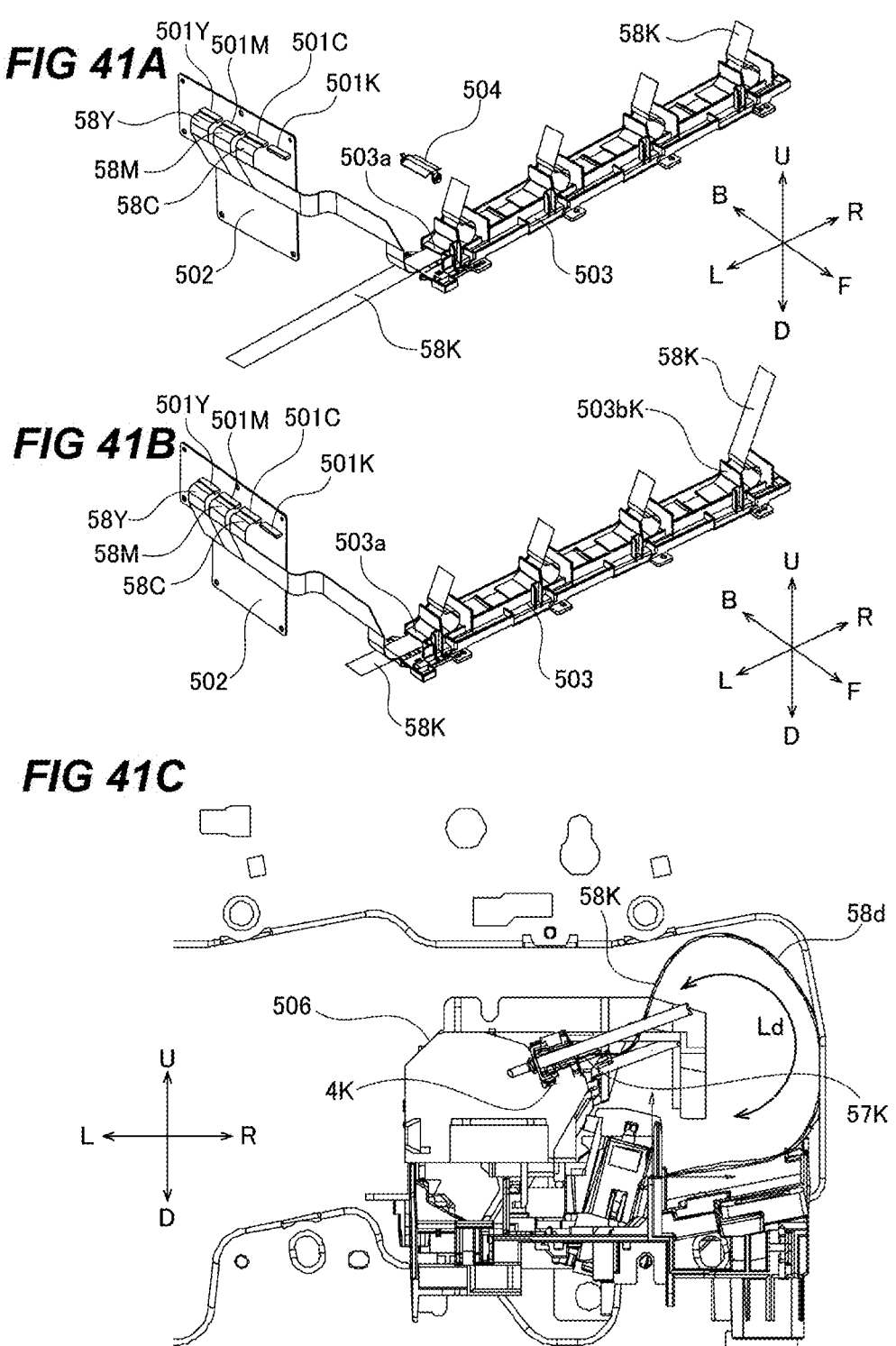

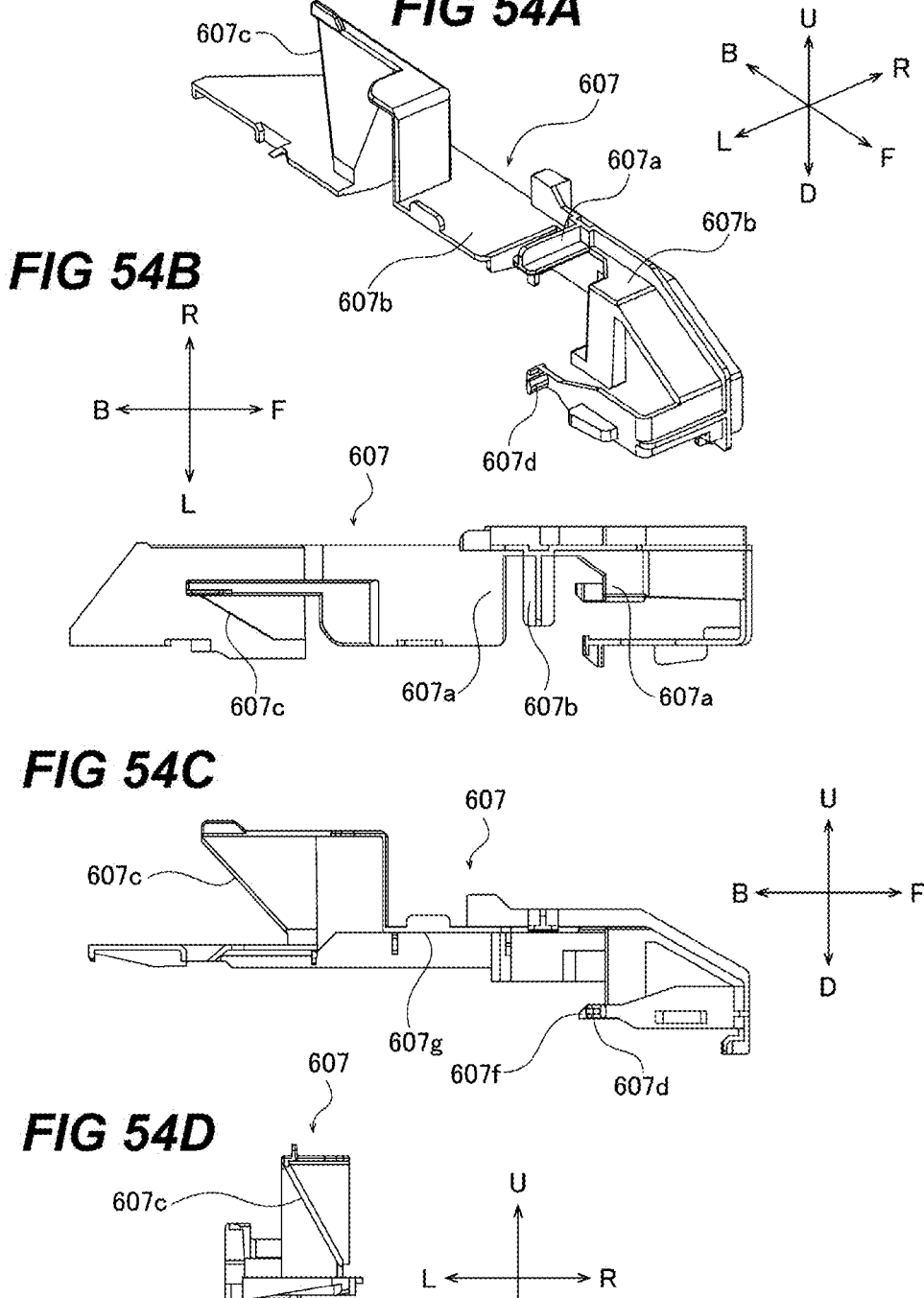

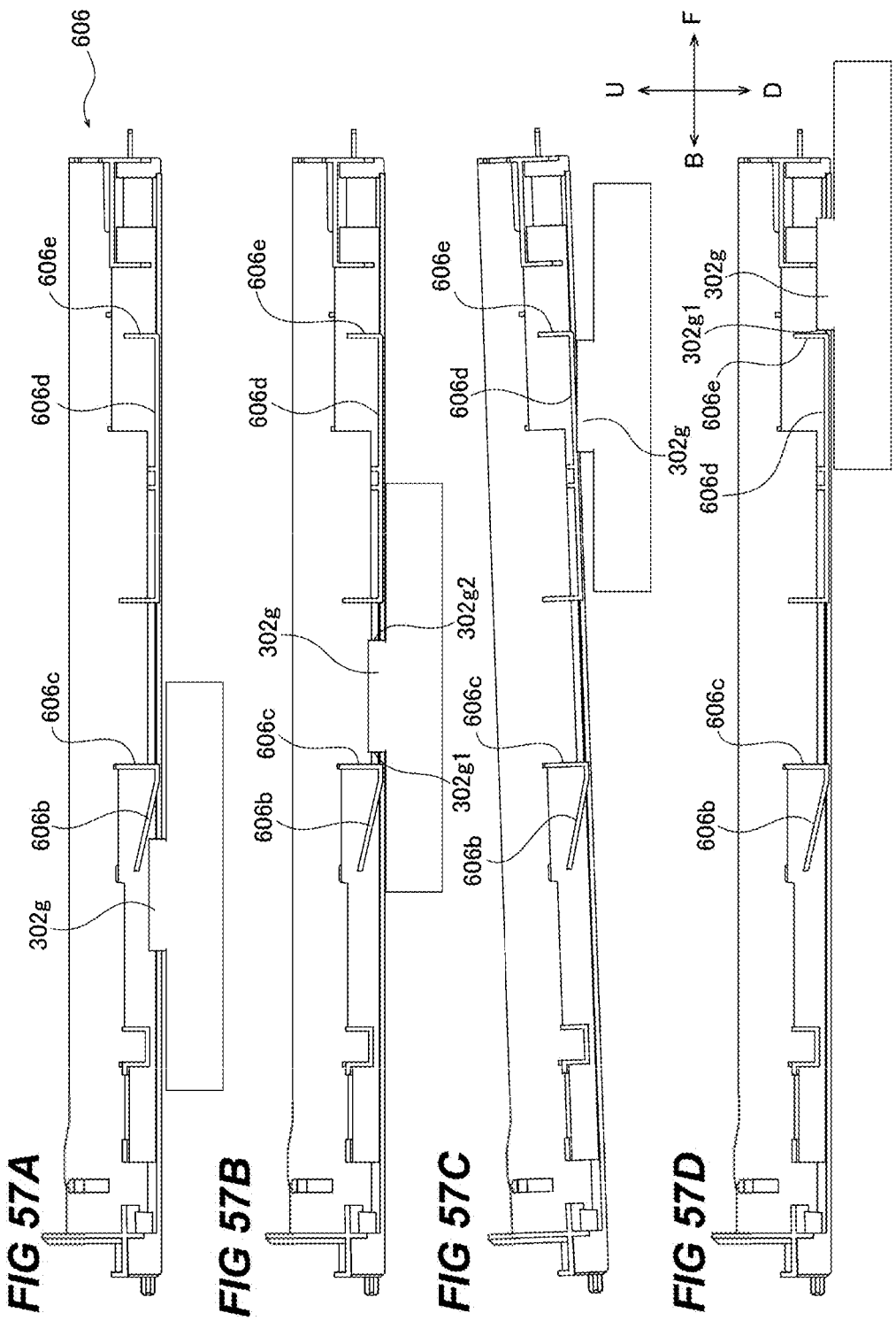

IMAGE FORMING APPARATUS INCLUDING AN EXPOSURE HEAD THAT EXPOSES A PHOTOSENSITIVE MEMBER

BACKGROUND OF THE INVENTION

Field of the Invention

The present invention relates to an image forming apparatus including an exposure head that exposes a photosensitive member.

Description of the Related Art

In an image forming apparatus using electrophotographic system such as a laser beam printer, a digital coping machine, an LED exposure head is used in an exposure portion that exposes the photosensitive member. In the LED exposure head, a predetermined number of LEDs are arranged substantially along a straight line and the LED exposure head exposes the photosensitive member for each image width in a batch.

The LED exposure head is disposed inside an image forming apparatus and a flexible flat cable (FFC) is connected to it, so that a signal from a control portion of the image forming apparatus is provided to the LED exposure head via an FFC.

In such a configuration, when exchanging FFCs, it is necessary to detach the FFC from the LED exposure head, to take out the detached FFC from the inside of the image forming apparatus, and to place and attach a new FFC in/to the image forming apparatus, so that the operation thereof is difficult. Further, a contact point might be broken when exchanging the FFCs.

SUMMARY OF THE INVENTION

A representative configuration of the present invention is an image forming apparatus comprising:
a photosensitive member;
an exposure head configured to expose the photosensitive member, the exposure head including:
a substrate having an elongated shape extending in axial directions of the photosensitive member;
multiple light emitting elements mounted on one surface of the substrate, the multiple light emitting elements being arranged in longitudinal directions of the substrate; and
a connector provided on a surface of the substrate opposite the one surface of the substrate on which multiple light emitting elements are mounted,
a control circuit board;
a flexible flat cable configured to electrically connect the connector to the control circuit board; and
an exposure support member configured to support the exposure head in a posture where the light emitting elements are disposed on an upper side and the connector is disposed on a lower side in upward and downward directions of the image forming apparatus,
wherein the flexible flat cable has a contact point that is provided on the one surface and the contact point is electrically connected to the connector of the exposure head, and
wherein the flexible flat cable is connected to the exposure head held by the exposure support member in the posture such that, when viewing the image forming apparatus from a front side, the contact point is disposed on a surface of a right side in leftward and rightward directions crossing the axial directions.

Further features of the present invention will become apparent from the following description of exemplary embodiments with reference to the attached drawings.

BRIEF DESCRIPTION OF THE DRAWINGS

FIG. 2 is a schematic cross-sectional view of the image forming apparatus in FIG. 1.

3

FIGS. 32A, 32B, 32C and 32D show an FFC holding member.

Figure 33:
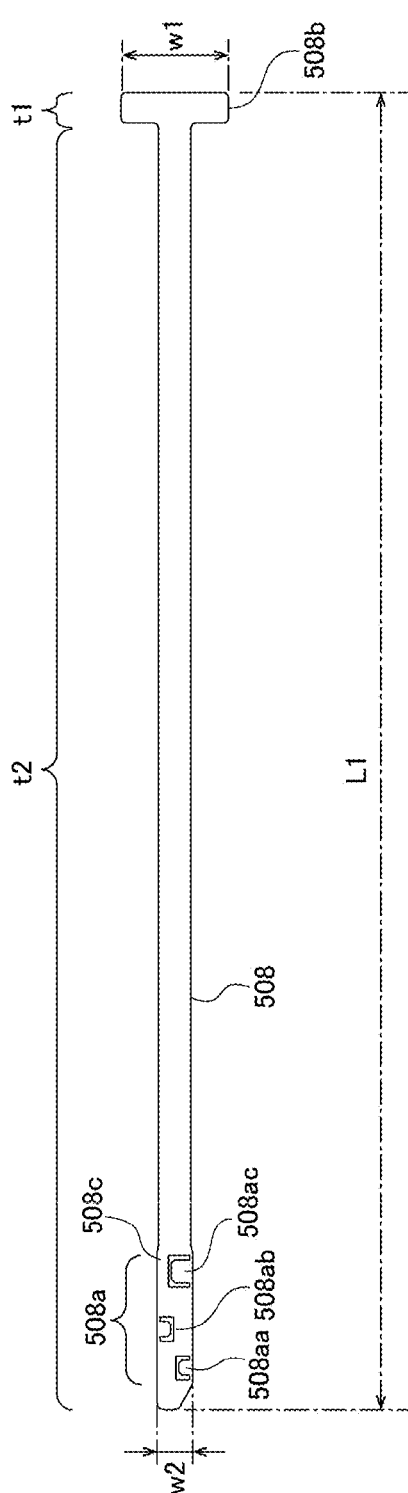

FIG. 33 shows a sheet member.

Figure 34:
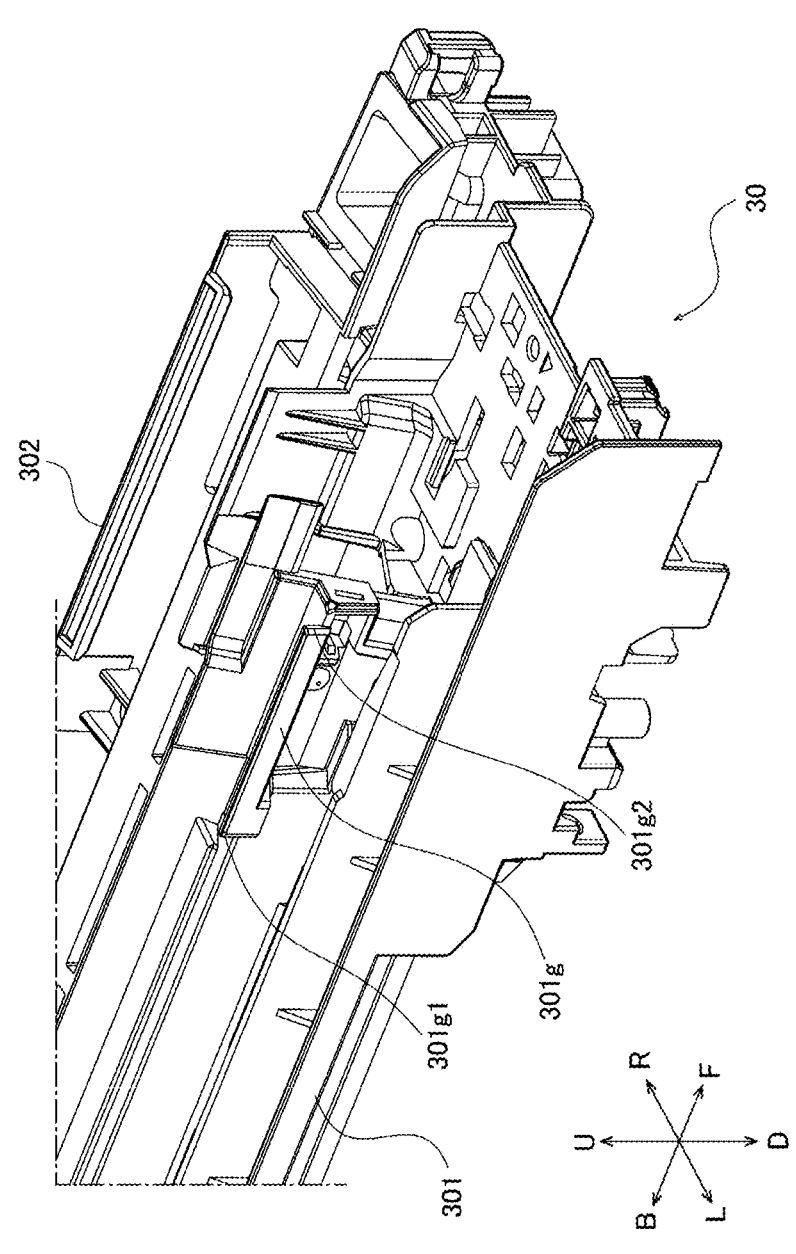

FIG. 34 is a left side perspective view of a restricting portion.

Figure 35A:
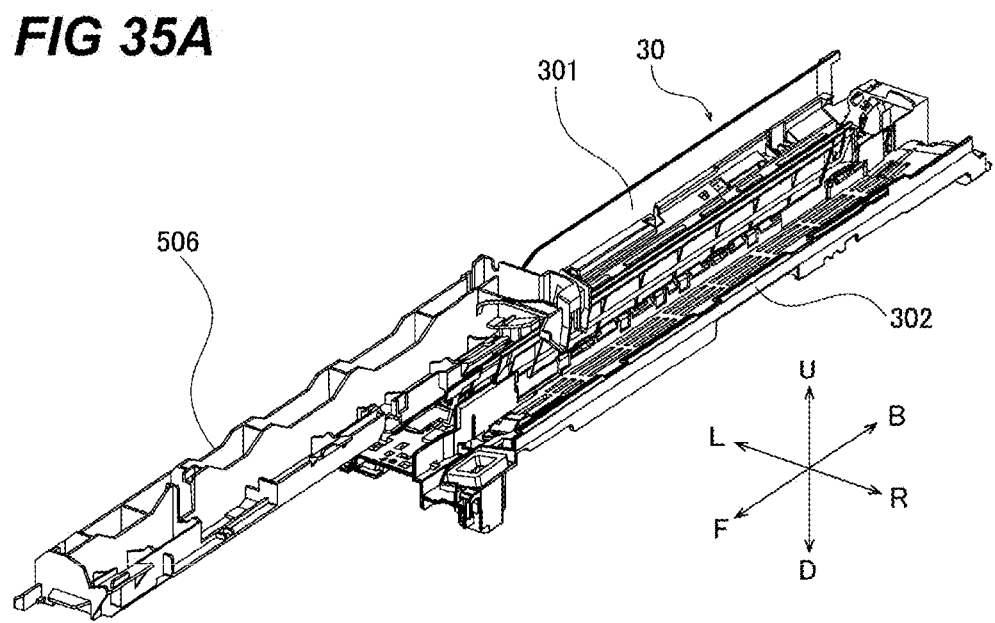
Figure 35B:
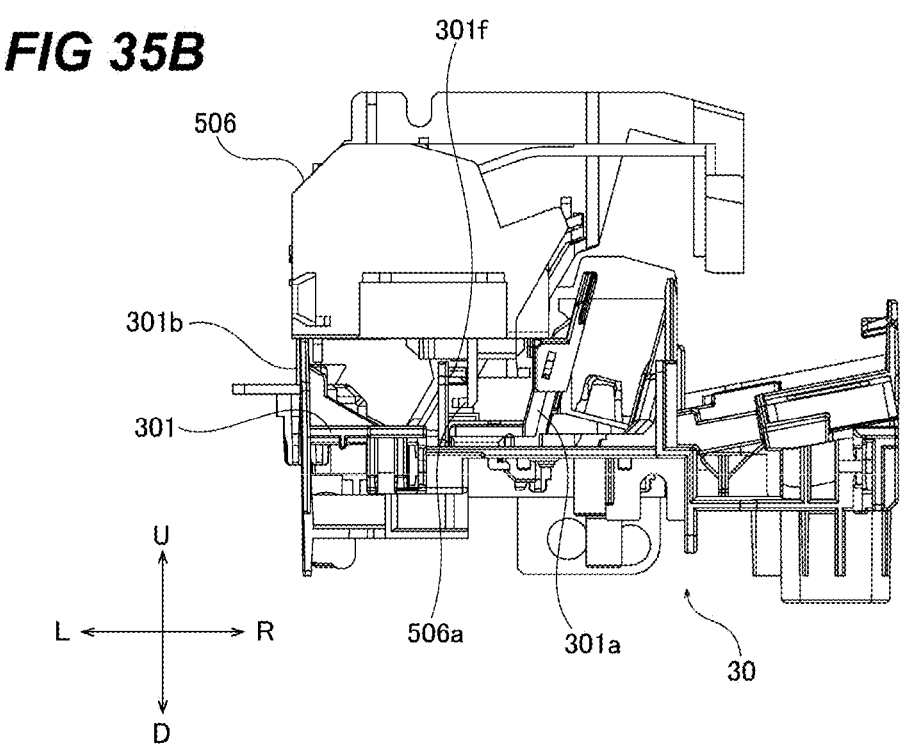

FIGS. 35A and 35B show exchanging procedures of the exposure head and the FFC.

FIGS. 36A, 36B, 36C and 36D show exchanging procedures of the exposure head and the FFC.

Figures 37A, 37B:
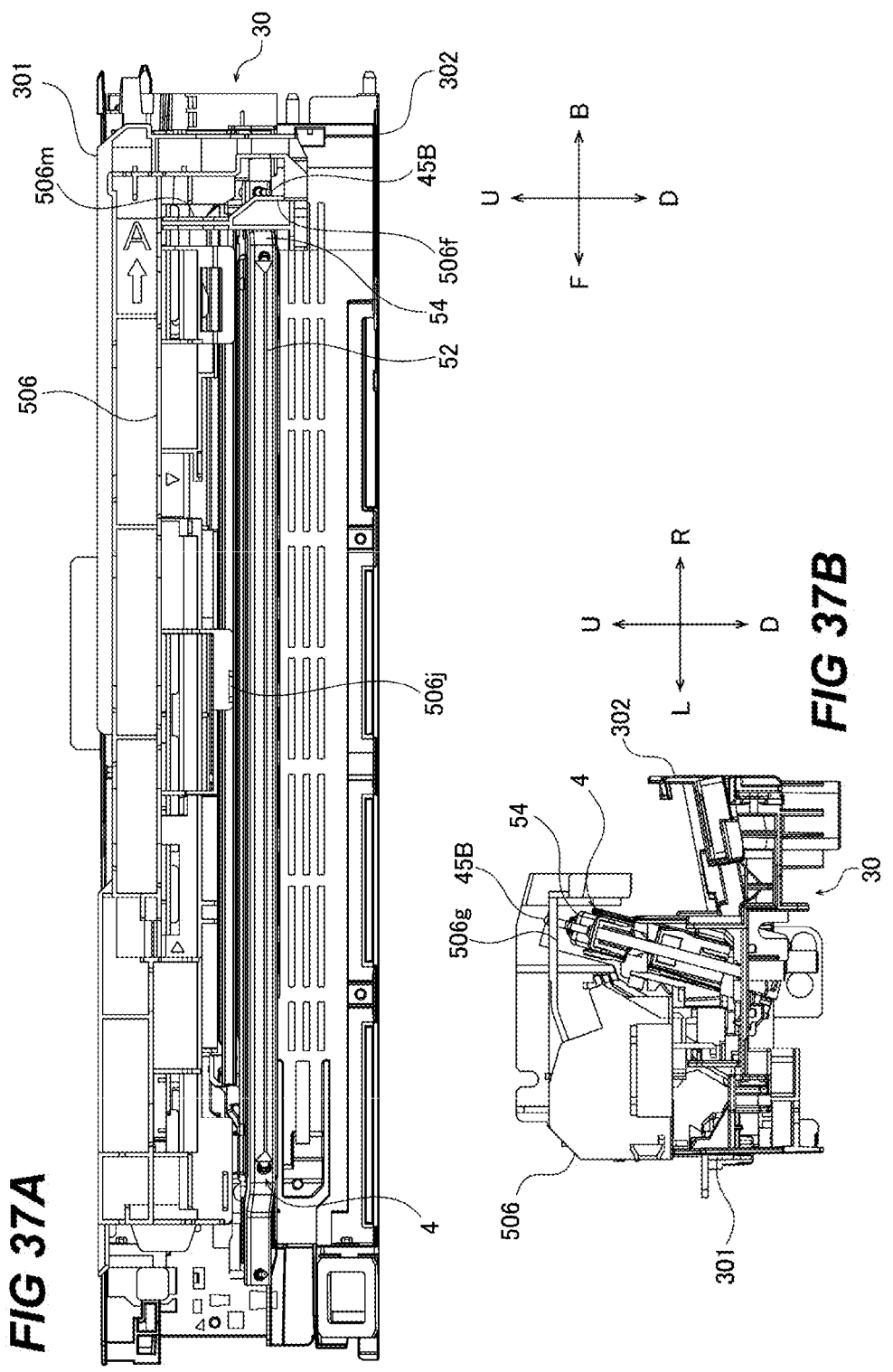

FIGS. 37A and 37B show exchanging procedures of the exposure head and the FFC.

Figures 38A, 38B, 38C:
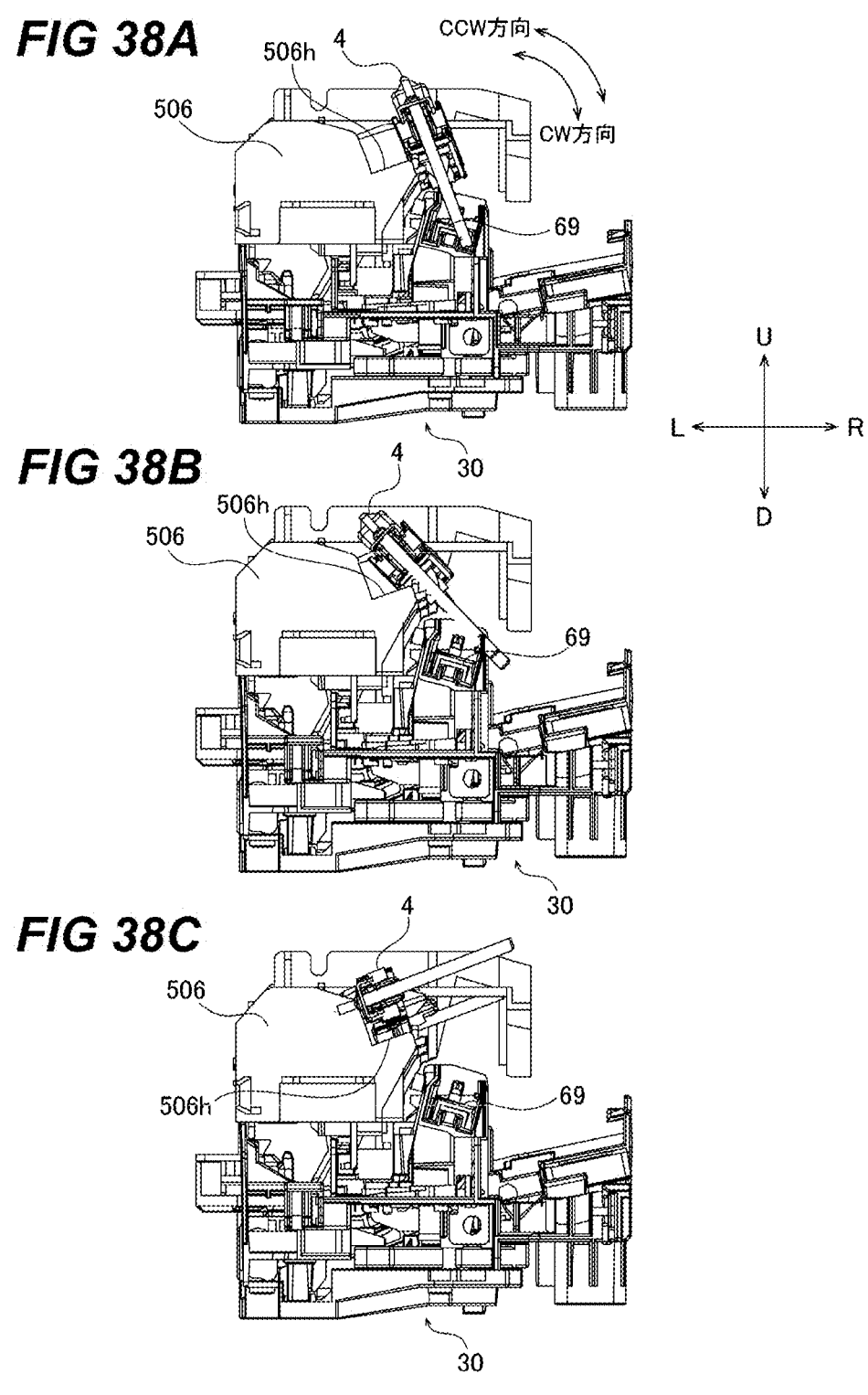

FIGS. 38A, 38B and 38C show exchanging procedures of the exposure head and the FFC.

Figure 39:
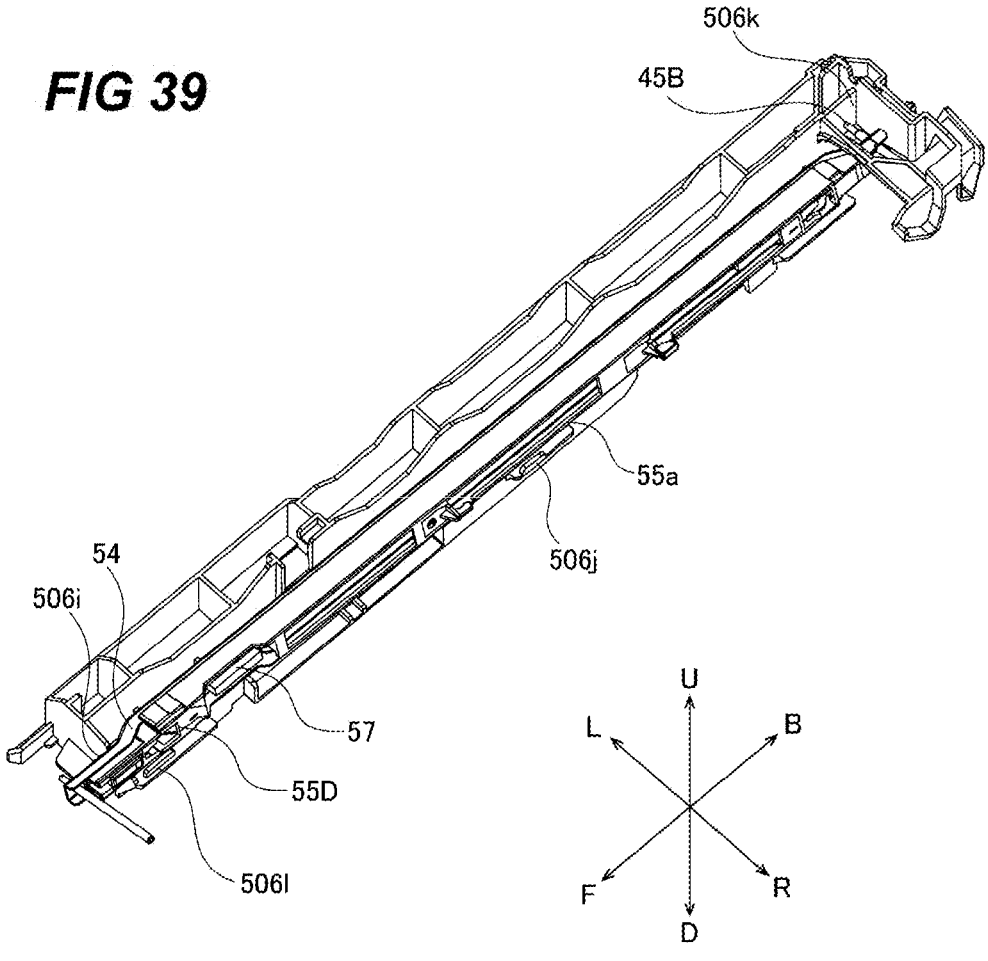

FIG. 39 shows exchanging procedures of the exposure head and the FFC.

Figure 40A:
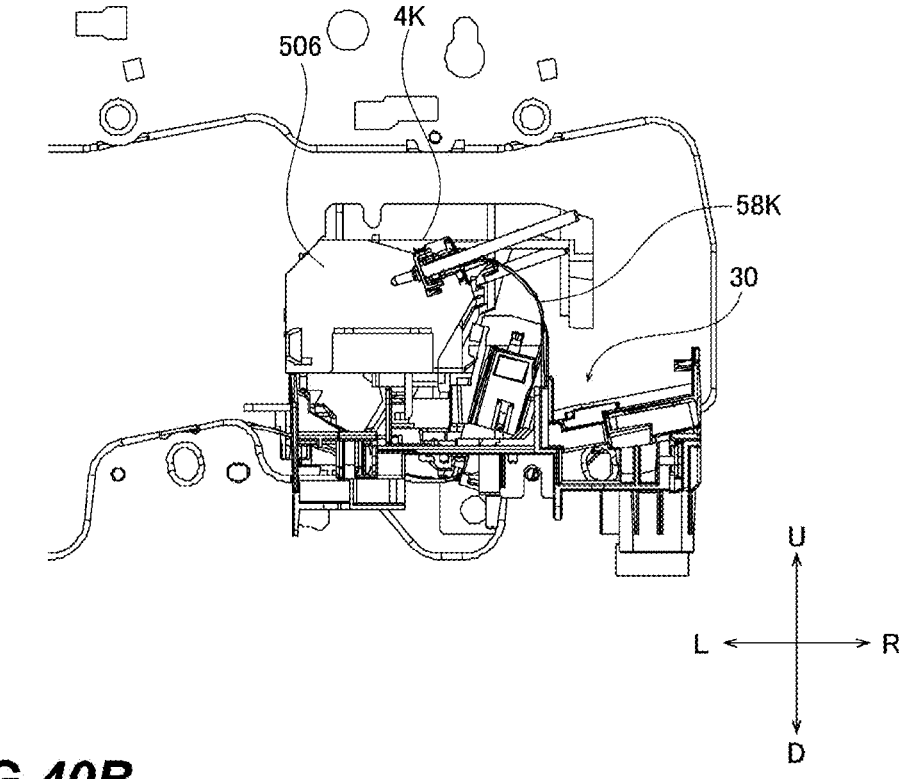
Figure 40B:
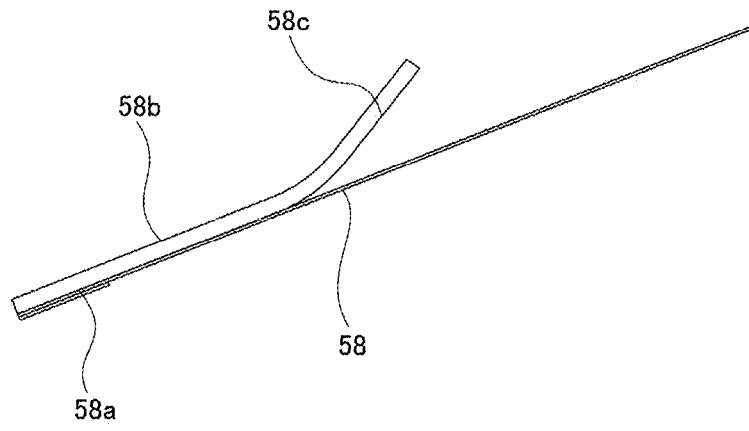

FIGS. 40A and 40B show exchanging procedures of the exposure head and the FFC.

FIGS. 41A, 41B and 41C show exchanging procedures of the exposure head and the FFC.

Figure 42A:
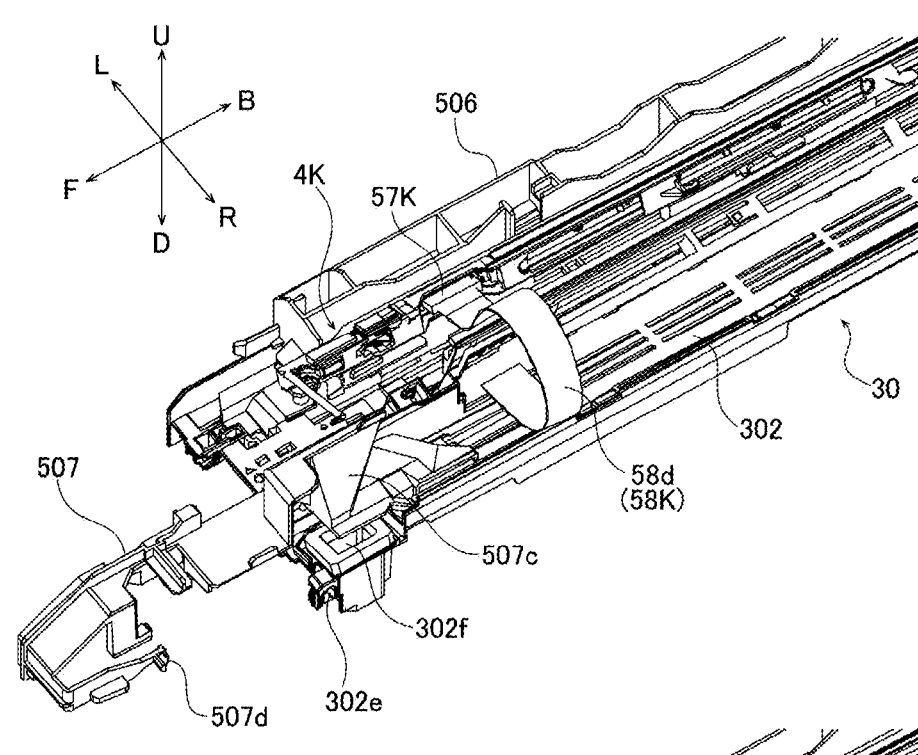
Figure 42B:
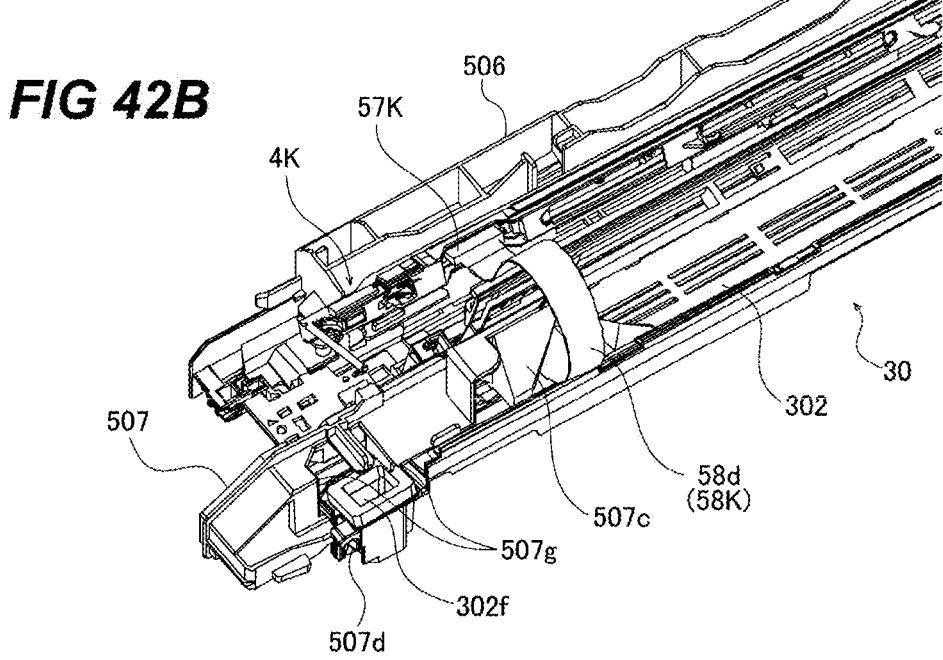

FIGS. 42A and 42B show exchanging procedures of the exposure head and the FFC.

Figure 43A:
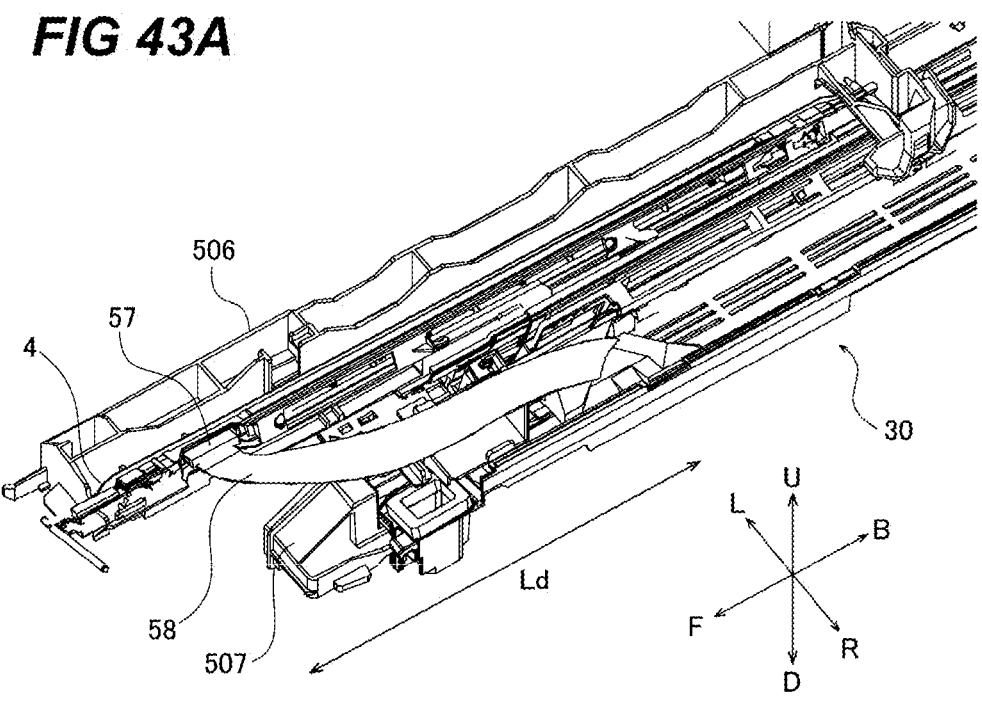
Figure 43B:
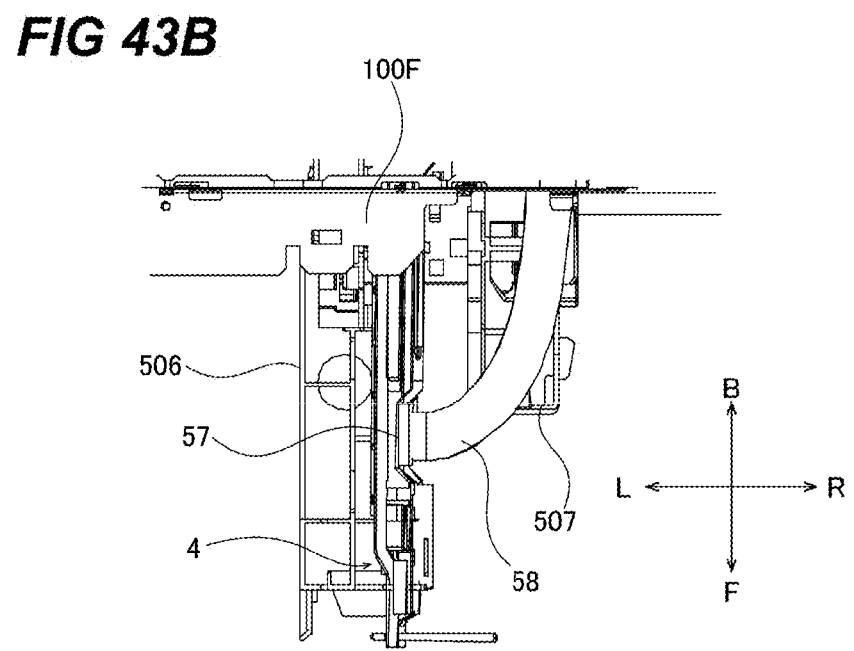

FIGS. 43A and 43B show exchanging procedures of the exposure head and the FFC.

Figure 44:
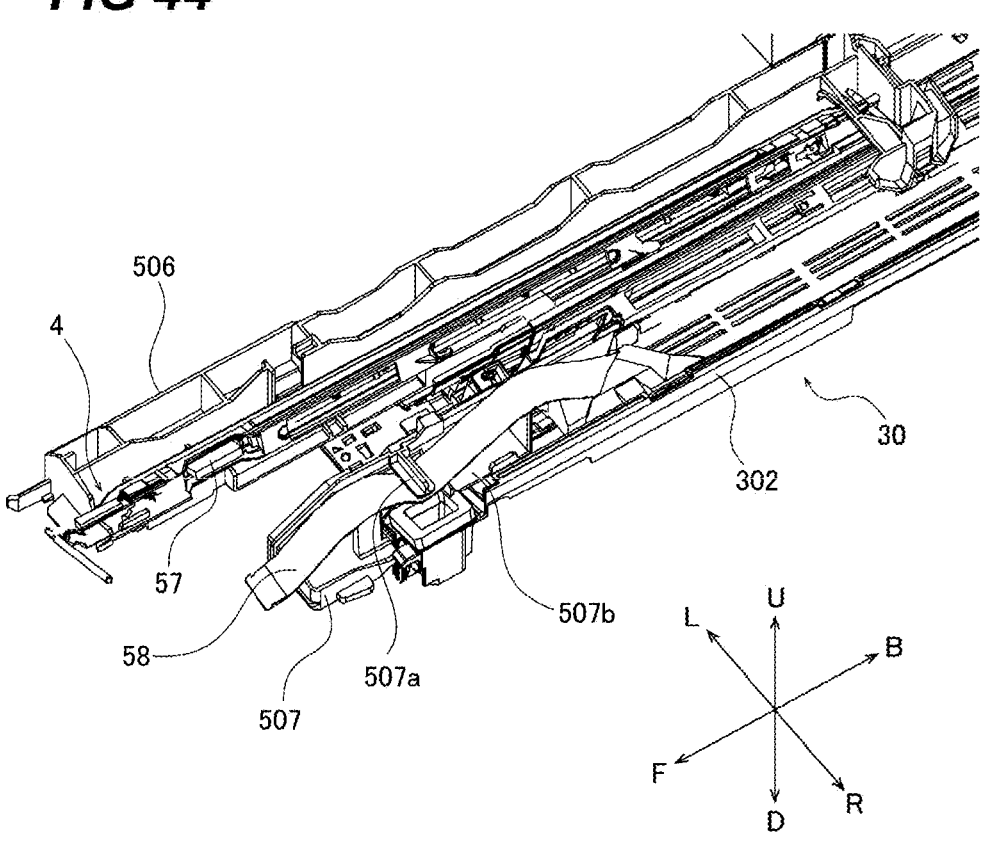

FIG. 44 shows exchanging procedures of the exposure head and the FFC.

Figure 45:
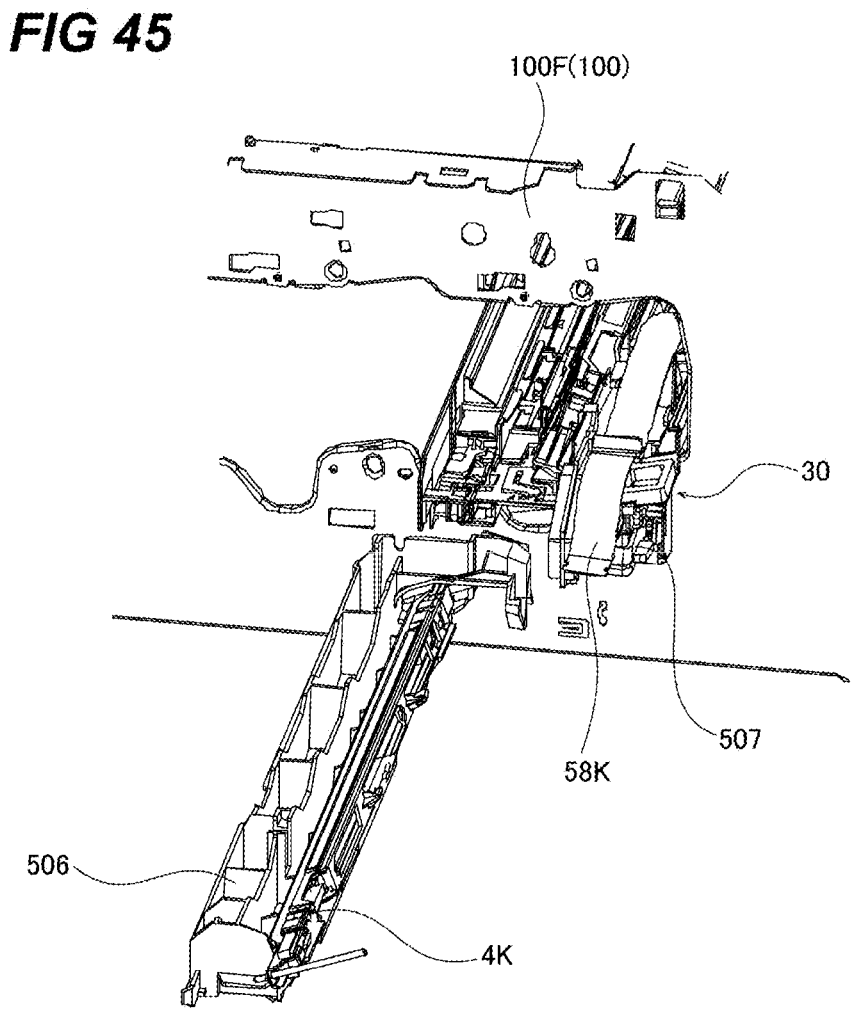

FIG. 45 shows exchanging procedures of the exposure head and the FFC.

Figures 46A, 46B, 46C:
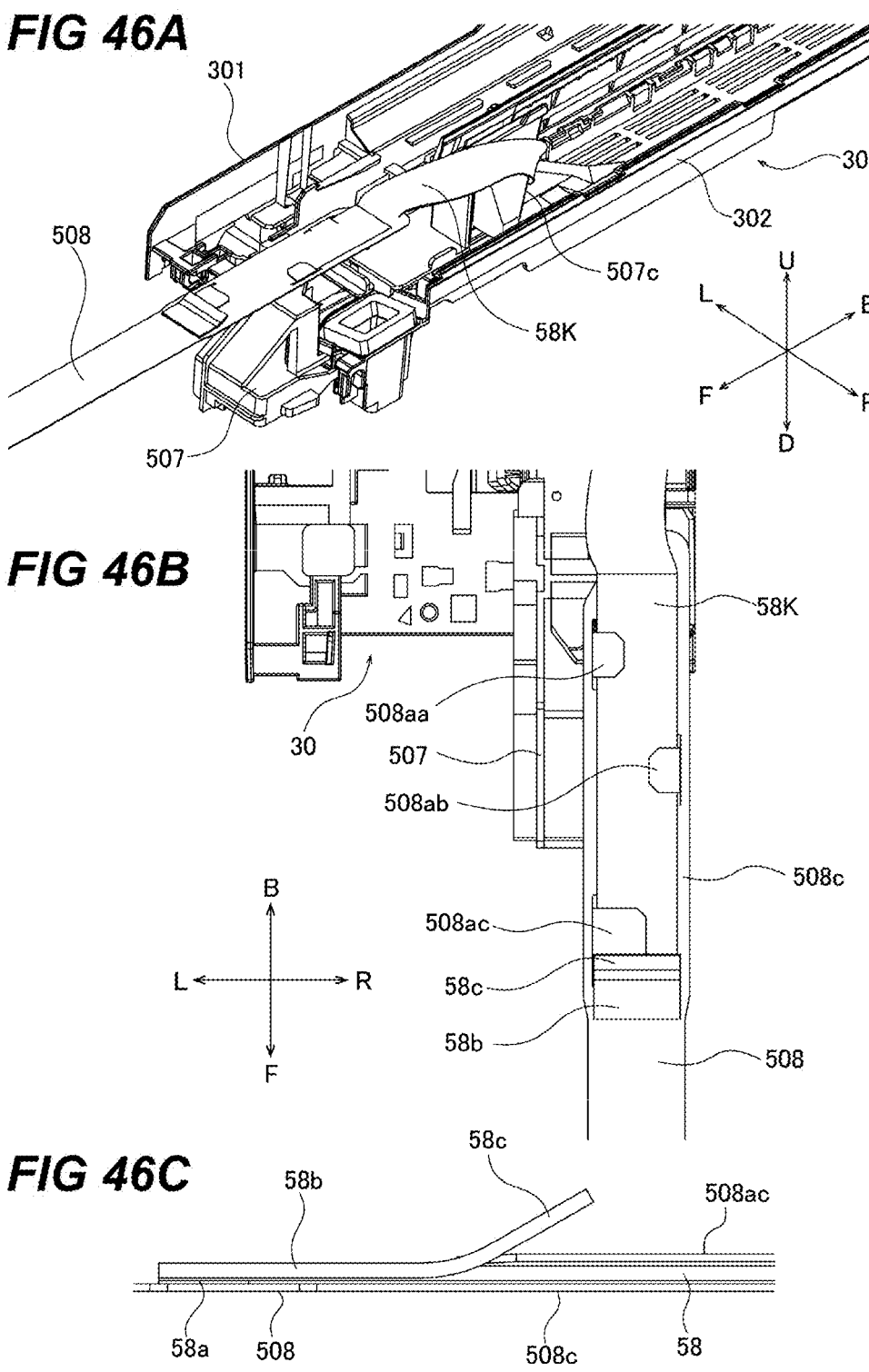

FIGS. 46A, 46B and 46C show exchanging procedures of the exposure head and the FFC.

Figures 47A, 47B, 47C:
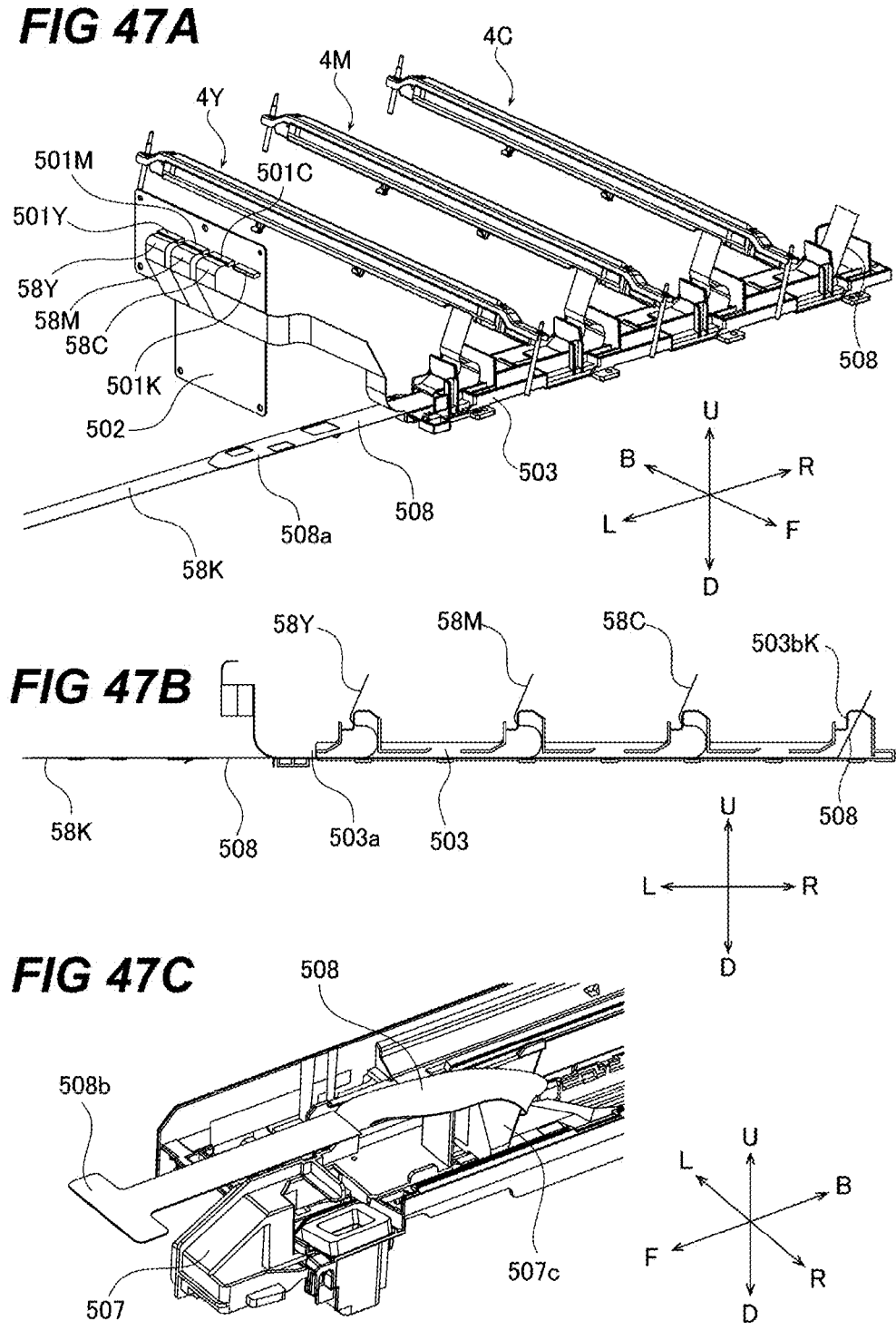

FIGS. 47A, 47B and 47C show exchanging procedures of the exposure head and the FFC.

Figures 48A, 48B, 48C:
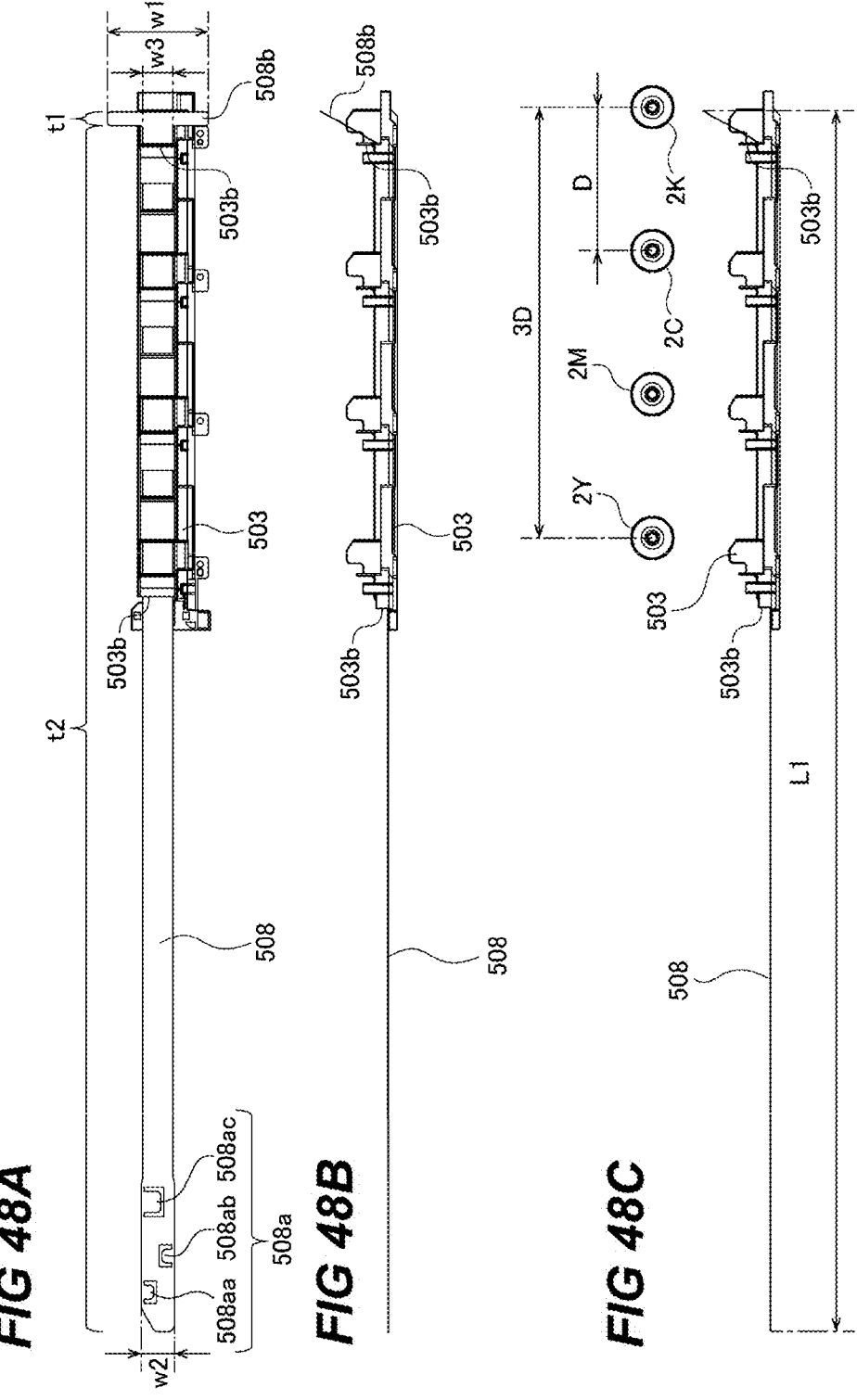

FIGS. 48A, 48B and 48C show exchanging procedures of the exposure head and the FFC.

Figures 49A, 49B:
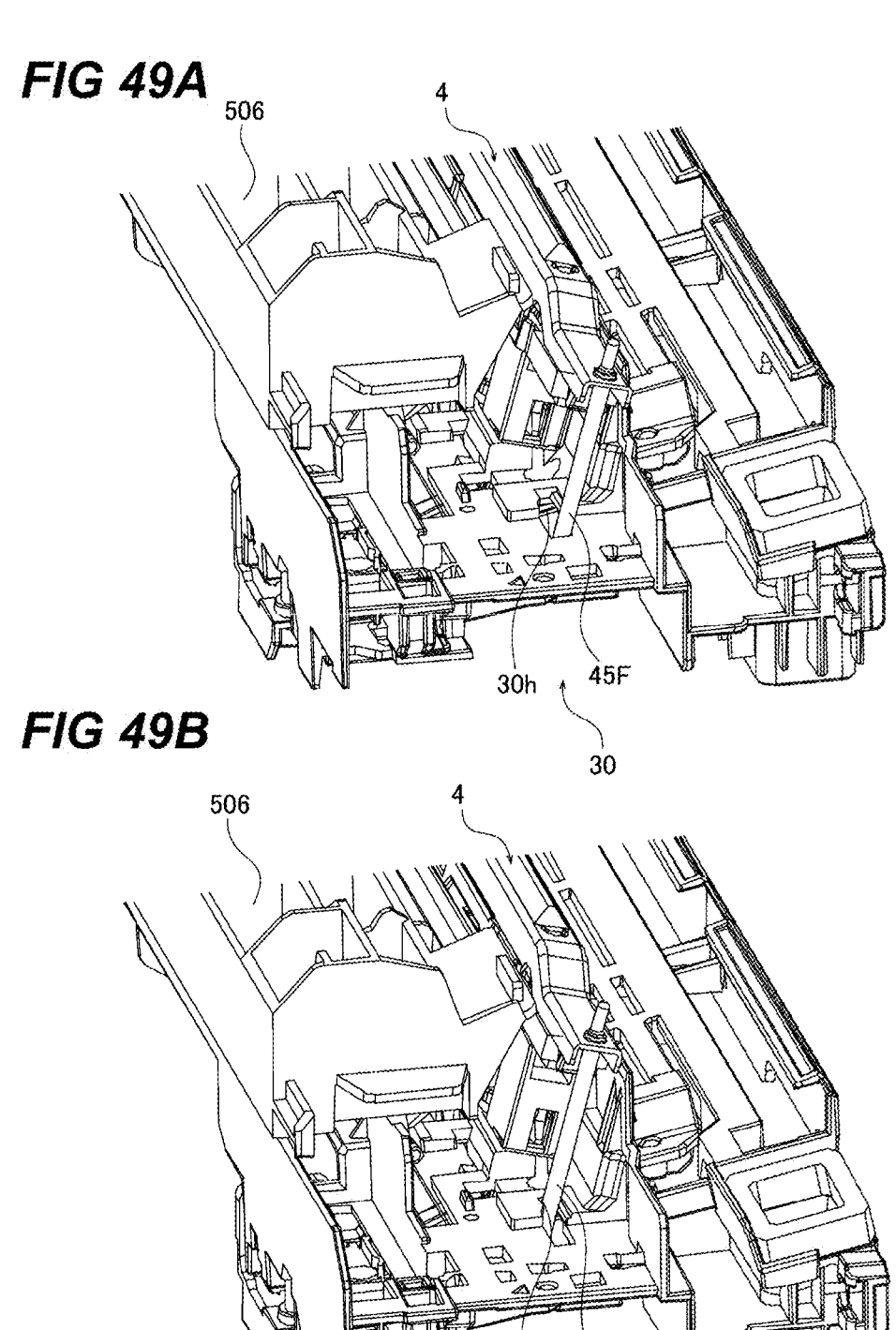

FIGS. 49A and 49B show exchanging procedures of the exposure head and the FFC.

Figure 50:
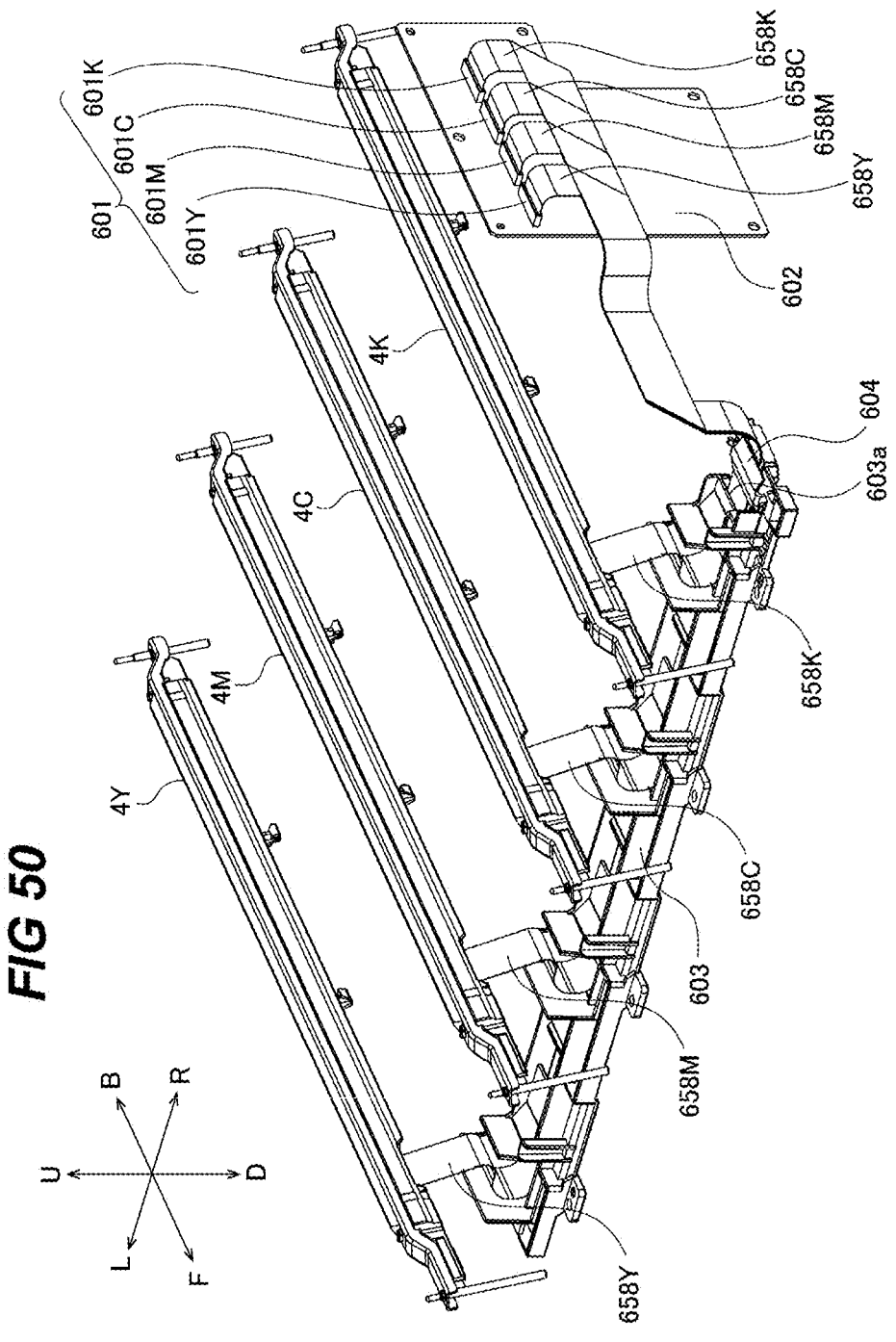

FIG. 50 is a right side perspective view of the exposure head, the FFC and an FFC guide according to the second embodiment.

Figures 51A, 51B:
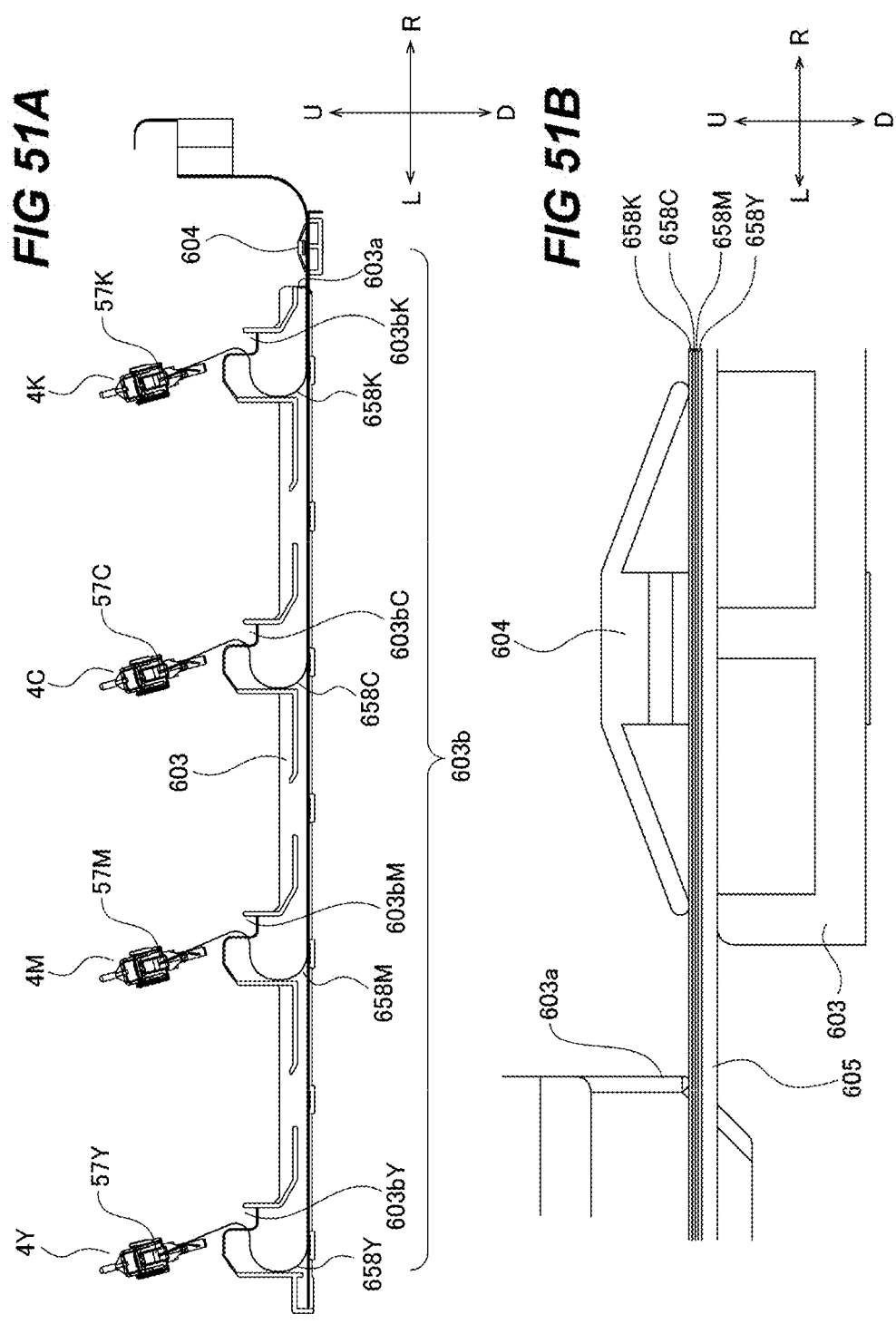

FIG. 51A is a cross-sectional view of the exposure head, the FFC and the FFC guide and FIG. 51B is an enlarged view of a biasing member according to the second embodiment.

Figure 52:
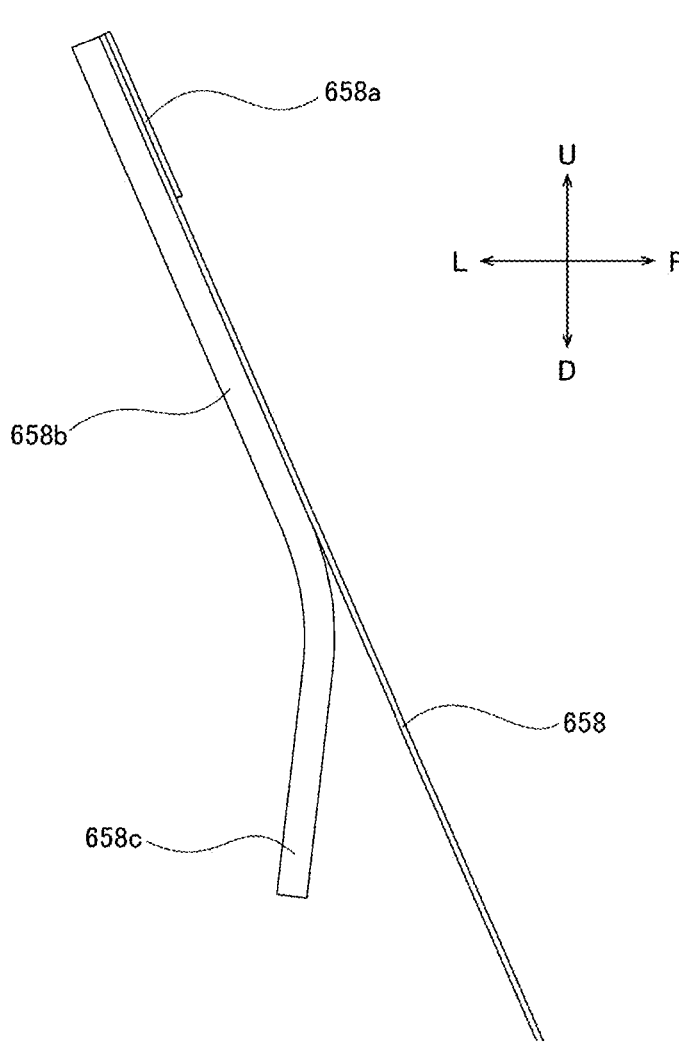

FIG. 52 is an enlarged view of an FCC contact point shown in FIG. 51A according to the second embodiment.

FIGS. 53A, 53B, 53C and 53D show an exposure head holding member according to the second embodiment.

FIGS. 54A, 54B, 54C and 54D show an FFC holding member according to the second embodiment.

Figure 55:
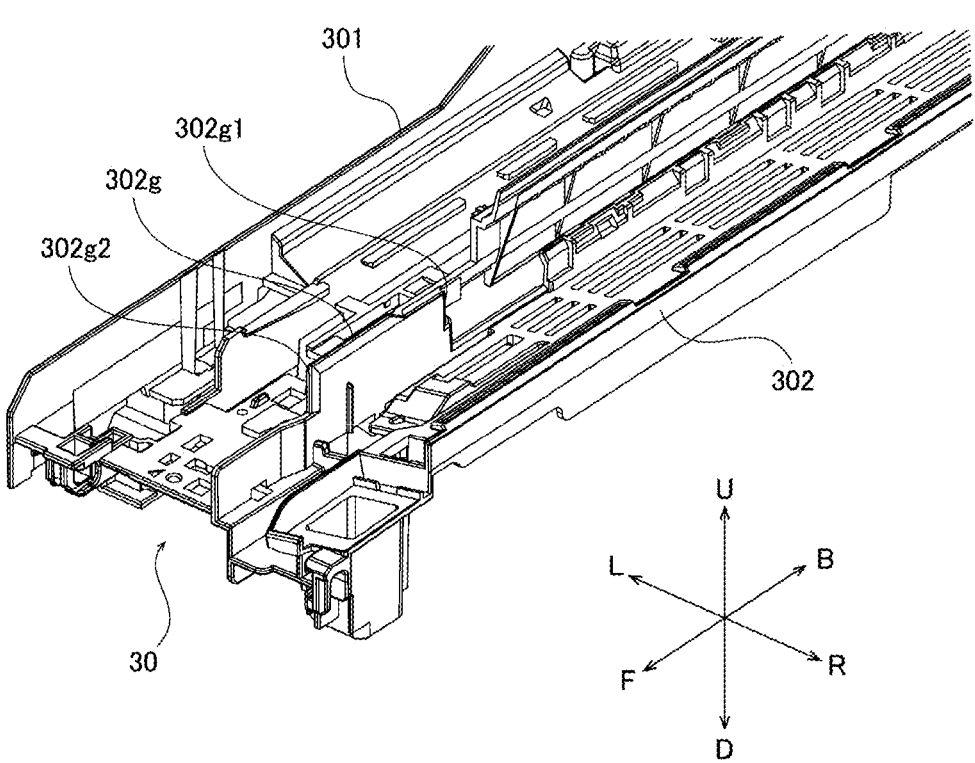

FIG. 55 is a right side perspective view of a restricting portion according to the second embodiment.

Figures 56A, 56B:
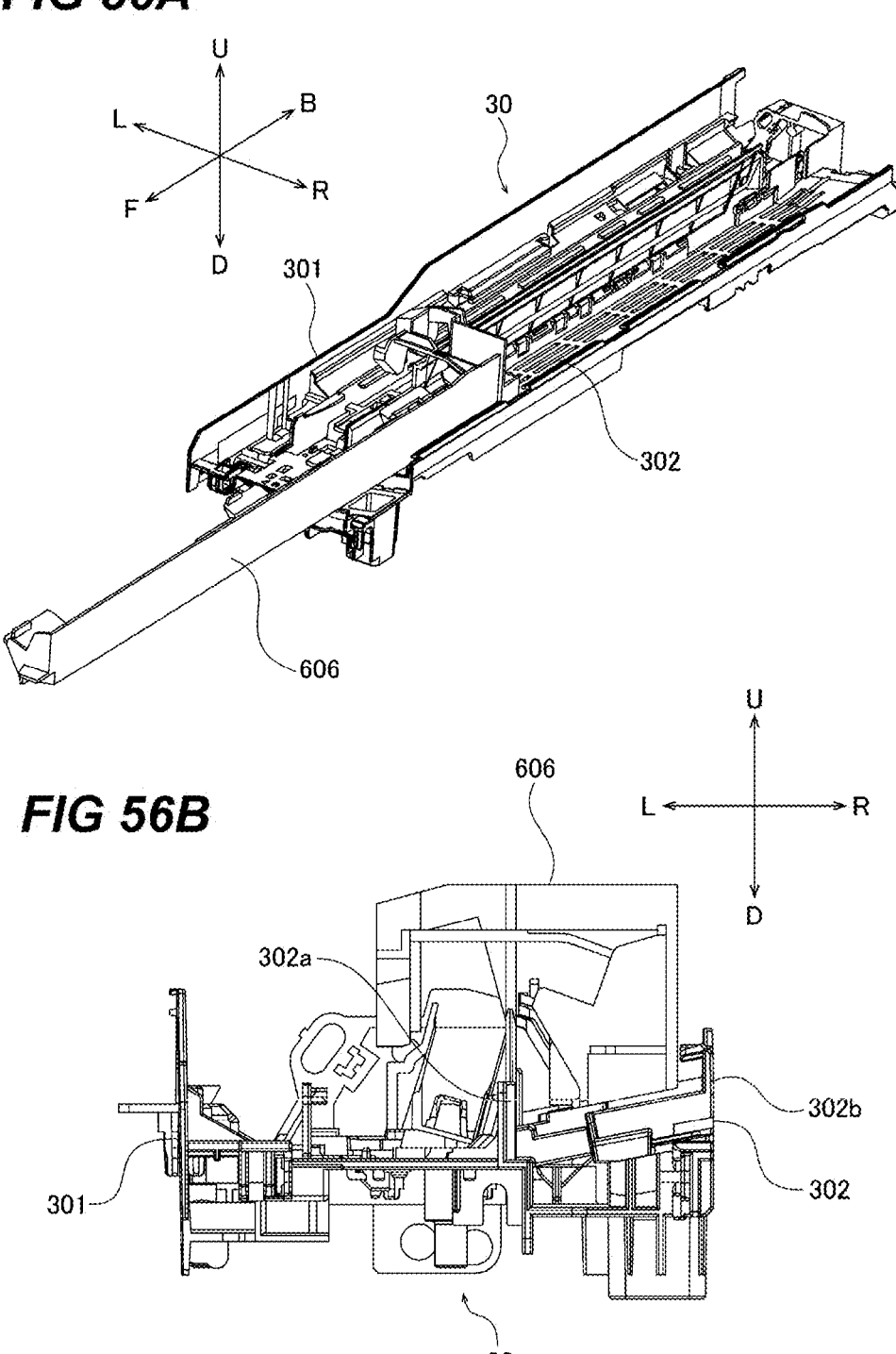

FIGS. 56A and 56B show exchanging procedures of the exposure head and the FFC according to the second embodiment.

FIGS. 57A, 57B, 57C and 57D show exchanging procedures of the exposure head and the FFC according to the second embodiment.

Figures 58A, 58B:
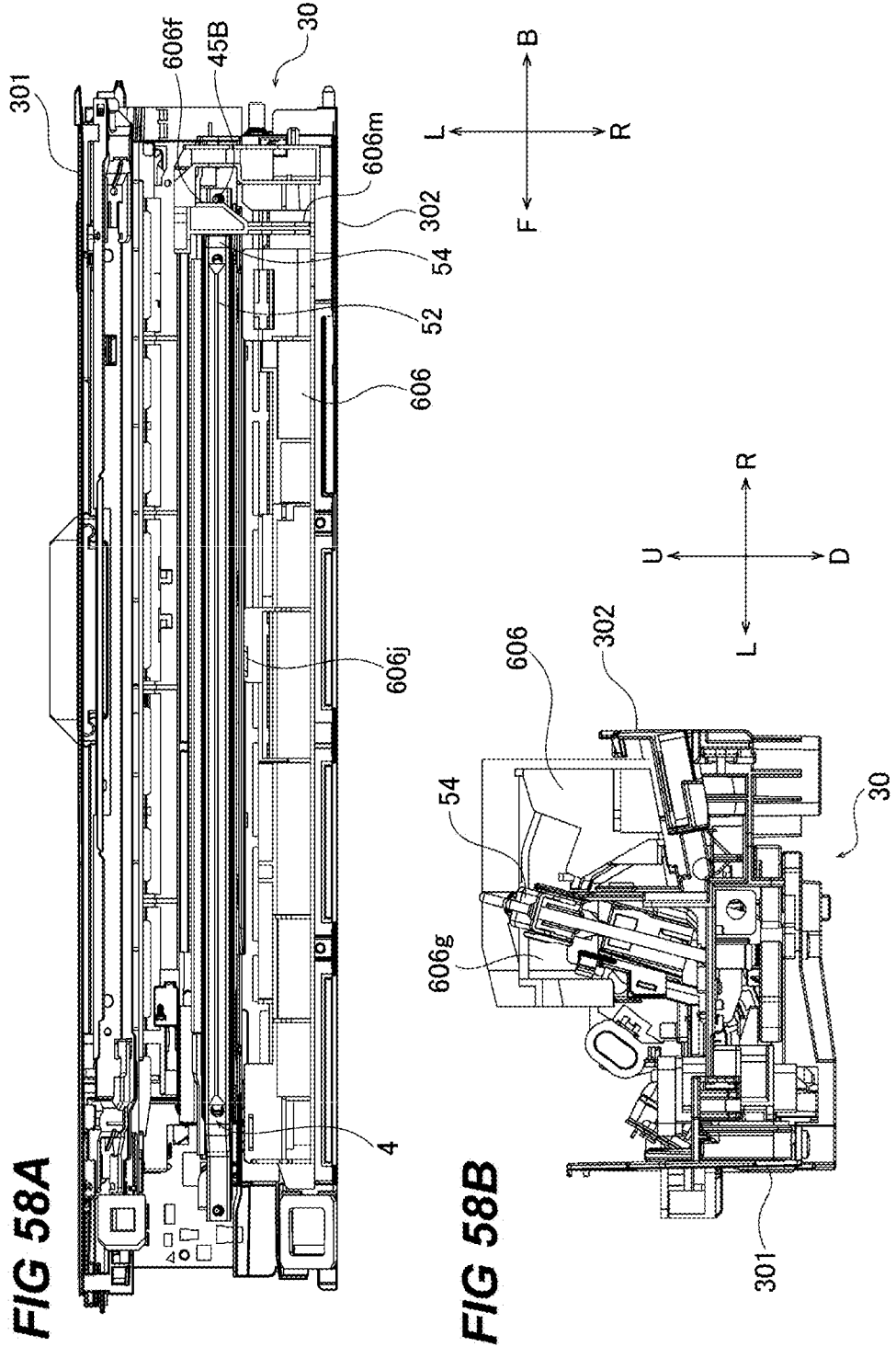

FIGS. 58A and 58B show exchanging procedures of the exposure head and the FFC according to the second embodiment.

Figures 59A, 59B, 59C:
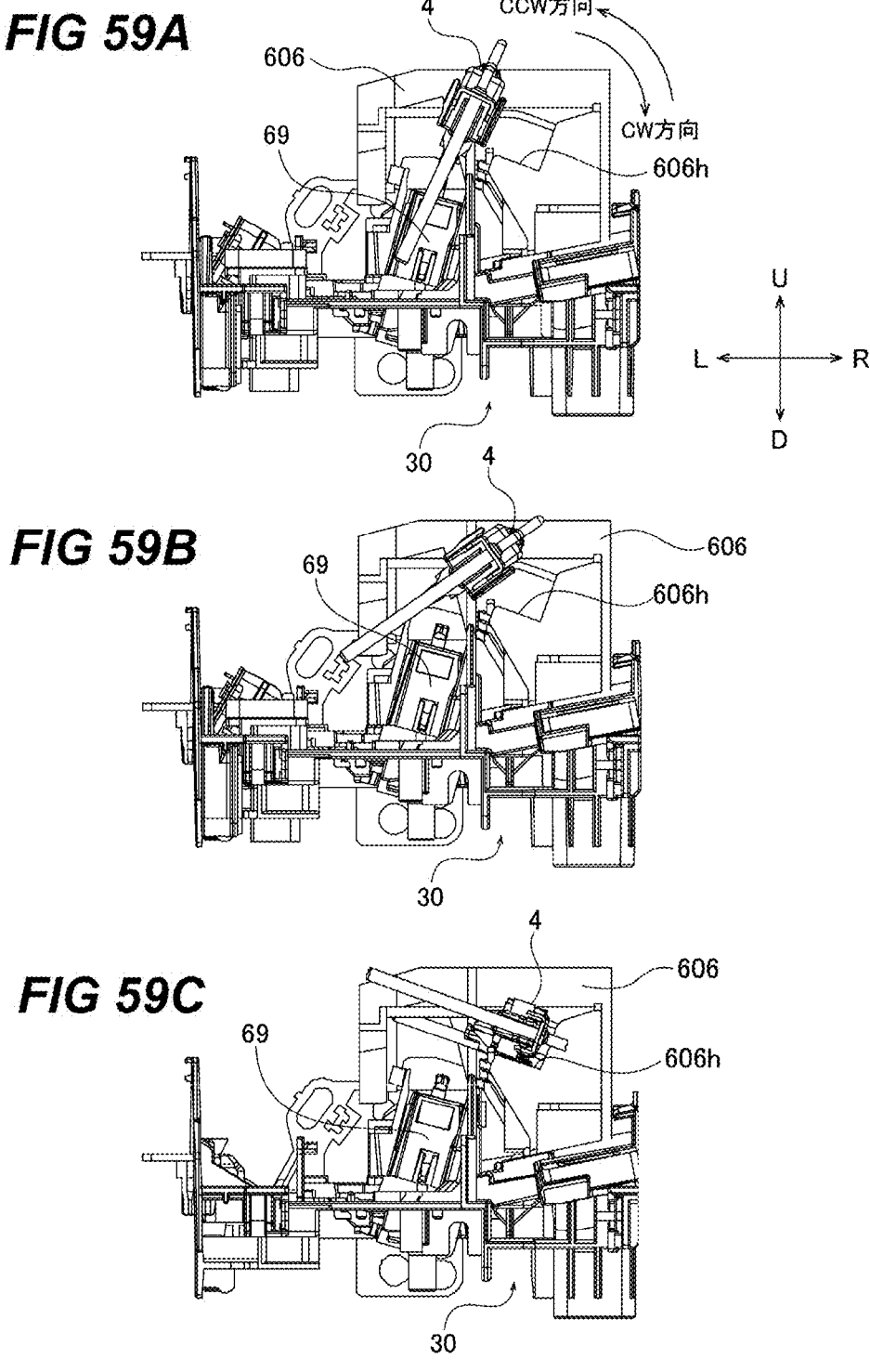

FIGS. 59A, 59B and 59C show exchanging procedures of the exposure head and the FFC according to the second embodiment.

Figure 60:
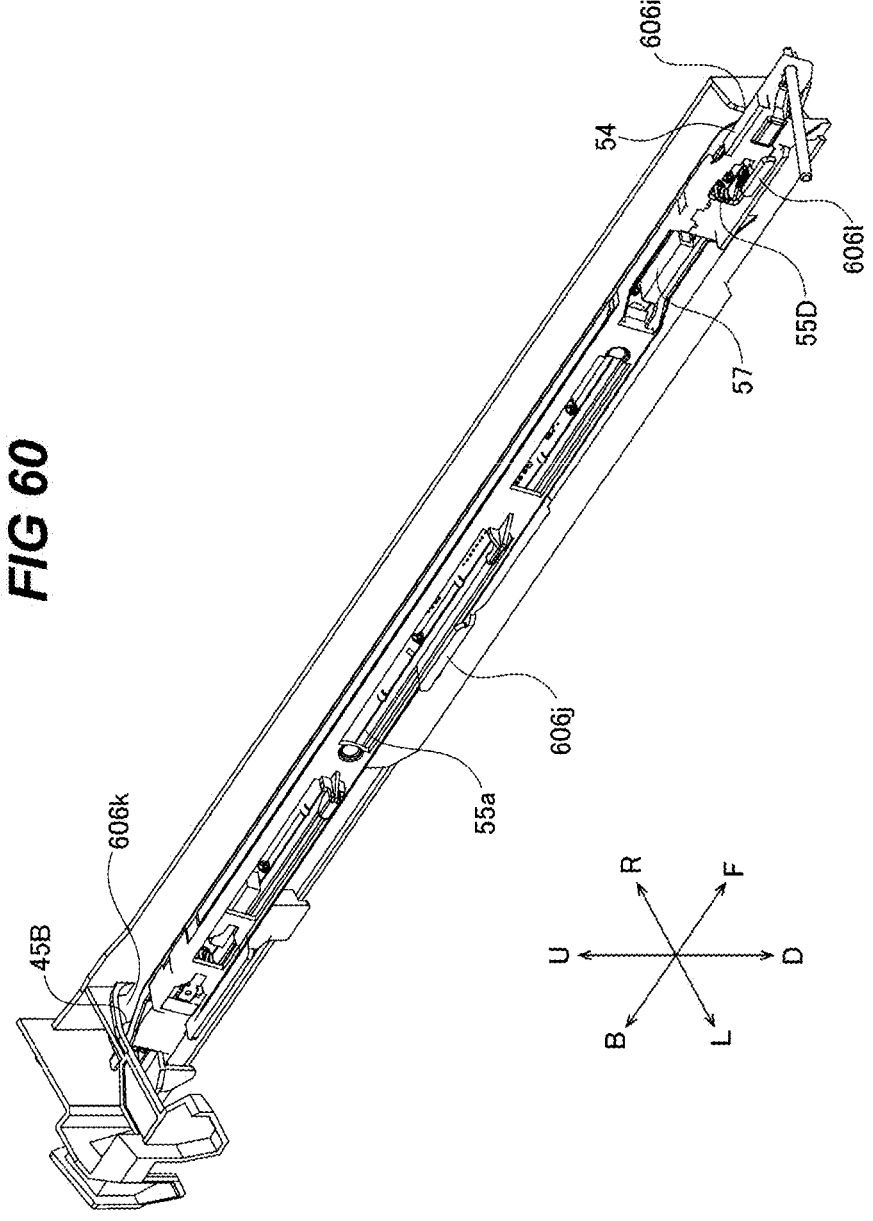

FIG. 60 shows exchanging procedures of the exposure head and the FFC according to the second embodiment.

Figure 61A:
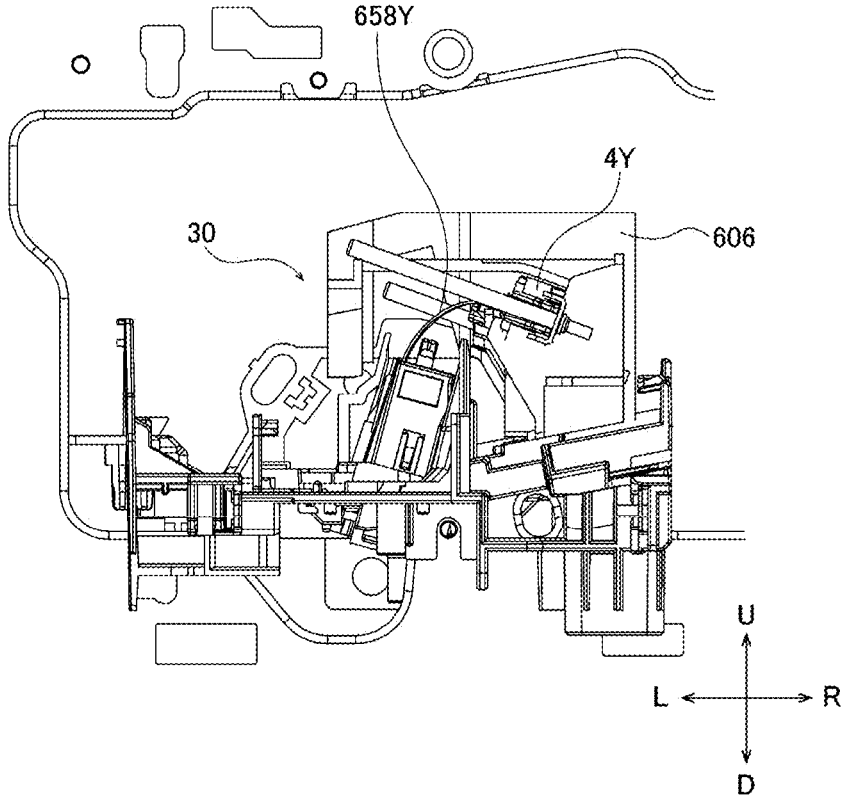
Figure 61B:
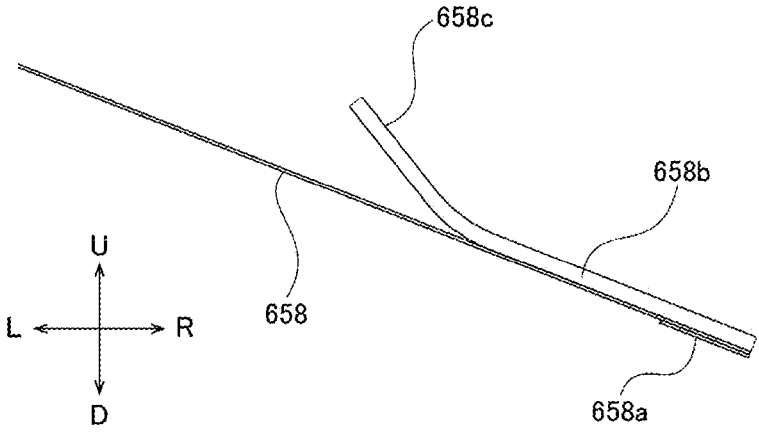

FIGS. 61A and 61B show exchanging procedures of the exposure head and the FFC according to the second embodiment.

4

Figures 62A, 62B, 62C:
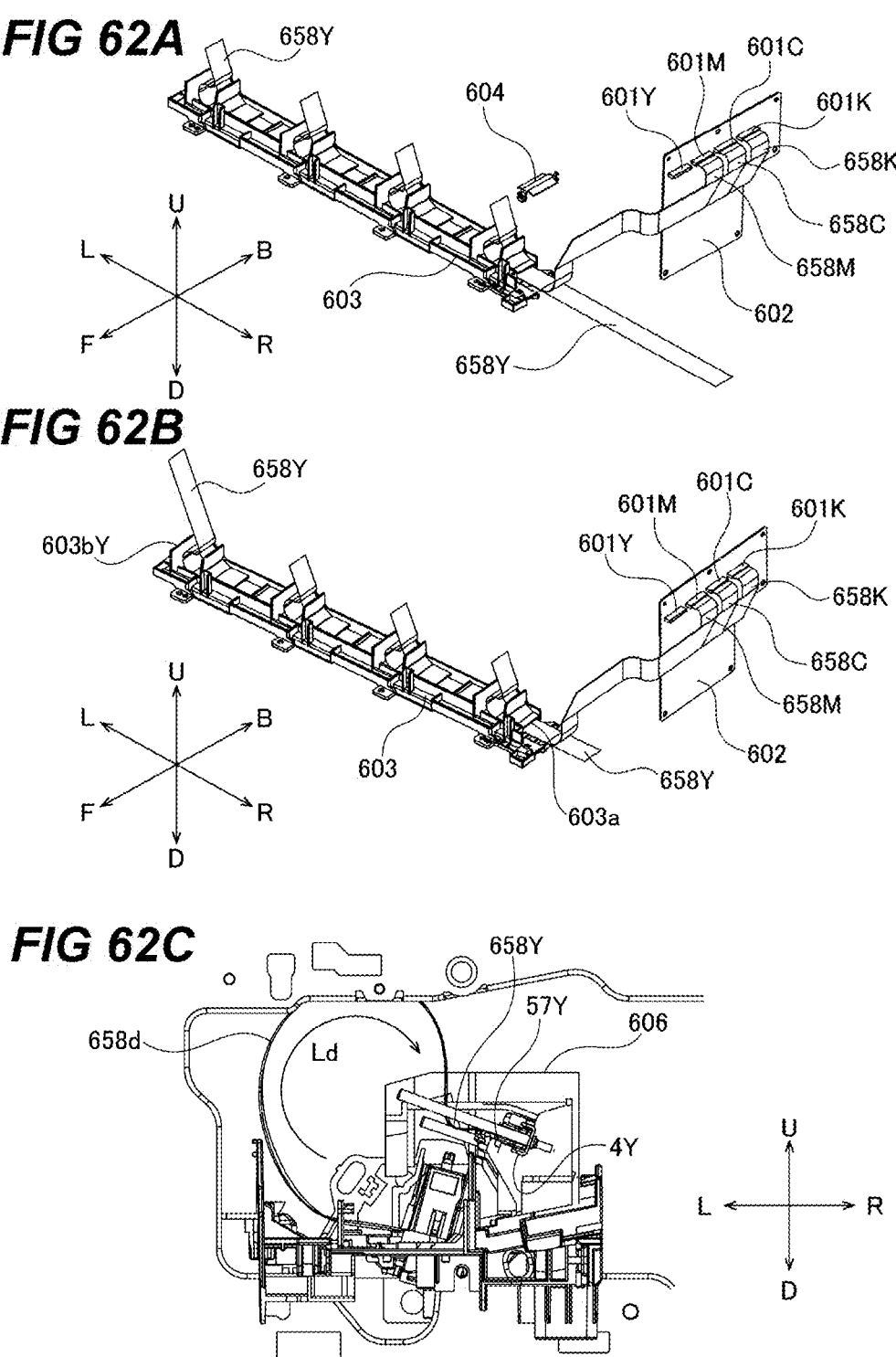

FIGS. 62A, 62B and 62C show exchanging procedures of the exposure head and the FFC according to the second embodiment.

Figure 63A:
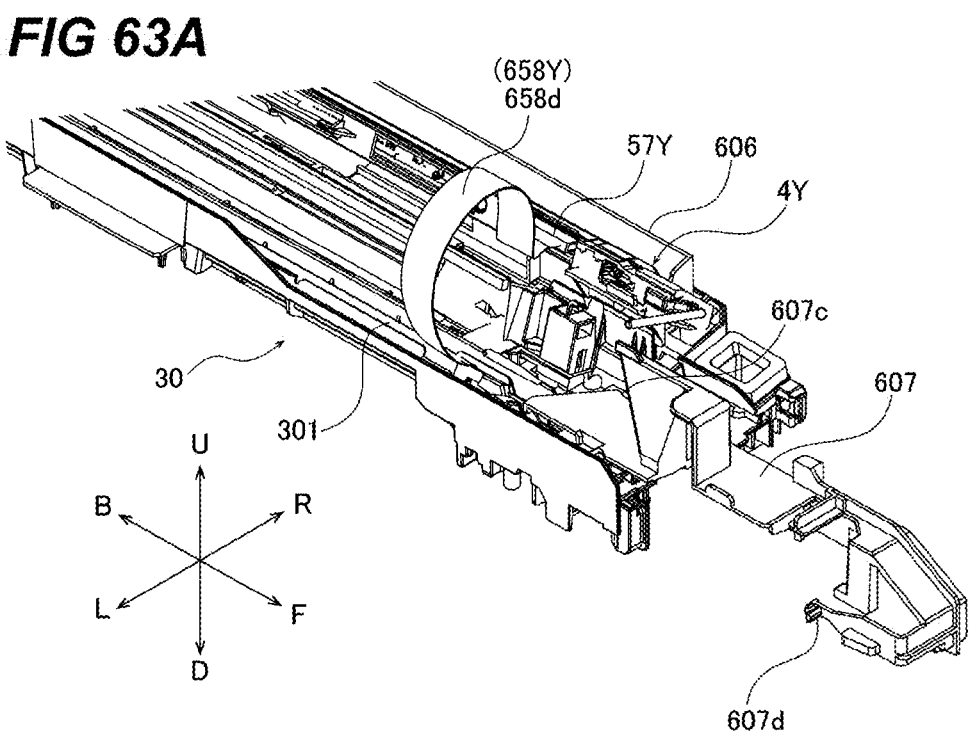
Figure 63B:
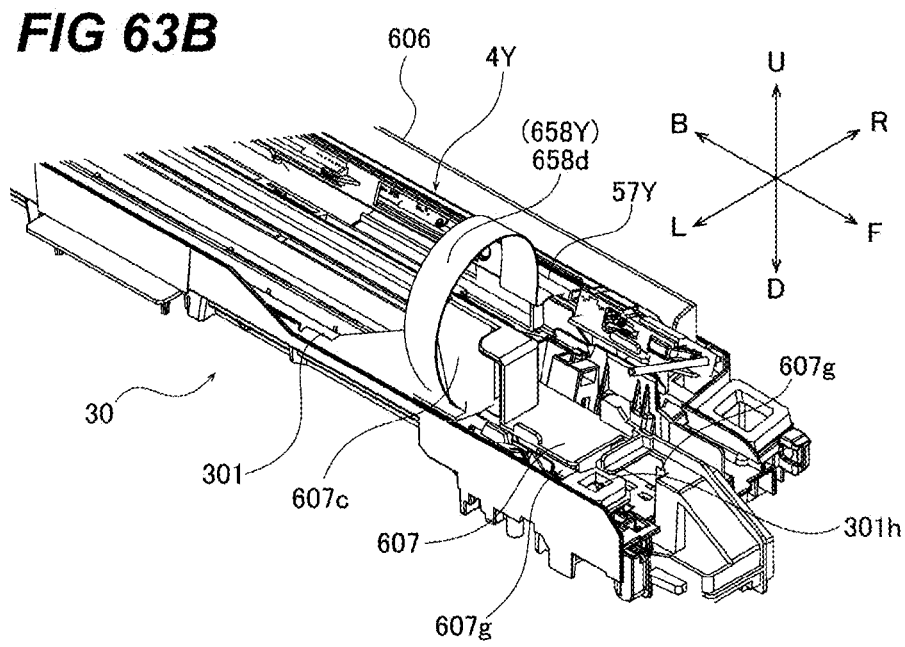

FIGS. 63A and 63B show exchanging procedures of the exposure head and the FFC according to the second embodiment.

Figure 64A:
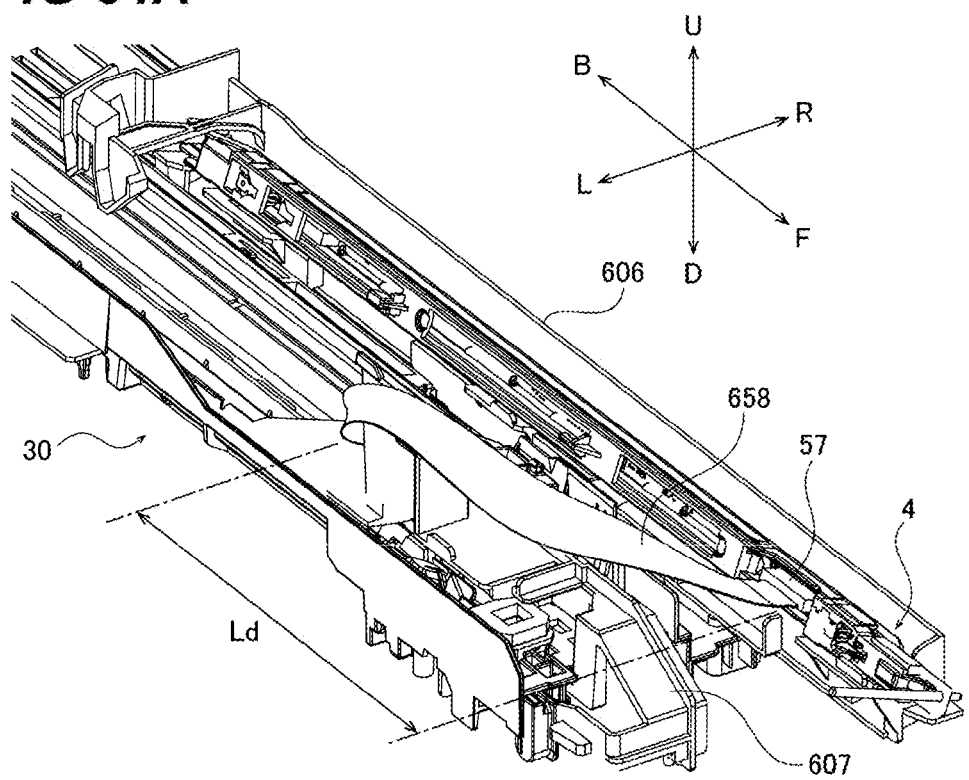
Figure 64B:
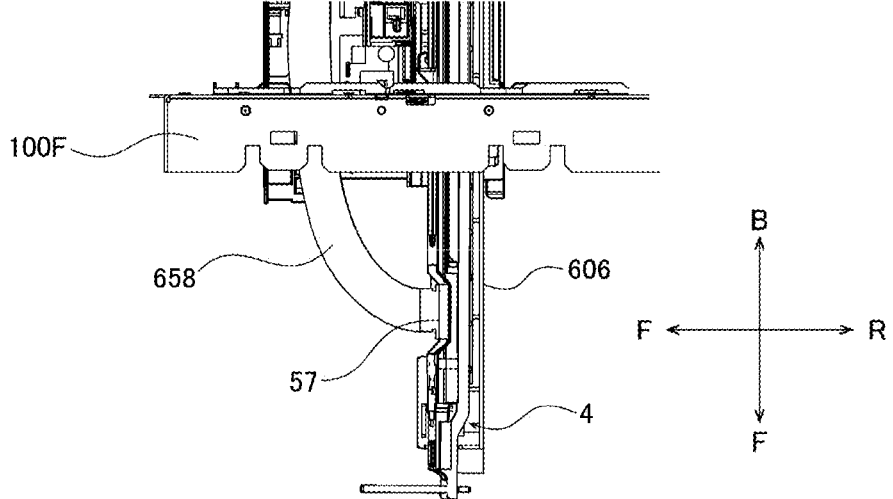

FIGS. 64A and 64B show exchanging procedures of the exposure head and the FFC according to the second embodiment.

Figure 65:
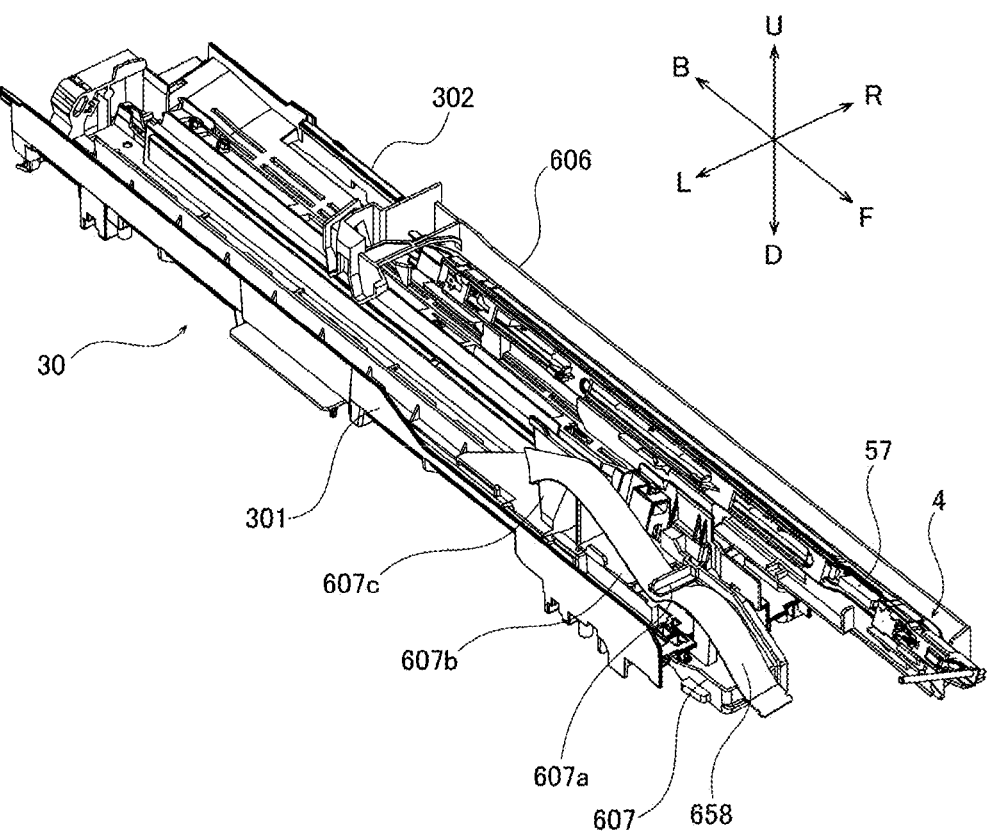

FIG. 65 shows exchanging procedures of the exposure head and the FFC according to the second embodiment.

Figure 66:
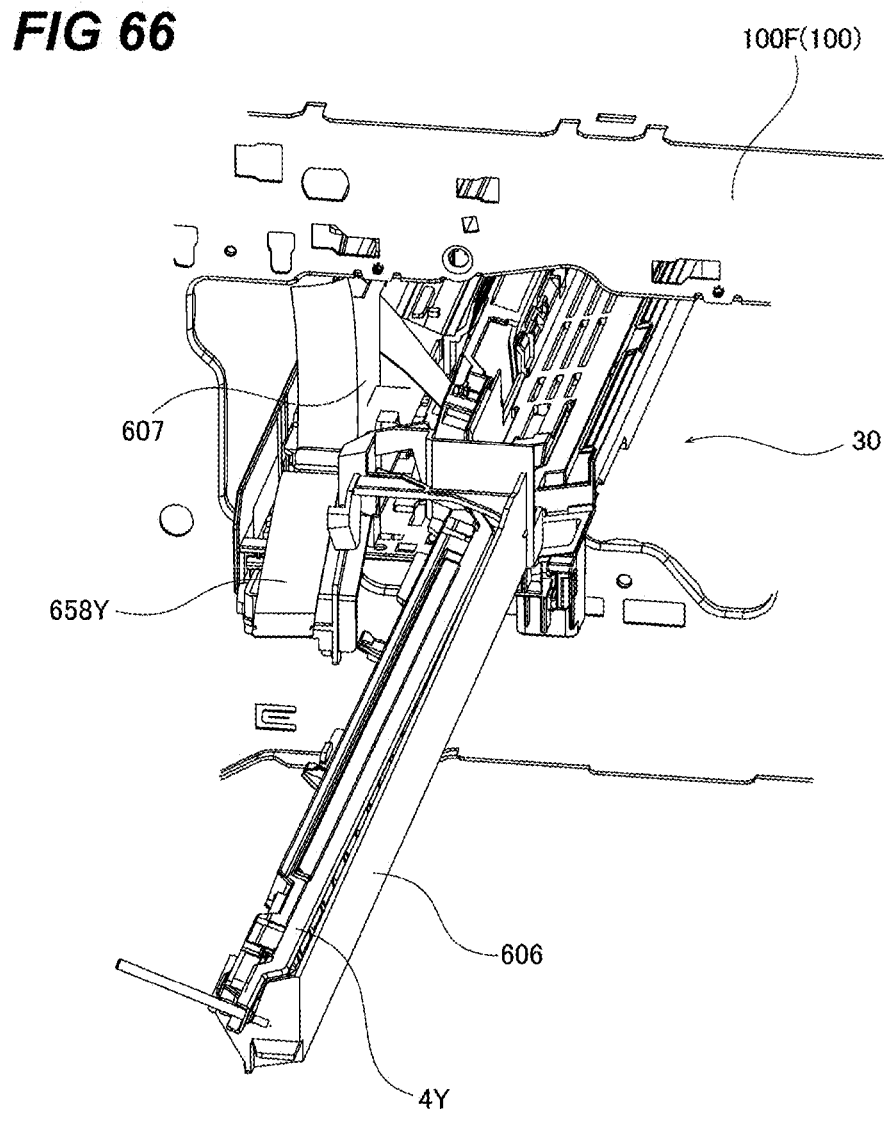

FIG. 66 shows exchanging procedures of the exposure head and the FFC according to the second embodiment.

Figures 67A, 67B, 67C:
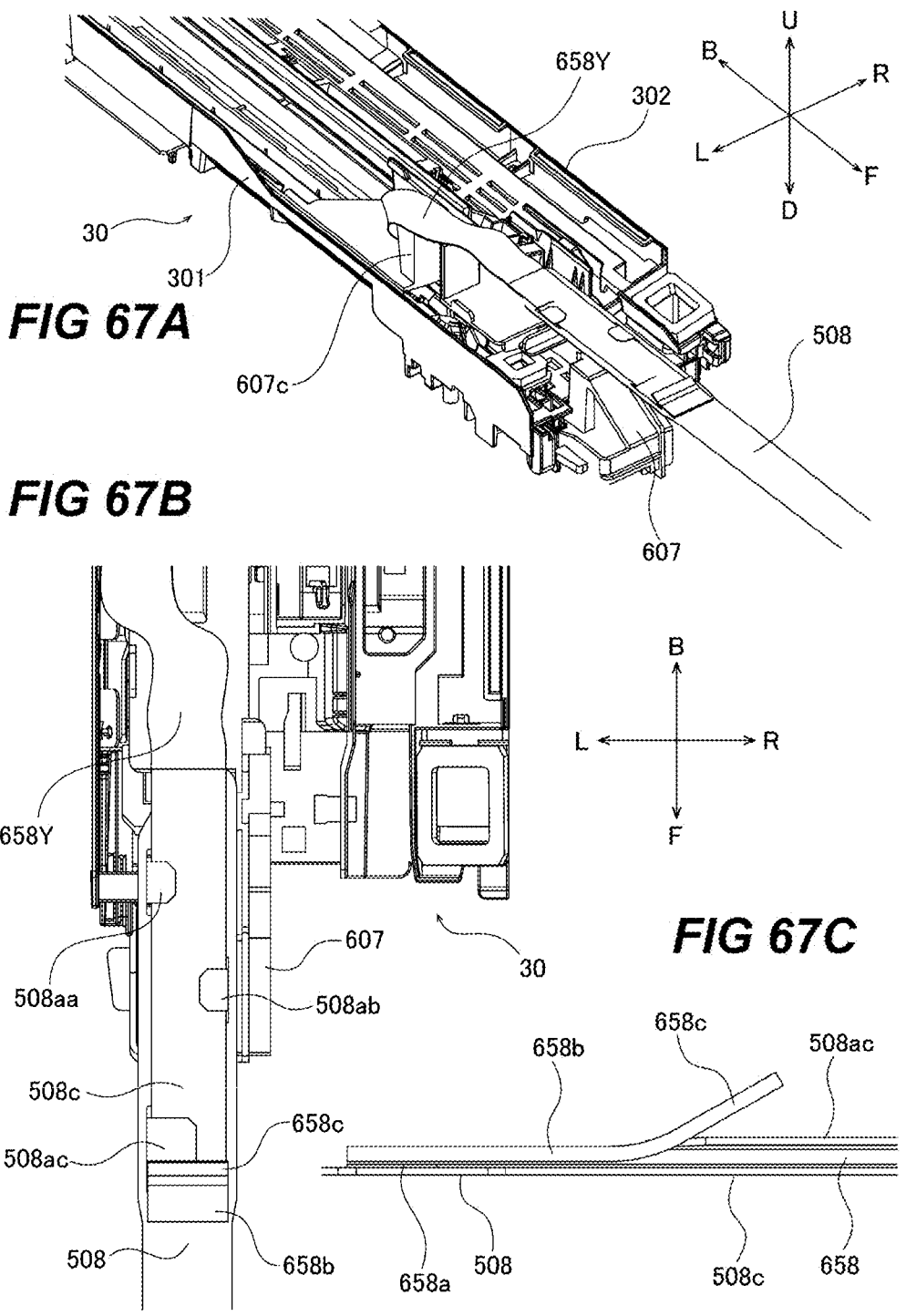

FIGS. 67A, 67B and 67C show exchanging procedures of the exposure head and the FFC according to the second embodiment.

Figures 68A, 68B, 68C:
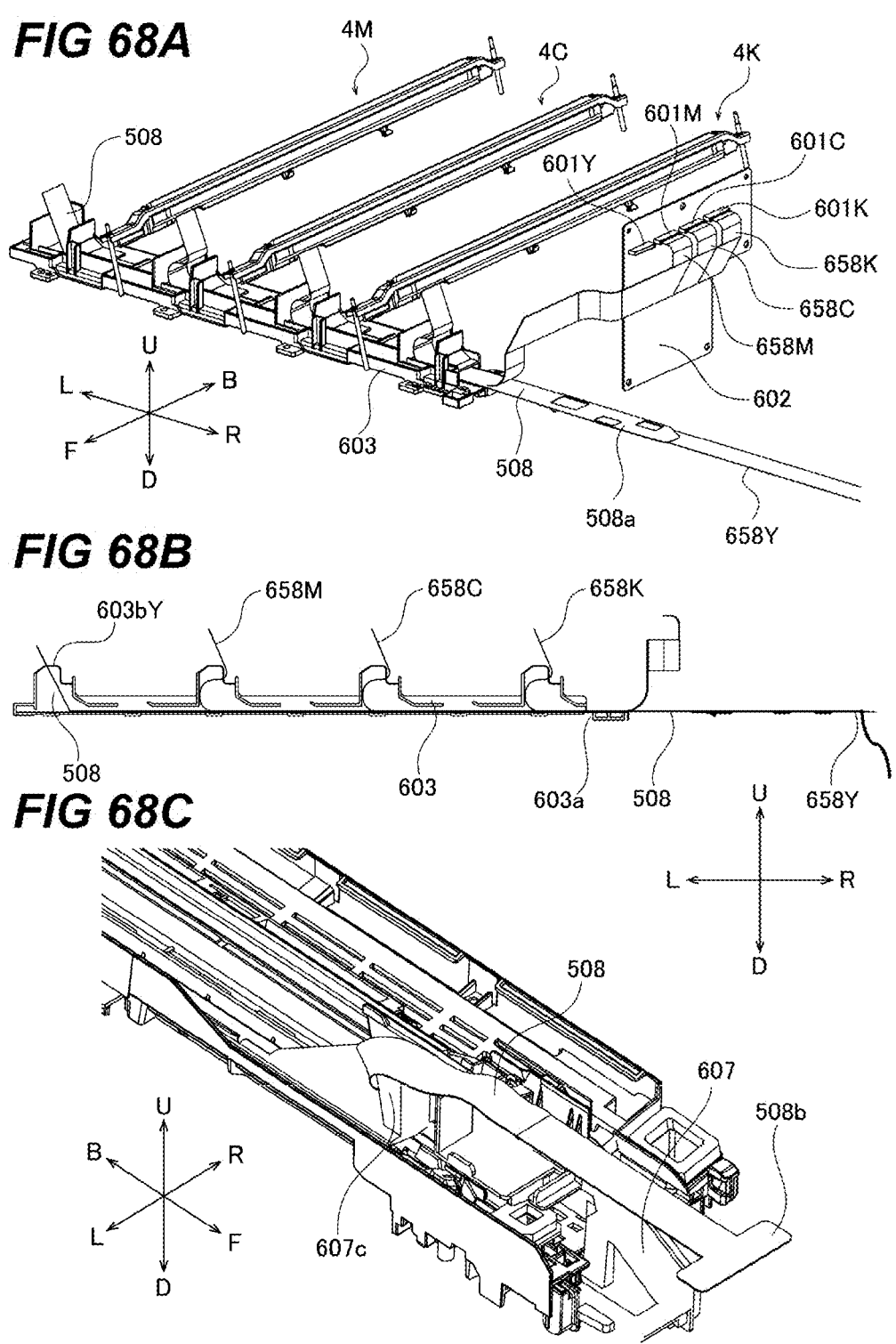

FIGS. 68A, 68B and 68C show exchanging procedures of the exposure head and the FFC according to the second embodiment.

DESCRIPTION OF THE EMBODIMENTS

Embodiment 1

Hereinafter, embodiments of the present invention will be described with reference to the drawings. The dimensions, materials, shapes, relative arrangements, and so on of the components described below are not intended to limit the scope of the present invention only thereto, unless otherwise specified.

(Image Forming Apparatus)

Figure 1:
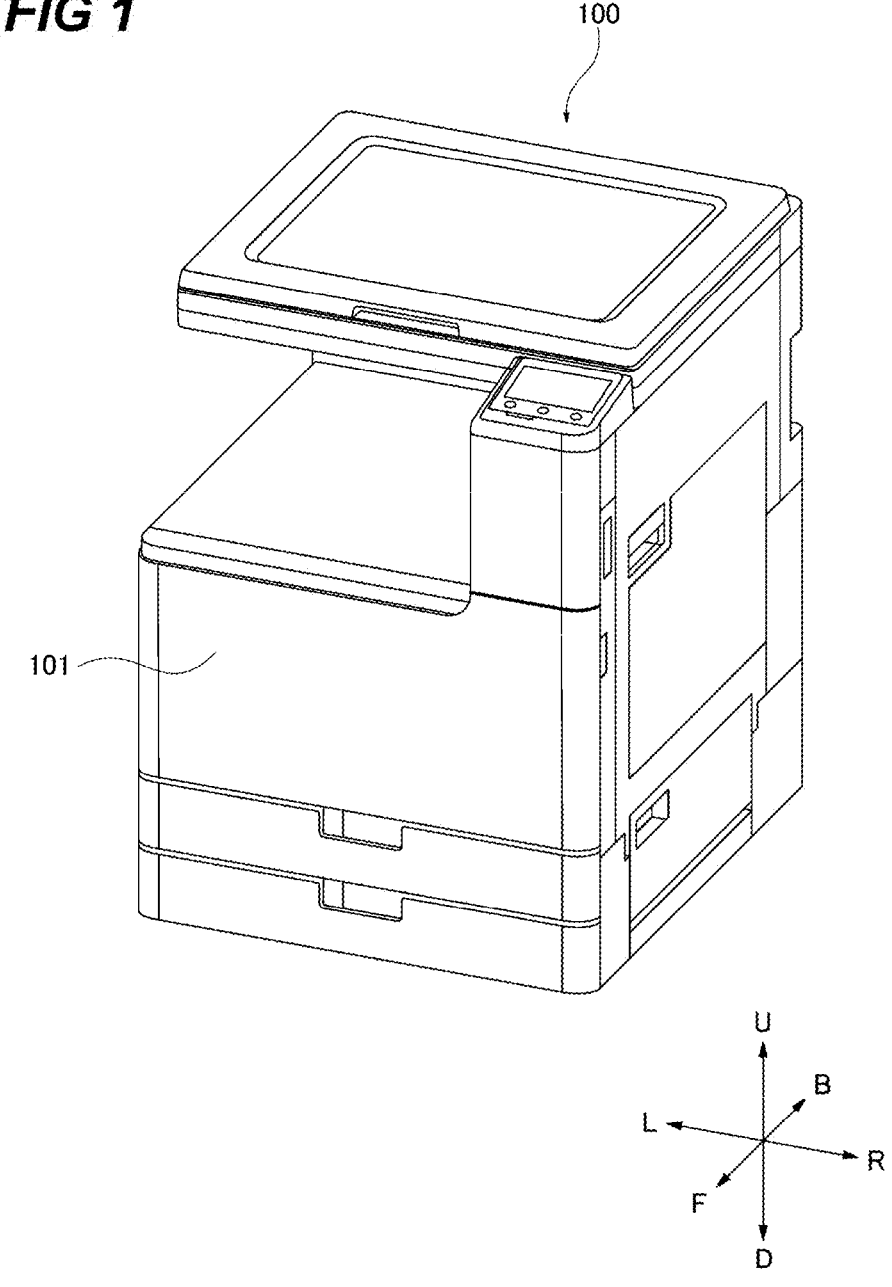
FIG. 1 is a perspective view of an image forming apparatus.
Figure 2:
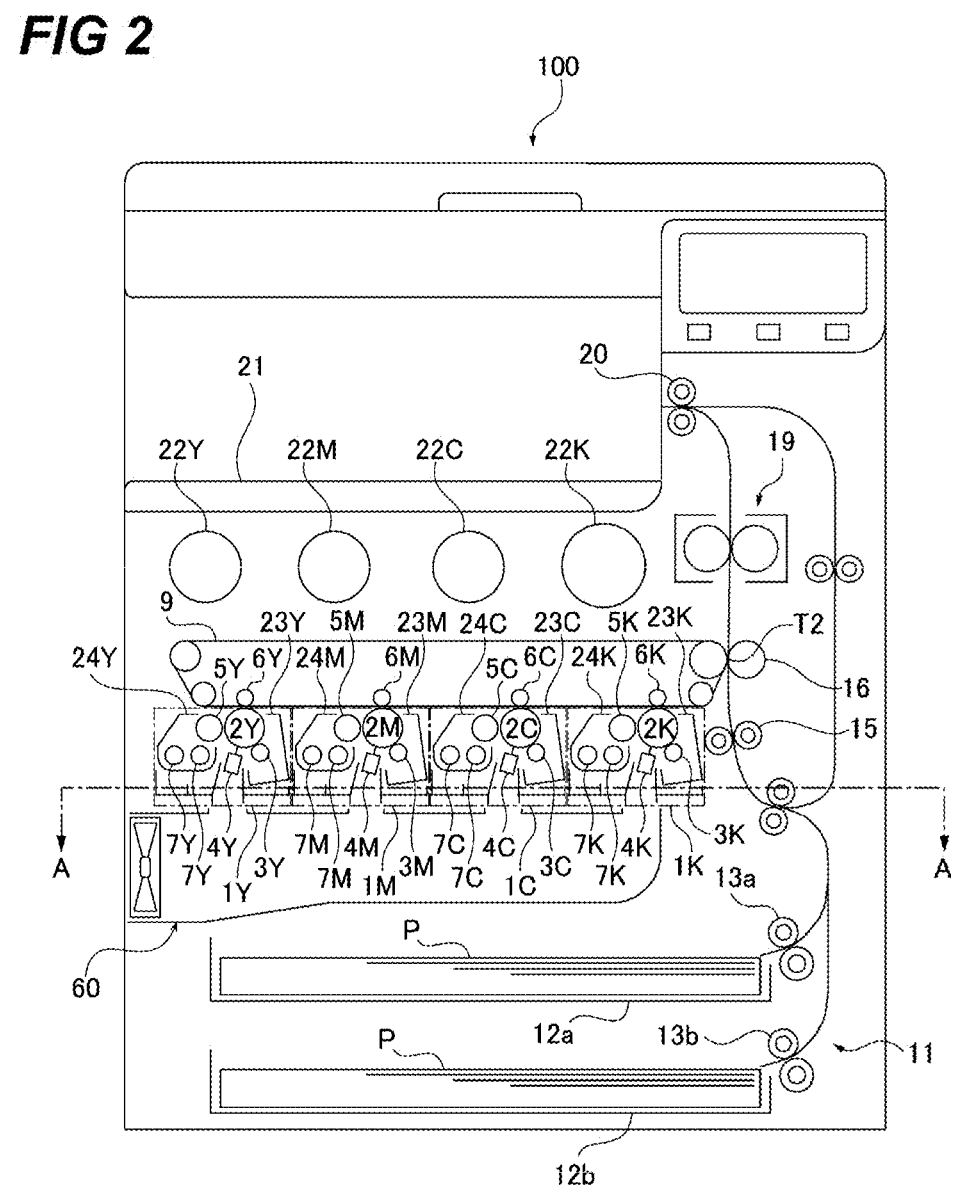
Figure 3:
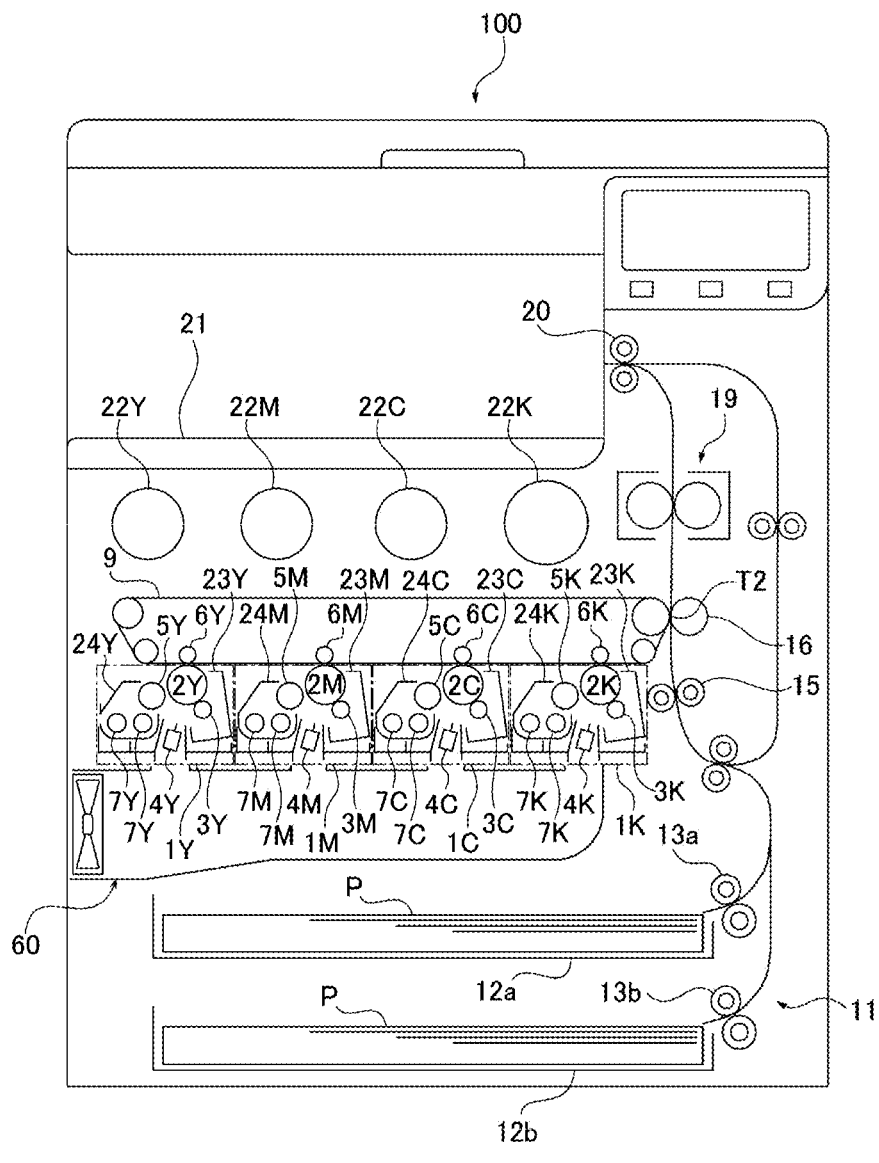
FIG. 3 is a schematic cross-sectional view of the image forming apparatus in FIG. 1.

First, a schematic configuration of an image forming apparatus 100 will be described with reference to FIGS. 1, 2, and 3. FIG. 1 is a perspective view of the image forming apparatus 100. FIGS. 2 and 3 are schematic cross-sectional views of the image forming apparatus in FIG. 1. The image forming apparatus 100 illustrated in FIGS. 1 to 3 is a copying machine including a reading device, but the embodiment may be another image forming apparatus such as a printer not including a reading device. Further, the embodiment is not limited to the color image forming apparatus including a plurality of photosensitive drums 2 as illustrated in FIGS. 2 and 3, and may be a color image forming apparatus including one photosensitive drum 2 or an image forming apparatus forming a monochrome image.

The image forming apparatus 100 illustrated in FIGS. 2 and 3 includes four image forming portions 1Y, 1M, 1C, and 1K (hereinafter, also collectively and simply referred to as "image forming portion 1") that form toner images of respective colors of yellow, magenta, cyan, and black.

The image forming portions 1Y, 1M, 1C, and 1K include photosensitive drums 2Y, 2M, 2C, and 2K (hereinafter, also collectively and simply referred to as a "photosensitive drum 2"), which are examples of photosensitive members, respectively. The photosensitive drum 2 may be a photosensitive belt.

The image forming portions 1Y, 1M, 1C, and 1K include charging rollers 3Y, 3M, 3C, and 3K (hereinafter, also collectively and simply referred to as a "charging roller 3") as charging portions that respectively charge the photosensitive drums 2Y, 2M, 2C, and 2K.

In addition, the image forming portions 1Y, 1M, 1C, and 1K include light emitting diode (LED, hereinafter referred to as LED) exposure heads 4Y, 4M, 4C, and 4K (hereinafter, also collectively and simply referred to as an "exposure head 4") as exposure units that expose the photosensitive drums 2Y, 2M, 2C, and 2K.

Further, the image forming portions 1Y, 1M, 1C, and 1K include developing units 24Y, 24M, 24C, and 24K (hereinafter, also collectively and simply referred to as a "developing unit 24") as developing units that develop the electrostatic latent image on the photosensitive drum 2 with toner and develop the toner image of each color on the photosensitive drum 2. Note that Y, M, C, and K attached to the reference numerals indicate the colors of the toner.

The image forming apparatus 100 illustrated in FIGS. 2 and 3 is an image forming apparatus adopting a so-called "lower surface exposure system" in which the photosensitive drum 2 is exposed from below, that is, the exposure head 4 is disposed below the photosensitive drum 2. Hereinafter, a description will be given on the premise of an image forming apparatus adopting a lower surface exposure system. Note that, although not illustrated, as an embodiment, an image forming apparatus adopting an "upper surface exposure system" in which the photosensitive drum is exposed from above may be used.

The image forming apparatus 100 includes an intermediate transfer belt 9 to which a toner image formed on the photosensitive drum 2 is transferred, and a primary transfer roller 6 (Y, M, C, and K) that sequentially transfers the toner image formed on the photosensitive drum 2 to the intermediate transfer belt 9. The intermediate transfer belt 9 is disposed above the image forming portion 1. In addition to the intermediate transfer method using the intermediate transfer belt 9, a direct transfer method of directly transferring from the photosensitive drum 2 to a sheet may be used.

In addition, the image forming apparatus 100 includes a secondary transfer roller 16 as a transfer portion that transfers the toner image on the intermediate transfer belt 9 onto a recording sheet P conveyed from a feeding portion 11, and a fixing device 19 as a fixing unit that fixes the secondarily transferred image onto the recording sheet P.

Toner bottles 22Y, 22M, 22C, and 22K (hereinafter, also collectively and simply referred to as a "toner bottle 22") that accommodate replenishment toners of the respective colors are detachably replaceable units with respect to the image forming apparatus 100. The toner bottle 22 is disposed above the intermediate transfer belt 9. In the toner bottle 22, an appropriate amount of toner is appropriately supplied from the corresponding toner bottle to each developing unit included in the four image forming portions by a toner supply mechanism (not illustrated).

In addition, the image forming apparatus 100 includes the feeding portion 11 that feeds the recording sheet P. The feeding portion 11 includes sheet cassettes 12a and 12b, feeding rollers 13a and 13b, and a registration roller 15. The sheet cassettes 12a and 12b are disposed below the image forming portion 1. The recording sheets P accommodated in the sheet cassettes 12a and 12b are fed one by one by the feeding rollers 13a and 13b, and conveyed to a secondary transfer portion T2 at a predetermined timing by the registration roller 15.

(Image Forming Process)

Next, an image forming process of the image forming apparatus 100 will be briefly described. The charging roller 3Y charges the surface of the photosensitive drum 2Y The exposure head 4Y exposes the surface of the photosensitive drum 2Y charged by the charging roller 3Y As a result, an electrostatic latent image is formed on the photosensitive drum 2Y Next, the developing unit 24Y develops the electrostatic latent image formed on the photosensitive drum 2Y with yellow toner. The yellow toner image developed on the surface of the photosensitive drum 2Y is transferred onto the intermediate transfer belt 9 by the primary transfer roller 6Y Magenta, cyan, and black toner images are also formed by a similar image forming process, and are transferred so as to be superimposed on the intermediate transfer belt 9.

The toner image of each color transferred onto the intermediate transfer belt 9 is conveyed to the secondary transfer portion T2 by the intermediate transfer belt 9. The toner images conveyed to the secondary transfer portion T2 are collectively transferred to the recording sheet P conveyed from the feeding portion 11 by the secondary transfer roller 16. The recording sheet P to which the toner image has been transferred is conveyed to the fixing device 19. The fixing device 19 fixes the toner image on the recording sheet P by heat and pressure. The recording sheet P subjected to the fixing process by the fixing device 19 is discharged to a discharge tray 21 disposed above the toner bottle 22 by a discharge roller 20.

(Drum Unit and Developing Unit)

A replaceable drum unit 23 and the developing unit 24 in the image forming apparatus 100 of the present embodiment will be described by way of example.

Figure 4:
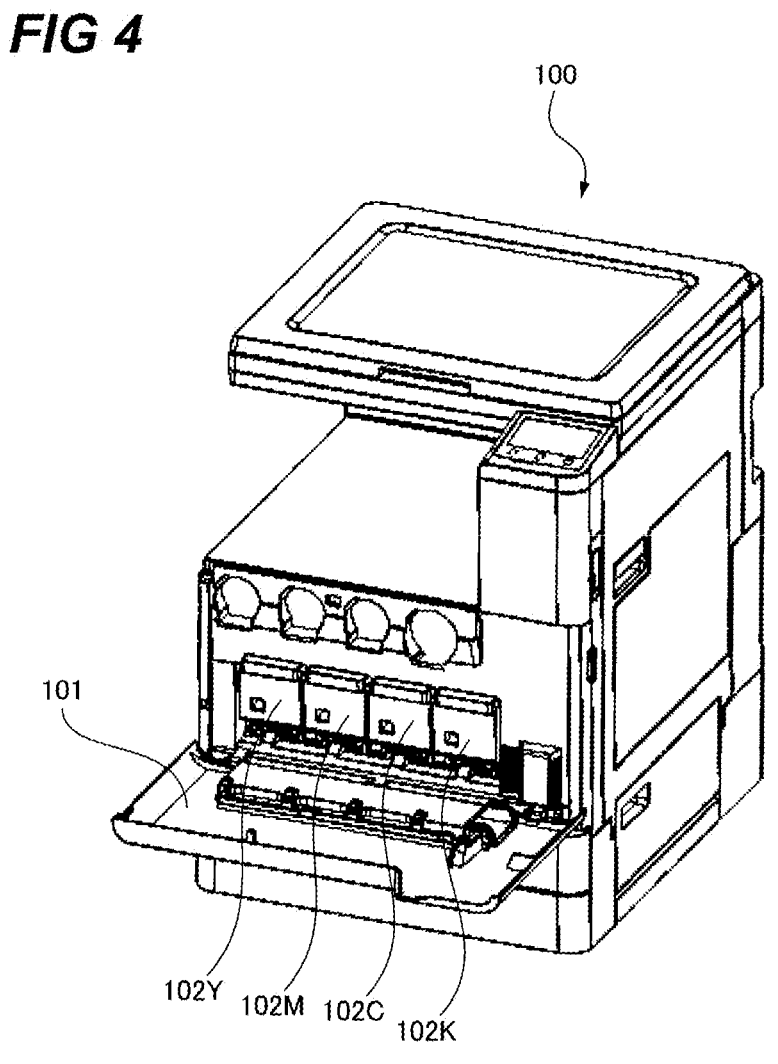
FIG. 4 is a perspective view of an image forming apparatus.
Figure 5:
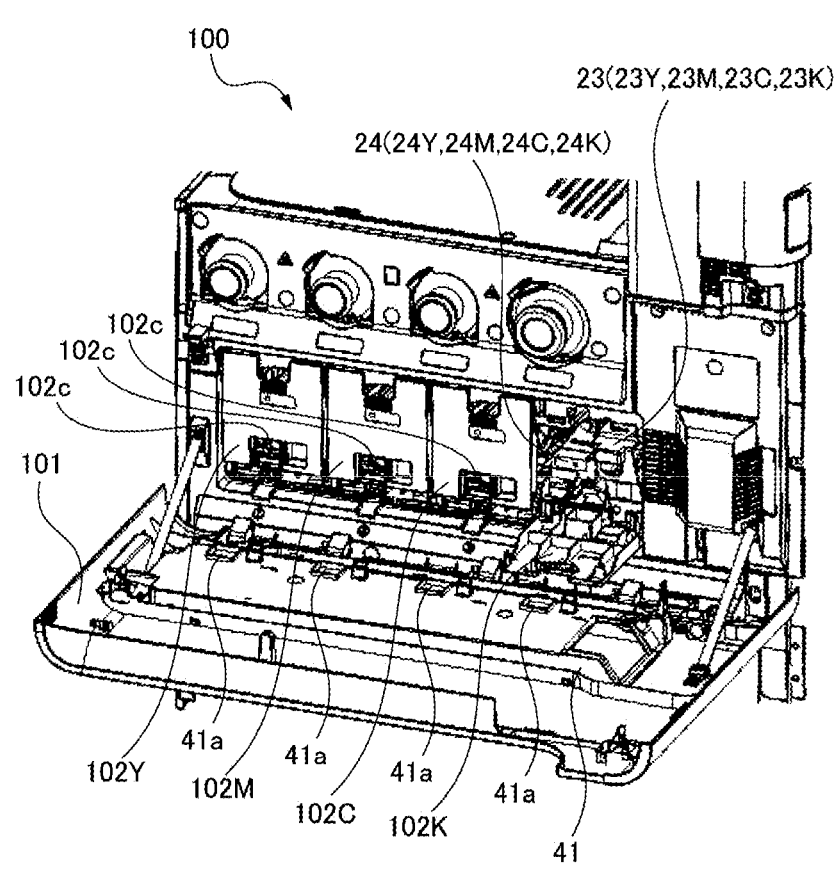
FIG. 5 is a partially enlarged perspective view of the image forming apparatus.
Figure 6:
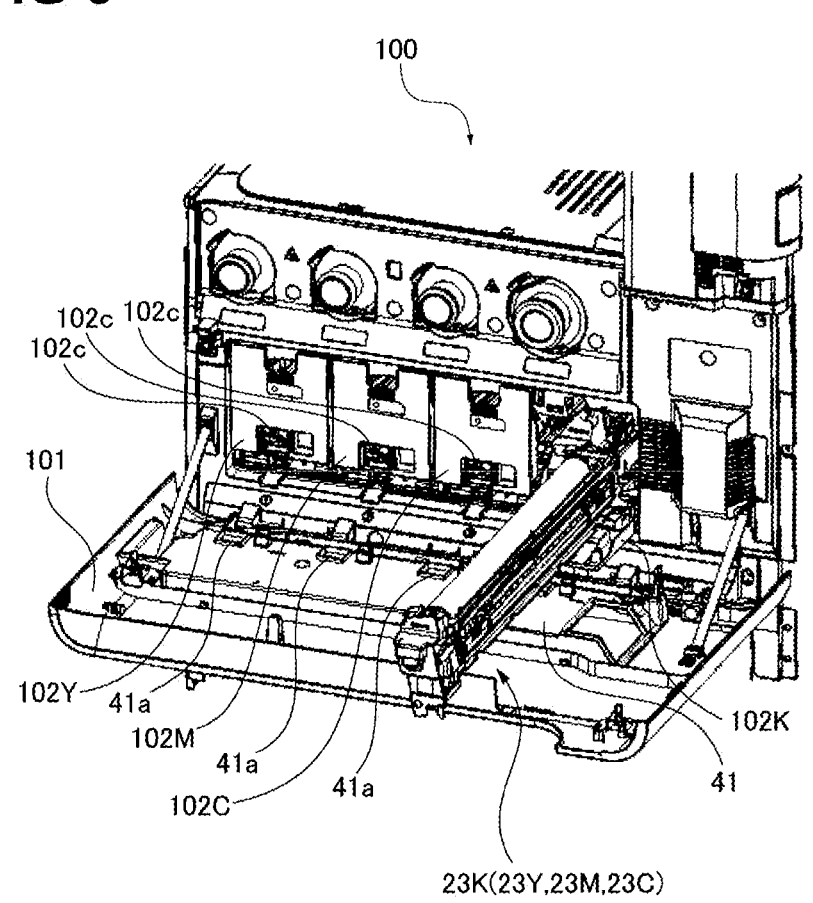
FIG. 6 is a partially enlarged perspective view of the image forming apparatus.
Figure 7:
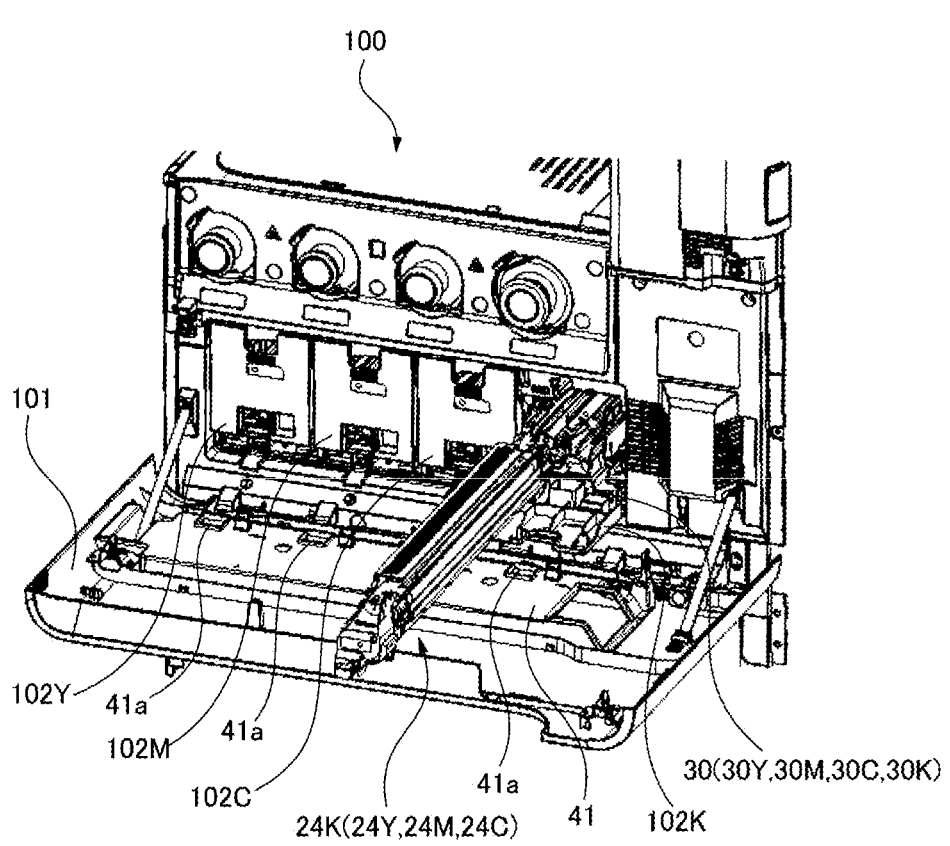
FIG. 7 is a partially enlarged perspective view of the image forming apparatus.

The photosensitive drum 2 and the charging roller 3 described above are integrally unitized (drum unit and drum cartridge) together with a cleaning device (not illustrated). An example of the configuration will be described with reference to FIGS. 4, 5, 6, and 7. FIGS. 4 and 5 are perspective views illustrating schematic structures around the drum unit 23 (Y, M, C, and K) and around the developing unit 24 (Y, M, C, and K) included in the image forming apparatus 100. FIG. 6 is a view illustrating how the drum unit 23 is inserted into and removed from the image forming apparatus 100 from the outside of the apparatus main body. FIG. 7 is a view illustrating how the developing unit 24 is inserted into and removed from the image forming apparatus 100 from the outside of the apparatus main body.

Drum units 23Y, 23M, 23C, and 23K (hereinafter, also collectively and simply referred to as a "drum unit 23") including the photosensitive drum 2 are attached to the image forming apparatus 100. The drum unit 23 is a cartridge to be replaced by an operator such as a user or a maintenance person. The drum unit 23 rotatably supports the photosensitive drum 2. Specifically, the photosensitive drum 2 is rotatably supported by the frame body of the drum unit 23. The drum unit 23 may not include the charging roller 3 or the cleaning device.

In addition, developing units 24Y, 24M, 24C, and 24K (hereinafter, also collectively and simply referred to as a "developing unit 24") separate from the drum unit 23, which is a photoconductor unit, are attached to the image forming apparatus 100. The developing unit 24 includes developing sleeves 5Y, 5M, 5C, and 5K (hereinafter, also collectively and simply referred to as a "developing sleeve 5") as developer carriers that carry the developer, and screws 7Y, 7M, 7C, and 7K (hereinafter, also collectively and simply referred to as a "screw 7") that supply the developer to the developing sleeve 5 and agitate the developer. The developing unit 24 is a cartridge in which the developing sleeve 5 and the screw 7 are integrated, and is detached from the apparatus main body of the image forming apparatus 100 and replaced by an operator as illustrated in FIGS. 5 and 7.

Here, the toner is circulated and conveyed at high speed by the screw 7 inside the developing unit 24. The rotation speed of the screw 7 is relatively very high with respect to the rotation speed of the developing sleeve 5 and the photosensitive drum 2, and coating on the developing sleeve 5 can be uniformly performed without unevenness.

Figure 8:
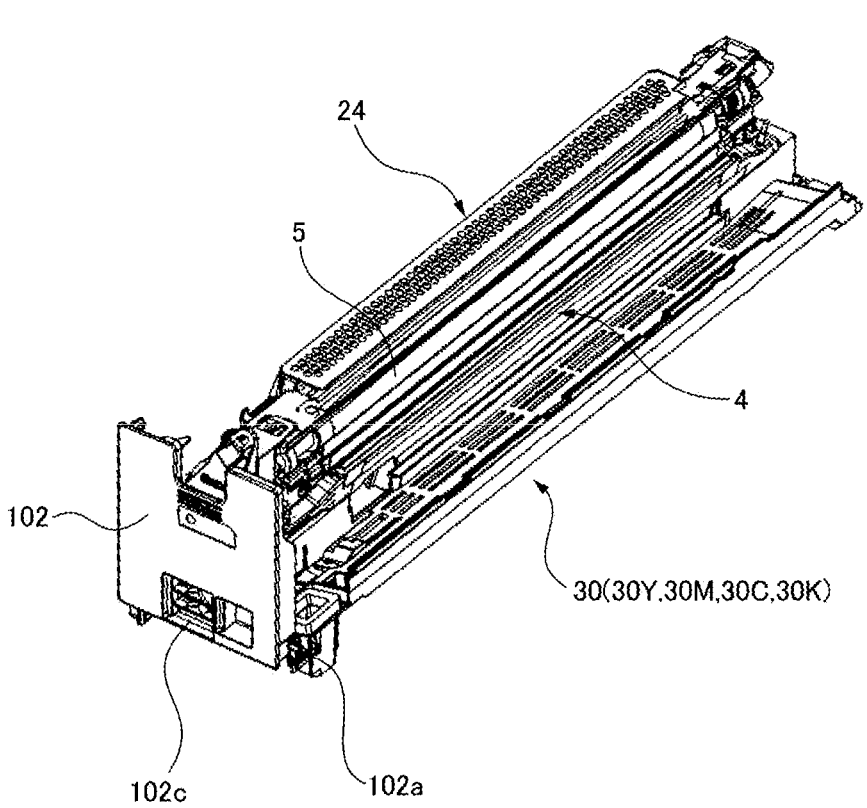
FIG. 8 is a perspective view of a cartridge tray.
Figure 9:
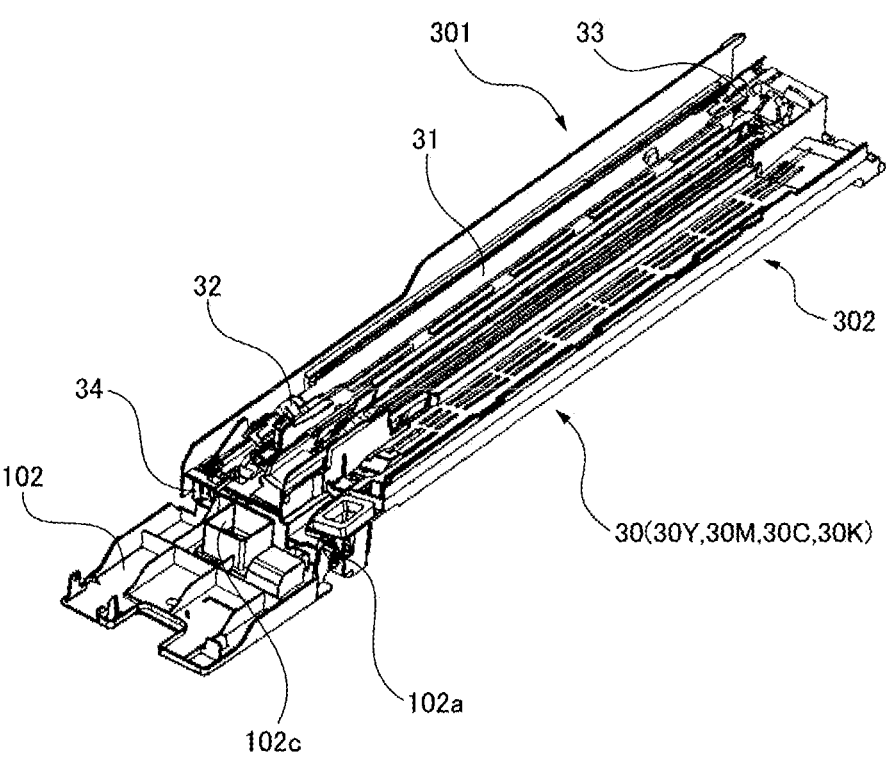
FIG. 9 is a perspective view of the cartridge tray.

In addition, the image forming apparatus 100 includes a cartridge tray 30 (30Y, 30M, 30C, and 30K) for each image forming portion (see FIGS. 8 and 9). The drum unit 23 and the developing unit 24 are supported by the cartridge tray 30 of each image forming portion, guided in the axial direction of the photosensitive drum, and inserted into and removed from the apparatus main body of the image forming apparatus 100.

Figure 22:
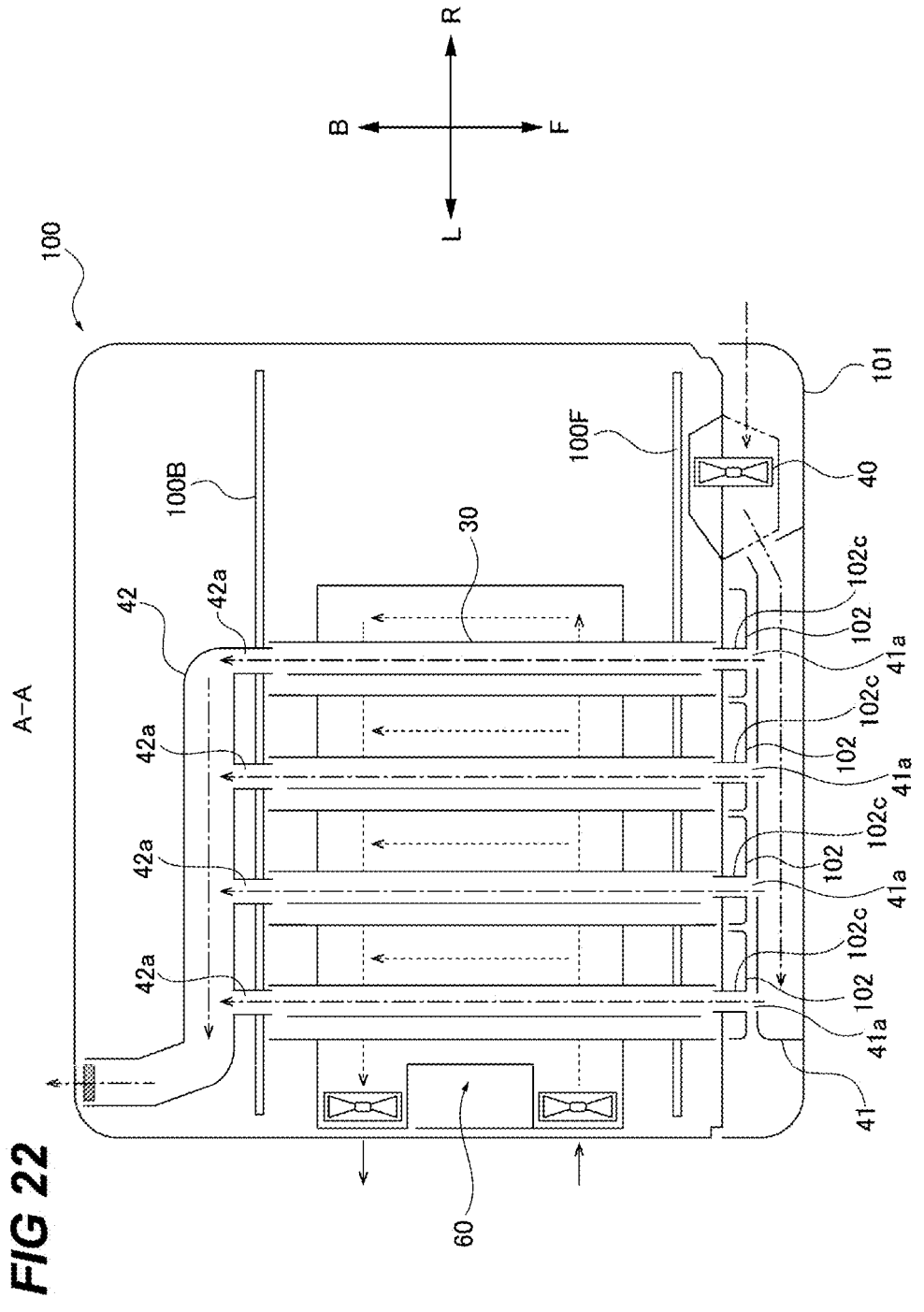
FIG. 22 is a cross-sectional view taken along line A-A in FIG. 2.

In addition, the image forming apparatus 100 includes a front plate 100F formed of a sheet metal and a back plate 100B similarly formed of a sheet metal (see FIG. 22). The front plate 100F is a side wall provided on the front side of the image forming apparatus 100. The front plate 100F forms a part of a housing of the apparatus main body on the front side of the apparatus main body of the image forming apparatus 100. The back plate 100B is a side wall provided on the back side of the image forming apparatus 100. The back plate 100B forms a part of the housing of the apparatus main body on the back side of the apparatus main body of the image forming apparatus 100. The front plate 100F and the back plate 100B are arranged to face each other on one side and the other side in the axial direction of the photosensitive drum, and a sheet metal (not illustrated) as a beam is bridged therebetween. Each of the front plate 100F, the back plate 100B, and the beam (not illustrated) constitutes a part of a frame body (housing) of the image forming apparatus. Here, regarding the image forming apparatus of the present embodiment or the constituent members thereof, the forward side or the front side is a side on which the drum unit 23 and the developing unit 24 are taken in and out (inserted and removed) with respect to the apparatus main body of the image forming apparatus 100.

One ends of the cartridge trays 30 are attached to the front plate 100F (see FIG. 22) and the other ends are attached to the back plate 100B (see FIG. 22) in the axial direction of the photosensitive drum. The cartridge tray 30 will be described later.

Since the drum unit 23 and the developing unit 24 deteriorate due to repetition of the image forming process, they take the form of a unit (cartridge) that can be maintained by replacement or attachment or detachment.

FIG. 3 illustrates the arrangement of the drum unit 23, the developing unit 24, and the exposure head 4 when replacement or attachment or detachment is performed. In the image forming apparatus illustrated in FIG. 3, unlike the image forming apparatus illustrated in FIG. 2, it can be seen that the developing unit 24 and the exposure head 4 are retracted and separated from the photosensitive drum 2.

This is because, when the state in which the developing unit 24 and the exposure head 4 are disposed close to the photosensitive drum 2 as illustrated in FIG. 2 is maintained, each unit may be damaged due to dynamic interference at the time of attachment and detachment of the unit, or the unit may not be taken out.

Therefore, at the time of attaching and detaching the unit, the developing unit 24 and the exposure head 4 are retracted from the photosensitive drum 2 and separated from each other as illustrated in FIG. 3 by a retraction mechanism by a development stay 31, a rotating arm 65, an elevating duct 69, and the like, which will be described later.

The drum unit 23 and the developing unit 24 are inserted and removed from the front side of the image forming apparatus 100, and are mounted at predetermined positions (mounting positions) of the apparatus main body of the image forming apparatus 100.

The image forming apparatus 100 includes inner doors 102Y, 102M, 102C, and 102K (hereinafter, also collectively and simply referred to as an "inner door 102") that cover front sides of both the drum unit 23 and the developing unit

24 mounted at the mounting positions. As illustrated in FIGS. 8 and 9, one end of the inner door 102 is fixed to the front side of the cartridge tray 30 by a hinge, and is rotatable with respect to the cartridge tray 30 by the hinge.

The inner door 102 is a member necessary for protecting each unit and making it difficult for the photosensitive drum 2 to be exposed to light in a process other than the image forming process, and is disposed at a position facing the front in the attachment and detachment direction of each color unit.

Furthermore, a front cover 101 forming an exterior of the apparatus is provided on the front side of the image forming apparatus 100. One end of the front cover 101 is fixed to the front side of the apparatus main body of the image forming apparatus 100 by a hinge, and is rotatable with respect to the apparatus main body of the image forming apparatus 100 by the hinge. The front cover 101 is provided on the front side of the inner door 102 in the axial direction of the photosensitive drum. In the closed state illustrated in FIG. 1, the front cover 101 covers the entire plurality of inner doors 102 arranged in the left-right direction to form an exterior on the front side of the apparatus.

Therefore, replacement work of the drum unit 23 and the developing unit 24 is performed by an operator in the following procedure. The operator opens the front cover 101 as illustrated in FIG. 4, then opens the inner door 102 as illustrated in FIG. 5, and takes out the drum unit 23 (FIG. 6) or the developing unit 24 (FIG. 7) in the apparatus main body. Then, the replacement work is completed by inserting a new drum unit 23 or developing unit 24, closing the inner door 102, and further closing the front cover 101.

The retraction mechanism of the developing unit 24 and the exposure head 4 retracts the developing unit 24 and the exposure head 4 from the photosensitive drum 2 in conjunction with the operation of opening the inner door 102. The retraction mechanism (the development stay 31, the rotating arm 65, and the elevating duct) will be described later.

Here, in the following description, the front plate side is defined as a front side (front side or forward side), and the back plate side is defined as a back side (back side or backward side) with respect to the apparatus main body. When the photosensitive drum 2K on which the electrostatic latent image related to the black toner image is formed is used as a reference, a side on which the photosensitive drum 2Y on which the electrostatic latent image related to the yellow toner image is formed is disposed is defined as a left side. When the photosensitive drum 2Y on which the electrostatic latent image related to the yellow toner image is formed is used as a reference, a side on which the photosensitive drum 2K on which the electrostatic latent image related to the black toner image is formed is disposed is defined as a right side. Furthermore, a direction perpendicular to the front-back direction and the left-right directions defined here and upward in the vertical directions is defined as an upward direction, and a direction perpendicular to the front-back directions and the left-right directions defined here and downward in the vertical directions is defined as a downward direction. The defined forward direction F, backward direction B, rightward direction R, leftward direction L, upward direction U, and downward direction D are illustrated in FIG. 1.

In addition, the axial directions of the photosensitive drum 2 described in the following description are directions that coincide with the front-back directions (near-far directions) illustrated in FIG. 1. The longitudinal directions of the exposure head 4 also coincide with the front-back directions illustrated in FIG. 1. That is, the axial directions of the photosensitive drum 2 and the longitudinal directions of the exposure head 4 coincide with each other. In addition, one end side in the axial directions of the photosensitive drum 2 means a front side defined herein, and the other end side means a back side defined herein. One end side and the other end side in the front-back directions also correspond to the front side and the back side defined here. One end side in the left-right directions means the left side defined here, and the other end side means the right side defined here.

(Exposure Head)

Figure 10:
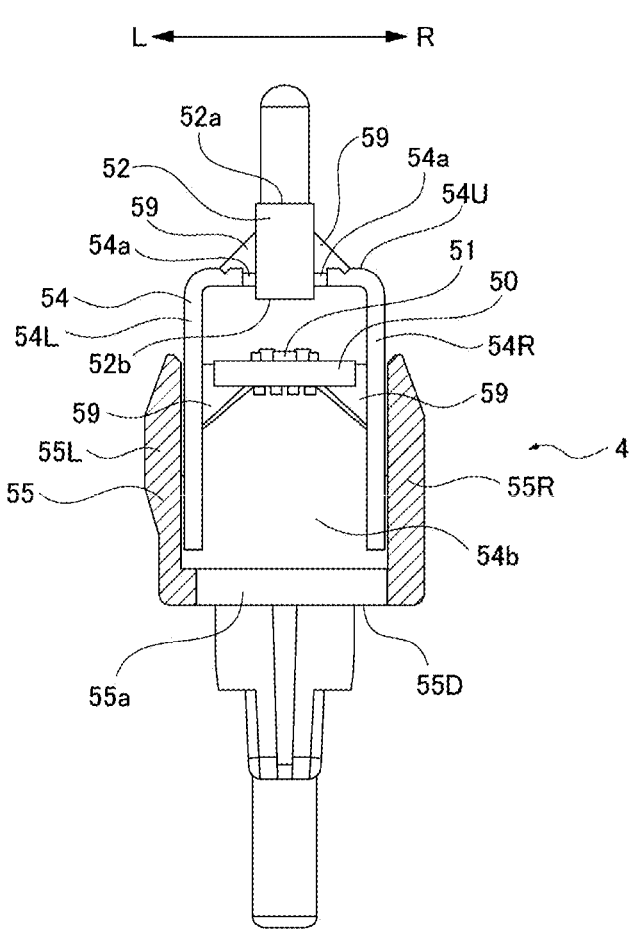
FIG. 10 is a cross-sectional view of an exposure head.
Figure 11:
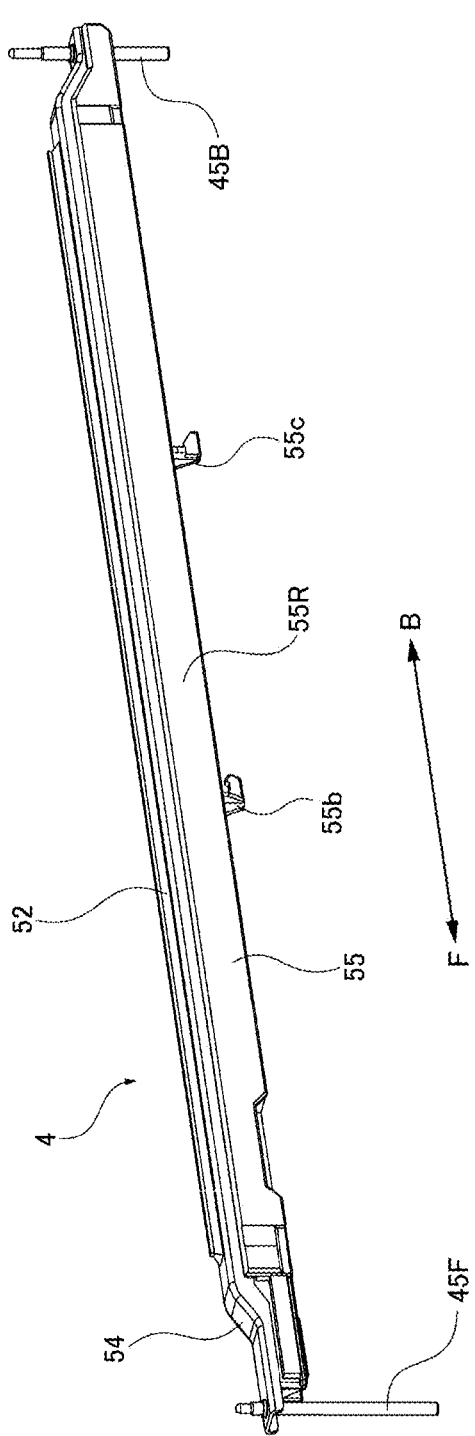
FIG. 11 is a perspective view of the exposure head.
Figure 12:
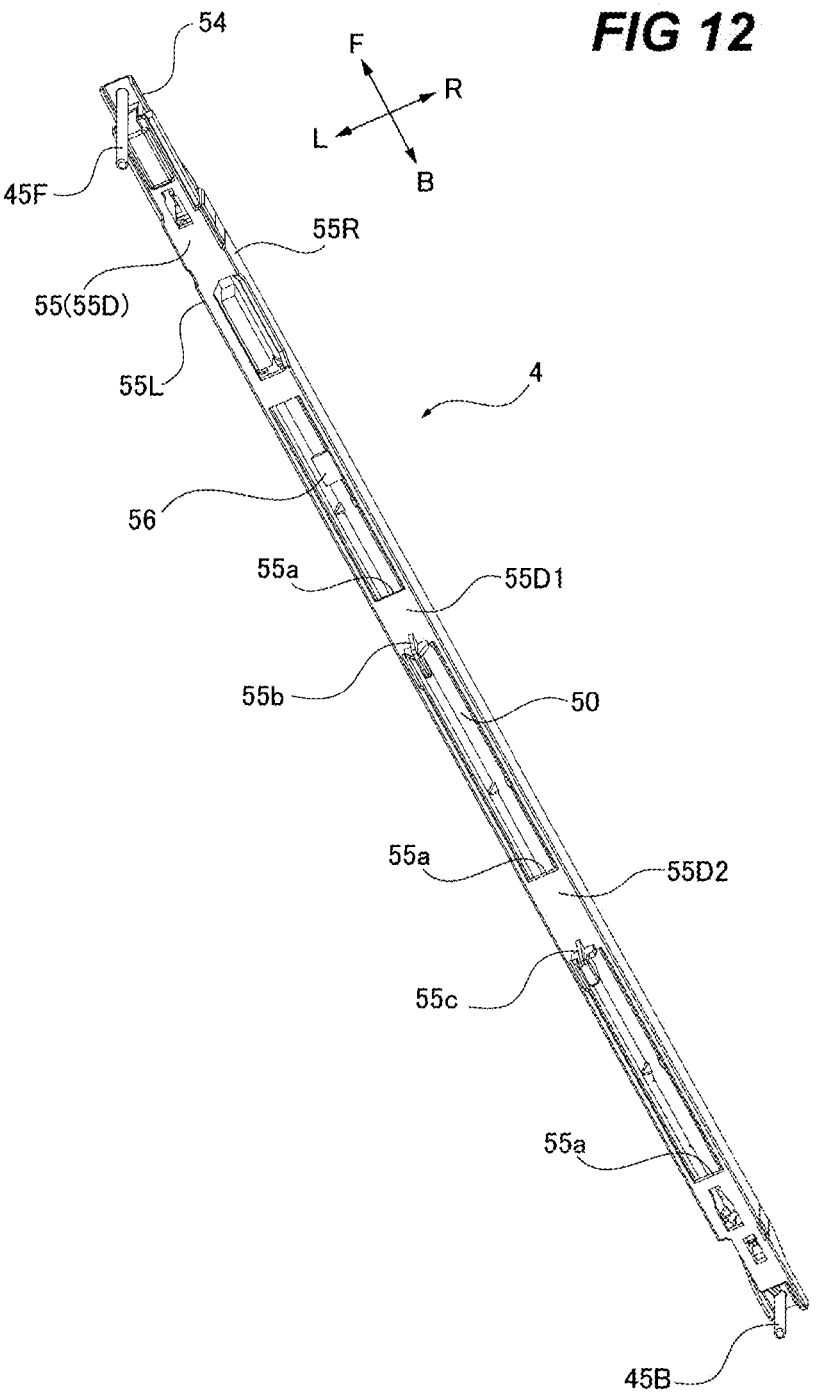
FIG. 12 is a perspective view of the exposure head.

Next, the exposure head 4 will be described with reference to FIGS. 10 to 18. FIG. 10 is a schematic cross-sectional view of the exposure head 4 included in the image forming apparatus of the present embodiment. FIG. 11 is a perspective view of the exposure head 4 as viewed from above. FIG. 12 is a perspective view of the exposure head 4 as viewed from below.

The exposure head 4 has an elongated shape (longitudinal shape) extending in the axial directions of the photosensitive drum 2. The exposure head 4 includes a substrate 50, a light emitting element mounted on the substrate 50, a lens array 52, and a holding member that holds the substrate 50 and the lens array 52. The holding member includes a housing 54 to be described later and a housing support member 55 that supports the housing 54. Here, the exposure head 4 includes an LED (Light Emitting Diode) 51 as a light emitting element that emits light.

(Substrate and Lens Array)

Figures 13A, 13B, 13C, 13D, 13E:
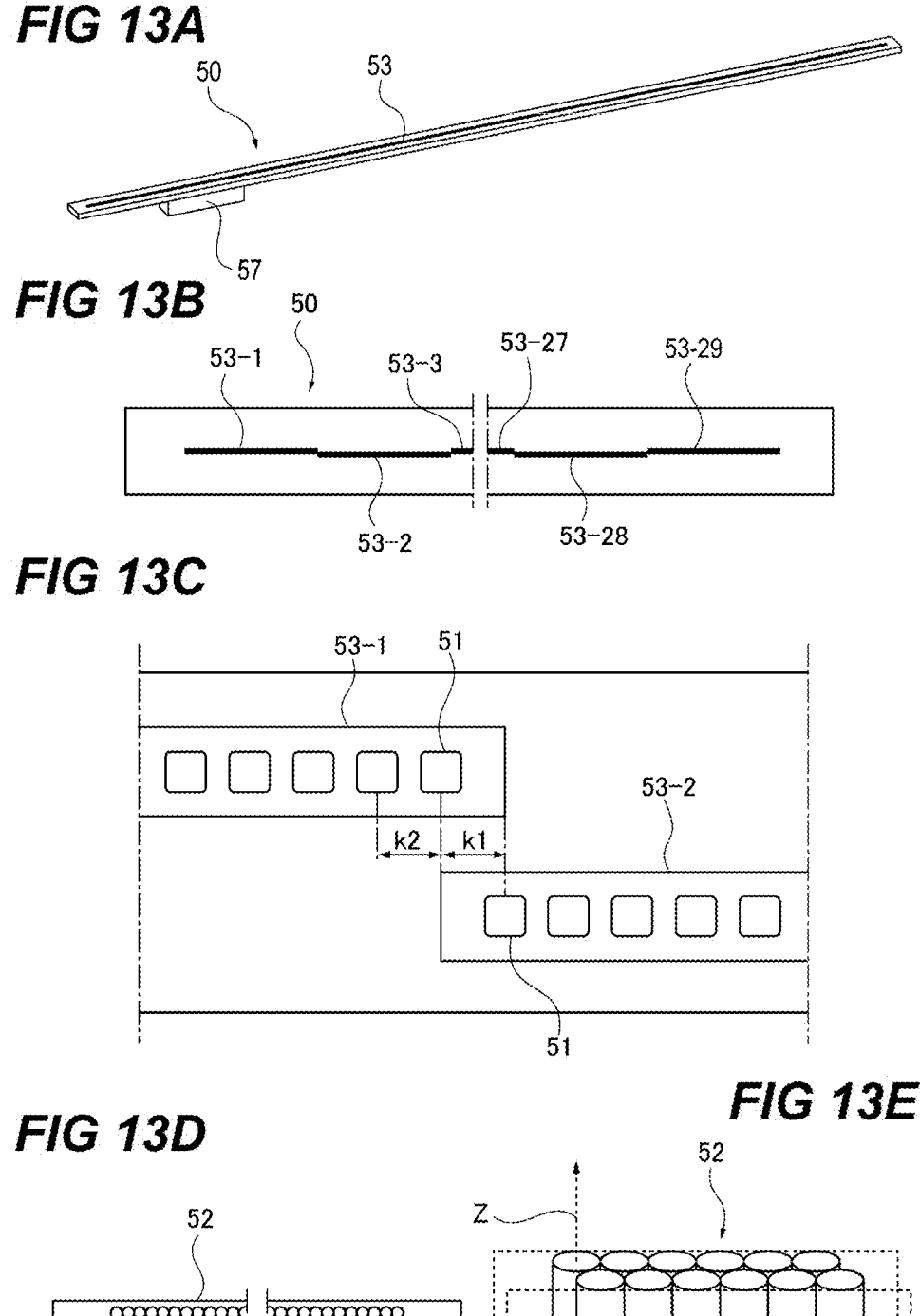
FIGS. 13A, 13B, and 13C are views showing a substrate in an exposure head.
FIGS. 13D and 13E are views showing a lens array.

Here, the substrate 50 and the lens array 52 of the exposure head 4 will be described with reference to FIGS. 13A to 13E. First, the substrate 50 will be described. FIG. 13A is a schematic perspective view of the substrate 50. FIG. 13B illustrates an alignment of the plurality of LEDs 51 provided on the substrate 50, and FIG. 13C illustrates an enlarged view of FIG. 13B.

An LED chip 53 is mounted on the substrate 50. As illustrated in FIGS. 13A, the LED chip 53 is provided on one surface of the substrate 50, and a long FFC connector 57 is provided on the other surface. Here, one surface of the substrate 50 is a surface (upper surface, front surface) on a side where the LED chip 53 is provided. The other surface of the substrate is a surface (lower surface, back surface) opposite to the side where the LED chip 53 is provided.

The FFC connector 57 is attached to the other surface (lower surface, back surface) of the substrate 50 such that the longitudinal direction thereof is along the longitudinal direction of the substrate 50. The long FFC connector 57 is provided on the front side of the image forming apparatus 100 (one side in the longitudinal direction of the circuit board 502). Wiring for supplying a signal to each LED chip 53 is provided on the substrate 50. One end of a flexible flat cable 58 (See FIG. 18, hereinafter FFC) as an example of a cable is connected to the FFC connector 57.

Note that a control circuit portion of the image forming apparatus 100 is provided with a circuit board 502 (See FIG. 28) including a control portion (not shown) and connectors 501. In this embodiment, the circuit board 502 is disposed at the left side of the image forming apparatus 100 and the exposure heads 4 are disposed at the right side of the circuit board 502. Each of the other end portions of the FFCs 58 (58Y, 58M, 58C, and 58K) connected to each of the exposure heads 4 are connected to each of the connectors 501 (501Y, 501M, 501C, and 501K) of the circuit board 502 (See FIG. 28). That is, the FFC 58 electrically connects the control circuit board 502 with the substrate 50 of the exposure head 4. A control signal (drive signal) is input to the substrate 50 of the exposure head 4 from the control circuit portion of the apparatus main body of the image forming apparatus 100 via the FFC 58 and the FFC connector 57. The control signal is transferred to each LED chip 53. The LED chip 53 is driven (light emission and turn-off operation) by the control signal input to the substrate 50.

The portions between one ends and the other ends of the FFCs 58 are held inside the image forming apparatus 100 by the FFC guide 503, which will be described later.

The LED chip 53 mounted on the substrate 50 will be described in more detail. As illustrated in FIGS. 13B and 13C, LED chips 53-1 to 53-29 (29 pieces) in which the plurality of LEDs 51 (an example of the light emitting element) are arranged are aligned on one surface of the substrate 50. In each of the LED chips 53-1 to 53-29, 516 LEDs 51 are aligned in the longitudinal direction. In the longitudinal direction of the LED chip 53, the center-to-center distance k2 between the adjacent LEDs 51 corresponds to the recording resolution of the image forming apparatus 100. Since the recording resolution of the image forming apparatus 100 of the present embodiment is 1200 dpi, the LEDs 51 are aligned such that the center-to-center distance k2 of the adjacent LEDs 51 is 21.16 μm in the longitudinal direction of the LED chips 53-1 to 53-29. Therefore, the exposure range of the exposure head 4 of the present embodiment is about 314 mm. The length of the photosensitive layer in the axial directions of the photosensitive drum 2 is 314 mm or more. Since the length of the long side of the A4-size recording sheet and the length of the short side of the A3-size recording sheet are 297 mm, the exposure head 4 of the present embodiment has an exposure range in which an image can be formed on the A4-size recording sheet and the A3-size recording sheet.

The LED chips 53-1 to 53-29 are aligned in a staggered manner in the axial directions of the photosensitive drum 2. Specifically, the LED chips 53-1 to 53-29 are alternately arranged in two rows along the axial directions of the photosensitive drum 2. That is, as illustrated in FIG. 13B, the odd-numbered LED chips 53-1, 53-3, . . . 53-29 counted from the left side are mounted in a row in the longitudinal direction of the substrate 50. Further, the even-numbered LED chips 53-2, 53-4, . . . 53-28 counted from the left side are mounted in a row in the longitudinal direction of the substrate 50. The LED chip 53 is arranged in this manner. As a result, as illustrated in FIG. 13C, in the longitudinal direction of the LED chip 53, the center-to-center distance k1 of the LEDs 51 arranged at one end of one LED chip 53 and the other end of the other LED chip 53 in the different adjacent LED chips 53 can be made equal to the center-to-center distance k2 of the adjacent LEDs 51 on one LED chip 53.

In the present embodiment, the light emitting element is a semiconductor LED which is a light emitting diode, but may be, for example, an organic light emitting diode (OLED). This OLED is also called organic electro-luminescence (organic EL), and is a current-driven light emitting element. The OLEDs are arranged on a line along the main scanning directions (axial directions of the photosensitive drum 2) on a thin film transistor (TFT) substrate, for example, and are electrically connected in parallel by power supply wiring similarly provided along the main scanning directions.

Next, the lens array 52 which is a lens assembly will be described. FIG. 13D is a schematic view of the lens array 52 as viewed from the photosensitive drum 2 side. FIG. 13E is a schematic perspective view of the lens array 52. As illustrated in FIG. 13D, the lens array 52 condenses the light emitted from the light emitting element on the photosensitive drum 2. The lens array 52 is a lens assembly including a plurality of lenses. The plurality of lenses are arranged in two rows along the alignment directions of the plurality of LEDs 51. Each lens is alternately arranged such that one of the lenses in the other row is arranged so as to be in contact with both of the adjacent lenses in the alignment direction of the lenses in one row. Each lens is a cylindrical rod lens made of glass, and has an incident surface 52*b* on which the light emitted from the LED 51 is incident and an exit surface 52*a* from which the light incident from the light incident surface is emitted (see FIG. 10). The material of the lens is not limited to glass, and may be plastic. The shape of the lens is not limited to the cylindrical shape, and may be, for example, a polygonal prism such as a hexagonal prism.

A dotted line Z illustrated in FIG. 13E indicates the optical axis of the lens. The exposure head 4 is moved in a direction substantially along the optical axis of the lens (hereinafter, also referred to as an optical axis direction) indicated by the dotted line Z by a retraction mechanism (the rotating arm 65 and the elevating duct 69 shown in FIG. 17) to be described later. The optical axis of the lens here means a line connecting the center of the light exit surface of the lens and the focal point of the lens. The lens array 52 is a lens assembly having a plurality of lenses, and the "optical axis" described above is an optical axis of any lens among the plurality of lenses. Here, strictly speaking, the plurality of lenses included in the lens array 52 may be slightly inclined to each other. This is due to tolerance during assembly. However, the deviation of the tolerance is not considered when the direction of the optical axis is defined. Therefore, it is considered that the optical axes of the plurality of lenses are in the same direction. The lens array 52 has a function of condensing the light emitted from the LED 51 on the surface of the photosensitive drum 2.

Amounting position of the lens array 52 with respect to the housing 54 is adjusted at the time of assembling the exposure head 4 such that a distance between the light emitting surface of the LED 51 and the light incident surface of the lens is substantially equal to a distance between the light exit surface of the lens and the surface of the photosensitive drum 2.

(Housing)

As illustrated in FIG. 10, the housing 54 holds the lens array 52 and the substrate 50. In the present embodiment, the housing 54 is a metal member formed by bending a plate material obtained by plating a galvanized steel plate or a cold-rolled steel plate.

The housing 54 is made of metal as described above. For example, the housing 54 is formed by pressing a sheet metal such as an iron thin plate into a squared U shape. Hereinafter, the shape of the housing 54 will be described.

As illustrated in FIG. 10, the housing 54 has a flat portion (opposing surface) 54U in which a first opening 54*a* into which the lens array 52 is inserted is formed. The flat portion 54U faces the photosensitive drum 2 in the optical axis direction of the lens of the lens array 52. Note that the flat portion 54U is not limited to a flat surface, and may be a slightly curved surface. The housing 54 has an extending portion 54R extending in a direction away from the photosensitive drum 2 from one side in the lateral direction of the flat portion 54U. The housing 54 has an extending portion 54L extending in a direction away from the photosensitive drum 2 from the other side in the lateral direction of the flat portion 54U.

The extending portion 54R and the extending portion 54L form a substrate support portion for supporting the substrate 50 inserted from a second opening 54*b* in the housing 54.

The flat portion 54U and the substrate support portion (the extending portions 54R and 54L) are integrated to form the housing 54 that holds the lens array 52 and the substrate 50, and a cross section thereof is formed in a substantially squared U-shape. Since the housing 54 is formed in a substantially squared U-shape, the second opening 54*b* is formed on the side opposite to the flat portion 54U. The second opening 54*b* is formed between the substrate support portions (the extending portions 54L and 54R) extending from the flat portion 54U to the side away from the photosensitive drum.

The substrate 50 is inserted from the second opening 54*b*, that is, from the lower side of the squared U-shaped housing 54, and is adhered to the inside of each substrate support portion (the inside of the extending portion 54L and the inside of the extending portion 54R) with an adhesive. Since the position of the substrate 50 in the focusing direction is determined by a jig (not illustrated), the exposure head 4 does not include a positioning unit in the focusing direction of the substrate 50.

In addition, the lens array 52 is also adhered to the flat portion 54U with an adhesive in a state of being inserted into the first opening 54*a* formed in the flat portion 54U. Note that the lens array 52 is fixed to the flat portion 54U (housing 54) after the position and inclination in the focusing direction are adjusted by a jig such that the distance in the focusing direction between all the LED chips 53 and the lens array 52 mounted on the substrate 50 becomes a predetermined value. The lens array 52 is fixed to the flat portion 54U at a plurality of positions in the longitudinal direction by an adhesive. That is, the exposure head 4 of the present embodiment has a plurality of adhering locations for adhering and fixing the lens array 52 inserted into the first opening 54*a* to the flat portion 54U in the longitudinal direction of the flat portion 54U.

After the substrate 50 and the lens array 52 are positionally adjusted and fixed to the housing 54, a gap between the substrate 50 inserted into the second opening 54*b* and the housing 54 (the extending portions 54L and 54R) is sealed by a sealant 59 in the longitudinal direction. This prevents the LED 51 from being contaminated by toner and dust from the outside. Here, the sealant 59 merely seals the gap (boundary portion) between the substrate 50 and the housing 54, and most part of the FFC connector 57 and the substrate 50 is exposed.

Similarly, the sealant 59 is applied to a gap between the lens array 52 inserted into the first opening 54*a* and the housing 54 (flat portion 54U), and the gap is sealed by the sealant 59 in the longitudinal direction. More specifically, as illustrated in FIG. 10, the sealant 59 seals a gap between the side wall of the lens array 52 and the edge of the first opening 54*a* along the longitudinal direction of the housing 54. As a result, it is possible to reduce the possibility that dust such as toner flows in from the gap between the side wall of the lens array 52 and the first opening 54*a* and the light emitted from the LED 51 is blocked by the dust. Note that, as a matter of course, the gap sealed by the sealant 59 seals not only the gap between the side wall on one side of the lens array 52 and the edge of the first opening 54*a*, but also the gap between the side wall on the other side of the lens array 52 and the edge of the first opening 54*a*. The side wall on the other side of the lens array 52 refers to a side wall opposite to the side wall on one side of the lens array 52. Also here, a gap (boundary portion) between the housing 54 and the lens array 52 is sealed with the sealant 59. This prevents the LED 51 from being contaminated by toner and dust from the outside.

As described above, the substrate 50 and the lens array 52 are held by the housing 54, so that the LED 51 and the incident surface 52*b* of the lens face each other. As a result, the light emitted from the LED 51 is incident on the incident surface 52*b* of the lens, and is emitted from the exit surface 52*a* of the lens toward the photosensitive drum 2. Here, in the present embodiment, the light emitted from the three LEDs 51 (the plurality of LEDs 51) can pass through the same one lens. In addition, even light emitted from one LED 51 can pass through a plurality of lenses because the light travels radially. That is, the light emitted from the plurality of LEDs 51 passes through the lens array 52 (some of the plurality of lenses included in the lens array 52) to expose the photosensitive drum 2.

(Housing Support Member)

As illustrated in FIGS. 11 and 12, the housing support member 55 supports the housing 54 holding the substrate 50 and the lens array 52 in the longitudinal direction, and is provided integrally with the housing 54. The housing support member 55 is a member having a longitudinal shape extending in the axial direction of the photosensitive drum 2. The housing support member 55 is formed in a squared U-shape as illustrated in FIG. 10. The housing support member 55 includes a left side wall 55L which is a first side wall, a right side wall 55R which is a second side wall facing the left side wall 55L, and a bottom surface portion 55D facing the flat portion 54U of the housing 54 between the left side wall 55L and the right side wall 55R. The bottom surface portion 55D of the housing support member 55 is provided with a plurality of openings 55*a* in the longitudinal directions which is the axial directions of the photosensitive drum 2.

The opening 55*a* of the housing support member 55 is provided at a position facing a surface (back surface of the substrate 50) of the substrate 50 opposite to the mounting surface (front surface of the substrate 50) on which the LED 51 is mounted. The opening 55*a* is provided between the left side wall 55L and the right side wall 55R in the lateral direction orthogonal to the longitudinal direction.

Figure 16:
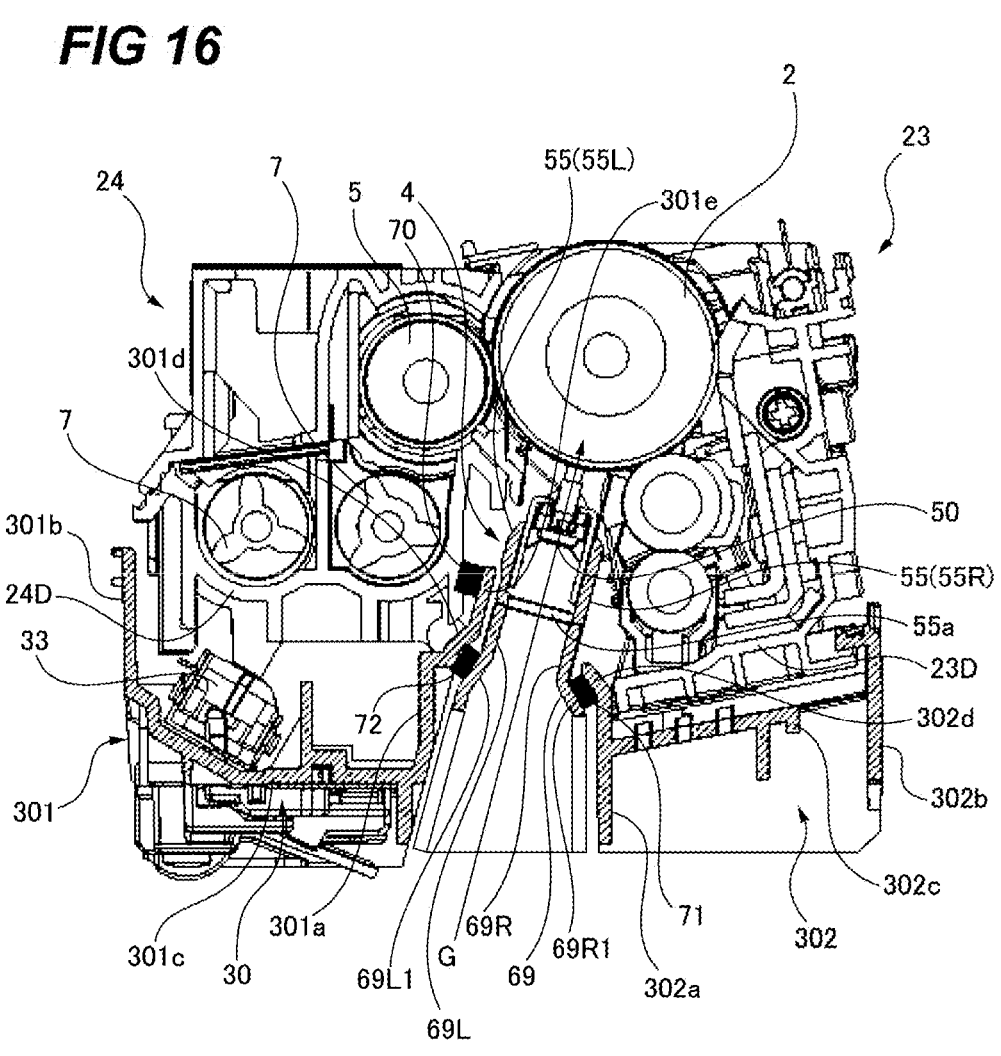
FIG. 16 is a cross-sectional view taken along line X-X in FIG. 14.

As illustrated in FIG. 16, the left side wall 55L which is the first side wall is provided between the housing 54 that holds the substrate 50 and the developing unit 24 which is a developing unit on one side in the lateral direction orthogonal to the axial direction of the photosensitive drum 2. As illustrated in FIG. 16, the left side wall 55L is provided across the axial directions of the photosensitive drum 2 so as to separate the housing 54 and the developing unit 24.

As illustrated in FIG. 16, the right side wall 55R which is the second side wall is provided between the housing 54 and the drum unit 23 which is an adjacent portion adjacent to the housing 54 on the other side in the lateral directions. Similarly to the left side wall, the right side wall 55R is provided across the axial directions of the photosensitive drum 2 so as to separate the housing 54 from the drum unit 23.

By providing the housing support member 55 integrally with the housing 54, the airflow sent from a duct unit 60 is blown to the back surface of the substrate 50 through the opening 55*a* between the left side wall 55L and the right side wall 55R of the housing support member 55. Moreover, the airflow blown onto the back surface of the substrate 50 is blown in a direction orthogonal to the back surface of the substrate 50.

As described above, the airflow blown from the opening 55*a* of the housing support member 55 to the back surface of the substrate 50 is separated from the developing unit 24 adjacent to the exposure head 4 by the left side wall 55L and separated from the drum unit 23 by the right side wall 55R. Therefore, the airflow for cooling the exposure head 4 introduced into the back surface of the substrate 50 does not leak to the side of the developing unit 24 adjacent to the exposure head 4, and the toner of the developing unit 24 can be prevented from scattering inside the image forming apparatus.

As described above, the housing support member 55 is provided across the longitudinal directions, which is the axial directions of the photosensitive drum 2 and has the opening 55*a* at the position opposite the back surface of the substrate 50. With this configuration, the housing support member 55 of the exposure head 4 forms a part of the duct (closed space) for blowing the airflow by the duct unit 60 at the back surface of the substrate 50 via the opening 55*a* and makes it flow in the longitudinal direction of the substrate 50 to cool the exposure head 4.

As described above, the exposure head 4 is configured as an integral head unit by the substrate 50 with LEDs, the lens array 52 with a plurality of lenses, the housing 54 and the housing support member 55.

(Engagement Claw)

As illustrated in FIGS. 11 and 12, the exposure head 4 includes an engagement claw 55*b* and an engagement claw 55*c* which are first engagement portions. The engagement claw 55*b* and the engagement claw 55*c* are provided on the housing support member 55 of the exposure head 4, and engage with the elevating duct 69 by snap-fitting (See FIG. 18).

In the housing support member 55 of the exposure head 4, a bottom surface portion 55D between the opening 55*a* at one end (front side) in the longitudinal directions and the opening 55*a* adjacent thereto is defined as a first bottom surface portion 55D1. Similarly, the bottom surface portion 55D between the opening 55*a* at the other end (back side) in the longitudinal directions and the opening 55*a* adjacent thereto is defined as a second bottom surface portion 55D2. The engagement claw 55*b* that engages with the elevating duct 69 is provided on the lower surface of the first bottom surface portion 55D1. The engagement claw 55*c* that engages with the elevating duct 69 is provided on the lower surface of the second bottom surface portion 55D2. The first bottom surface portion 55D1 and the second bottom surface portion 55D2, that is, the bottom surface portion 55D, are facing portions facing an upper surface portion 69U of the elevating duct 69 (See FIG. 18).

The engagement claws 55*b* and 55*c* as the first engagement portion are formed on the bottom surface portion 55D so as to protrude toward the elevating duct 69 in the moving direction of the elevating duct 69 described later, and are further formed to extend in the axial directions of the photosensitive drum 2 orthogonal to the protruding direction.

Specifically, the engagement claws 55*b* and 55*c* of the exposure head 4 are formed so as to protrude toward the elevating duct 69, and have a substantially L shape formed so as to extend in the axial directions of the photosensitive drum 2 orthogonal to the protruding direction. As will be described later, by sliding the exposure head 4, the substantially L-shaped claw ends of the engagement claws 55*b* and 55*c* are engaged with the edges of the engagement holes 69*b* and 69*c* by snap-fitting and integrated with the elevating duct 69 (See FIG. 18).

(Elevating Duct)

Figure 17:
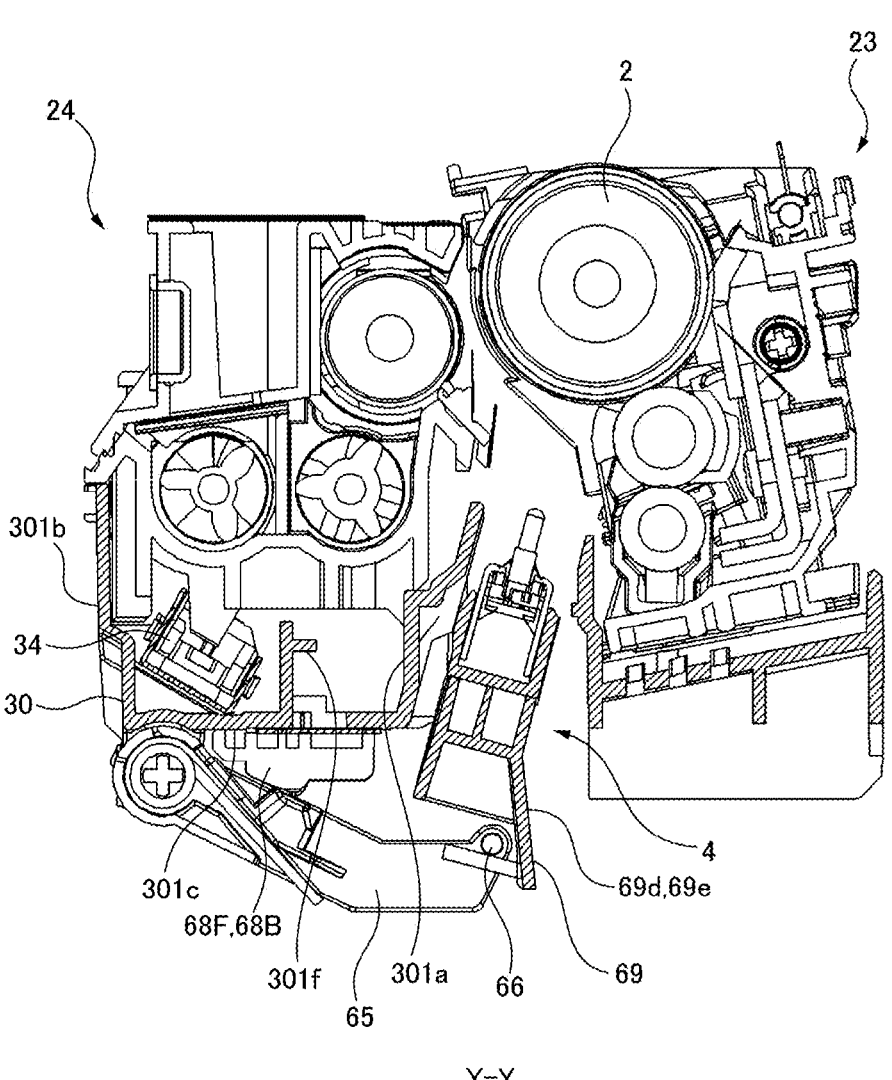
FIG. 17 is a cross-sectional view taken along line Y-Y in FIG. 14.

The image forming apparatus 100 includes the elevating duct 69. The elevating duct 69 will be described with reference to FIGS. 16 and 17. FIG. 16 is a cross-sectional view taken along line X-X in FIG. 14. FIG. 17 is a cross-sectional view taken along line Y-Y in FIG. 14.

The elevating duct 69 is an exposure support member that detachably supports the exposure head 4, and is provided in the apparatus main body of the image forming apparatus 100 together with a cartridge tray 30 to be described later.

The elevating duct 69 is provided between a developing support member 301 that supports the developing unit 24 of the cartridge tray 30 to be described later and a drum support member 302 that supports the drum unit 23. The elevating duct 69 is provided to be movable between an exposure position (see FIG. 16) at which the photosensitive drum 2 is exposed and a retracted position (see FIG. 17) retracted from the exposure position between the developing support member 301 and the drum support member 302 of the cartridge tray 30. Both end portions of the elevating duct 69 in the longitudinal directions are supported from below by the rotating arm 65 to be described later. The elevating duct 69 is moved in a direction (direction G indicated by an arrow in FIG. 16) crossing the axial direction of the photosensitive drum 2 integrally with the exposure head 4 by the rotating arm 65. The elevating duct 69 is moved to the exposure position or the retracted position by the rotation of the rotating arm 65 (See FIGS. 16 and 17).

The elevating duct 69 has a longitudinal shape extending in the front-back directions (the axial direction of the photosensitive drum) similarly to the exposure head 4 so as to be able to support the entire exposure head 4, and a central portion thereof has a shape having openings in the vertical directions. The elevating duct 69 forms a duct in which one opening 69*a* (See FIG. 18) communicates with the opening 55*a* of the exposure head 4 and the other opening portion 64 communicates with the opening portion 61 of the duct unit 60. The elevating duct 69 forms a part of a duct that cools the exposure head 4 while supporting the exposure head 4.

The elevating duct 69 has an upper surface portion 69U (see FIG. 18) facing the bottom surface portion 55D of the housing support member 55. The upper surface portion 69U of the elevating duct 69 is provided with a plurality of openings 69*a* in the longitudinal direction which is the axial direction of the photosensitive drum 2. The elevating duct 69 includes a duct left wall 69L, a duct right wall 69R facing the duct left wall 69L, a duct front wall 69F, and a duct back wall 69B facing the duct front wall 69F (See FIG. 15). The duct left wall 69L, the duct right wall 69R, the duct front wall 69F, and the duct back wall 69B are provided integrally with the upper surface portion 69U so as to surround the periphery of the upper surface portion 69U, that is, so as to surround the opening 69*a* provided in the upper surface portion 69U. As a result, the elevating duct 69 has a shape in which the upper surface portion 69U, the duct left wall 69L, the duct right wall 69R, the duct front wall 69F, and the duct back wall 69B are integrally formed and openings are provided in the upper and lower positions. The elevating duct 69 forms a duct (closed space) that allows an airflow from the duct unit 60 described later to flow to the exposure head 4 through between the duct walls and the opening 69*a* of the upper surface portion 69U (See FIG. 18).

The plurality of openings 69*a* is provided at positions facing the plurality of openings 55*a* provided in the bottom surface portion 55D of the housing support member 55, respectively. In other words, similarly to the opening 55*a* of the housing support member 55, the opening 69*a* of the elevating duct 69 is provided at a position facing the back surface of the substrate 50. In other words, the elevating duct 69 has the opening 69*a* communicating with the opening 55*a* of the exposure head 4 (See FIG. 18).

The elevating duct 69 is formed in a hollow shape having no opening at a position facing the developing unit 24 and the drum unit 23 and having openings in upper and lower positions by these duct walls (duct left wall 69L, duct right wall 69R, duct front wall 69F, and duct back wall 69B).

Accordingly, the elevating duct 69 allows an air flow generated by the duct unit 60 described later to flow to the back surface of the substrate 50 of the exposure head 4 through the opening portion 64 described later and the opening 69*a* between the duct left wall 69L and the duct right wall 69R. Therefore, the elevating duct 69 can allow the airflow from the duct unit 60 to flow to the back surface of the substrate 50 of the exposure head 4 without leaking the airflow to the side of the adjacent developing unit 24 or drum unit 23, and the scattering of the toner inside the apparatus can be reduced.

Figure 14:
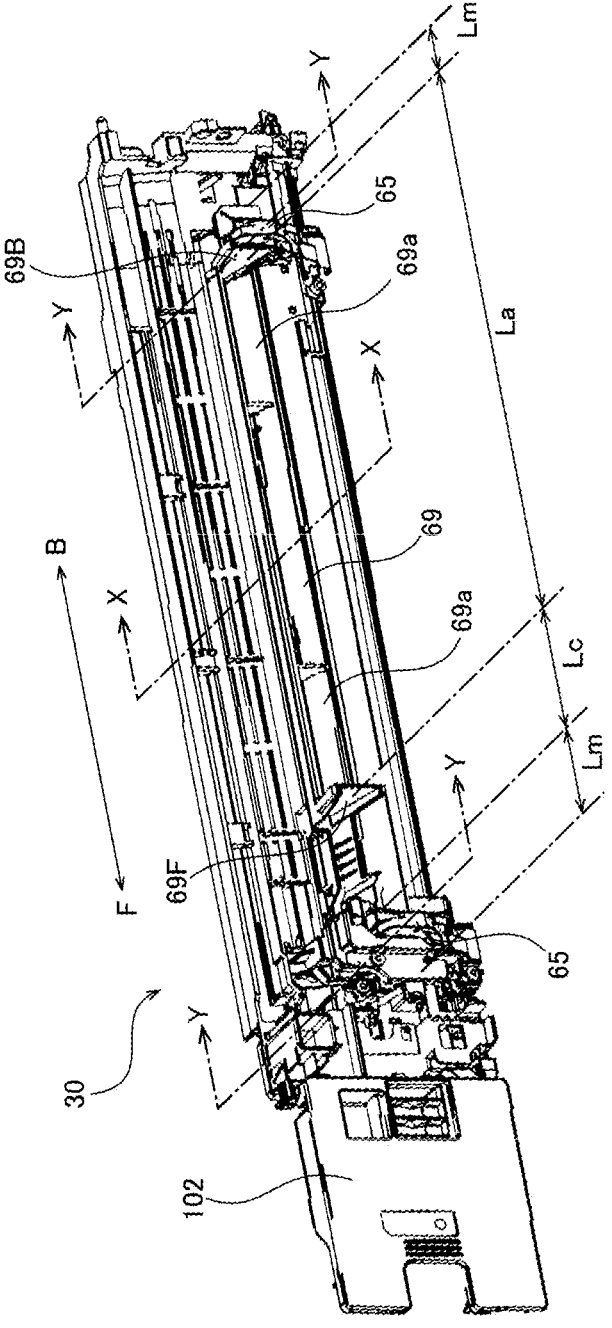
FIG. 14 is a perspective view of the cartridge tray.

Further, the elevating duct 69 includes a first engagement portion 69*d* and a second engagement portion 69*e* which are engaged with the rotating arm 65 at both end portions in the longitudinal direction as shown in FIG. 14. The first engagement portion 69*d* is provided outside the duct front wall 69F on one end side in the longitudinal direction. Further, the first engagement portion 69*d* is provided outside a region provided with the FFC connector 57 located outside the duct front wall 69F on one end side in the longitudinal direction. The second engagement portion 69*e* is provided outside the duct back wall 69B on the other end side in the longitudinal direction.

Therefore, the region (range Lm at the front side) where the first engagement portion 69*d* is provided and the region (range Lm at the back side) where the second engagement portion 69*e* is provided are provided outside the duct region (range La) where the opening (opening portion 64, opening 69*a*) of the elevating duct 69 is surrounded by the duct walls 69F and 69B. In other words, the duct region (range La) where the opening of the elevating duct 69 is surrounded by the duct walls 69F and 69B is provided between the region (range Lm at the front side) where the first engagement portion 69*d* is provided and the region (range Lm at the backside) where the second engagement portion 69*e* is provided.

The range Lc in FIG. 14 is a region where the FFC connector 57 of the exposure head 4 is provided, and is provided outside the duct region indicated by the range La, and between the duct region and the region indicated by the range Lm at the front side where the first engagement portion 69*d* is provided.

In addition, the range La forming the duct includes most of the substrate 50 on which the LED 51 is mounted, and the exposure head 4 can be sufficiently cooled by blowing the airflow to the range La. Note that the range Lc is a mounting portion of the FFC connector 57 of a signal line that transmits a drive signal to the substrate 50 on which the LED 51 is mounted. The range Lc is not provided with an opening for forming a duct, but is configured to enable necessary and sufficient cooling in the range La as described above.

As a result, the air taken in from the outside of the apparatus by the duct unit 60 to be described later is blown against the back surface of the substrate 50 from the opening 55*a* of the exposure head 4 through the elevating duct 69. The airflow blown from the opening 55*a* of the exposure head 4 to the back surface of the substrate 50 is exhausted to the outside of the apparatus by the duct unit 60 through the elevating duct 69.

(Engagement Hole)

Figure 18:
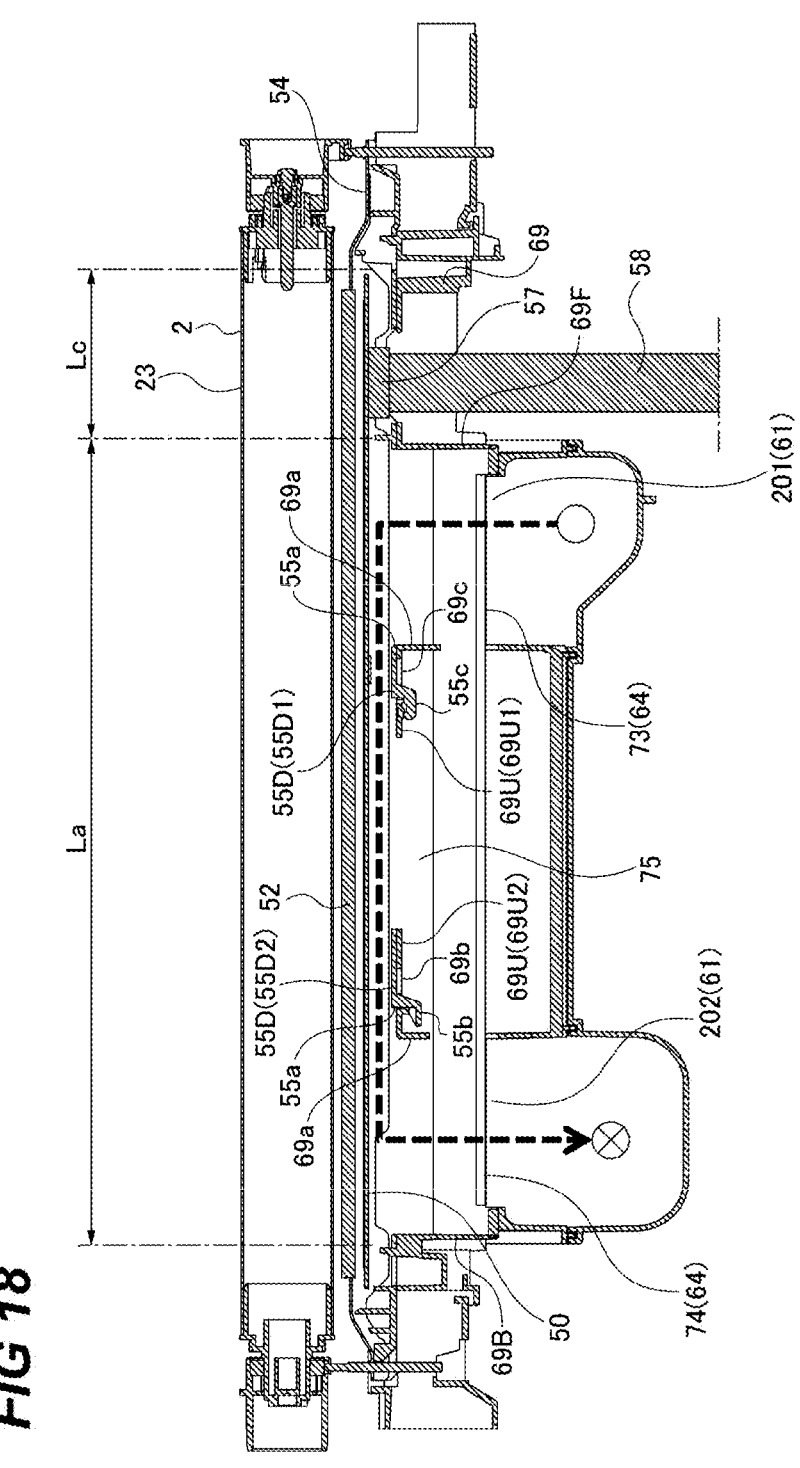
FIG. 18 is a cross-sectional view in the direction perpendicular to an optical axis of an exposure cooling airflow.

As illustrated in FIG. 18, the elevating duct 69 has an engagement hole 69*b* and an engagement hole 69*c* which are second engagement portions. The engagement hole 69*b* and the engagement hole 69*c* which are the second engagement portions are engaged with the engagement claw 55*b* and the engagement claw 55*c* which are the first engagement portions of the exposure head 4 by snap-fitting.

In the elevating duct 69, the upper surface portion 69U between the opening 69*a* at one end (front side) in the longitudinal direction and the opening 69*a* adjacent thereto is defined as a first upper surface portion 69U1. Similarly, the upper surface portion 69U between the opening 69*a* at the other end (back side) in the longitudinal direction and the opening 69*a* adjacent thereto is defined as a second upper surface portion 69U2. The first upper surface portion 69U1 is provided with the engagement hole 69*b* to be engaged with the engagement claw 55*b* of the exposure head 4. The second upper surface portion 69U2 is provided with the engagement hole 69*c* to be engaged with the engagement claw 55*c* of the exposure head 4. The first upper surface portion 69U1 and the second upper surface portion 69U2, that is, the upper surface portion 69U are support portions that face the bottom surface portion 55D of the exposure head 4 (housing support member 55) and support the exposure head 4 in a detachably attachable manner.

The engagement holes 69*b* and 69*c* as the second engagement portions are formed in the upper surface portion 69U facing the exposure head 4 at positions corresponding to the engagement claws 55*b* and 55*c*.

Thus, the exposure head 4 is configured to be detachably attachable from the image forming apparatus 100. The exposure head 4 is moved so that the engagement claws 55*b* and 55*c* of the exposure head 4 are dropped inside the engagement holes 69*b* and 69*c* of the elevating duct 69, respectively, and the bottom surface portion 55D of the exposure head 4 abuts against the upper surface portion 69U of the elevating duct 69. That is, the exposure head 4 is moved in the direction orthogonal to the axial directions with respect to the elevating duct 69 to engage the engagement claws 55*b* and 55*c* with the engagement holes 69*b* and 69*c* in the protruding direction.

Thereafter, by moving the exposure head 4 along the upper surface portion 69U of the elevating duct 69, the engagement claws 55*b* and 55*c* of the exposure head 4 are respectively engaged with the engagement holes 69*b* and 69*c* of the elevating duct 69 by snap-fitting.

That is, the exposure head 4 is moved in the axial directions with respect to the elevating duct 69 to engage the engagement claws 55*b* and 55*c* with the engagement holes 69*b* and 69*c* in the extending directions orthogonal to the protruding direction. In this manner, the exposure head 4 is connected to the elevating duct 69 in the image forming apparatus 100, and the exposure head 4 is integrated with the elevating duct 69. The procedure of detaching the exposure head 4 from the elevating duct 69 is reverse to the procedure described above. The replacement and attachment or detachment configuration of the exposure head will be described later in detail.

(Cartridge Tray)

Figure 15:
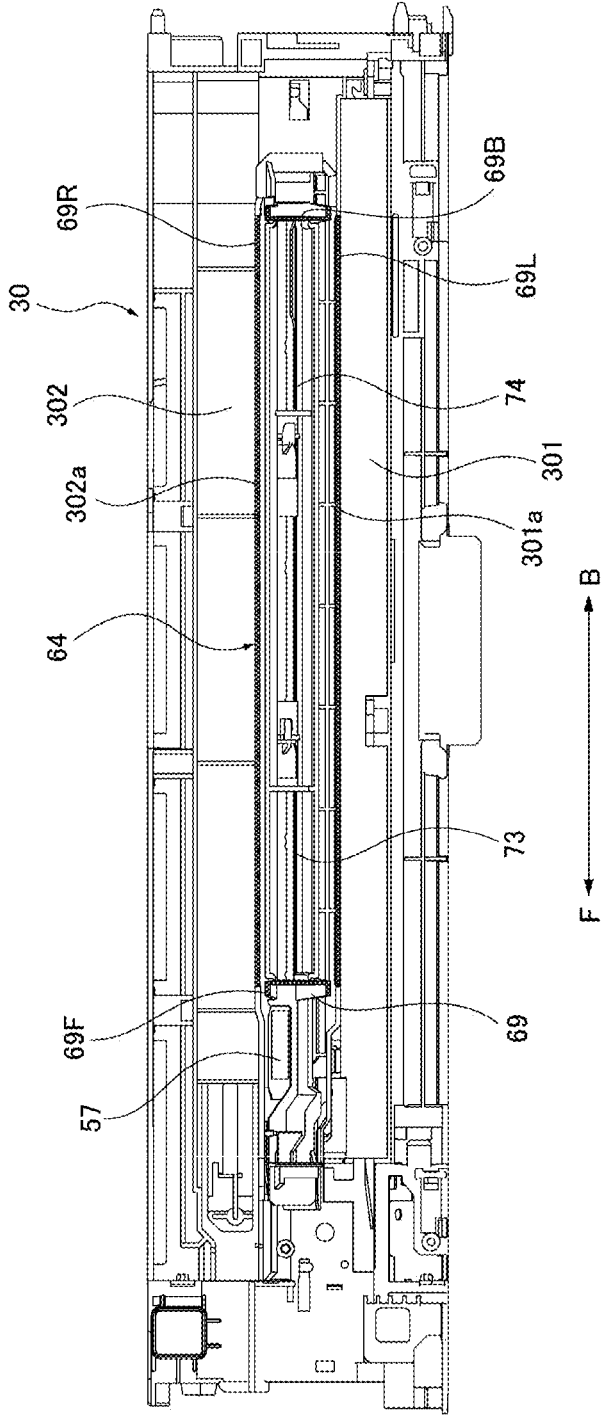
FIG. 15 is a bottom view of the cartridge tray and an elevating duct.

The image forming apparatus 100 includes the cartridge tray 30. The cartridge tray 30 will be described with reference to FIGS. 8, 9, 14 to 17. FIGS. 8, 9, and 14 are perspective views of the cartridge tray 30. FIG. 15 is a view of the cartridge tray 30 as viewed from the lower surface.

The cartridge tray 30 is a support member that supports the drum unit 23 and the developing unit 24 described above, and guides and supports the attaching and detaching operation along the axial directions of the photosensitive drum 2. The cartridge tray 30 axially supports a rotation shaft 102*a* of the inner door 102 such that the inner door 102 is rotatable within a predetermined range.

The cartridge tray 30 is provided for each image forming portion. Each cartridge tray 30 includes the developing support member 301 that guides and supports the attaching and detaching operation of the developing unit 24 along the axial direction of the photosensitive drum 2, and the drum support member 302 that guides and supports the attaching and detaching operation of the drum unit 23 along the axial directions of the photosensitive drum 2. In the cartridge tray 30, the developing support member 301 and the drum support member 302 are integrally formed. The cartridge tray 30 is not limited to a configuration to be provided for each image forming portion.

The elevating duct 69 is movably disposed between the developing support member 301 and the drum support member 302 of the cartridge tray 30. In the elevating duct 69, the first engagement portion 69*d* and the second engagement portion 69*e* at both ends in the longitudinal direction are supported by the rotating arm 65 from below between the developing support member 301 and the drum support member 302. The rotating arm 65 is rotatably provided on the developing support member 301 of the cartridge tray 30. The exposure head 4 is detachably attached to the elevating duct 69 movably arranged on the cartridge tray 30. In other words, the cartridge tray 30 is a support member that supports the exposure head 4, and guides and supports the attaching and detaching operation along the axial directions of the photosensitive drum 2.

(Developing Support Member)

The developing support member 301 is a developing support member that guides and supports the attaching and detaching operation of the developing unit 24 along the axial direction of the photosensitive drum, and is a member having a longitudinal shape extending in the axial direction of the photosensitive drum 2. The developing support member 301 includes a first developing guide portion 301*a*, a second developing guide portion 301*b* facing the first developing guide portion 301*a*, and a developing bottom surface portion 301*c* provided between the first developing guide portion 301*a* and the second developing guide portion 301*b*. The developing support member 301 further includes a third developing guide portion 301*f*. In the developing support member 301, the first developing guide portion 301*a*, the second developing guide portion 301*b*, the developing bottom surface portion 301*c*, and the third developing guide portion 301*f* are integrally formed.

The developing bottom surface portion 301*c* faces the bottom surface portion 24D of the frame body of the developing unit 24 with a space therebetween, and is provided over the longitudinal directions which are the axial directions of the photosensitive drum 2. The first developing guide portion 301*a* is provided on one end side in the lateral directions orthogonal to the longitudinal directions of the developing bottom surface portion 301*c*, and is provided between the elevating duct 69 and the developing unit 24 so as to separate the elevating duct 69 from the developing unit 24. The second developing guide portion 301*b* is provided on the other end side in the lateral directions of the developing bottom surface portion 301*c*, and is provided so as to face the first developing guide portion 301*a*. The first developing guide portion 301*a* and the second developing guide portion 301*b* abut on the frame body of the developing unit 24, and guide, in the longitudinal directions, the developing unit 24 inserted and removed in the longitudinal directions.

The first development guide portion 301a and the second development guide portion 301b are engaged with an exposure head holding member 506 and guide across the longitudinal direction the exposure head holding member 506 inserted and removed in the longitudinal direction. Further, the third development guide portion 301f engages with the engagement portion 506a of the exposure head holding member 506 to guide the exposure head holding member 506 together with the first development guide portion 301a and the second development guide portion 301b.

The first developing guide portion 301a includes a facing portion 301d facing the first inclined surface 69L1 of the elevating duct 69. The facing portion 301d has a first tray inclined surface which is inclined similarly to the first inclined surface 69L 1 of the elevating duct 69.

The first developing guide portion 301a includes a partition wall portion 301e on the downstream side of the facing portion 301d in the moving direction from the retracted position to the exposure position of the elevating duct 69. The partition wall portion 301e is provided between the exposure head 4 and the developing unit 24 so as to separate the exposure head 4 located at the exposure position illustrated in FIG. 16 from the developing unit 24. The partition wall portion 301e is an end portion (upper end portion) on the developing sleeve side in the first developing guide portion 301a.

As illustrated in FIGS. 2, 8, and 16, the developing support member 301 (cartridge tray 30) is disposed immediately below the developing unit 24. The upper surface of the developing support member 301 (cartridge tray 30) and the bottom surface of the developing unit 24 form a duct that is a closed space, and function as an intermediate path of a development cooling airflow in addition to a guide of the attaching and detaching operation of the developing unit.

In the duct (closed space) formed by the upper surface of the cartridge tray 30 (developing support member 301) and the upper surface of the developing unit 24, the opening on one end side (front side) in the longitudinal directions communicates with an opening 41a of a front-side duct 41 that takes in air from the outside of the apparatus through the opening 102c of the inner door 102. The duct between the developing unit 24 and the developing support member 301 forms one closed space communicating with the front-side duct 41 and the back-side duct 42 (see FIG. 22).

(Restricting Portion of Cartridge Tray)

Referring to FIG. 34, the restricting portion 301g of the cartridge tray 30 will be described. FIG. 34 is an enlarged perspective view in the vicinity of the restricting portion 301g of the cartridge tray 30.

As shown in FIG. 34, the cartridge tray 30 is provided with the restricting portion 301g. By abutting on the hole portion 506c and restricting portion 506i, which are an engagement portion of the exposure head holding member 506 in an operation of exchanging the exposure heads, the restricting portion 301g restricts the movement of exposure head holding member 506 in the forward and backward directions in predetermined positions (first position and second position) (See FIG. 36). When moving the exposure head holding member 506 in the forward and backward directions, the restricting portion 301g restricts both the movement in the forward direction F, which is one direction of the forward and backward directions, and the movement in the backward direction B, which is the other direction of the forward and backward directions.

The restricting portion 301g is provided with two restricting surfaces 301g1 and 301g2. The restricting surface 301g1 is a first restricting surface that restricts the movement of the exposure head holding member 506 in the forward direction F. The restricting surface 301g2 is a second restricting surface that restricts the movement of the exposure head holding member 506 in the backward direction B. The restricting surfaces 301g1 and 301g2 engage with the hole portion 506c of the exposure head holding member 506 in the first position where the FFC 58 is inserted and removed to/from the exposure head 4 to restrict the movement of the exposure head holding member 506 in the forward and backward directions. The restricting surface 301g1 engages with the restricting portion 506e of the exposure head holding member 506 in the second position where the exposure head 4 is attached and detached to/from the elevating duct 69 to restrict the movement of the exposure head holding member 506 in the forward direction.

In this way, the restricting portion 301g restricts both the movements of the exposure head holding member 506 in the forward direction F and the backward direction B. However, the restricting portion 301g is disposed in the cartridge tray 30 in the position where the restricting portion 301g does not restrict the movement of the developing unit 24 in the forward and backward directions. As a result, the restricting portion 301g does not prevent the developing unit 24 from moving in the forward and backward directions.

In the present embodiment, the configuration is exemplified in which the restricting portion 301g is provided on a separate member from the developing support member 301. However, the present invention is not limited to this configuration and the restricting portion 301g may be provided directly on the developing support member 301. The detailed function of the restricting portion 301g will be described later.

(Drum Support Member)

The drum support member 302 is a photoconductor support member that guides and supports the attaching and detaching operation of the drum unit 23 along the axial directions of the photosensitive drum, and is a member having a longitudinal shape extending in the axial directions of the photosensitive drum 2. The drum support member 302 includes a first drum guide portion 302a, a second drum guide portion 302b facing the first drum guide portion 302a, and a drum bottom surface portion 302c provided between the first drum guide portion 302a and the second drum guide portion 302b. In the drum support member 302, the first drum guide portion 302a, the second drum guide portion 302b, and the drum bottom surface portion 302c are integrally formed.

The drum bottom surface portion 302c faces the bottom surface portion 23D of the frame body of the drum unit 23 and is provided over the longitudinal directions which are the axial directions of the photosensitive drum 2. The first drum guide portion 302a is provided on one end side in the lateral directions orthogonal to the longitudinal directions of the drum bottom surface portion 302c, and is provided between the elevating duct 69 and the drum unit 23 so as to separate the elevating duct 69 from the drum unit 23. The second drum guide portion 302b is provided on the other end side in the lateral directions of the drum bottom surface portion 302c, and is provided so as to face the first drum guide portion 302a. Each of the first drum guide portion 302a and the second drum guide portion 302b abuts on the frame body of the drum unit 23 and guides, in the longitudinal directions, the drum unit 23 inserted and removed in the longitudinal directions.

The first drum guide portion 302a includes a facing portion 302d facing the second inclined surface 69R1 of the elevating duct 69. The facing portion 302d has a second tray inclined surface which is inclined similarly to the second inclined surface 69R1 of the elevating duct 69.

(Relationship Between Cartridge Tray and Elevating Duct)

Here, a relationship between the cartridge tray 30 and the elevating duct 69 will be described.

The elevating duct 69 is movably disposed between the first developing guide portion 301a and the first drum guide portion 302a in the cartridge tray 30, and is moved between the exposure position illustrated in FIG. 16 and the retracted position illustrated in FIG. 17 by rotation of the rotating arm 65. That is, the first developing guide portion 301a and the first drum guide portion 302a of the cartridge tray 30 function as guide members that guide the elevating duct 69 in the moving direction thereof.

When the exposure head 4 is detachably mounted, the opening 55a of the exposure head 4 and the opening 69a of the elevating duct 69 communicate with each other and the elevating duct 69 is integrated with the exposure head 4. The elevating duct 69 is separated from the developing unit 24 by the first developing guide portion 301a of the cartridge tray 30, and is separated from the drum unit 23 by the first drum guide portion 302a of the cartridge tray 30. Further, a gap between the elevating duct 69 and the first developing guide portion 301a is sealed by a seal 72 which is a sealing member at the exposure position illustrated in FIG. 16. Similarly, a gap between the elevating duct 69 and the first drum guide portion 302a is sealed by a seal 71 which is a sealing member at the exposure position illustrated in FIG. 16.

Further, in the pressing position of the developing unit 24 shown in FIG. 16, a gap between the developing unit 24 is sealed by a seal 70 which is a sealing member.

In this manner, the cartridge tray 30 and the elevating duct 69 disposed between the first developing guide portion 301a and the first drum guide portion 302a of the cartridge tray 30 form a duct that is a closed space communicating with the opening 55a of the exposure head 4.

(Relationship Between Cartridge Tray, Elevating Duct, and Duct Unit)

Further, the cartridge tray 30 and the elevating duct 69 form the opening portion 64 communicating with the opening portion 61 of the duct unit 60 on a side facing the duct unit 60.

(Development Stay)

Figure 19:
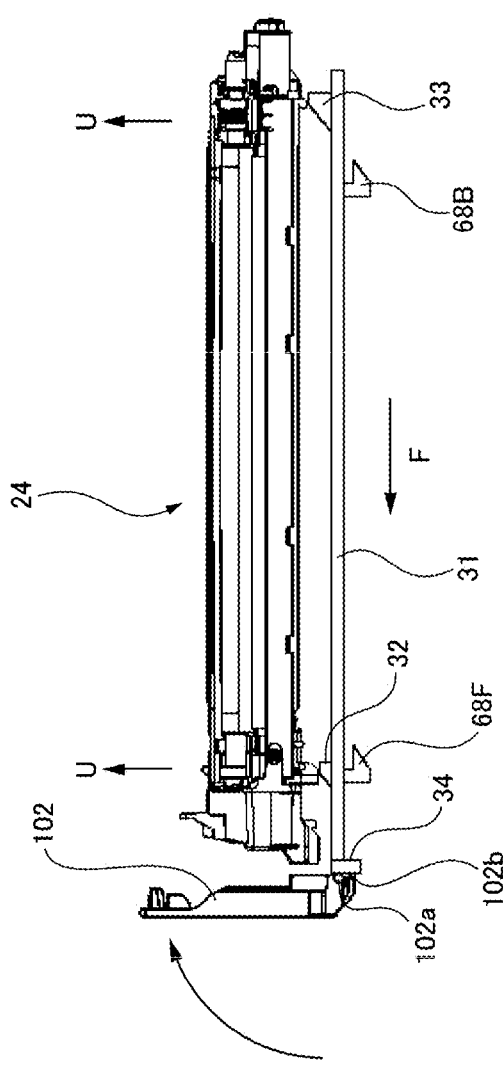
FIG. 19 is a side view of a development stay.
Figure 20:
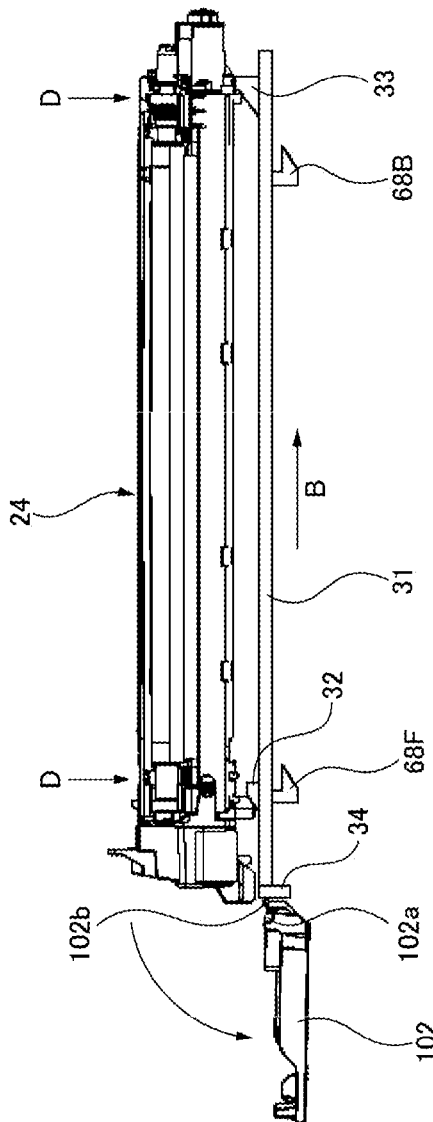
FIG. 20 is a side view of the development stay.

The image forming apparatus 100 includes a development stay 31 slidable along the axial direction of the photosensitive drum 2. The development stay 31 will be described with reference to FIGS. 16, 19 and 20. FIGS. 19 and 20 are side views of the development stay 31 as viewed from the right direction. FIG. 16 is a cross-sectional view taken along line X-X in FIG. 14.

FIG. 19 shows the state where the inner door 102 is closed, the developing unit 24 is located close to the photosensitive drum 2, and the exposure head 4 is located at the exposure position that is close to the photosensitive drum 2. FIG. 20 shows the state where the inner door 102 is opened, the developing unit 24 is located in a position retracted from the photosensitive drum 2, and the exposure head 4 is located in the retracted position where the exposure head 4 is retracted from the exposure position.

The development stay 31, which is a sliding member, is provided so as to be movable in the axial directions of the photosensitive drum 2. The development stay 31 moves in one direction of the axial directions while interlocking with the opening operation of the inner door 102 and moves in the other direction of the axial directions while interlocking with the closing operation of the inner door 102. The development stay 31 is provided movably with respect to the developing support member 301 of the cartridge tray 30. The development stay 31 has an elongated shape (longitudinal shape) extending in the axial directions of the photosensitive drum 2, and includes a development pressurizing top 32, a development pressurizing top 33, a development stay link 34, an arm retracting member 68F, and an arm retracting member 68B.

The development stay link 34 is fixed to the front end portion of the development stay 31 and is engaged with the inner door 102 axially supported by the cartridge tray 30. The development pressurizing top 32 is fixed to one side (front side) in the longitudinal direction of the development stay 31, and the development pressurizing top 33 is fixed to the other side (back side) in the longitudinal direction of the development stay 31. The development pressurizing top 32 and the development pressurizing top 33 are provided at positions facing the developing unit 24.

The development pressurizing tops 32 and 33 are development engaging members that are moved in the same direction by the development stay 31 being moved and that engage with the developing unit 24. The development pressurizing tops 32 and 33 engage with the developing unit 24 to move the developing unit 24 to the development position (See FIG. 19) close to the photosensitive drum 2 or to the separated position (See FIG. 20) where the developing unit 24 is separated from the photosensitive drum 2.

The inner door 102 has a link engagement portion 102b that engages with the development stay link 34. In the inner door 102, the link engagement portion 102b is provided at the side opposite the part covering the unit via the rotation shaft 102a.

As shown in FIG. 20, in a state where the inner door 102 is opened, a link engagement portion 102b engaged with the development stay link 34 is located close to the back end of the inner door 102. While as shown in FIG. 19, in a state where the inner door 102 is closed, the link engagement portion 102b is located closer to the lower end of the inner door 102 than the rotation shaft 102a. Therefore, according to the rotation of the inner door 102, the link engagement portion 102b of the inner door 102 moves in the rotation direction along a locus of a circle whose radius is the distance between the rotation shaft 102a and the link engagement portion 102b. That is, as illustrated in FIG. 20, by opening the inner door 102, the link engagement portion 102b also rotates and moves to the apparatus back side.

As a result, the development stay link 34 engaged with the link engagement portion 102b of the inner door 102 is slid in the backward direction B which is the direction toward the back side of the apparatus, and the two development pressurizing tops 32 and 33 integrally configured through the development stay 31 are also slid in the backward direction B. This means that, as illustrated in FIG. 20, the two development pressurizing tops 32 and 33 are out of the holding position where the developing unit 24 is held. When the development pressurizing tops 32 and 33 deviate from the holding position, the developing unit 24 moves in the downward direction D, which is a direction in which the development pressurizing tops are retracted from the photosensitive drum 2 by their own weight.

From the above description, it can be understood that the developing unit 24 retracts from the photosensitive drum 2 in conjunction with the operation of opening the inner door 102. When the inner door 102 is closed, the developing unit 24 is moved in the direction of the photosensitive drum 2 and pressed through a procedure reverse to the opening operation.

As illustrated in FIG. 19, the development stay 31 is slid in the forward direction F in conjunction with the operation of closing the inner door 102. At this time, the development pressurizing top 32 and the development pressurizing top 33 engage with the developing unit 24 so that the developing unit 24 is moved upward direction U along the inclined surface of the development pressurizing top 32 and the development pressurizing top 33 of the development stay 31. As a result, the developing sleeve 5 of the developing unit 24 is moved in a direction approaching the photosensitive drum 2 of the drum unit 23 to place the developing sleeve 5 at the developing position (See FIG. 16) that is close to the photosensitive drum 2.

Also, as illustrated in FIG. 20, the development stay 31 is slid in the backward direction B in conjunction with the operation of opening the inner door 102. At this time, the development pressurizing top 32 and the development pressurizing top 33 engage with the developing unit 24 so that the developing unit 24 is moved in the downward direction D along the inclined surface of the development pressurizing top 32 and the development pressurizing top 33 of the development stay 31. As a result, the developing sleeve 5 of the developing unit 24 is moved in a direction away from the photosensitive drum 2 of the drum unit 23 to place the developing sleeve 5 at the separated position (See FIG. 17) that is separated from the photosensitive drum 2. In the period of non-development shown in FIG. 20, the developing sleeve 5 is separated from the photosensitive drum 2 in contrast to the period of the development shown in FIG. 19.

Furthermore, the development stay 31 includes the arm retracting member 68F for rotating the rotating arm 65, which is a rotational member, and the arm retracting member 68B. The arm retracting member 68F and the arm retracting member 68B are integrally formed with the development stay 31 (See FIG. 17). The arm retracting member 68F is fixed to one side (apparatus front side) in the longitudinal directions of the development stay 31, and is provided on a surface on the opposite side of the development pressurizing top 32. The arm retracting member 68B is fixed to the other side (apparatus back side) in the longitudinal directions of the development stay 31, and is provided on a surface on the opposite side of the development pressurizing top 33. The arm retracting member 68F and the arm retracting member 68B are moved in the same direction as the development stay 31 is slid in the front-back directions in conjunction with the operation of opening and closing the inner door 102, and rotate the rotating arm 65.

Namely, when the development stay 31 is moved in one direction (backward direction B) of the axial directions in conjunction with the opening operation of the inner door 102, the arm retracting member 68F and the arm retracting member 68B are moved in the same direction, so that the development stay 31 engages with the rotating arm 65. As a result, the rotating arm 65 is rotated in the one direction to move the exposure head 4 to the retracted position integrally with the elevating duct 69 (See FIG. 17). On the other hand, when the development stay 31 is moved in the other direction (forward direction F) of the axial directions in conjunction with the closing operation of the inner door 102, the arm retracting member 68F and the arm retracting member 68B are moved in the same direction, so that the engagement of the development stay 31 with the rotating arm 65 is released. As a result, the rotating arm 65 is rotated in the other direction to move the exposure head 4 to the exposure position integrally with the elevating duct 69 (See FIG. 16).
(Rotating Arm)

As shown in FIG. 14, the rotating arm 65 is a rotating member that moves the exposure head 4 between the exposure position (See FIG. 16) close to the photosensitive drum 2 and the retracted position (See FIG. 17) where the exposure head 4 is retracted from the exposure position.

The rotating arm 65, which is a rotational member, is rotatably provided on the developing support member 301 of the cartridge tray 30. One end portion of the rotating arm 65 in the left-right directions orthogonal to the axial directions of the photosensitive drum 2 is supported to be rotatable about the axis that is in parallel with the axial directions. The other end portion of the rotating arm 65 in the left-right directions supports both end portions of a region (range Lm) outside the opening (opening 69*a*, opening portion 64) of the elevating duct 69 in the axial directions.

The rotating arm 65 presses the bottom surfaces at both ends in the longitudinal directions of the elevating duct 69 upward by the force of an arm pressure spring (not shown) which is a biasing member. In FIG. 16, the exposure head 4 is disposed close to the photosensitive drum 2, but this is maintained by the rotating arm 65 pressing the bottom surfaces at both ends of the elevating duct 69 upward. This pressing is ensured by a predetermined spring pressure by the arm pressure spring.

In this manner, the rotating arm 65 does not directly press the exposure head 4 but presses the elevating duct 69 that supports the exposure head 4.

Note that the operation of the rotating arm 65 that moves the exposure head 4 to the exposure position or the retracted position is powered by the sliding movement of the development stay 31 that retracts the developing unit 24, but may be powered via another member linked with the inner door 102.
(Positioning Pin of Exposure Head)

Next, positioning pins 45F and 45B of the exposure head 4 will be described.

The housing 54 of the exposure head 4 is provided with a positioning pin 45F as a positioning axis and a positioning pin 45B. Each of the positioning pin 45F and the positioning pin 45B is an example of a metal pin. The housing 54 is an electroconductive member having conductivity, and the positioning pins 45F and 45B are also a member having conductivity. The positioning pin 45F and the positioning pin 45B are fixed to both end portions in the longitudinal directions of the housing 54. The positioning pin 45F is fixed to the housing 54 on one side (front side) of the lens array 52 in the axial directions of the photosensitive drum 2, and protrudes from both sides of the housing 54 in the optical axis directions of the lens array 52. The positioning pin 45B is fixed to the housing 54 on the other side (back side) of the lens array 52 in the axial directions of the photosensitive drum 2, and protrudes from both sides of the housing 54 in the optical axis directions of the lens array 52.

In the positioning pin 45F, the upper end (apex portion) of the part that protrudes towards the upper side of the housing 54 is located below the top surface (light exit surface) of the lens array 52 secured on the housing 54. While, in the positioning pin 45B, the upper end (apex portion) of the part that protrudes towards the upper side of the housing 54 is located above the top surface (light exit surface) of the lens array 52 secured on the housing 54.

In order to ensure the distance between the surface of the photosensitive drum 2 and the light exit surface of the lens array 52 of the exposure head 4 with high accuracy, the positioning pins 45F and 45B adjust the position of the positioning surface at the shaft distal end with reference to the housing 54 and are caulked to the housing 54. Note that the fixing of the positioning pins 45F and 45B to the housing 54 is not limited thereto, and for example, the positioning pin 45F and the positioning pin 45B made of metal may be fixed to the housing 54 made of metal by welding. As described above, in the present embodiment, the positioning pin 45F and the positioning pin 45B are integrated with the housing 54.

Figure 23:
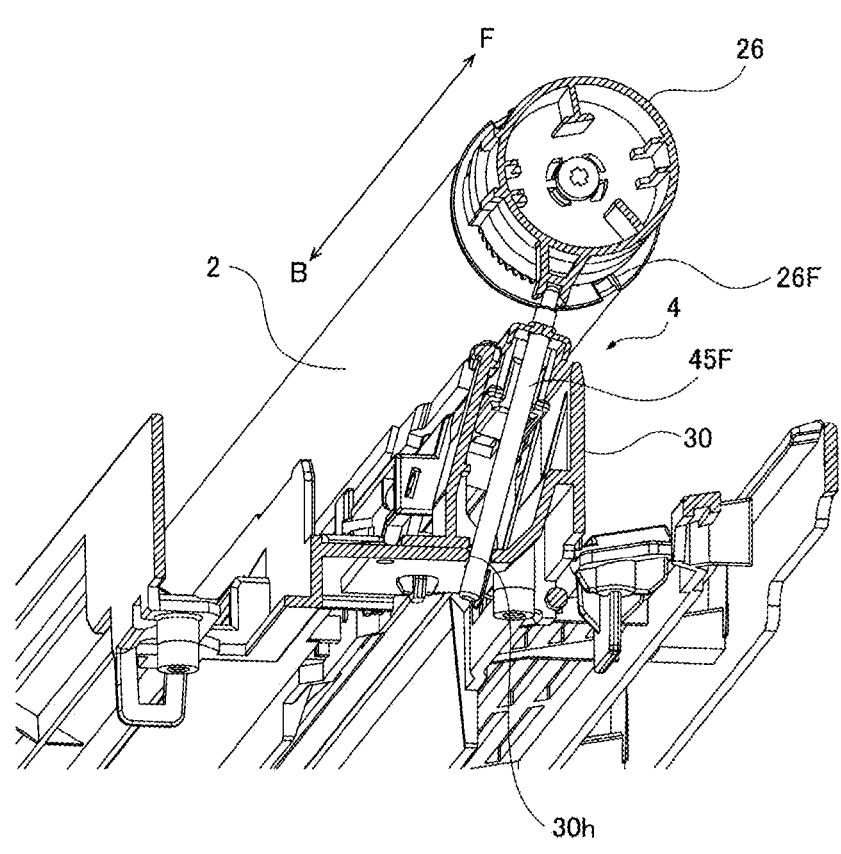
FIG. 23 is a cross-sectional perspective view illustrating positioning on the front side of the photosensitive drum and the exposure head.
Figure 24:
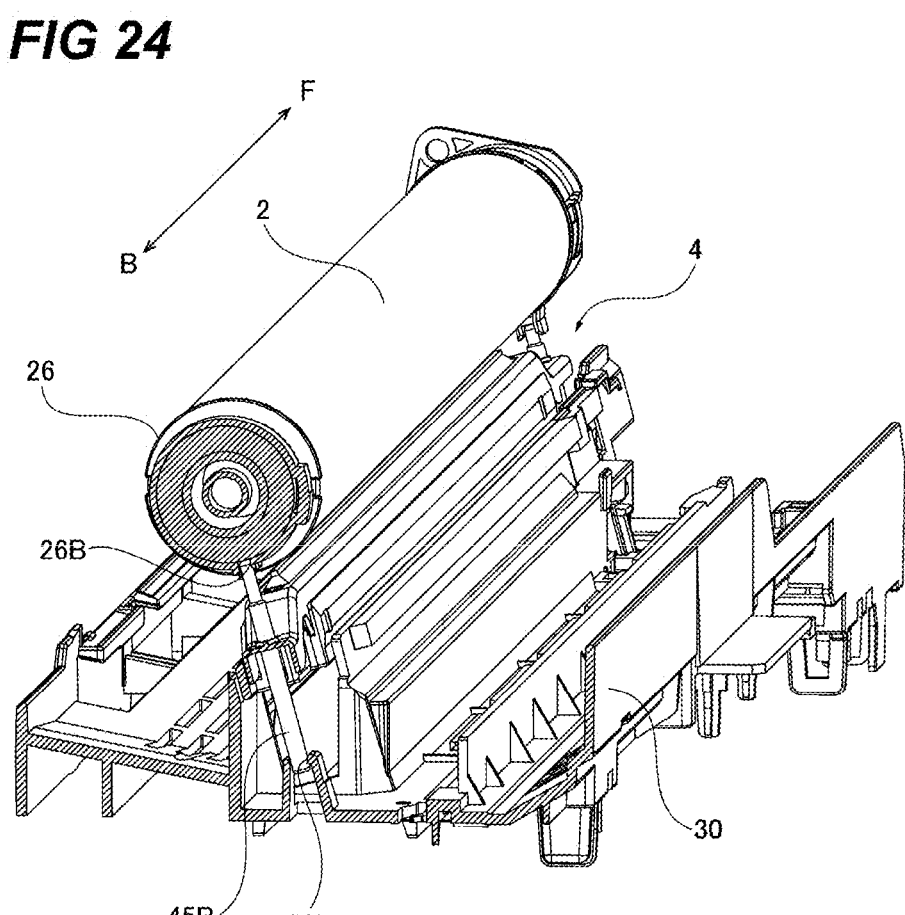
FIG. 24 is a cross-sectional perspective view illustrating positioning on the rear side of the photosensitive drum and the exposure head.

When the exposure head 4 is moved to the exposure position, the positioning pin 45F and the positioning pin 45B of the exposure head 4 abut on predetermined positions (for example, the engagement portions 26F and 26B of the drum bearing 26 shown in FIGS. 23 and 24) of the drum unit 23 for supporting photosensitive drum 2. As a result, the distance between the exposure head 104 and the surface of the photosensitive drum 2 is maintained at the exposure position. Further, by the positioning pins 45F and 45B, not only the distance between the exposure head 104 and the surface of the photosensitive drum 2, but also the angle of the exposure head 104 with respect to the photosensitive drum 2 is fixed.

Although, not illustrated, a pressing position in which the engagement boss 66 of the rotating arm 65 presses the elevating duct 69, abutting positions between the positioning pins 45F and 45B and the predetermined positions of the drum unit 23 and a center position of the photosensitive drum 2 are arranged on a substantially straight line in the exposure position.

With this arrangement, the exposure head 4 is pressed toward the center of the photosensitive drum 2, so that an unnecessary rotational moment is not applied to the elevating duct 69. This means that there is no component promoting the inclination of the exposure head 4 with respect to the photosensitive drum 2 in the pressing force, which leads to the positioning accuracy of the distance and angle and the stability of the repeated attaching and detaching operation.

Furthermore, as illustrated in FIGS. 23 and 24, the positioning pins 45F and 45B are supplementarily fitted to the auxiliary fitting portions 30h and 30i of the cartridge tray 30 in the direction orthogonal to the optical axis directions of the exposure head 4 and the direction orthogonal to the axial directions of the photosensitive drum 2 on the lower end peripheral surfaces thereof. As a result, even when a slight rotational moment is generated due to the weight, surface property, dimensional error, and the like of the component, stable positioning accuracy at a distance and an angle, and repeated attaching and detaching operations can be achieved.

(Relationship Between Engagement Claw and Engagement Hole)

Here, the relationship between the engagement claws of the exposure head 4 and the engagement holes of the elevating duct 69 will be described in more detail with reference to FIG. 27. Here, the relationship between the engagement claw 55b of the exposure head 4 and the engagement hole 69b of the elevating duct 69 will be described, but the same applies to the relationship between the engagement claw 55c of the exposure head 4 and the engagement hole 69c of the elevating duct 69.

Figure 27:
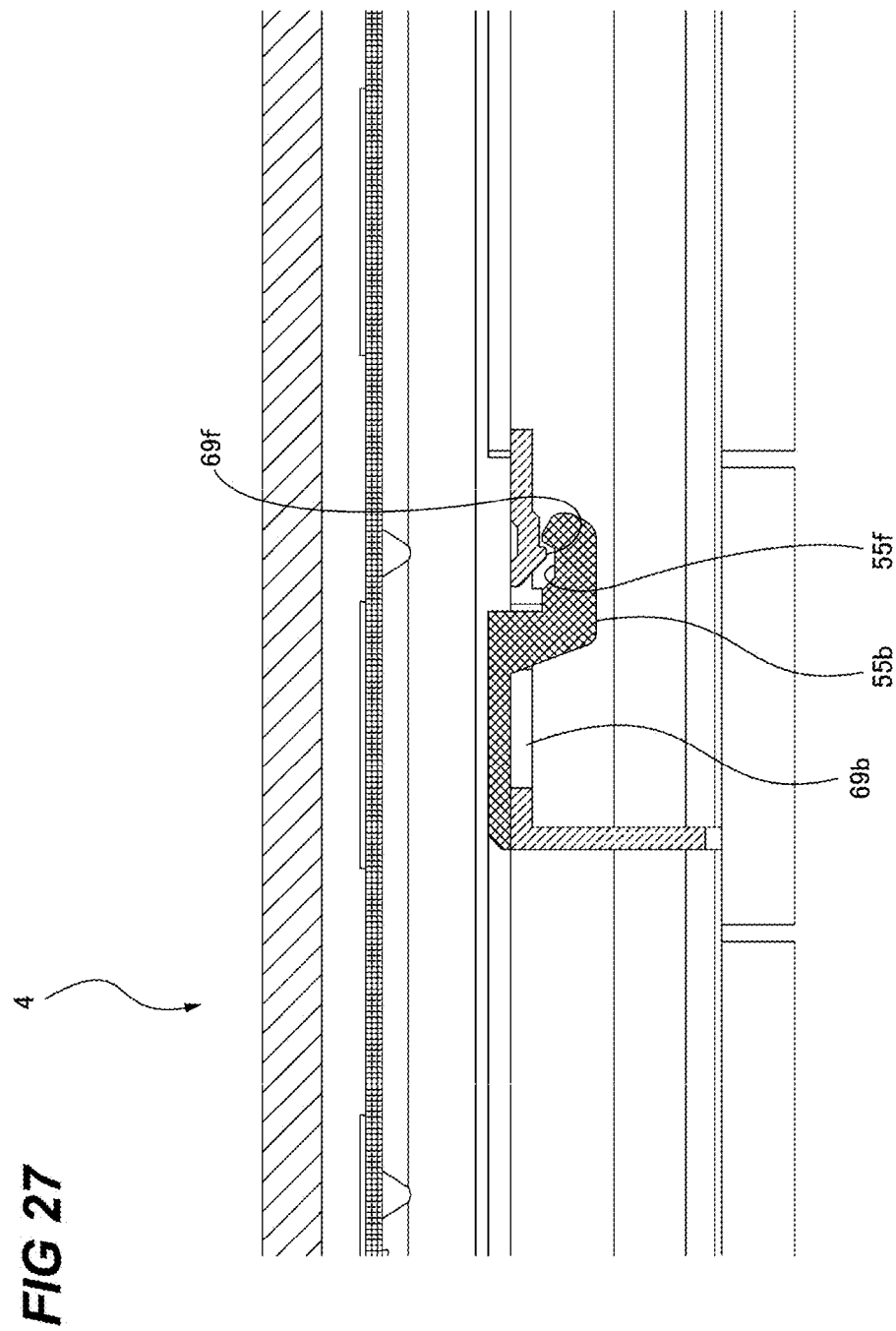
FIG. 27 is an enlarged cross-sectional view of an engagement portion illustrated in FIG. 26.

As illustrated in FIG. 27, the engagement claw 55b has elasticity, and a concave portion 55f is provided at the extended distal end of the engagement claw 55b. A convex portion 69f to be engaged with the concave portion 55f is provided at an edge of the engagement hole 69c corresponding to the concave portion 55f The convex portion 69f provided at the edge of the engagement hole 69c is disposed at a position corresponding to the concave portion 55f provided at the distal end of the engagement claw 55b at the slide operation completion position of the exposure head 4 with respect to the elevating duct 69, that is, the mounting completion position.

Immediately before the completion of the sliding operation of the exposure head 4 in the direction of the arrow K, the distal end of the engagement claw 55b interferes with the convex portion 69f and the engagement claw 55b is elastically deformed, so that the sliding operation force of the exposure head 4 once rises compared to the operation force immediately before the interference. Thereafter, the concave portion 55f of the engagement claw 55b immediately reaches the convex portion 69f, and the concave portion 55f and the convex portion 69f are engaged with each other, so that the sliding operation force of the exposure head 4 decreases. That is, when the exposure head 4 is moved in the extending direction with respect to the elevating duct 69, the engagement claw 55b is elastically deformed until the concave portion 55f and the convex portion 69f are engaged with each other, so that the operation force for moving the exposure head 4 in the extending direction is changed. By the rapid increase or decrease of the sliding operation force of the exposure head 4, it is possible to provide a click feeling indicating that the sliding operation of the exposure head 4 is completed.

As described above, the sliding operation force of the exposure head 4 is changed by the elastic deformation of the engagement claw 55b until the concave portion 55f of the engagement claw 55b and the convex portion 69f of the engagement hole 69b are engaged, whereby the completion of the mounting of the exposure head 4 can be clearly presented.

As described above, as illustrated in FIGS. 23 and 24, the positioning pins 45F and 45B of the exposure head 4 are supplementarily fitted to the auxiliary fitting portions 30h and 30i of the cartridge tray 30 on the lower end peripheral surface thereof. This fitting is simultaneously performed by the sliding operation of the exposure head 4 in the backward direction B.

Furthermore, in the present embodiment, the earth connection between the housing 54 of the exposure head 4 and the image forming apparatus 100 is also simultaneously performed by the above-described sliding operation of the exposure head 4 in the backward direction B. The housing 54 of the exposure head 4 and the positioning pins 45F and 45B are caulked and fixed, and conduction is established. The earth connection with the image forming apparatus 100 is performed by the peripheral surface of the positioning pin 45F of the exposure head 4 coming into contact with the conductive member (not shown) provided in the cartridge tray 30 on the apparatus side. The conductive member has conductivity. Specifically, the conductive member is made of a metallic thin plate. Therefore, a sufficient contact pressure can be obtained by contact and deformation by the sliding operation of the exposure head 4. The conductive member is electrically connected to the frame body sheet metal of the image forming apparatus 100 via a circuit board on which a harness, a resistance element for noise removal, and a capacitor are mounted.

In this manner, the positioning pin 45F of the exposure head 4 can be electrically connected to the conductive member by the sliding operation, and the exposure head 4 can be connected to the ground. As a result, the exposure head 4 can be connected to the ground or the like with easy work to reduce generation of radiation noise such as electromagnetic waves. That is, a stable grounding characteristic can be obtained only by a sliding operation for mounting the exposure head 4 on the elevating duct 69.

(Configurations of FFC and FFC Guide)

Figure 28:
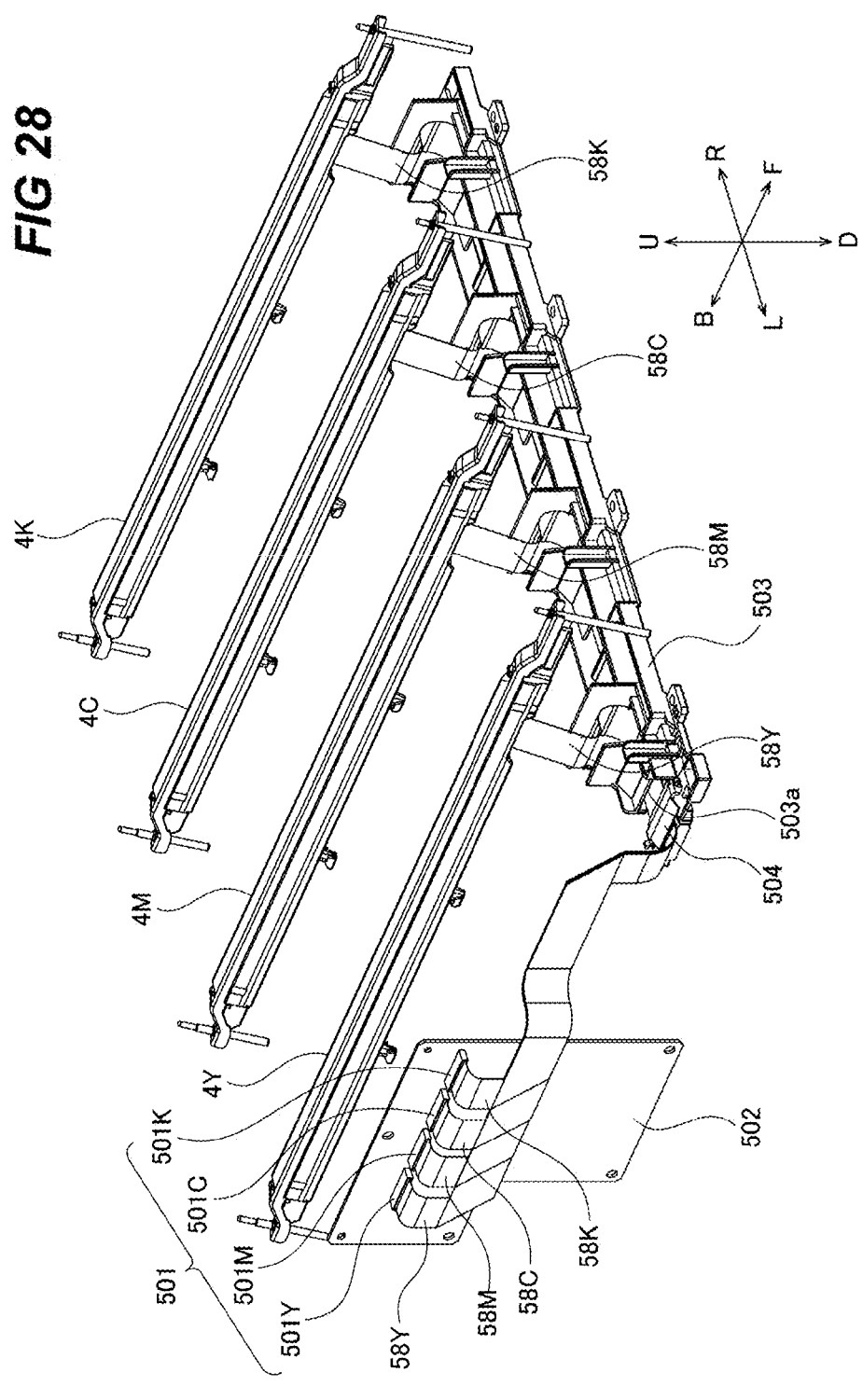
FIG. 28 is a left side perspective view of the exposure head, the FFC and an FFC guide.
Figure 29:
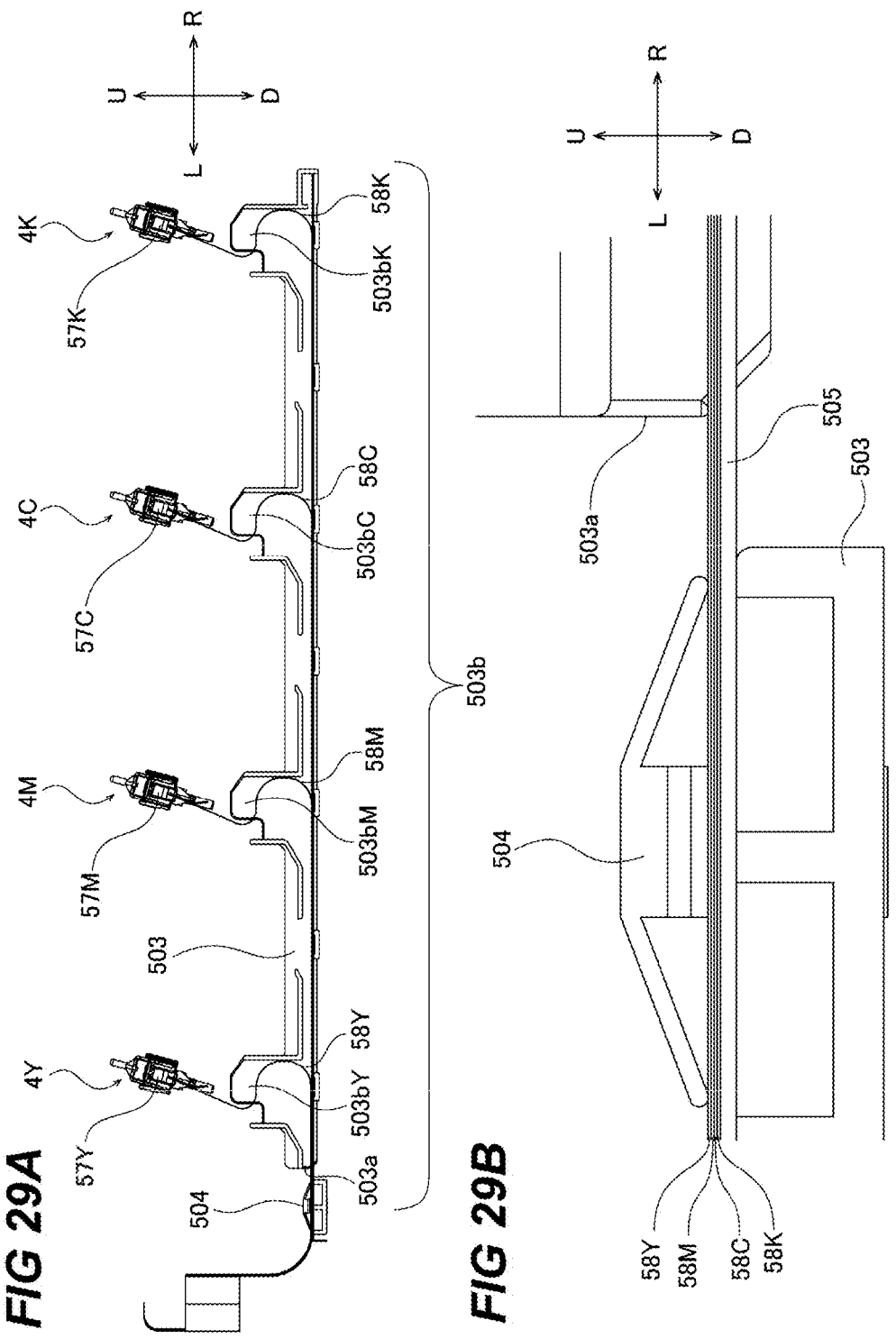
FIG. 29A is a cross-sectional view of the exposure head, the FFC and the FFC guide
FIG. 29B is an enlarged view of a biasing member.
Figure 30:
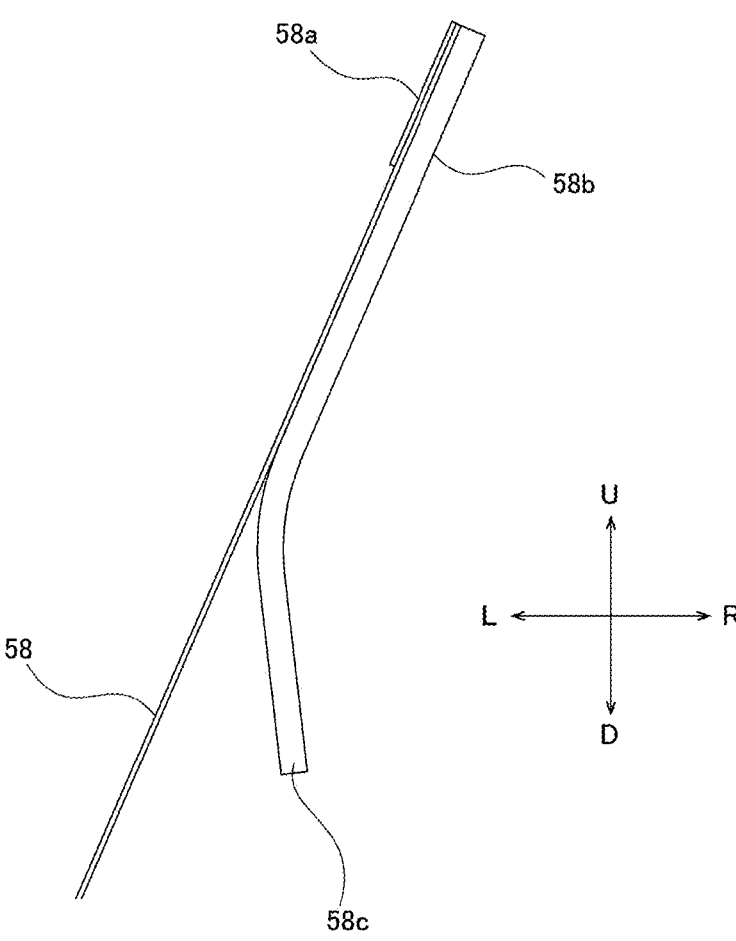
FIG. 30 is an enlarged view of an FCC contact point shown in FIG. 29A.

Next, the configurations of the FFC 58 and the FFC guide 503 will be described with reference to FIGS. 28 to 30. FIG. 28 shows a perspective view of the exposure head 4, the FFC 58, the circuit board 502, the FFC guide 503. FIG. 29A shows a cross-sectional view of the image forming apparatus 100 shown in FIG. 28 viewed from the front side. FIG. 29B shows an enlarged view of the vicinity of the biasing member 504 in FIG. 29A. FIG. 30 shows an enlarged view of the vicinity of the contact point 58a in FIG. 29A. In FIG. 30, the exposure head is not illustrated for the description.

(Configuration of FFC)

The image forming apparatus 100 is provided with a plurality of the FFCs 58 (58Y, 58M, 58C and 58K) for electrically connecting exposure heads 4 (4Y, 4M, 4C, and 4K) to the circuit board 502, respectively. As described above, in the present embodiment, the circuit board 502 is disposed at the left side of the image forming apparatus 100 and the exposure head 4 is disposed at the right side of the circuit board 502. One end portion of each FFC 58 is connected to each exposure head 4 and the other end portion of each FFC 58 is connected to the circuit board 502 so that the exposure heads 4 and the circuit board 502 are electrically connected to each other.

As shown in FIG. 28, each FFC 58 connects the FFC connector 57 provided in each exposure head 4 with the connector 501 provided on the circuit board 502. The FFCs 58 (58Y, 58M, 58C and 58K) are disposed in multilayered form.

As shown in FIG. 30, each of the FFCs 58 (58Y, 58M, 58C and 58K) is provided with the contact point 58a to be electrically connected to the FFC connector 58 of the exposure head 4 and the reinforcing plate 58b for reinforcing the contact point 58a at the one end portion. In the FFC 58, the reinforcing plate 58b is secured with double-sided adhesive tape to the surface opposite the one where the contact point 58a is provided.

At the other end portion of each FFC 58 (58Y, 58M, 58C and 58K), a contact point (not shown) to be connected to each of the connectors 501 (501Y, 501M, 501C, and 501K) provided in circuit board 502 is provided.

Further, the reinforcing plate 58b is provided with the protruding portion 58c that protrudes from the surface opposite the contact point 58a. The protruding portion 58c provided on the reinforcing plate 58b has a shape such that the protruding portion 58c can be pinched by fingers when inserting and drawing out the FFC 58 in/from the FFC connector 57.

As shown in FIGS. 29A and 30, in the first posture in which the exposure head 4 exposes the photosensitive drum 2, the reinforcing plate 58b and the protruding portion 58c are disposed at the right side of the contact point 58a. Namely, in the leftward and rightward directions (second directions) of the image forming apparatus 100, the FFC 58 is connected to the connector of the exposure head 4 held in the first posture such that the reinforcing plate 58b and the protruding portion 58c are disposed at the right side of the contact point 58a.

As shown in FIGS. 40A and 40B, in the second posture in which the exposure head 4 is exchanged, the reinforcing plate 58b and the protruding portion 58c are disposed at the upper side of the contact point 58a. Namely, in the upward and downward directions (third directions) of the image forming apparatus 100, the FFC 58 is connected to the connector of the exposure head 4 held in the second posture different from the first posture such that the reinforcing plate

58b and the protruding portion 58c are disposed at the upper side of the contact point 58a.

(Configuration of FFC Guide)

Further, the image forming apparatus 100 is provided with the FFC guide 503 as a guide member that holds the FFCs 58 (58Y, 58M, 58C and 58K) along the leftward and rightward directions. The FFC guide 503 extends in the leftward and rightward directions (second directions). The FFC guide 503 is disposed immediately under the exposure heads 4 in the image forming apparatus 100. Specifically, the FFC guide 503 is disposed immediately under the FFC connectors 57 (57Y, 57M, 57C, and 57K) of the exposure heads 4 linearly along the leftward and rightward directions.

The FFC guide 503 is provided in the image forming apparatus 100 and is configured to restrict the position of the FFCs 58. The parts between the one ends and the other ends of the FFCs 58 are held in the image forming apparatus 100 by the FFC guide 503. As shown in FIG. 29A, the FFC guide 503 has the first opening portion 503a and the second opening portions 503b (503bY, 503bM, 503bC, and 503bK) through which the FFCs 58 pass. The first opening portion 503a is disposed at the left side of the second opening portions 503b. The first opening portion 503a is disposed at one side (left side) of the FFC guide 503 in the leftward and rightward directions and is a first through hole through which the multilayered FFCs 58 pass. Further, the first opening portion 503a is disposed closer to the circuit board 502 than the four exposure heads 4. The second opening portions 503b are disposed at the other side (right side) of the FFC guide 503 in the leftward and rightward directions and are second through holes through which the FFCs 58 respectively pass. The second opening portions 503b are respectively provided for the exposure heads 4. The first opening portion 503a and the second opening portions 503b are provided on the FFC guide 503 linearly in the leftward and rightward directions.

In the above, the configuration is exemplified in which the first opening portion (first through hole) 503a and the second opening portions (second through holes) 503b are provided on the FFC guide 503. However, the present invention is not limited to this configuration. For example, the first through hole may be provided on another member other than the FFC guide 503. Further, the second through holes may be provided on another member other than the FFC guide 503 such as the elevating duct 69 and the cartridge tray 30. In this case, it is preferable that the second through holes are provided on the side where the FFC holding member 507 is disposed.

As shown in FIGS. 28 and 29A, the FFC guide 503 is provided with the biasing member 504 that biases the FFCs 58. The biasing member 503 biases the FFCs 58 with respect to the FFC guide 503 in the upward and downward directions to restrict the FFCs 58 not to move with respect to the FFC guide 503. As the biasing member 503, a bundle wire clamp is used. When the biasing member 504 is detached, the FFCs 58 become able to move with respect to the FFC guide 503. Therefore, the FFCs 58 are held to be able to move with respect to the FFC guide 503 under a predetermined condition.

As shown in FIG. 29B, the cover member 505 that restricts the FFCs 58 not to fall downward is attached to the FFC guide 503. The cover member 505 is used to simplify the mold to form the FFC guide 503. The FFC guide 503 itself may be configured to include a wall having the same function.

Next, the path of the FFCs 58 from the circuit board 502 to the exposure heads 4 will be described.

As shown in FIG. 28, the other end portions of the FFCs 58 are connected to the connectors 501 provided on the circuit board 502 disposed in the left side of the main body of the image forming apparatus 100. The FFCs 58 (58Y, 58M, 58C and 58K) that are respectively connected to the connectors 501 of the circuit board 502 disposed on the left side of the main body of the image forming apparatus 100 are multilayered at the left side of the main body and bent so as to head for the right side of the main body from the left side of the main body. As shown in FIG. 29A, the multi-layered FFCs 58 pass through the first opening portion 503a of the FFC guide 503 and enter the inside of the FFC guide 503. In this moment, the multilayered FFCs 58 are biased from the upper side to the lower side by the biasing member 504 provided on the FFC guide 503. With the friction force generated by the FFCs 58 being nipped by the biasing member 504 and the FFC guide 503, the FFCs 58 are held not to move in the leftward and rightward directions.

The order of the layers in the upward and downward directions of the FFCs 58 nipped by the biasing member 504 and the FFC guide 503 is for yellow (Y), magenta (M), cyan (C), and Black (K) from the upper side. Namely, the order of the layers from upper side to lower side in the upward and downward directions of the FFCs 58 nipped by the biasing member 504 and the FFC guide 503 conforms to the order of the corresponding exposure heads 4 disposed from left side to right side.

The FFCs 58 entering the inside of the FFC guide 503 are disposed such that the FFCs 58 extend in the leftward and rightward directions along the FFC guide 503. When the FFCs 58 come under the second opening portion 503bY of the FFC guide 503, only the FFC 58Y is disposed such that it is bent and separated upward to go towards the FFC connector 57Y of the exposure head 4Y The FFC 58Y is connected to the FFC connector 57Y of the exposure head 4Y to electrically connect the circuit board 502 with the exposure head 4Y After the FFC 58Y is separated, the multilayered FFCs 58 (58M, 58C, and 58B) are disposed such that they extend in the leftward and rightward directions as to go from the left side of the main body to the right side of the main body along the FFC guide 503. Thereafter, similarly to the yellow image forming portion 1Y, when the multilayered FFCs 58 come under the second opening portions 503b in each image forming portion 1M, 1C, 1K, the FFC 58 in the most upper position is disposed such that it is bent and separated upward as to go towards the FFC connectors 57, respectively. The FFCs 58 disposed as to go toward the exposure heads 4 are connected to the FFC connectors 57 of the exposure heads 4 to electrically connect the circuit board 502 with the FFC connectors 57.

As described above, the circuit board 502 is connected to the exposure heads 4 via the FFCs 58. In the above description, the image forming apparatus 100 has four image forming portions 1Y, 1M, 1C, and 1K assuming that the image forming apparatus 100 is a color multifunction apparatus. However, the configuration may be adopted in which only one image forming portion 1K is provided assuming that the image forming apparatus 100 is a monochrome multifunction apparatus.

(Exchanging Tools)

Figures 31A, 31B, 31C, 31D:
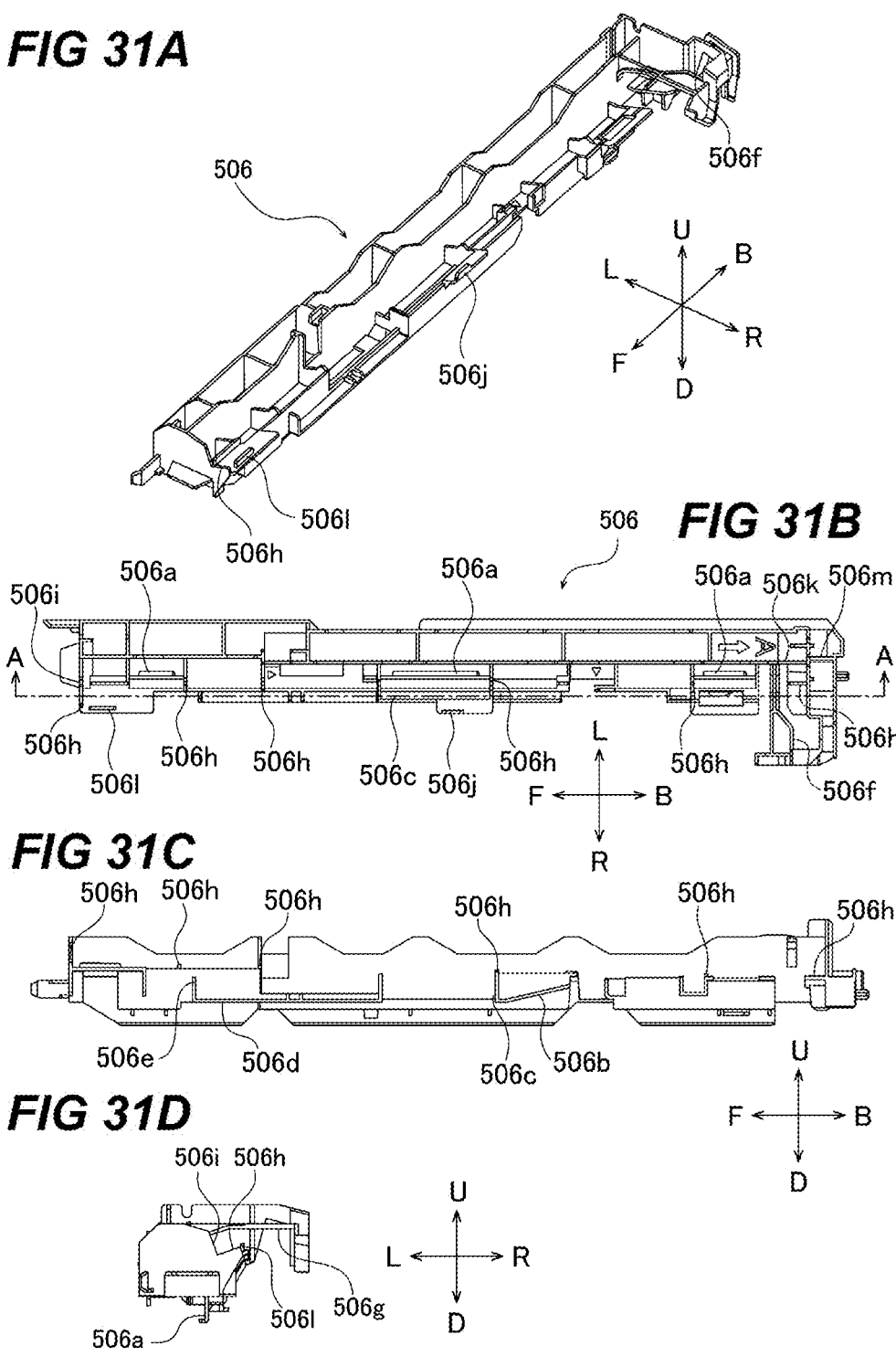
FIGS. 31A, 31B, 31C and 31D show an exposure head holding member.
Figures 32A, 32B, 32C, 32D:
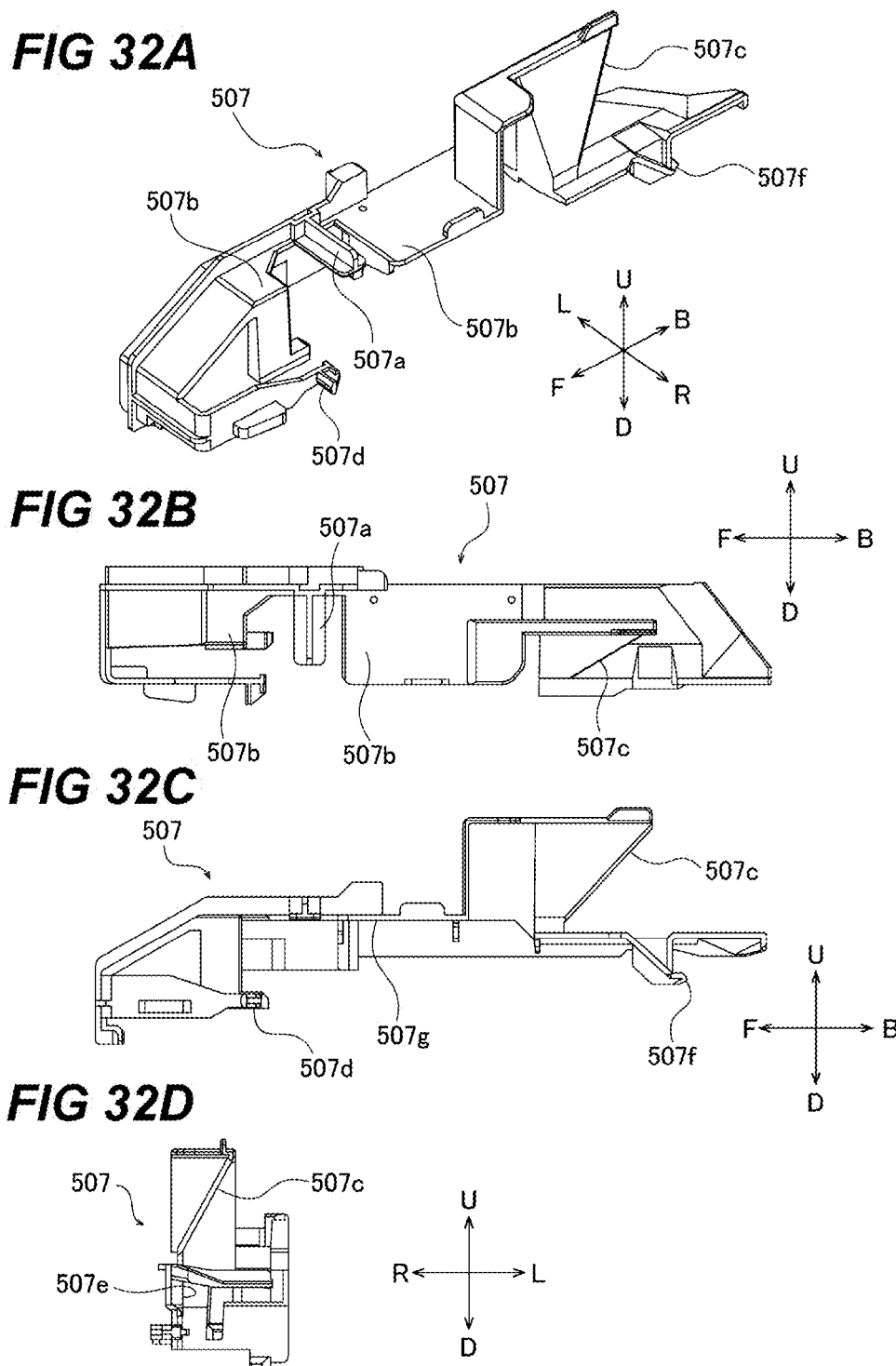

Next, exchanging tools that are used in exchanging the exposure heads 4 and the FFCs 58 in the image forming apparatus 100 will be described with reference to FIGS. 31A to 31D, 32A to 32D, and 33. FIG. 31A is a perspective view of the exposure head holding member 506, which is one of the tools for exchanging the exposure heads and the FFCs. FIG. 31B is a top view of the exposure head holding member 506. FIG. 31C is an A-A cross-sectional view of the exposure head holding member 506 in FIG. 31B viewed from the right side. FIG. 31D is a front-side view of the exposure head holding member 506. FIG. 32A is a perspective view of the FFC holding member 507, which is one of the tools for exchanging the exposure heads and the FFCs. FIG. 32B is a top view of the FFC holding member 507. FIG. 32C is a right-side view of the FFC holding member 507. FIG. 32D is a back-side view of the FFC holding member 507. FIG. 33 is a front-side view of the sheet member 508, which is one of the tools for exchanging the exposure heads and the FFCs.

The exchanging tools for exchanging the exposure heads 4 and the FFC s58 are used in a case where the exposure heads or the FFCs 58 should be taken out from inside the image forming apparatus 100 and new exposure heads or FFCs should be attached when the exposure heads 4 or the FFCs 58 become out of order. These exchanging tools are used by a service personnel in the market.

The exchanging tools for the exposure heads 4 and the FFCs 58 consist of three members of the exposure head holding member 506, the FFC holding member 507, and the sheet member 508. At least one of the three members is/are attached to the housing or the cover of the image forming apparatus 100 (not shown). In this embodiment, the image forming apparatus 100 is exemplified as to include the exchanging tools for the exposure head 4 and the FFC 58. The invention is not limited to this configuration. For example, the exchanging tools may be included in a new exposure head 4 or a new FFC 58 without not being included in the image forming apparatus 100. Further, a service personnel may bring the exchanging tools. The exchanging tools for the exposure heads 4 and the FFCs 58 are not limited to the three members of the exposure head holding member 506, the FFC holding member 507, and the sheet member 508. The exchanging tool(s) may be one or two of the three members. Furthermore, some of the three members of the exposure head holding member 506, the FFC holding member 507, and the sheet member 508 may be included in the image forming apparatus and the other member(s) may be included in a new exposure head 4 or a new FFC 58 for exchange, or the other member(s) may be brought by a service personnel.

Directions for the exposure head holding member 506 and the FFC holding member 507 are defined as follows. During exchanging operation of the exposure heads 4 and the FFCs 58, in a state where the exposure head holding member 506 and the FFC holding member 507 are held in the cartridge tray 30, the front side plate side with respect to the apparatus main body is defined as front side, the back side plate side with respect to the apparatus main body is defined as back side. With respect to the photosensitive drum 2K on which an electrostatic latent image for a black toner image is formed, the side at which the photosensitive drum 2Y on which an electrostatic latent image for a yellow toner image is formed is defined as left side. With respect to the photosensitive drum 2Y on which an electrostatic latent image for a yellow toner image is formed, the side at which the photosensitive drum 2K on which an electrostatic latent image for a black toner image is formed is defined as right side. Moreover, the upward direction in vertical directions that is perpendicular to the forward and backward directions and to the leftward and rightward directions, which are defined above is defined as upward direction and the downward direction in vertical directions that is perpendicular to the forward and backward directions and to the leftward and rightward directions, which are defined above is defined as downward direction. The defined forward direction F, the backward direction B, the rightward direction R, the leftward direction L, the upward direction U, and the downward direction D are shown in FIGS. 31A to 31D and 32A to 32D.
(Exposure Head Holding Member)

The exposure head holding member 506 is one of the exchanging tools used for exchanging the exposure heads 4 and the FFCs 58. The exposure head holding member 506 is a movable member that engages with the cartridge tray 30, is able to move in the longitudinal direction (forward and backward directions) of the exposure head 4, and has a function to temporarily hold the exposure head 4 during exchanging operation of the exposure heads 4 and the FFCs 58. Namely, the exposure head holding member 506 is not limited to an exchanging tool to be used for exchanging the exposure heads 4 and it is sufficient that the exposure head holding member 506 is a holding tool that holds at least the exposure head 4.

In this embodiment, the exposure head holding member 506 is disposed at the left side (development unit side) in the leftward and rightward directions via the exposure head 4 held at the exposure position. Specifically, the exposure head holding member 506 is disposed, via the exposure head 4 attached to the image forming apparatus 100, at the developing support member 301 of the cartridge tray 30, which is at the development unit side.

The exposure head holding member 506 is provided with the engagement portions 506a that engage with the developing support member 301 while being able to move in the forward and backward directions (first directions). As shown in FIG. 31A, the exposure head holding member 506 is provided with the engagement portions 506a at different positions in the forward and backward directions. In the exchanging operation of the exposure heads 4, the engagement portions 506a engage with the developing support member 301 provided on the cartridge tray 30 so that the exposure head holding member 506 is guided in the forward and the backward directions (See FIGS. 35A and 35B). In the present embodiment, three engagement portions 506a are provided at different three positions in the forward and backward directions. The invention is not limited to this configuration. For example, one engagement portion 506a, two engagement portions 506a, or more than three engagement portions 506a may be provided.

As shown in FIG. 31C, the exposure head holding member 506 is provided with the inclined portion 506b, the hole portion 506c, the plane portion 506d, and the restricting portion 506e. These portions have shapes for the developing support member 301 to hold the exposure head holding member 506 in the FFC inserting and drawing out position, which is the first position, and the exposure head attaching and in the detaching position, which is the second position during the exchanging operation of the exposure heads 4 (See FIGS. 36A to 36D).

The first position is the FFC inserting and drawing out position in which the FFCs 58 are inserted into the exposure heads 4 and are drawn out from the exposure heads 4. The second position is the exposure head attaching and detaching position in which the exposure heads 4 are attached to and detached from the image forming apparatus 100.

The hole portion 506c is a first movement restricting portion that restricts the movement of the exposure head holding member 506 in the forward and backward directions in the first position (FFC inserting and drawing out position) in which a part of the exposure head 4 is exposed to the outside of the image forming apparatus 100 in the forward and backward directions.

Figures 36A, 36B, 36C, 36D:
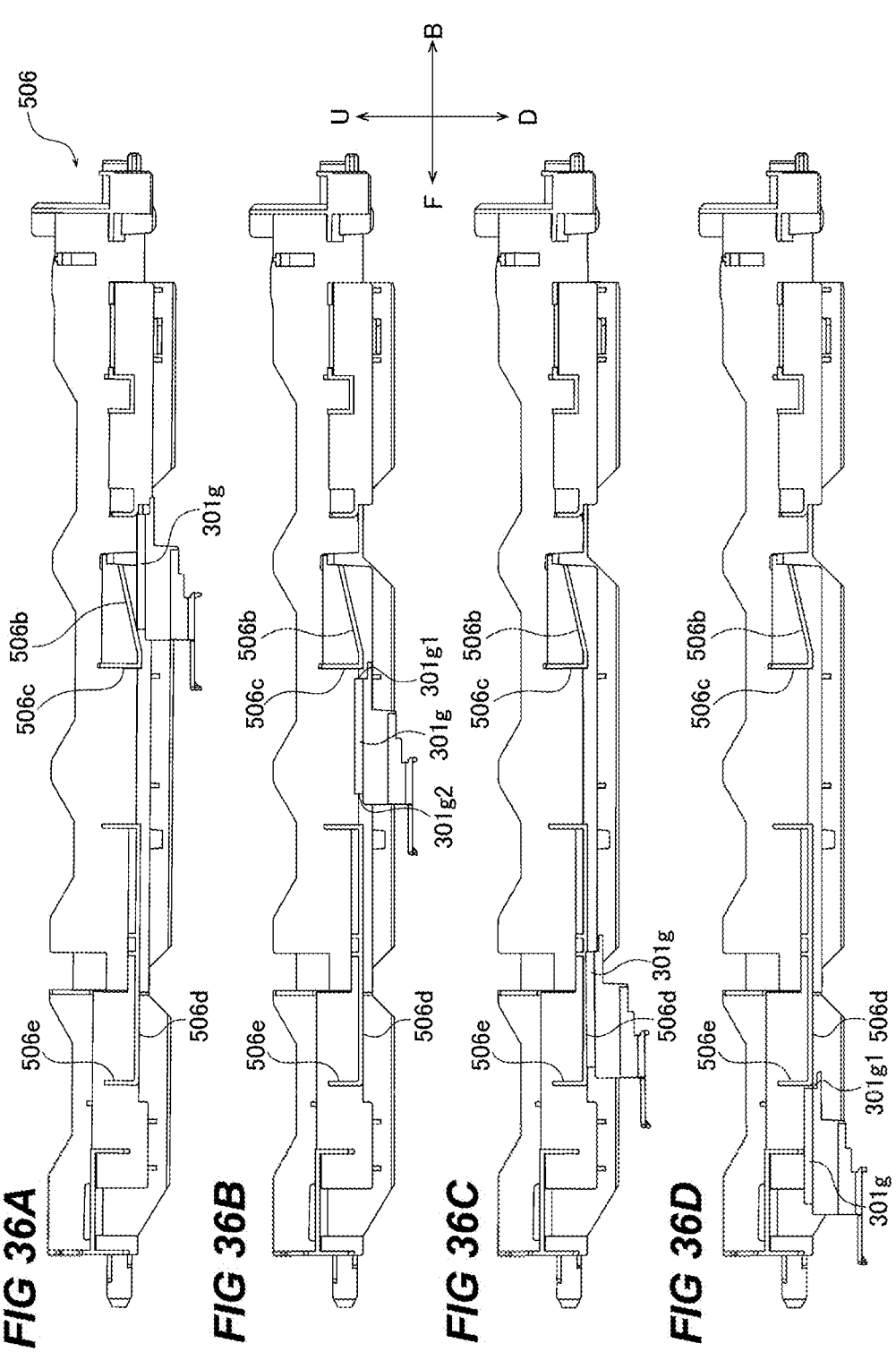

The inclined portion 506b becomes inclined upward towards the backward direction B and is provided immediately before the hole portion 506c in the backward direction B. When the exposure head holding member 506 is inserted in the developing support member 301 of the cartridge tray 30 in the backward direction B, the inclined portion 506b abuts on the restricting portion 301g of the cartridge tray 30. When the exposure head holding member 506 is further inserted in the backward direction B, the inclined portion 506b is pushed up by the restricting portion 301g so that the exposure head holding member 506 is lifted as shown in FIG. 36A. When the inclined portion 506b exceeds the restricting portion 301g, the abutment of the inclined portion 506b on the restricting portion 301g is released as shown in FIG. 36B. Then, due to the weight of the exposure head holding member 506, the hole portion 506c engages with the restricting portion 301g. A fall of the exposure head holding member 506 due to its own weight produces click feeling and an operational worker can recognize the engagement of the exposure head holding member 506 in the first position. In the state where the hole portion 506c is engaged with the restricting portion 301g, the exposure head holding member 506 cannot be inserted into and drawn out from the cartridge tray 30 so that the movement of the exposure head holding member 506 in the forward and backward directions is restricted in the first position. The position where the hole portion 506c engages with the restricting portion 301g is the FFC inserting and drawing out position (first position) where the FFC 58 is inserted into and drawn out from the FFC connector 57 of the exposure head 4. In this way, the movement of the exposure head holding member 506 in the forward and backward directions is restricted, so that the operation of inserting and drawing out the FFC becomes stabilized and simplified.

The restricting portion 506e is a second movement restricting portion that restricts the movement of the exposure head holding member 506 in the forward and backward directions in the second position (exposure head attaching and detaching position) where the exposure head 4 is located more inner side of the image forming apparatus 100 than in the first position in the forward and backward directions.

The plane portion 506d is provided immediately after the hole portion 506c and immediately before the restricting portion 506e in the backward direction B. When the exposure head holding member 506 is further inserted in the backward direction B after the engagement of the hole portion 506c with the restricting portion 301g is released by lifting the exposure head holding member 506, the plane portion 506d rides on the restricting portion 301g as shown in FIG. 36C. When the exposure head holding member 506 is further inserted in the backward direction B, the plane portion 506d exceeds the restricting portion 301g, so that the abutment of the plane portion 506d on the restricting portion 301g is released as shown in FIG. 36D. Then, due to the weight of the exposure head holding member 506, the restricting portion 506e engages with the restricting portion 301g. In the state where the restricting portion 506e is engaged with the restricting portion 301g, the exposure head holding member 506 cannot be inserted into or drawn out from the cartridge tray 30, and the movement of the exposure head holding member 506 in the forward and backward directions is restricted in the second position. The position where the restricting portion 506e engages with the restricting portion 301g is the exposure head attaching and detaching position (second position) where the exposure head 4 is attached to and detached from the elevating duct 69. In this way, the movement of the exposure head holding member 506 in the forward and backward directions is restricted, so that the operation of attaching and detaching the exposure head becomes stabilized and simplified.

Further, as shown in FIG. 31B, the exposure head holding member 506 is provided with the restricting portion 506*f*, the restricting portion 506*g*, the protruding portion 506*j*, and the guide portion 506*m*. These portions are provided for helping an operational worker dealing with the exposure head 4 during an exchanging operation (See FIGS. 38A to 38C).

In the state where the exposure head holding member 506 is engaged with the developing support member 301, the exposure head holding member 506 is provided with the restricting portion 506*f* at the backside in the forward and backward directions. The restricting portion 506*f* is a first restricting portion that restricts the position of the exposure head 4 in the forward and backward directions (first directions). As shown in FIG. 37A, in the state where the exposure head holding member 506 is engaged with the developing support member 301, the restricting portion 506*f* is located at the backside of the lens array 52 of the exposure head 4 held by the elevating duct 69 and at the frontside of the positioning pin 45B. Further, in the state where the exposure head holding member 506 is engaged with the developing support member 301, the restricting portion 506*f* is located below the upper end of the positioning pin 45B. With this configuration, after the engagement of the restricting portion 506*f* with the elevating duct 69 is released, the restricting portion 506*f* abuts on the positioning pin 45B of the exposure head 4 that is drawn out in the forward direction F, so that the restricting portion 506*f* restricts the position of the exposure head 4 in the forward and backward directions.

In the state where the exposure head holding member 506 is engaged with the developing support member 301, the exposure head holding member 506 is provided with the restricting portion 506*g* at the backside in the forward and backward directions. The restricting portion 506*g* is a third restricting portion that restricts the position of the exposure head 4 in the upward and downward directions (third directions). As shown in FIG. 37B, in the state where the exposure head holding member 506 is engaged with the developing support member 301, the restricting portion 506*g* is located at the backside of the lens array 52 of the exposure head 4 held by the elevating duct 69 and at the frontside of the positioning pin 45B. Further, in the state where the exposure head holding member 506 is engaged with the developing support member 301, the restricting portion 506*g* is located at the upper side of the top surface of the exposure head 4 (top surface of the housing 54) held by the elevating duct 69. With this configuration, even if the exposure head 4 whose engagement on the elevating duct 69 is released is lifted in the upward direction U, the restricting portion 506*g* abuts on the exposure head 4, so that the restricting portion 506*g* restricts the position of the exposure head 4 in the upward and downward directions.

The guide portion 506*m* is a restricting portion that restricts the locus of the positioning pin 45B of the exposure head 4 when the exposure head 4 whose position is restricted by the restricting portion 506*f* and the restricting portion 506*g* is rotated in the counterclockwise direction (direction CCW) towards the seat surface 506*h* of the exposure head holding member 506. By restricting the rotation locus of the exposure head 4 by means of the guide portion 506*m*, the operation of rotation of the exposure head 4 can be stably performed.

The protruding portion 506*j* is an engagement portion that engages with the opening 55*a* of the housing support member 55 of the exposure head 4 and serves as a fulcrum when the exposure head 4 is rotated in the counterclockwise direction as described above. By engaging the exposure head 4 with the protruding portion 506*j*, the operation of rotation of the exposure head 4 can be stably performed.

As shown in FIGS. 31B and 31D, the exposure head holding member 506 is provided with the seat surfaces 506*h*, the restricting portion 506*i*, the restricting portion 506*k*, and the restricting portion 506*l*. These portions are holding portions that stably hold the exposure head 4 during an exchanging operation for the exposure head 4 (See FIG. 39).

The exposure head holding member 506 is provided with the seat surfaces 506*h* that are holding portions that temporarily hold the exposure head 4 detached from the elevating duct 69. As shown in FIG. 31C, the heights of the seat surfaces 506*h* becomes lower as it goes from one side to the other side (backward direction B) in the forward and backward directions. Namely, out of the seat surfaces 506*h* provided in the forward and backward directions, a seat surface 506*h* in a more back-side position is lower in the upward and downward directions than a seat surface 506*h* in a more front-side position. Additionally, as shown in FIG. 31D, the heights of the seat surfaces 506*h* becomes lower as it goes from one side to the other side (leftward direction L) in the leftward and rightward directions. Namely, the heights of the seat surfaces 506*h* become lower as it becomes farther from the exposure head 4 held by the elevating duct 69 in the leftward and rightward directions. In this embodiment, the heights of the seat surfaces 506*h* become lower from the right side to the left side in the leftward and rightward directions of the seat surfaces 506*h*. Therefore, in the state where the engagement portion 506*a* is engaged with the developing support member 301, the seat surfaces 506*h* are constituted of surfaces with height differences in the forward and backward directions and the leftward and rightward directions. In the present embodiment, the seat surfaces 506*h* are constituted of tip surfaces of ribs provided in multiple positions in the forward and the backward directions but the invention is not limited to this configuration. The number and position of the seat surfaces 506*h* may be appropriately determined as needed. For example, just one seat surface 506*h* may be provided.

The restricting portion 506*i* is a holding portion that is provided on the front side of the forward and backward directions, abuts on the housing 54 of the exposure head 4 which has been rotated in the counterclockwise direction as described above, and holds the exposure head 4. The restricting portion 506*i* is provided on one of the ribs that are provided in multiple positions in the forward and backward positions. More specifically, the restricting portion 506*i* is provided on the rib on which the most front side seat surface 506*h* is located. The seat surfaces 506*h* abut on one side surface of the exposure head 4, whereas the restricting portion 506*i* abuts on the top surface crossing the one side surface. Namely, the restricting portion 506*i* is configured as a surface crossing the most front side seat surface 506*h*. In the present embodiment, the restricting portion 506*i* is provided on one of the ribs provided in multiple positions in the forward and backward directions but the invention is not limited to this configuration.

The restricting portion 506*k* is a holding portion that is provided on the back side in the forward and backward directions, abuts on the positioning pin 45B of the exposure head 4 which has been rotated in the counterclockwise direction as described above, and holds the exposure head 4. The restricting portion 506*k* is configured as a surface crossing the most back side seat surface 506*h* out of the ribs provided in multiple positions in the forward and backward directions. The seat surfaces 506h abut on one side surface of the exposure head 4, whereas the restricting portion 506k abuts on the tip of the positioning pin 45B that protrudes from the top surface crossing the one side surface.

In the state where the exposure head holding member 506 is engaged with the developing support member 301, the exposure head holding member 506 is provided with the restricting portion 506l at the front side in the forward and backward directions. The restricting portion 506l is a second restricting portion that restricts the position of the exposure head 4 in the leftward and rightward directions (second directions). As shown in FIG. 39, at the front side in the forward and backward directions, the restricting portion 506l abuts on the right-side end portion that is a bottom surface portion of the exposure head 4 held by the seat surface 506h of the exposure head holding member 506 to restrict the position of the exposure head 4 in the leftward and rightward directions.

Procedures of using the exposure head holding member 506 during exchanging operation will be described in detail later.

(FFC Holding Member)

The FFC holding member 507 is one of the tools used for exchanging the exposure head 4 and the FFCs 58. The FFC holding member 507 engages with the cartridge 30, guides the FFCs 58, and has a function to temporarily hold the FFCs 58 during the exchange operation for the exposure head 4 and the FFCs 58.

In the present embodiment, via the exposure head 4 held in the exposure position, the FFC holding member 507 is disposed on the right side in the leftward and rightward directions, which is the opposite side of the exposure head holding member 506. More specifically, the FFC holding member 507 is disposed on the drum support member 302 of the cartridge tray 30 on the drum unit side in the leftward and rightward directions via the exposure head 4 attached to the image forming apparatus 100.

As shown in FIG. 32B, the FFC holding member 507 is provided with the FFC holding portions 507a and 507b that temporarily hold the FFCs 58 detached from the exposure head 4. Two FFC holding portions 507b are provided for holding one surface side of the FFCs 58. The FFC holding portion 507a is provided between the two FFC holding portions 507b for holding the other surface side of the FFCs 58. As shown in FIG. 44, the FFC holding member 507 temporarily holds the FFCs 58 by nipping the FFCs 58 between the FFC holding portion 507a and the FFC holding portion 507b during the operation of exchanging the exposure head 4 and the FCCs 58.

The FFC holding member 507 is provided with the guide portion 507c that guides the FFCs 58 from the leftward and rightward directions and the upward and downward directions to the forward and backward directions. As shown in FIGS. 32B, 32C and 32D, the guide portion 507c includes a surface inclined with respect to the leftward and rightward directions, the upward and downward directions, and the forward and backward directions of the image forming apparatus 100. The directions of inclination include the direction from left to right, the direction from upper to lower, and the direction from back to front of the image forming apparatus. Namely, as shown in FIGS. 32B, 32C and 32D, the surface of the guide portion 507c is substantially parallel to the straight-line connecting left-upper-back side and right-lower-front side of the main body. Therefore, the guide portion 507c guides the FFCs 58 such that the movement of the FFCs 58 is converted from the leftward and rightward directions and the upward and downward directions to the forward and backward directions.

As a result, the guide portion 507c has the function to guide the FFCs 58 and the sheet member 508 such that the movement of the FFCs 58 and the sheet member 508 is converted from the leftward and the rightward directions (first moving directions) into the forward and backward directions (second moving directions) during exchanging operation of the exposure heads and the FFCs (See FIG. 46).

As shown in FIGS. 32C and 32D, the FFC holding member 507 is provided with the restricting portions 507d, 507e, and 507f. The restricting portions 507d, 507e, and 507f are respectively provided with surfaces orthogonal to the forward and backward directions, the leftward and rightward directions, and the upward and downward directions. The restricting portions 507d, 507e, and 507f restrict the position of the FFC holding member 507 in the respective directions by engaging with the drum support member 302 of the cartridge tray 30 during the exchanging operation of the exposure heads and the FFCs. Especially, the position of the FFC holding member 507 is restricted by the restricting portion 507d engaging with the drum support member 302 of the cartridge tray 30. The restricting portion 507d is provided on a part of an elastic deformable shape such as a snap-fit claw. By displacing the restricting portion 507d by pushing the restricting portion 507d with a finger, the engagement of the restricting portion 507d with the cartridge tray 30 is released, so that the movement of the FFC holding member 507 is enabled (See FIGS. 42A and 42B).

Further, the FFC holding member 507 is disposed such that the bottom surface 507g of the FFC holding member 507 overlaps with the toner collecting duct 302f, which is a part of a toner conveying path, provided on the drum support member 302 of the cartridge tray 30. In the position where the restricting portion 507d of the FFC holding member 507 is engaged with the drum support member 302 of the cartridge tray 30, the bottom surface 507g is disposed to overlap with the toner collecting duct 302f of the cartridge tray 30.

Procedures of using the FFC holding member 507 during exchanging operation will be described in detail later.

(Sheet Member)

The sheet member 508 is one of the exchanging tools used for exchanging the exposure head 4 and the FFCs 58. As shown in FIG. 33, the sheet member 508 has an elongated shape. The sheet member 508 is provided with the FFC holding portion 508a and the protruding portion 508b.

The sheet member 508 has the FFC holding portion 508a at one end portion of the sheet member 508. The FFC holding portion 508a is a cable holding portion for holding the contact point 58a of the FFC 58. In this embodiment, the FFC holding portion 508a is constituted of the arm portions 508aa, 508ab, and 508ac. The arm portions 508aa, 508ab, and 508ac are integrally provided with the base portion 508c of the sheet member 508. The arm portions 508aa, 508ab, and 508ac are provided in a region in the widthwise direction orthogonal to the longitudinal direction of the base portion 508c by cutting off a part of the base portion 508c of the sheet member 508. The arm portions 508aa, 508ab, and 508ac are disposed in this order in the longitudinal direction of the sheet member 508. One end side portions of the arm portions 508aa, 508ab, and 508ac in the widthwise directions are integrally provided with the base portion 508c and the other end side portions of the arm portions 508aa, 508ab, and 508ac in the widthwise directions become free ends. The other end side portion of the arm portion 508ab in the widthwise directions is integrally provided with the base portion 508c and the one end side portion of the arm portion 508ab in the widthwise directions becomes a free end. The arm portion 508ab is provided between the arm portion 508aa and the arm portion 508ac. With this configuration, the sheet member 508 can hold the FFC 58 at the FFC holding portion 508a and move integrally with the FFC 58, so that the sheet member 508 has the function to pass the FFC 58 through the FFC guide 503. The contact points 58a of the FFCs 58 are electrically connected to the FFC connectors 57 of the exposure heads 4, respectively. In this embodiment, the configuration in which the FFC holding portion 508a is provided at one end portion of the sheet member 508 in the longitudinal directions, but the invention is not limited to this configuration. It is sufficient that the FFC holding portion 508a is provided on one end side of the sheet member 508 in the longitudinal directions.

The sheet member 508 includes, at the other end portion, the protruding portion 508b that restricts the position of the sheet member 508 such that the sheet member 508 does not enter the inside of the FFC guide 503 during the exchanging operation of the exposure heads and the FFCs. As shown in FIG. 48A, the protruding portion 508b protrudes from both sides of the sheet member 508 in the widthwise directions such that the protruding portion 508b has the width w1 that is greater than the width w2 of the portion of the sheet member 508 other than the protruding portion 508b. More specifically, the protruding portion 508b protrudes such that the width w1 of the widthwise direction is greater than those of the first opening portion 503a (first through hole) and the second opening portion 503b (second through hole) of the FFC guide 503. The width w2 of the portion of the sheet member 508 other than the protruding portion 508b is set to a little greater than the width of the FFCs 58 in the widthwise directions.

The sheet member 508 has such an elongated shape that the length L1 between one end portion (the end portion on the side of the FFC holding portion 508a) and the other end portion (the end portion of the side of protruding portion 508b) is greater than the distance between the first opening portion 503a disposed on one side in the leftward and rightward directions and the second opening portion 503b disposed on the other side in the leftward and rightward directions when guided by the FFC guide 503. Namely, the sheet member 508 has such a length that when guided by the FFC guide 503, the other end portion (protruding portion 508b) is exposed from the first opening portion 503a disposed on the one side in the leftward and rightward directions and the FFC holding portion 508a is exposed from the second opening portion 503b disposed on the other side in the leftward and rightward directions.

In the present embodiment, the sheet member 508 is a PET sheet made from resin, the thickness of the sheet member 508 is within the range from 0.15 [mm] to 0.3 [mm], and the tensile modulus is within the range from 3500 [MPa] to 4500 [MPa]. The material and the thickness are just examples, and the sheet member is not limited to these specifications.

Procedures of using the sheet member 508 during exchanging operation will be described in detail later.
(Exchange of Exposure Heads and FFCs)

Figure 21:
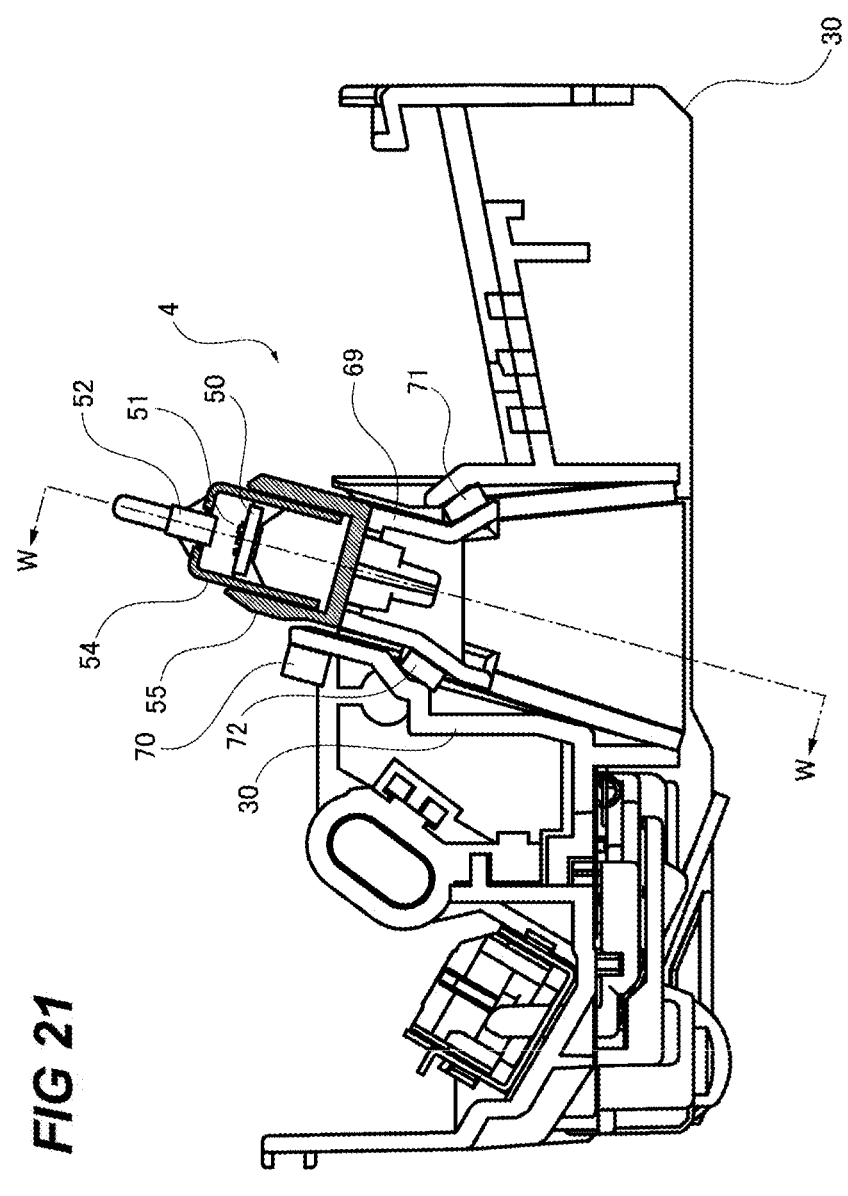
FIG. 21 is a cross-sectional view taken along line X-X in FIG. 14.

Next, referring to FIGS. 21, 25 to 49B, the exchange of the exposure heads 4 and the FFCs 58 will be described in detail. FIG. 21 is a cross-sectional view taken along line X-X in FIG. 14. However, different from FIG. 16, FIG. 21 is a cross-sectional view of the exposure head 4, the elevating duct 69, the cartridge tray 30 viewed from the front side without illustrating the drum unit 23 and developing unit 24.

The exchange of the exposure heads 4 and the FFCs 58 is performed using the above-described exchanging tools. The exchange of the exposure heads 4 and the FFCs 58 is performed in the state shown in FIG. 21 in which the drum unit 23 and developing unit 24 are detached from the cartridge tray 30. In the state where the photosensitive drum (the photosensitive drum unit) is detached from the cartridge tray 30, the exposure head 4 can be manually moved from the retracted position to the exposure position. Therefore, as shown in FIG. 21, the exchange, the detachment, or the attachment of the exposure heads 4 and the FFC 58 is performed in the state where the exposure head 4 is manually moved to the exposure position.

The exposure heads 4 and the FFCs 58 are configured to be detachably attachable to the image forming apparatus 100. The procedures for exchanging the exposure heads 4 and the FFCs 58 will be described in detail. FIGS. 35A to 49B are drawings showing the procedures of the exchange of the exposure heads 4 and the FFCs 58.

The operations of exchanging the exposure heads 4 and the FFCs 58 consist of the following four procedures 1 to 4. In the procedure 1, the old exposure head 4 is detached from the image forming apparatus 100. In the procedure 2, the old FFCs 58 are detached from the image forming apparatus 100. In the procedure 3, new FFCs 58 are attached to the image forming apparatus 100. In the procedure 4, a new exposure head 4 is attached to the image forming apparatus 100.

When only the exposure heads 4 are exchanged without exchanging the FFCs 58, only the procedures 1 and 4 are performed omitting the procedures 2 and 3. When only the FFCs 58 are exchanged without exchanging the exposure heads 4, the procedures 1 to 4 are performed, however, the following operations can be omitted in the procedures 1 and 4. Namely, in the procedure 1, it is not necessary to perform the operations of taking out the exposure head 4 held in the second posture by the exposure head holding member 506 to the outside of the image forming apparatus 100 together with the exposure head holding member 506. Further, in the procedure 4, it is not necessary to perform the operations of holding a new exposure head 4 on the exposure head holding member 506 drawn to the outside of the image forming apparatus 100 in the second posture and attaching the exposure head 4 to the image forming apparatus 100 together with the exposure head holding member 506.
(Procedure 1)

Next, the procedure 1 will be described. The operations for exchanging the exposure heads and the FFCs for the image forming portion 1K for black disposed on the most right side, in the leftward and rightward directions, of the image forming apparatus 100 are exemplified.

As shown in FIGS. 35A and 35B, the exposure head holding member 506 is inserted into the developing support member 301 of the cartridge tray 30 in the backward direction B. Then, the first developing guide portion 301a and the second developing guide portion 301b of the developing support member 301 engages with the outer portion of the exposure head holding member 506. Further, the third developing guide portion 301f of the developing support member 301 engages with the engagement portion 506a of the exposure head holding member 506. With this engagement, the exposure head holding member 506 is guided by the developing support member 301 in the backward direction B.

When the exposure head holding member 506 is inserted in the backward direction B, the inclined portion 506b of the exposure head holding member 506 abuts on the restricting portion 301*g* of the cartridge tray 30 as shown in FIG. 36A. When the exposure head holding member 506 is further inserted in the backward direction B, the inclined portion 506*b* is pushed up by the restricting portion 301*g*, so that the exposure head holding member 506 is lifted upward.

When the exposure head holding member 506 is further inserted in the backward direction B and the inclined portion 506*b* exceeds the restricting portion 301*g* as shown in FIG. 36B, the hole portion 506*c* of the exposure head holding member 506 falls due to the weight of the exposure head holding member 506 such that the restricting portion 301*g* enters the hole portion 506*c* of the exposure head holding member 506 and engages with it. A fall of the exposure head holding member 506 due to its own weight produces click feeling and an operational worker can recognize the engagement of the exposure head holding member 506. In the state where the hole portion 506*c* engages with the restricting portion 301*g*, the exposure head holding member 506 cannot be inserted into and drawn out from the cartridge tray 30. The position where the hole portion 506*c* engages with the restricting portion 301*g* is the first position where the FFC 58 is inserted into and drawn out from the FFC connector 57 of the exposure head 4 held by the exposure head holding member 506. In this configuration, the operation of inserting and drawing out the FFC 58 into/from the exposure head 4 becomes stabilized and simplified.

Next, the engagement of the hole portion of 506*c* with the restricting portion 301*g* can be released by lifting the exposure head holding member 506 upward as shown in FIG. 36C and the exposure head holding member 506 can be further inserted in the backward direction B. When the above engagement is released and the exposure head holding member 506 is further inserted in the backward direction B, the plane portion 506*d* of the exposure head holding member 506 rides on the restricting portion 301*g*.

When the exposure head holding member 506 is further inserted in the backward direction B and the plane portion 506*d* exceeds the restricting portion 301*g*, the restricting portion 506*e* of the exposure head holding member 506 engages with the restricting portion 301*g* due to the weight of the exposure head holding member 506 as shown in FIG. 36D. In the state where the restricting portion 506*e* is engaged with the restricting portion 301*g*, the exposure head holding member 506 cannot be inserted into or drawn out from the cartridge tray 30. The position where the restricting portion 506*e* engages with the restricting portion 301*g* is the second position where the exposure head 4 is attached to and detached from the elevating duct 69. With this configuration, the exposure head holding member 506 is held by the developing support member 301 in the first position where the FFCs 58 are inserted and drawn out and in the second position where the exposure head 4 is attached and detached, so that the operation of attaching the exposure heads can become stabilized and simplified.

Figure 26:
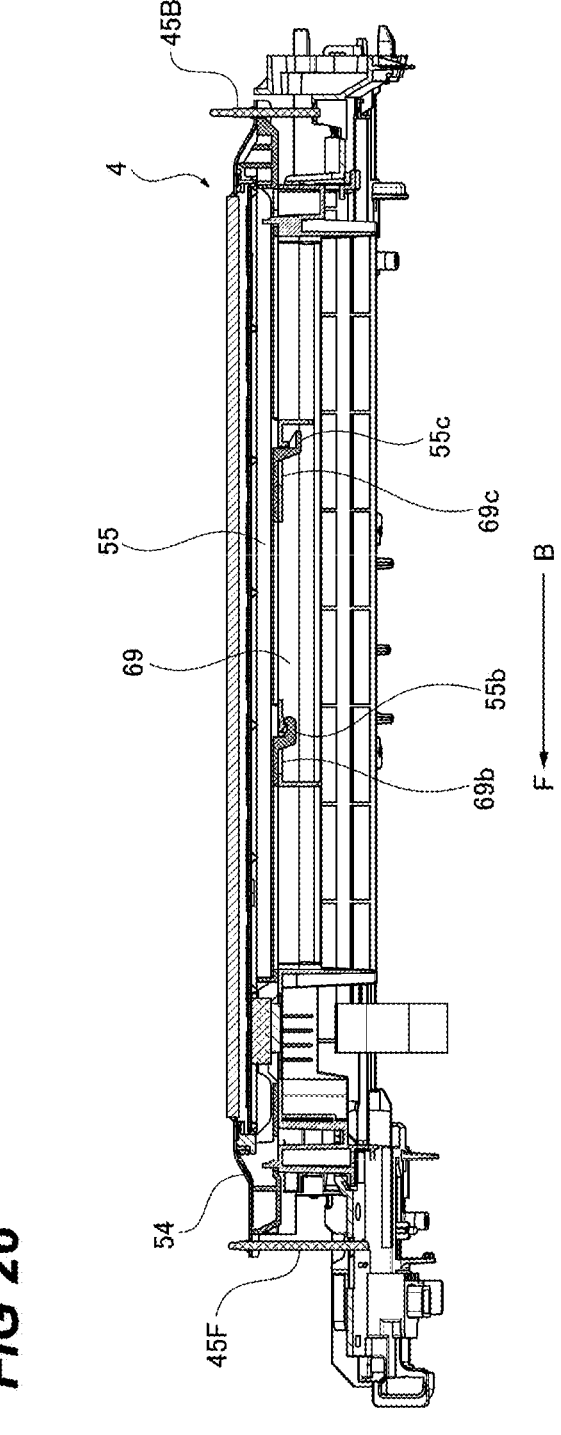
FIG. 26 is a front cross-sectional view of a state where the exposure head is attached to the elevating duct.

Next, the operation of mounting the exposure head 4 on the exposure head holding member 506 is performed. First, the configuration for engaging the exposure head 4 with the elevating duct 69 will be described. FIG. 26 is a cross-sectional view taken along line W-W in FIG. 21 and shows the state where the exposure head 4 is mounted on the elevating duct 69. FIG. 27 is an enlarged cross-sectional view of an engagement portion illustrated in FIG. 26.

The exposure head 4 engaged by the elevating duct 69 is in the first posture shown in FIGS. 16 and 29A. The first posture is the one the exposure head 4 takes when it exposes the photosensitive drum. When the exposure head 4 is in the first posture, the LED chip 53 is disposed on the upper side in the upward and downward directions and the FFC connector 57 is disposed on the lower side (see FIG. 13A). Further, as shown in FIGS. 29A and 30, the FFC 58 is connected to the FFC connector 57 of the exposure head 4 held in the first posture such that the contact point 58*a* is disposed on the left side and the reinforcing plate 58*b* and the protruding portion 58*c* are disposed on the right side of the contact point 58*a* in the leftward and rightward directions.

As shown in FIGS. 26 and 27, the engagement claws 55*b* and 55*c* of the exposure head 4 are formed to protrude toward the elevating duct 69 and extend in the backward direction B, which is the sliding direction of the exposure head 4, to have a substantially L-shape. Therefore, by sliding the exposure head 4 in the backward direction B, the claw tips with a substantially L-shape of the engagement claws 55*b* and 55*c* are engaged with the edges of the engagement holes 69*b* and 69*c*. By this engagement, the exposure head 4 is attached to the elevating duct 69 and becomes integral with the elevating duct 69. By the exposure head 4 sliding in the forward direction F, the engagement of the claw tips having a substantially L-shape of the engagement claws 55*b* and 55*c* is released (See FIG. 25). With this release of the engagement, the exposure head 4 can be detached from the elevating duct 69.

Figure 25:
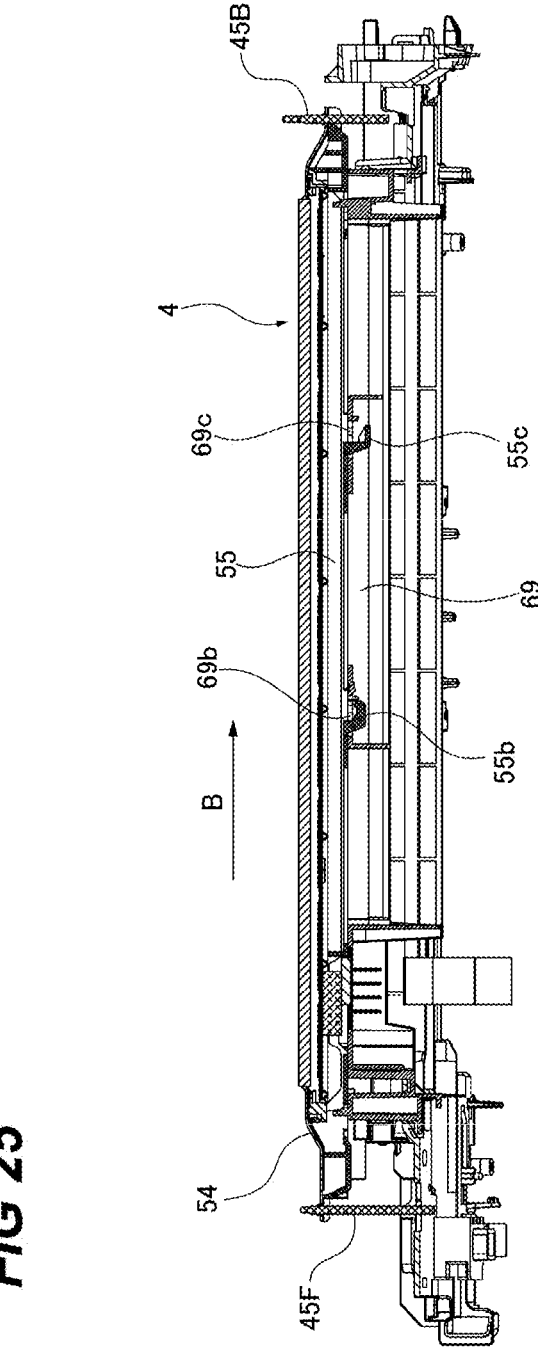
FIG. 25 is a right perspective view of a state where the exposure head is placed in the elevating duct.

Returning to the description of procedure 1, the exposure head 4 is drawn in the forward direction F, so that the engagement of the exposure head 4 with the elevating duct 69 is released (See FIG. 25). When the exposure head 4 is further drawn in the forward direction F, the positioning pin 45B of the exposure head 4 abuts on the restricting portion 506*f* of the exposure head holding member 506 held in the second position and the movement of the exposure head 4 in the forward direction F is restricted as shown in FIG. 37A. In this case, as shown in FIG. 37B, the restricting portion 506*g* of the exposure head holding member 506 is positioned over the exposure head 4. As a result, even if the exposure head 4 is lifted in the upward direction U, the housing 54 abuts on the restricting portion 506*g*, so that the movement of the exposure head 4 in the upward direction U is also restricted and the exposure head 4 remains in the predetermined position.

As shown in FIGS. 38A, 38B and 38C in this order, the exposure head 4 is mounted on the seat surface 506*h* of the exposure head holding member 506 while being rotated in the counterclockwise direction (direction CCW) as viewed from the front side. In this case, the guide portion 506*m* shown in FIG. 37A restricts the locus of the rotation of the positioning pin 45B and serves as a fulcrum of rotation by the protruding portion 506*j* shown in FIG. 39 engaging with the opening 55*a* of the housing support member 55. With this configuration, the exposure head 4 can be stably rotated. The exposure head 4 rotated in this way, is stably held on the exposure head holding member 506 by the restricting portion 506*i*, the restricting portion 506*k*, and the restricting portion 506*l* respectively engage with the housing 54, the positioning pin 45B, and the bottom surface portion 55D of the housing support member 55 as shown in FIG. 39.

As shown in FIGS. 31*c* and 31*d*, the seat surfaces 506*h* of the exposure head holding member 506 are constituted of surfaces with height differences in the forward and backward directions and the leftward and rightward directions. Namely, a seat surface 506*h* in a more back-side position is lower in the upward and downward directions than a seat surface 506*h* in a more front-side position. Additionally, a seat surface 506*h* in a more left-side position is lower in the upward and downward directions than a seat surface 506*h* in a more right-side position. With this configuration, the exposure head 4 rotated in the counterclockwise direction viewed from the front side of the apparatus is urged to the seat surface 506*h* of the exposure head holding member 506 by its own weight, so that the exposure head 4 is uniquely held on the exposure head holding member 506 as shown in FIG. 40A. Further, owing to the configuration in which a seat surface 506*h* in a more frontside position, which is an operational worker side, is higher in the upward and downward directions than a seat surface 506*h* in a more backside position as shown in FIG. 31C, an operational worker can easily perform the above-described operation of rotation.

The exposure head 4 that is rotated in the counterclockwise direction and mounted on the seat surface 506*h* of the exposure head holding member 506 is held on the exposure head holding member 506 in the second posture shown in FIGS. 39 and 40A. The second posture is different from the first posture and is the holding posture for exchanging the exposure heads 4. Further, in the second posture, the LED chip 53 is disposed on the left side and the FFC connector 57 is disposed on the right side in the leftward and rightward directions. As shown in FIGS. 40A and 40B, the FFC 58 is connected to the connector 57 of the exposure head 4 held in the second posture such that the contact point 58*a* is disposed on the lower side and the reinforcing plate 58*b* and the protruding portion 58*c* are disposed on the upper side of the contact point 58*a* in the upward and downward directions.

Next, the extra length treatment of the FFC 58 connected to the exposure head 4 is performed in order to take out the exposure head 4 held in the second posture by the exposure head holding member 506. One end portion of the FFC 58 is connected to the FFC connector 57 of the exposure heads 4 and the other end portion of the FFC 58 is connected to the connectors 501 of the circuit board 502 disposed on the left side of the main body of the image forming apparatus 100. As shown in FIG. 41A, the other end portion of the FFC 58K is detached from the connector 501K on the circuit board 502 in the image forming portion 1K for black, and the biasing member 504 is detached from the FFC guide 503 to enable the FFC 58K to be movable. When the FFC 58K is pushed from the left side to the right side (rightward direction R) in the leftward and rightward directions, the FFC 58K moves to the right side (rightward direction R) in the FFC guide 503 to pass through the second opening portion 503*b*K of the FFC guide 503 as shown in FIG. 41B. Since the one end portion of the FFC 58K is connected to the FFC connector 57K and its movement is restricted, the FFC 58K that has passed through the second opening portion 503*b*K is let out in the space above the drum support member 302 of the cartridge tray 30 as shown in FIG. 41C. The FFC 58K that has been let out in the space above the drum support member 302 forms a bent portion 58*d* that is largely more bent between the second opening portion 503*b*K and the FFC connector 57K than before being let out. In this case, the total length (extra length) Ld of the bent portion 58*d* is a necessary one for the operations of drawing out the exposure head 4 in the forward direction F. The bent portion 58*d* accounts for the part of the FFC 58K from the position where the FFC 58K has been just exposed from the cartridge tray 30 after having passed through the second opening portion 503*b*K to the position of the end portion of the FFC 58K connected to the FFC connector 57K.

Next, as shown in FIG. 42A, the FFC holding member 507 is inserted into the drum support member 302 in the backward direction B. In this case, as shown in FIG. 42B, the FFC holding member 507 is inserted such that the guide portion 507*c* of the FFC holding member 507 passes through the inside of the bent portion 58*d* of the FFC 58K. Namely, the guide portion 507*c* of the FFC holding member 507 enters the inside of the bent portion 58*d* of the FFC 58K between the one end portion and the other end portion of the bent portion 58*d*. The one end portion of the bent portion 58*d* is the end portion of the FFC 58K connected to the FFC connector 57K. Further, the other end portion of the bent portion of the bent portion 58*d* is the portion, located below the one end portion, that has just been exposed from the cartridge tray 30 after having passed through the second opening portion 503*b*K. Then, the restricting portions 507*e* and 507*f* (See FIGS. 32C and 32D) of the FFC holding member 507 inserted in the backward direction B are guided by engaging with the drum support member 302 to respectively restrict the positions of the FFC holding member 507 in the leftward and right directions and the upward and downward directions. Further, the restricting portion 507*d* of the FFC holding member 507 engages with the engagement portion 302*e* provided on the drum support member 302 to restrict the position of the FFC holding member 507 in the forward and backward directions. In this case, the bottom surface 507*g* of the FFC holding member 507 is disposed overlapping with the toner collecting duct 302*f*, which is a part of the toner conveying path. As a result, the toner collecting duct 302*f* of the cartridge tray 30 is blocked by the FFC holding member 507.

Next, the operations for detaching the FFC 58 from the FFC connector 57 of the exposure head 4 is performed. As shown in FIG. 36D and described before, the restricting portion 506*e* of the exposure head holding member 506 engages with the restricting portion 301*g*, so that the movement in the forward and backward directions of the exposure head holding member 506 in the exposure head attaching and detaching position (second position) is restricted and the exposure head holding member 506 cannot be inserted or drawn out. Therefore, as shown in FIG. 36C, by lifting the exposure head 4 upward, the engagement of the restricting portion 506*e* with the restricting portion 301*g* is released and the exposure head holding member 506 is drawn out in the forward direction F. At this moment, the plane portion 506*d* is placed on the restricting portion 301*g*. When the exposure head holding member 506 is further drawn out from the cartridge tray 30 in the forward direction F and the plane portion 506*d* exceeds the restricting portion 301*g* as shown in FIG. 36B, the exposure head falls due to its own weight and the restricting portion 301*g* enters and engages with the hole portion 506*c*. As described before, the position where the restricting portion 301*g* engages with the hole portion 506*c* is the FFC inserting and drawing out position (first position) where the FFC 58 is inserted into and drawn out from the FFC connector 57 of the exposure head 4, which is shown in FIGS. 43A and 43B.

In the FFC inserting and drawing out position shown in FIGS. 43A and 43B, the movement of the exposure head holding member 506 in the forward and backward directions is restricted by the engagement of restricting portion 301*g* with the hole portion 506*c* and the exposure head holding member 506 is in the state where a part of the exposure head 4 is exposed to the outside of the image forming apparatus 100 in the forward and backward directions. More specifically, the FFC connector 57 of the exposure head 4 held on the exposure head holding member 506 in the FFC inserting and drawing out position is exposed to the outside from the front side plate 100F of the image forming apparatus 100.

In the FFC inserting and drawing out position, the operational worker holds the protruding portion 58*c* provided on the FFC 58 and draws out the FFC 58 from the FFC connector 57 in the rightward direction R. Since operational workers often work by using their right hand, the configuration in which the reinforcing plate 58*b* and the protruding portion 58*c* are disposed on the upper side (in the upward direction U) of the contact point 58*a* as described before makes easy the drawing out operation of the FFC 58 in the rightward direction R. Further, as shown in FIG. 43B, since the FFC connector 57 of the exposure head 4 held on the exposure head holding member 506 is drawn out from the front side plate 100F to the front side, the visibility is improved, so that the FFC inserting and drawing out operation becomes easy. The FFC 58 detached from the exposure head 4 is held by being nipped between the FFC holding portion 507*a* and the FFC holding portion 507*b* of the FFC holding member 507 as shown in FIG. 44. With this configuration, the FFC inserting and drawing out operation can be stabilized and simplified as described above.

Next, the operation for taking out the exposure head 4 from the image forming apparatus 100 is performed. As shown in FIG. 36A, by lifting the exposure head holding member 506 upward, the engagement of restricting portion 301*g* with the hole portion 506*c* can be released, so that the exposure head holding member 506 can be further drawn in the forward direction F. At this moment, the inclined portion 506*b* of the exposure head holding member 506 is pushed and placed on the restricting portion 301*g*. By subsequently drawing out the exposure head holding member 506 in the forward direction F, the exposure head 4 can be taken out from the image forming apparatus 100 together with the exposure head holding member 506 as shown in FIG. 45. With this configuration, the operation of taking out the exposure head can be stabilized and simplified as described above.

(Procedure 2)

Next, the procedure 2 will be described.

When the procedure 1 is completed, as shown in FIG. 45, the FFC 58K is held on the FFC holding member 507 and one end portion of the FFC 58K is exposed to the outside (front side) from the front side plate 100F of the image forming apparatus 100. The FFC 58K whose one end portion is held is folded over along the guide portion 507*c* in the direction crossing the backward direction B as shown in FIG. 43A, and passes through the inside of the FFC guide 503 via the second opening portion 503*b*K in the left and right directions as shown in FIG. 41B. Further, the other end portion of the FFC 58K passes through the first opening portion 503*a* and is exposed to the outside of the FFC guide 503.

First, the one end portion of the FFC 58K is detached from the FFC holding portion 507*a* and the FFC holding portion 507*b*. The detached one end portion of the FFC 58 is attached to the FFC holding portion 508*a* of the sheet member 508 to be held as shown in FIGS. 46A, 46B and 46C. The FFC holding portion 508*a* is constituted of the arm portions 508*aa*, 508*ab* and 508*ac*, which are provided in three positions as shown in FIG. 46B. The FFC 58 is nipped by the arm portions 508*aa*, 508*ab* and 508*ac*, and the base portion 508*c* to be held. The arm portion 508*ac*, which is closest to the tip of the FFC 58, is configured to hold the reinforcing plate 58*b* such that the FFC 58 is not separated from the sheet member 508 as shown in FIG. 46C. Specifically, the arm portion 508*ac*, which is closest to the tip of the FFC 58, holds the reinforcing plate 58*b* such that the arm portion 508*ac* enters between the protruding portion 58*c* and the FFC 58 to be caught between the reinforcing plate 58*b* and the FFC 58 and the FFC 58 is not separated from the sheet member 508. Namely, the arm portion 508*ac* out of the three arm portions 508*aa*, 508*ab* and 508*ac* enters between the reinforcing plate 58*b* and the FFC 58 such that the FFC 58 is nipped between the base portion 508*c* and the arm portion 508*ac*. With this configuration, the FFC 58 and the sheet member 508 can move integrally with each other.

Further, as shown in FIG. 46C, the FFC 58 is held by the sheet member 508 such that the contact point 58*a* of the FFC 58 is in contact with the base portion 508*c* of the sheet member 508. As a result, the contact point 58*a* of the FFC 58 is protected by the sheet member 508 such that the contact point 58*a* of the FFC 58 does not slide on another member.

When the FFC 58K in the state shown in FIG. 41B is drawn out in the leftward direction L, the FFC 58K and the sheet member 508 are drawn in in the backward direction B shown in FIG. 46A. The FFC 58 and the sheet member 508 are folded over at the guide portion 507*c*, pass through the inside of the FFC guide 503 via the second opening portion 503*b*K of the FFC guide 503, pass through the first opening portion 503*a*, and as shown in FIG. 47A are drawn out from the left side of the main body. At this moment, the FFC 58K is held by the sheet member 508 to pass through the inside of the FFC guide 503 as shown in FIG. 47A. Namely, the end portion of the FFC holding portion 508*a* of the sheet member 508 and the end portion of the FFC 58K have passed through the inside of the FFC guide 503 to be exposed from the first opening portion 503*a*. Further, as shown in FIG. 47C, the protruding portion 508*b* of the sheet member 508 is exposed to the front side of the image forming apparatus 100. Then, the FFC 58K is detached from the FFC holding portion 508*a* of the sheet member 508. With above operations, the FFC 58 before exchange can be detached from the image forming apparatus 100 and simultaneously the sheet member 508 can be disposed in the image forming apparatus 100.

As described above, the sheet member 508 is a PET sheet having a thickness of 0.15 to 0.3 [mm] and a tensile modulus of 3500 to 4500 [MPa]. When the thickness or the tensile modulus is low, the strength or the stiffness of the sheet member is low, so that the workability of exchanging operations deteriorates due to breakage or buckling of the sheet member 508 in the exchanging operations. Further, when the thickness is greater, the sheet member 508 cannot pass through the inside of the FFC guide 503, which also leads to the deterioration of workability. Furthermore, when the tensile modulus is greater, the stiffness of the sheet member 508 becomes high and the resistance becomes high in guiding the sheet member 508 with the guide portion 507*c*, which also leads to the deterioration of workability. Therefore, the thickness of the sheet member 508 is set from 0.15 [mm] to 0.3 [mm] and the tensile modulus of the sheet member 508 is set from 3500 [MPa] to 4500 [MPa].

Next, the case will be described where the operational worker has drawn too much the FFC 58K and the sheet member 508 in the leftward direction (left direction L) in the leftward and rightward directions by mistake. The protruding portion 508*b* is provided on the end portion of the sheet member 508 that is opposite the FFC holding portion 508*a* that holds the FFC 58. The width w1 in the region t1 of the protruding portion 508*b* of the sheet member 508, the width w2 in the region t2 of the portion other than the protruding portion 508*b*, and the width w3 of the second opening portion 503*b* of the FFC guide 503 have the following relation: w1>w3>w2.

Namely, the sheet member 508 has the first region t1 (protruding portion 58*b*) that is wider than the second opening portion 503b of the FFC guide 503, and the second region t2 (base portion 508c) that is narrower than the second opening portion 503b. With this configuration, the region t2 of the sheet member 508 (base portion 508c including the FFC holding portion 508a) can pass through the second opening portion 503b of the FFC guide 503, but the region t1 (protruding portion 508b) cannot do so. Therefore, even when the operational worker has drawn too much the FFC 58K and the sheet member 508, the protruding portion 508b is caught by the second opening portion 503b as shown in FIGS. 48A and 48B. Namely, the protruding portion 508b serves as a stopper and prevents the sheet member 508 from being detached from the FFC guide 503.

As shown in FIGS. 48C and 33, the entire length L1 of the sheet member 508 is longer than the three times the distance D between the centers of adjacent two photosensitive drums 2, i.e., the distance 3D. Namely, the entire length L1 of the sheet member 508 is greater than the distance 3D between the center of the most left side photosensitive drum 2Y, which is located at one end side and the center of the most right side photosensitive drum 2K, which is located at the other end side in the leftward and rightward directions (disposing directions) out of the multiple photosensitive drums 2 (2Y, 2M, 2C, and 2K). Further, the sheet member 508 has an elongated shape whose entire length L1 is greater than the one from the first opening portion 503a as a first through hole to the second opening portion 503b (second opening portion 503bK) as a second through hole via the FFC guide 503. The second opening portion 503b as a second through hole is the second opening portion 503bK located at the farthest location from the circuit board 502 in the leftward and rightward directions. The entire length L1 of the sheet member 508 is the one from the FFC holding portion 508a as one end portion to the protruding portion 508b as the other end portion. With this configuration, at least one of the FFC holding portion 508a and protruding portion 508b is on the outside of the image forming apparatus 100, so that the operational worker can work on the outside of the image forming apparatus 100.

As described above, the configuration is exemplified in which the first through hole (first opening portion 503a) and the second through hole (second opening portion 503b) through which the sheet member 508 passes are provided on the FFC guide 503, but the invention is not limited to this configuration. For example, the first through hole can be provided on another member other than the FFC guide 503, or the second opening portion 503b can be provided on another member such as the elevating duct 69 and the cartridge tray 30 via the FFC guide 503. It is sufficient that that the entire length L1 of the sheet member 508 is greater than the distance between the first through hole and the second through hole via the FFC guide 503.

(Procedure 3)

Next, the procedure 3 will be described.

When the procedure 2 is completed, the sheet member 508 has passed through the first opening portion 503a and the FFC holding portion 508a is exposed from the left side of the main body. The new FFC 58 is attached to the FFC holding portion 508a of the sheet member 508 as shown in FIG. 47A. As a result, the FFC 58 and the sheet member 508 can be moved integrally with each other. When the sheet member 508 in the state shown in FIG. 47C is drawn in the front side of the main body (in the forward direction F), the FFC 58 and the sheet member 508 is drawn in the rightward direction R shown in FIG. 47A. The FFC 58 and the sheet member 508 pass through the first opening portion 503a of the FFC guide 503, travels through the inside of the FFC guide 503, is folded over at the guide portion 507c of the FFC holding member 507 while forming a loop with the side of the contact point 58a inside, and is drawn out from the front side of the main body as shown in FIG. 46A. In this case, the guide portion 507c of the FFC holding member 507 guides the FFC 58 and the sheet member 508 such that the moving direction of the FFC 58 and the sheet member 508 is changed from the leftward and right directions as the first moving direction (rightward direction R) to the forward and backward direction directions as the second moving direction (forward direction F). The guide portion 507c has a surface inclined in the leftward and rightward directions and the upward and the downward directions of the image forming apparatus 100. The inclined directions include the direction from the left-upper position to the right-lower position and the direction from the upper-back position to the lower-front position of the image forming apparatus 100. With this configuration, a smooth change of the moving direction can be performed (See FIG. 47C).

The FFC 58K is held as to travel through the inside of the FFC guide 503 as shown in FIG. 29A. The other end portion of the FFC 58K is exposed to the left side of the image forming apparatus 100 as shown in FIG. 41B and the one end portion of the FFC 58K is exposed to the front side of the image forming apparatus 100 as shown in FIG. 46A. Then, the FFC 58 is detached from the FFC holding portion 508a of the sheet member 508. The detached FFC 58 is held by being nipped between the FFC holding portions 507a and 507b of the FFC holding member 507 as shown in FIG. 44. With the above operations, a new FFC 58 can be attached to the image forming apparatus 100, and simultaneously the sheet member 508 can be taken out from the image forming apparatus 100.

(Procedure 4)

Next, the procedure 4 will be described.

First, the exposure head 4 is set on the exposure head holding member 506 as shown in FIG. 39. By the restricting portions 506i, 506k, and 5061 respectively abut on the housing 54, the positioning pin 45B, the bottom surface portion 55D of the housing support member 55, the exposure head 4 is stably held on the exposure head holding member 506.

Next, like the procedure 1, as shown in FIG. 44, the exposure head holding member 506 is inserted into the developing support member 301 of the cartridge tray 30 in the backward direction B. Then, the exposure head holding member 506 engages with the developing support member 301 and is guided by the developing support member 301 in the backward direction B.

When the exposure head holding member 506 is inserted in the backward direction B, the inclined portion 506b of the exposure head holding member 506 abuts on the restricting portion 301g of the cartridge tray 30 as shown in FIG. 36A, the exposure head holding member 506 is lifted upward. When the inclined portion 506b exceeds the restricting portion 301g as shown in FIG. 36B, the hole portion 506c of the exposure head holding member 506 falls due to the weight of the exposure head holding member 506 such that the restricting portion 301g enters the hole portion 506c and engages with it. The position where the hole portion 506c engages with the restricting portion 301g is the first position where the FFC 58 is inserted into and drawn out from the FFC connector 57 of the exposure head 4 held by the exposure head holding member 506 as shown in FIG. 44.

The operational worker holds the protruding portion 58c provided on the FFC 58, detaches the FFC 58 from the FFC holding member 507, and inserts the FFC 58 in the leftward direction L to the FFC connector 57 of the exposure head 4 held in the second posture as shown in FIG. 43A. Since operational workers often work by using their right hand, the configuration in which the protruding portion 58c is disposed on the upper side (in the upward direction U) as described before makes easy the inserting operation. Further, since the FFC connector 57 of the exposure head 4 and the end portion of the FFC 58 are drawn out to a more front side than the front side plate 100F of the image forming apparatus 100 as shown in FIG. 43B, the visibility is improved, so that the operation becomes easy. With this configuration, the FFC inserting and drawing out operation can be stabilized and simplified as described above.

Next, the engagement of the hole portion 506c with restricting portion 301g can be released by lifting the exposure head holding member 506 upward as shown in FIG. 36C and the exposure head holding member 506 can be further inserted in the backward direction B. When the above engagement is released and the exposure head holding member 506 is further inserted in the backward direction B, the plane portion 506d of the exposure head holding member 506 rides on the restricting portion 301g.

When the exposure head holding member 506 is further inserted in the backward direction B and the plane portion 506d exceeds the restricting portion 301g, the restricting portion 506e of the exposure head holding member 506 engages with the restricting portion 301g due to the weight of the exposure head holding member 506 as shown in FIG. 36D. In the state where the restricting portion 506e is engaged with the restricting portion 301g, the exposure head holding member 506 cannot be inserted into or drawn out from the cartridge tray 30. As described above, the position where the restricting portion 506e engages with the restricting portion 301g is the second position where the exposure head 4 is attached to and detached from the elevating duct 69. After the exposure head holding member 506 is disposed in the second position, the engagement of the restricting portion 507d of the FFC holding member 507 is released by, for example, elastically deforming the restricting portion 507d, and the FFC holding member 507 is drawn in the forward direction F to be taken out from the image forming apparatus 100.

Next, the operation of placing the exposure head 4 on the elevating duct 69 is performed. The exposure head 4 is held on the seat surface 506h of the exposure head holding member 506 in the second posture shown in FIG. 38C. Next, as shown in FIGS. 38C, 38B, 38A in this order, the exposure head 4 is rotated in the clockwise direction (direction CW) viewed from the front surface side such that the bottom surface portion 55D of the housing support member 55 is placed on the top surface portion 69U of the elevating duct 69. At this moment, the guide portion 506m of the exposure head holding member 506 held in the second position restricts the locus of the positioning pin 45B of the exposure head 4, so that the exposure head 4 can be stably rotated. Further, as shown in FIG. 25, the engagement claws 55b, and 55c of the exposure head 4 fall into the inside of the engagement holes 69b, and 69c of the elevating duct 69, respectively. Namely, the engagement claws 55b, and 55c of the exposure head 4 engage with the engagement holes 69b, and 69c of the elevating duct 69 in the protruding direction, respectively. Simultaneously, as shown in FIG. 49A, the lower end portion of the positioning pin 45F of the exposure head 4 falls into the auxiliary fitting portion 30h of the cartridge tray 30 with a gap.

Next, as shown in FIG. 26, by the exposure head 4 being slid with respect to the elevating duct 69 in the backward direction B, the engagement claws 55b and 55c are engaged respectively with the engagement holes 69b and 69c in the extending directions orthogonal to the protruding direction. The engagement claws 55b and 55c of the exposure head 4 are formed as to protrude toward the elevating duct 69, and have a substantially L shape formed as to extend in the backward direction B, which is the sliding direction of the exposure head 4. Therefore, by sliding the exposure head 4 in the backward direction B, the substantially L-shaped claw ends of the engagement claws 55b and 55c respectively engage with the edges of the engagement holes 69b and 69c. With this engagement, the exposure head 4 is attached to the elevating duct 69 and the becomes integral with the elevating duct 69 in the position shown in FIG. 26. Simultaneously, as shown in FIG. 49B, the lower end portion of the positioning pin 45F of the exposure head 4 is inserted into the auxiliary fitting portion 30h of the cartridge tray 30.

As described above, by the exposure head 4 being slid after the posture of the exposure head 4 is stabilized in the state where the engagement claws 55b and 55c of the exposure head 4 are through the engagement holes 69b and 69c of the elevating duct 69, the attaching the exposure head 4 is completed. As a result, an easy attachment of the exposure head 4 can be realized with low cost.

Next, the extra length of the FFC 58 connected to the exposure head 4 is stored. In this case, the extra length of the FFC 58 is one necessary for the operations of drawing out the exposure head 4 in the forward direction F. The extra length of the FFC 58 accounts for the part of the FFC 58 from the position where the FFC 58 has been just exposed from the cartridge tray 30 after having passed through the second opening portion 503bK to the position of the end portion of the FFC 58 connected to the FFC connector 57K.

In the state where the exposure head 4 is attached to the elevating duct 69, the extra length of the FFC 58K is exposed to the space above the drum support member 302 of the cartridge tray 30. In this state, as shown in FIG. 41B, the other end portion of the FFC 58K is exposed to the outside (left side) from the first opening portion 503a on the left side of the main body. Therefore, by drawing the other end portion of the FFC 58K to the left side of the main body (leftward direction L), the FFC 58K is moved to the left side of the main body (leftward direction L) in the FFC guide 503. As a result, the extra length of the FFC 58K exposed to the space above the drum support member 302 is drawn into the inside of the FFC guide 503 from the second opening portion 503bK and is stored in the FFC guide 503 as shown in FIG. 29A. Even if the FFC 58K is drawn in too much, this movement is restricted since the one end portion of the FFC 58K is connected to the FFC connector 57K of the exposure head 4K.

Next, the operations for taking out the exposure head holding member 506 is performed. As shown in FIG. 36D and described before, the restricting portion 506e of the exposure head holding member 506 engages with the restricting portion 301g, so that the exposure head holding member 506 cannot be inserted or drawn out. Therefore, as shown in FIG. 36C, by lifting the exposure head holding member 506 upward, the engagement of the restricting portion 506e with the restricting portion 301g can be released and the exposure head holding member 506 can be drawn out to the front side (in the forward direction F). When the above engagement is released and the exposure head holding member 506 is drawn out to the front side (in the forward direction F), the plane portion 506d of the exposure head holding member 506 rides on the restricting portion 301g.

When the exposure head holding member 506 is further drawn out in the forward direction F and the plane portion 506*d* exceeds the restricting portion 301*g* as shown in FIG. 36B, the hole portion 506*c* of the exposure head holding member 506 falls due to the weight of the exposure head holding member 506 and the restricting portion 301*g* enters and engages with the hole portion 506*c*. As shown in FIG. 36A, by lifting the exposure head holding member 506 upward, the engagement of the restricting portion 301*g* with the hole portion 506*c* can be released, so that the exposure head holding member 506 can be further drawn out in the forward direction F. When the above engagement is released and the exposure head holding member 506 is further drawn out in the forward direction F, the inclined portion 506*b* is pushed and placed on the restricting portion 301*g*. By further drawing out the exposure head holding member 506 in the forward direction F after the inclined portion 506*b* exceeds the restricting portion 301*g*, the exposure head holding member 506 can be taken out from the cartridge tray 30.

By the above operations, the exchanging operations for exposure head 4 and the FFC 58 are completed.

In this embodiment, the configuration is exemplified in which the exposure head holding member 506 can be inserted and drawn out with the exposure head 4 held by the exposure head holding member 506, but the invention is not limited to this configuration. For example, another configuration can be adopted in which the exposure head 4 is detached from the exposure head holding member 506 with the exposure head holding member 506 attached to the cartridge tray 30, and in this state a new exposure head is mounted on the exposure head holding member 506. With this configuration, the exposure head 4 can be exchanged without inserting and drawing out the exposure head holding member 506 during exchanging operations.
(Effect)

Next, the effect of the present embodiment will be described.

In the image forming apparatus 100 according to the present embodiment, when exchanging the exposure head 4, the FFC 58 is inserted and drawn out after the exposure head 4 is temporarily held by the exposure head holding member 506. Further, by inserting and drawing out the exposure head holding member 506 with the exposure head 4 held by the exposure head holding member 506, the exposure head 4 is exchanged. The FFC 58 detached from the exposure head 4 is temporarily held by the FFC holding portions 507*a* and 507*b* of the FFC holding member 507. Furthermore, during the exchanging operations, the FFC holding member 507 is disposed overlapping with the toner collecting duct 302*f*, which is a part of the toner conveying path, to block the toner collecting duct 302*f*. As configured like this, the exchanging operations for the exposure head can be performed without damaging or polluting the exposure head and the FFC and stably with less burden on the operational worker.

Further, in exchanging the FFC 58, the FFC 58 is inserted and drawn out with the contact point 58*a* of the FFC 58 covered by the sheet member 508, and the FFC 58 and the sheet member 508 are guided by the FFC holding member 507. With this configuration, the exchanging operations for the FFC can be performed without damaging or polluting the FFC 58 and stably with less burden on the operational worker. Furthermore, owing to the configuration in which the thickness of the sheet member 508 is set from 0.15 [mm] to 0.3 [mm] and the tensile modulus of the sheet member 508 is set from 3500 [MPa] to 4500 [MPa], the exchanging operations for the FFC can be performed stably with less burden on the operational worker.

Moreover, the FFC 58 is disposed from the left side of the main body (leftward direction L) to the right side of the main body (rightward direction R), and the contact point 58*a* of the FFC 58 is disposed on the left side of the main body (leftward direction L) in the attaching position of the exposure head 4. With this configuration, a loop is formed such that the contact point 58*a* is disposed on the inside of the loop during exchanging operation for the FFC 58, which reduces the possibility of breaking the contact point 58*a*. When the exposure head 4 is exchanged, in the position where the exposure head 4 is held on the exposure head holding member 506, the contact point 58*a* of the FFC 58 is disposed on the lower side (downward direction D) of the main body and the protruding portion 58*c* is disposed on the upper side (upward direction U) of the main body. With this configuration, an operational worker can perform the operations of inserting and drawing out the FFC 58 with their right hand while visually inspecting the protruding portion 58*c*. As a result, a right-handed operational worker can more easily perform the operations.

As described above, in the first embodiment, the exposure heads 4 and the FFCs 58 can be easily exchanged.

Embodiment 2

The image forming apparatus 100 according to the embodiment 2 will be described. The same reference characters are attached to the same components as those of the image forming apparatus 100 according to the embodiment 1 and the description thereof is omitted. In the following, the configuration different from that of the embodiment 1 is described. The FFC, the configuration of the FFC guide, the exchanging tools, and the exchange of exposure heads and the FFC are described in this order.

As shown in FIG. 50, in the present embodiment, the circuit board 602 is on the right side of the image forming apparatus 100 and the exposure head is disposed on the left side of the circuit board 602.
(Configurations of FFC and FFC Guide)

First, the configurations of the FFC 658 and the FFC guide 603 will be described with reference to FIGS. 50 to 52. FIG. 50 shows a perspective view of the exposure head 4, the FFC 658, the circuit board 602, the FFC guide 603. FIG. 51A shows a cross-sectional view of the image forming apparatus 100 shown in FIG. 50 viewed from the front side. FIG. 51B shows an enlarged view of the vicinity of biasing member 604 in FIG. 51A. FIG. 52 shows an enlarged view of the vicinity of the contact point 658*a* in FIG. 51A. In FIG. 52, the exposure head is not illustrated for the description.
(Configuration of FFC)

The image forming apparatus 100 is provided with a plurality of the FFCs 658 (658Y, 658M, 6658C and 58K) for electrically connecting exposure heads 4 (4Y, 4M, 4C, and 4K) to the circuit board 602, respectively. As described above, in the present embodiment, the circuit board 602 is disposed at the right side of the image forming apparatus 100 and the exposure head 4 is disposed at the left side of the circuit board 602. One end portion of each FFC 658 is connected to each exposure head 4 and the other end portion of each FFC 658 is connected to the circuit board 602 so that the exposure heads 4 and the circuit board 602 are electrically connected to each other.

The circuit board 602 is an alternative to the circuit board 502 of the embodiment 1 and has the connector 601 having the same function as that of the connector 501 of the circuit board 502. The other end portions of the FFCs 58 (58Y, 58M, 58C and 58K) connected to the exposure heads 4 are respectively connected to the connectors 601 (601Y, 601M, 601C and 601K). The other configuration of the circuit board 602 is the same as that of the circuit board 502 of the embodiment 1.

As shown in FIG. 50, each FFC 658 connects the FFC connector 57 provided in each exposure head 4 with the connector 601 provided on the circuit board 602. The FFCs 658 (658Y, 658M, 658C and 658K) are disposed in multi-layered form.

As shown in FIG. 52, each of the FFCs 658 (658Y, 658M, 658C and 658K) is provided with the contact point 658a to be electrically connected to the FFC connector 658 of the exposure head 4 and the reinforcing plate 658b for reinforce the contact point 658a at the one end portion. In the FFC 658, the reinforcing plate 658b is secured with double-sided adhesive tape to the surface opposite the one where the contact point 658a is provided.

At the other end portion of each FFC 658 (658Y, 658M, 658C and 658K), a contact point (not shown) to be connected to each of the connectors 601 (601Y, 601M, 601C, and 601K) provided in circuit board 602 is provided.

Further, the reinforcing plate 658b is provided with the protruding portion 658c that protrudes from the surface opposite the contact point 658a. The protruding portion 658c provided on the reinforcing plate 658b has a shape such that the protruding portion 658c can be pinched by fingers when inserting and drawing out the FFC 658 in/from the FFC connector 57.

As shown in FIGS. 51A and 52, in the first posture in which the exposure head 4 exposes the photosensitive drum 2, the reinforcing plate 658b and the protruding portion 658c are disposed at the left side of the contact point 658a. Namely, in the leftward and rightward directions (second directions) of the image forming apparatus 100, the FFC 658 is connected to the connector of the exposure head 4 held in the first posture such that the reinforcing plate 658b and the protruding portion 658c are disposed at the left side of the contact point 658a.

As shown in FIGS. 61A and 61B, in the second posture in which the exposure head 4 is exchanged, the reinforcing plate 658b and the protruding portion 658c are disposed at the upper side of the contact point 658a. Namely, in the upward and downward directions (third directions) of the image forming apparatus 100, the FFC 658 is connected to the connector of the exposure head 4 held in the second posture different from the first posture such that the reinforcing plate 658b and the protruding portion 658c are disposed at the upper side of the contact point 658a.

(Configuration of FFC Guide)

Further, the image forming apparatus 100 is provided with the FFC guide 603 as a guide member that holds the FFCs 658 (658Y, 658M, 658C and 658K) along the leftward and rightward directions. The FFC guide 603 extends in the leftward and rightward directions (second directions). The FFC guide 603 is disposed immediately under the exposure heads 4 in the image forming apparatus 100. Specifically, the FFC guide 603 is disposed immediately under the FFC connectors 57 (57Y, 57M, 57C, and 57K) of the exposure heads 4 linearly along the leftward and rightward directions.

The FFC guide 603 is provided in the image forming apparatus 100 and is configured to restrict the position of the FFCs 658. The parts between the one ends and the other ends of the FFCs 658 are held in the image forming apparatus 100 by the FFC guide 603. As shown in FIG. 51A, the FFC guide 603 has the first opening portion 603a and the second opening portions 603b (603bY, 603bM, 603bC, and 603bK) through which the FFCs 658 pass. The first opening portion 603a is disposed at the right side of the second opening portions 603b. The first opening portion 603a is disposed at the other side (right side) of the FFC guide 603 in the leftward and rightward directions and is a first through hole through which the multilayered FFCs 658 pass. Further, the first opening portion 603a is disposed closer to the circuit board 602 than the four exposure heads 4. The second opening portions 603b are disposed at the one side (left side) of the FFC guide 603 in the leftward and rightward directions and are second through holes through which the FFCs 658 respectively pass. The second opening portions 603b are respectively provided for the exposure heads 4. The first opening portion 603a and the second opening portions 603b are provided on the FFC guide 603 linearly in the leftward and rightward directions.

In the above, the configuration is exemplified in which the first opening portion (first through hole) 603a and the second opening portions (second through holes) 603b are provided on the FFC guide 603. However, the present invention is not limited to this configuration. For example, the first through hole may be provided on another member other than the FFC guide 603. Further, the second through holes may be provided on another member other than the FFC guide 603 such as the elevating duct 69 and the cartridge tray 30. In this case, it is preferable that the second through holes are provided on the side where the FFC holding member 607 is disposed.

The biasing member 604 and the cover member 605 shown in FIGS. 51A and 51B are the same as the biasing member 504 and the cover member 505 and description thereof is omitted.

Next, the path of the FFCs 658 from the circuit board 602 to the exposure heads 4 will be described.

As shown in FIG. 50, the other end portions of the FFCs 658 are connected to the connectors 601 provided on the circuit board 602 disposed in the right side of the main body of the image forming apparatus 100. The FFCs 658 (658Y, 658M, 658C and 658K) that are respectively connected to the connectors 601 of the circuit board 602 disposed on the right side of the main body of the image forming apparatus 100 are multilayered at the right side of the main body and bent so as to head for the left side of the main body from the right side of the main body. As shown in FIG. 51A, the multilayered FFCs 658 pass through the first opening portion 603a of the FFC guide 603 and enter the inside of the FFC guide 603. In this moment, the multilayered FFCs 658 are biased from the upper side to the lower side by the biasing member 604 provided on the FFC guide 603. With the friction force generated by the FFCs 658 being nipped by the biasing member 604 and the FFC guide 603, the FFCs 658 are held not to move in the leftward and rightward directions.

The order of the layers in the upward and downward directions of the FFCs 658 nipped by the biasing member 604 and the FFC guide 603 is for Black (K), cyan (C), magenta (M), and yellow (Y) from the upper side. Namely, the order of the layers from upper side to lower side in the upward and downward directions of the FFCs 658 nipped body the biasing member 604 and the FFC guide 603 conforms to the order of the corresponding exposure heads 4 disposed from right side to left side.

The FFCs 658 entering the inside of the FFC guide 603 are disposed such that the FFCs 658 extend in the leftward and rightward directions along the FFC guide 603. When the FFCs 658 come under the second opening portion 603bK of the FFC guide 603, only the FFC 658K is disposed such that it is bent and separated upward to go towards the FFC connector 57K of the exposure head 4K. The FFC 658K is connected to the FFC connector 57K of the exposure head 4K to electrically connect the circuit board 602 with the exposure head 4K. After the FFC 658K is separated, the multilayered FFCs 658 (658C, 658M, and 658Y) are disposed such that they extend in the leftward and rightward directions as to go from the right side of the main body to the left side of the main body along the FFC guide 603. Thereafter, similarly to the black image forming portion 1K, when the multilayered FFCs 658 come under the second opening portions 603b in each image forming portion 1C, 1M, 1Y, the FFC 658 in the most upper position is disposed such that it is bent and separated upward as to go towards the FFC connectors 57, respectively. The FFCs 658 disposed as to go toward the exposure heads 4 are connected to the FFC connectors 57 of the exposure heads 4 to electrically connect the circuit board 602 with the FFC connectors 57.

As described above, the circuit board 602 is connected to the exposure heads 4 via the FFCs 658. In the above description, the image forming apparatus 100 has four image forming portions 1K, 1M, 1C, and 1K assuming that the image forming apparatus 100 is a color multifunction apparatus. However, the configuration may be adopted in which only one image forming portion 1K is provided assuming that the image forming apparatus 100 is a monochrome multifunction apparatus.

(Restricting Portion of Cartridge Tray)

Referring to FIG. 55, the restricting portion 302g of the cartridge tray 30 will be described. FIG. 55 is an enlarged perspective view in the vicinity of the restricting portion 302g of the cartridge tray 30.

As shown in FIG. 55, the cartridge tray 30 is provided with the restricting portion 302g. By abutting on the hole portion 606c and restricting portion 606i, which are an engagement portion of the exposure head holding member 606 in an operation of exchanging the exposure heads, the restricting portion 302g restricts the movement of exposure head holding member 606 in the forward and backward directions at predetermined positions (first position and second position) (See FIG. 57). When moving the exposure head holding member 606 in the forward and backward directions, the restricting portion 302g restricts both the movement in the forward direction F, which is one direction of the forward and backward directions, and the movement in the backward direction B, which is the other direction of the forward and backward directions.

The restricting portion 302g is provided with two restricting surfaces 302g1 and 302g2.

The restricting surface 302g1 is a first restricting surface that restricts the movement of the exposure head holding member 606 in the forward direction F. The restricting surface 302g2 is a second restricting surface that restricts the movement of the exposure head holding member 606 in the backward direction B. The restricting surfaces 302g1 and 302g2 engage with the hole portion 606c of the exposure head holding member 606 at the first position where the FFC 658 is inserted and removed to/from the exposure head 4 to restrict the movement of the exposure head holding member 606 in the forward and backward directions. The restricting surface 302g1 engages with the restricting portion 606e of the exposure head holding member 606 at the second position where the exposure head 4 is attached and detached to/from the elevating duct 69 to restrict the movement of the exposure head holding member 606 in the forward direction.

In this way, the restricting portion 302g restricts both the movements of the exposure head holding member 606 in the forward direction F and the backward direction B. However, the restricting portion 302g is disposed in the cartridge tray 30 at the position where the restricting portion 302g does not restrict the movement of the drum unit 23 in the forward and backward directions. As a result, the restricting portion 302g does not prevent the drum unit 23 from moving in the forward and backward directions.

In the present embodiment, the configuration is exemplified in which the restricting portion 302g is provided on a separate member from the drum support member 302. However, the present invention is not limited to this configuration and the restricting portion 302g may be provided directly on the drum support member 302. The detailed function of the restricting portion 302g will be described later.

(Exchanging Tools)

Figures 53A, 53B, 53C, 53D:
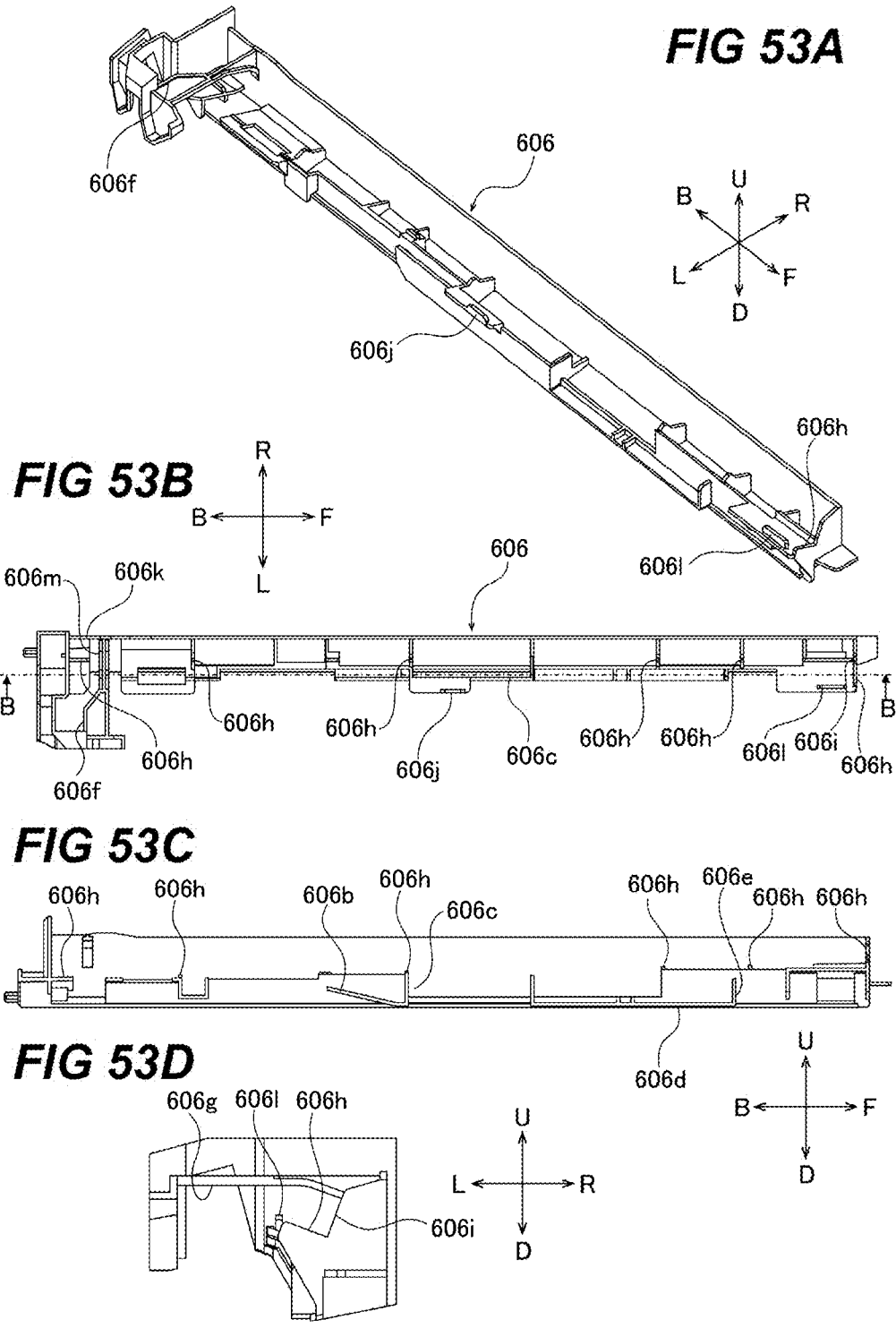

Next, exchanging tools that are used in exchanging the exposure heads 4 and the FFCs 658 in the image forming apparatus 100 will be described with reference to FIGS. 53A to 53D and 54A to 54D. FIG. 53A is a perspective view of the exposure head holding member 606, which is one of the tools for exchanging the exposure heads and the FFCs. FIG. 53B is a top view of the exposure head holding member 606. FIG. 53C is an B-B cross-sectional view of the exposure head holding member 606 in FIG. 53B viewed from the right side. FIG. 53D is a front-side view of the exposure head holding member 606. FIG. 54A is a perspective view of the FFC holding member 607, which is one of the tools for exchanging the exposure heads and the FFCs. FIG. 54B is a top view of the FFC holding member 607. FIG. 54C is a right-side view of the FFC holding member 607. FIG. 54D is a back-side view of the FFC holding member 607.

The exchanging tools for exchanging the exposure heads 4 and the FFCs 658 are used in a case where the exposure heads or the FFCs 658 should be taken out from inside the image forming apparatus 100 and new exposure heads or FFCs should be attached when the exposure heads or the FFCs 658 become out of order. These exchanging tools are used by a service personnel in a market.

The exchanging tools for the exposure heads 4 and the FFCs 658 consist of three members of the exposure head holding member 606, the FFC holding member 607, and the sheet member 508. At least one of the three members is/are attached to the housing or the cover of the image forming apparatus 100 (not shown). In this embodiment, the image forming apparatus 100 is exemplified as to include the exchanging tools for the exposure head 4 and the FFC 658. The invention is not limited to this configuration. For example, the exchanging tools may be included in a new exposure head 4 or a new FFC 658 without not being included in the image forming apparatus 100. Further, a service personnel may bring the exchanging tools. The exchanging tools for the exposure heads 4 and the FFCs 658 are not limited to the three members of the exposure head holding member 606, the FFC holding member 607, and the sheet member 508. The exchanging tool(s) may be one or two of the three members. Furthermore, some of the three members of the exposure head holding member 606, the FFC holding member 607, and the sheet member 508 may be included in the image forming apparatus and the other member(s) may be included in a new exposure head 4 or a new FFC 658 for exchange, or the other member(s) may be brought by a service personnel.

Directions for the exposure head holding member 606 and the FFC holding member 607 are the same as those in the embodiment 1 and description thereof is omitted. The defined forward direction F, the backward direction B, the rightward direction R, the leftward direction L, the upward direction U, and the downward direction D are shown in FIGS. 53A to 53D and 54A to 54D.

(Exposure Head Holding Member)

The exposure head holding member 606 is one of the exchanging tools used for exchanging the exposure heads 4 and the FFCs 658. The exposure head holding member 606 is a movable member that engages with the cartridge tray 30, is able to move in the longitudinal direction (forward and backward directions) of the exposure head 4, and has a function to temporarily hold the exposure head 4 during exchanging operation of the exposure heads 4 and the FFCs 658.

In this embodiment, the exposure head holding member 606 is disposed at the right side (drum unit side) in the leftward and rightward directions via the exposure head 4 held at the exposure position. Specifically, the exposure head holding member 606 is disposed, via the exposure head 4 attached to the image forming apparatus 100, at the drum support member 302 of the cartridge tray 30, which is at the drum unit side.

As shown in FIG. 53C, the exposure head holding member 606 is provided with the inclined portion 606b, the hole portion 606c, the plane portion 606d, and the restricting portion 606e. These portions have shapes for the drum support member 302 to hold the exposure head holding member 606 in the FFC inserting and drawing out position, which is the first position, and the exposure head attaching and in the detaching position, which is the second position during the exchanging operation of the exposure heads 4 (See FIGS. 57A to 57D).

The first position is the FFC inserting and drawing out position in which the FFCs 658 are inserted into the exposure heads 4 and are drawn out from the exposure heads 4. The second position is the exposure head attaching and detaching position in which the exposure heads 4 are attached to and detached from the image forming apparatus 100.

The hole portion 606c is a first movement restricting portion that restricts the movement of the exposure head holding member 606 in the forward and backward directions in the first position (FFC inserting and drawing out position) in which a part of the exposure head 4 is exposed to the outside of the image forming apparatus 100 in the forward and backward directions.

The inclined portion 606b becomes inclined upward towards the backward direction B and is provided immediately before the hole portion 606c in the backward direction B. When the exposure head holding member 606 is inserted in the drum support member 302 of the cartridge tray 30 in the backward direction B, the inclined portion 606b abuts on the restricting portion 302g of the cartridge tray 30. When the exposure head holding member 606 is further inserted in the backward direction B, the inclined portion 606b is pushed up by the restricting portion 302g so that the exposure head holding member 606 is lifted as shown in FIG. 57A. When the inclined portion 606b exceeds the restricting portion 302g, the abutment of the inclined portion 606b on the restricting portion 302g is released as shown in FIG. 57B. Then, due to the weight of the exposure head holding member 606, the hole portion 606c engages with the restricting portion 302g. A fall of the exposure head holding member 606 due to its own weight produces click feeling and an operational worker can recognize the engagement of the exposure head holding member 606 in the first position.

In the state where the hole portion 606c is engaged with the restricting portion 302g, the exposure head holding member 606 cannot be inserted into and drawn out from the cartridge tray 30 so that the movement of the exposure head holding member 606 in the forward and backward directions is restricted in the first position. The position where the hole portion 606c engages with the restricting portion 302g is the FFC inserting and drawing out position (first position) where the FFC 658 is inserted into and drawn out from the FFC connector 57 of the exposure head 4. In this way, the movement of the exposure head holding member 606 in the forward and backward directions is restricted, so that the operation of inserting and drawing out the FFC becomes stabilized and simplified.

The restricting portion 606e is a second movement restricting portion that restricts the movement of the exposure head holding member 606 in the forward and backward directions in the second position (exposure head attaching and detaching position) where the exposure head 4 is located more inner side of the image forming apparatus 100 than in the first position in the forward and backward directions.

The plane portion 606d is provided immediately after the hole portion 606c and immediately before the restricting portion 606e in the backward direction B. When the exposure head holding member 606 is further inserted in the backward direction B after the engagement of the hole portion 606c with the restricting portion 302g is released by lifting the exposure head holding member 606, the plane portion 606d rides on the restricting portion 302g as shown in FIG. 57C. When the exposure head holding member 606 is further inserted in the backward direction B, the plane portion 606d exceeds the restricting portion 302g, so that the abutment of the plane portion 606d on the restricting portion 302g is released as shown in FIG. 57D. Then, due to the weight of the exposure head holding member 606, the restricting portion 606e engages with the restricting portion 302g. In the state where the restricting portion 606e is engaged with the restricting portion 302g, the exposure head holding member 606 cannot be inserted into or drawn out from the cartridge tray 30, and the movement of the exposure head holding member 606 in the forward and backward directions is restricted in the second position. The position where the restricting portion 606e engages with the restricting portion 302g is the exposure head attaching and detaching position (second position) where the exposure head 4 is attached to and detached from the elevating duct 69. In this way, the movement of the exposure head holding member 606 in the forward and backward directions is restricted, so that the operation of attaching and detaching the exposure head becomes stabilized and simplified.

Further, as shown in FIG. 53B, the exposure head holding member 606 is provided with the restricting portion 606f, the restricting portion 606g, the protruding portion 606j, and the guide portion 606m. These portions are provided for helping an operational worker dealing with the exposure head 4 during an exchanging operation (See FIGS. 59A to 59C).

In the state where the exposure head holding member 606 is engaged with the drum support member 302, the exposure head holding member 606 is provided with the restricting portion 606f at the backside in the forward and backward directions. The restricting portion 606f is a first restricting portion that restricts the position of the exposure head 4 in the forward and backward directions (first directions). As shown in FIG. 58A, in the state where the exposure head holding member 606 is engaged with the drum support member 302, the restricting portion 606f is located at the backside of the lens array 52 of the exposure head 4 held by the elevating duct 69 and at the frontside of the positioning pin 45B. Further, in the state where the exposure head holding member 606 is engaged with the drum support member 302, the restricting portion 606*f* is located below the upper end of the positioning pin 45B. With this configuration, after the engagement of the restricting portion 606*f* with the elevating duct 69 is released, the restricting portion 606*f* abuts on the positioning pin 45B of the exposure head 4 that is drawn out in the forward direction F, so that the restricting portion 606*f* restricts the position of the exposure head 4 in the forward and backward directions.

In the state where the exposure head holding member 606 is engaged with the drum support member 302, the exposure head holding member 606 is provided with the restricting portion 606*g* at the backside in the forward and backward directions. The restricting portion 606*g* is a third restricting portion that restricts the position of the exposure head 4 in the upward and downward directions (third directions). As shown in FIG. 58B, in the state where the exposure head holding member 606 is engaged with the drum support member 302, the restricting portion 606*g* is located at the backside of the lens array 52 of the exposure head 4 held by the elevating duct 69 and at the frontside of the positioning pin 45B. Further, in the state where the exposure head holding member 606 is engaged with the drum support member 302, the restricting portion 606*g* is located at the upper side of the top surface of the exposure head 4 (top surface of the housing 54) held by the elevating duct 69. With this configuration, even if the exposure head 4 whose engagement on the elevating duct 69 is released is lifted in the upward direction U, the restricting portion 606*g* abuts on the exposure head 4, so that the restricting portion 606*g* restricts the position of the exposure head 4 in the upward and downward directions.

The guide portion 606*m* is a restricting portion that restricts the locus of the positioning pin 45B of the exposure head 4 when the exposure head 4 whose position is restricted by the restricting portion 606*f* and the restricting portion 606*g* is rotated in the clockwise direction (direction CW) towards the seat surface 606*h* of the exposure head holding member 606. By restricting the rotation locus of the exposure head 4 by means of the guide portion 606*m*, the operation of rotation of the exposure head 4 can be stably performed.

The protruding portion 606*j* is an engagement portion that engages with the opening 55*a* of the housing support member 55 of the exposure head 4 and serves as a fulcrum when the exposure head 4 is rotated in the clockwise direction as described above. By engaging the exposure head 4 with the protruding portion 606*j*, the operation of rotation of the exposure head 4 can be stably performed.

As shown in FIGS. 53B and 53D, the exposure head holding member 606 is provided with the seat surfaces 606*h*, the restricting portion 606*i*, the restricting portion 606*k*, and the restricting portion 606*l*. These portions are holding portions that stably hold the exposure head 4 during an exchanging operation the exposure head 4 (See FIG. 60).

The exposure head holding member 606 is provided with the seat surfaces 606*h* that are holding portions that temporarily hold the exposure head 4 detached from the elevating duct 69. As shown in FIG. 44C, the heights of the seat surfaces 606*h* becomes lower as it goes from one side to the other side (backward direction B) in the forward and backward directions. Namely, out of the seat surfaces 606*h* provided in the forward and backward directions, a seat surface 606*h* in a more back-side position is lower in the upward and downward directions than a seat surface 606*h* in a more front-side position. Additionally, as shown in FIG. 44D, the heights of the seat surfaces 606*h* becomes lower as it goes from the other side to the one side (rightward direction R) in the leftward and rightward directions. Namely, the heights of the seat surfaces 606*h* become lower as it becomes farther from the exposure head 4 held by the elevating duct 69 in the leftward and rightward directions. In this embodiment, the heights of the seat surfaces 606*h* become lower from the left side to the right side in the leftward and rightward directions of the seat surfaces 606*h*. Therefore, in the state where the exposure head holding member 606 is engaged with the drum support member 302, the seat surfaces 606*h* are constituted of surfaces with height differences in the forward and backward directions and the leftward and rightward directions. In the present embodiment, the seat surfaces 606*h* are constituted of tip surfaces of ribs provided in multiple positions in the forward and the backward directions but the invention is not limited to this configuration. The number and position of the seat surfaces 606*h* may be appropriately determined as needed. For example, just one seat surface 606*h* may be provided.

The restricting portion 606*i* is a holding portion that is provided on the front side of the forward and backward directions, abuts on the housing 54 of the exposure head 4 which has been rotated in the clockwise direction as described above, and holds the exposure head 4. The restricting portion 606*i* is provided on one of the ribs that are provided in multiple positions in the forward and backward positions. More specifically, the restricting portion 606*i* is provided on the rib on which the most front side seat surface 606*h* is located. The seat surfaces 606*h* abut on one side surface of the exposure head 4, whereas the restricting portion 606*i* abuts on the top surface crossing the one side surface. Namely, the restricting portion 606*i* is configured as a surface crossing the most front side seat surface 606*h*. In the present embodiment, the restricting portion 606*i* is provided on one of the ribs provided in multiple positions in the forward and backward directions but the invention is not limited to this configuration.

The restricting portion 606*k* is a holding portion that is provided on the back side in the forward and backward directions, abuts on the positioning pin 45B of the exposure head 4 which has been rotated in the clockwise direction as described above, and holds the exposure head 4. The restricting portion 606*k* is configured as a surface crossing the most back side seat surface 606*h* out of the ribs provided in multiple positions in the forward and backward directions. The seat surfaces 606*h* abut on one side surface of the exposure head 4, whereas the restricting portion 606*k* abuts on the tip of the positioning pin 45B that protrudes from the top surface crossing the one side surface.

In the state where the exposure head holding member 606 engages with the drum support member 302, the exposure head holding member 606 is provided with the restricting portion 606*l* at the front side in the forward and backward directions. The restricting portion 606*l* is a second restricting portion that restricts the position of the exposure head 4 in the leftward and rightward directions (second directions). As shown in FIG. 60, at the front side in the forward and backward directions, the restricting portion 606*l* abuts on the right-side end portion that is a bottom surface portion of the exposure head 4 held by the seat surface 606*h* of the exposure head holding member 606 to restrict the position of the exposure head 4 in the leftward and rightward directions.

Procedures of using the exposure head holding member 606 during exchanging operation will be described in detail later.

(FFC Holding Member)

The FFC holding member 607 is one of the tools used for exchanging the exposure head 4 and the FFCs 658. The FFC holding member 607 engages with the cartridge 30, guides the FFCs 658, and has a function to temporarily hold the FFCs 658 during the exchange operation for the exposure head 4 and the FFCs 658.

In the present embodiment, via the exposure head 4 held in the exposure position, the FFC holding member 607 is disposed on the left side in the leftward and rightward directions, which is the opposite side of the exposure head holding member 606. More specifically, the FFC holding member 607 is disposed on the developing support member 301 of the cartridge tray 30 on the drum unit side in the leftward and rightward directions via the exposure head 4 attached to the image forming apparatus 100.

As shown in FIG. 54B, the FFC holding member 607 is provided with the FFC holding portions 607a and 607b that temporarily hold the FFCs 658 detached from the exposure head 4. Two FFC holding portions 607b are provided for holding one surface side of the FFCs 658. The FFC holding portion 607a is provided between the two FFC holding portions 607b for holding the other surface side of the FFCs 658. As shown in FIG. 65, the FFC holding member 607 temporarily holds the FFCs 658 by nipping the FFCs 658 between the FFC holding portion 607a and the FFC holding portion 607b during the operation of exchanging the exposure head 4 and the FFCs 658.

The FFC holding member 607 is provided with the guide portion 607c that guides the FFCs 658 from the leftward and rightward directions to the forward and backward directions. As shown in FIGS. 54B, 54C and 54D, the guide portion 607c includes a surface inclined with respect to the leftward and rightward directions and the upward and downward directions of the image forming apparatus 100. The directions of inclination include the direction from right-upper to left-lower, the direction from upper to lower, and the direction from upper-back to lower-front of the image forming apparatus. Namely, as shown in FIGS. 54B, 54C and 54D, the surface of the guide portion 607c is substantially parallel to the straight-line connecting right-upper-back side and left-lower-front side of the main body. Therefore, the guide portion 607c guides the FFCs 658 such that the movement of the FFCs 658 is converted from the upward and downward directions and the leftward and rightward directions to the forward and backward directions.

As a result, the guide portion 607c has the function to guide the FFCs 658 and the sheet member 508 such that the movement of the FFCs 658 and the sheet member 508 is converted from the leftward and the rightward directions (first moving directions) into the forward and backward directions (second moving directions) during exchanging operation of the exposure heads and the FFCs (See FIG. 67).

As shown in FIGS. 32C and 32D, the FFC holding member 607 is provided with the restricting portions 607d, 607e, and 607f. The restricting portions 607d, 607e, and 607f are respectively provided with surfaces orthogonal to the forward and backward directions, the leftward and rightward directions, and the upward and downward directions. The restricting portions 607d, 607e, and 607f restrict the position of the FFC holding member 607 in the respective directions by engaging with the developing support member 301 of the cartridge tray 30 during the exchanging operation of the exposure heads and the FFCs. Especially, the position of the FFC holding member 607 is restricted by the restricting portion 607d engaging with the developing support member 301 of the cartridge tray 30. The restricting portion 607d is provided on a part of an elastic deformable shape such as a snap-fit claw. By displacing the restricting portion 607d by pushing the restricting portion 607d with a finger, the engagement of the restricting portion 607d with the cartridge tray 30 is released, so that the movement of the FFC holding member 607 is enabled (See FIGS. 63A and 63B).

Further, the FFC holding member 607 is disposed such that the bottom surface 607g of the FFC holding member 607 overlaps with the toner collecting duct 301h, which is a part of a toner conveying path, provided on the developing support member 301 of the cartridge tray 30. In the position where the restricting portion 607d of the FFC holding member 607 engages with the developing support member 301 of the cartridge tray 30, the bottom surface 607g is disposed to overlap with the toner collecting duct 301h of the cartridge tray 30.

Procedures of using the FFC holding member 607 during exchanging operation will be described in detail later.

(Sheet Member)

The sheet member 508 is one of the exchanging tools used for exchanging the exposure head 4 and the FFCs 58. As shown in FIG. 33, the sheet member 508 has an elongated shape. The sheet member 508 is provided with the FFC holding portion 508a and the protruding portion 508b. The sheet member 508 is already described in the embodiment 1 and the duplicate description is omitted. The sheet member 508 can be used as a exchanging tool both in the embodiment 1 and the embodiment 2 by reversing the front side and the back side.

(Exchange/Detachment/Attachment of Exposure Heads and FFCs)

Next, the exchange configuration of the exposure heads 4 and the FFCs 658 will be described using FIGS. 50 to 68A, 68B and 68C. The same content as the embodiment 1 is omitted as appropriate during the description.

The exchange of the exposure heads 4 and the FFCs 658 is performed using the above-described exchanging tools. The exchange of the exposure heads 4 and the FFCs 658 is performed in the state shown in FIG. 21 in which the drum unit 23 and developing unit 24 are detached from the cartridge tray 30. In the state where the photosensitive drum (the photosensitive drum unit) is detached from the cartridge tray 30, the exposure head 4 can be manually moved from the retracted position to the exposure position. Therefore, as shown in FIG. 21, the exchange, the detachment, or the attachment of the exposure heads 4 and the FFC 658 is performed in the state where the exposure head 4 is manually moved to the exposure position.

The exposure heads 4 and the FFCs 658 are configured to be detachably attachable to the image forming apparatus 100. The procedures for exchanging the exposure heads 4 and the FFCs 658 will be described in detail. FIGS. 56A to 68B are drawings showing the procedures of the exchange of the exposure heads 4 and the FFCs 658.

The operations of exchanging the exposure heads 4 and the FFCs 658 consist of the following four procedures 1 to 4. In the procedure 1, the old exposure head 4 is detached from the image forming apparatus 100. In the procedure 2, the old FFCs 658 are detached from the image forming apparatus 100. In the procedure 3, new FFCs 658 are attached to the image forming apparatus 100. In the procedure 4, a new exposure head 4 is attached to the image forming apparatus 100.

When only the exposure heads 4 are exchanged without exchanging the FFCs 58, only the procedures 1 and 4 are performed omitting the procedures 2 and 3. When only the FFCs 58 are exchanged without exchanging the exposure heads 4, the procedures 1 to 4 are performed, however, the following operations can be omitted in the procedures 1 and 4. Namely, in the procedure 1, it is not necessary to perform the operations of taking out the exposure head 4 held in the second posture by the exposure head holding member 606 to the outside of the image forming apparatus 100 together with the exposure head holding member 606. Further, in the procedure 4, it is not necessary to perform the operations of holding a new exposure head 4 on the exposure head holding member 606 drawn to the outside of the image forming apparatus 100 in the second posture and attaching the exposure head 4 to the image forming apparatus 100 together with the exposure head holding member 606.

(Procedure 1)

Next, the procedure 1 will be described. The operations for exchanging the exposure heads and the FFCs for the image forming portion 1Y for yellow disposed on the most left side, in the leftward and rightward directions, of the image forming apparatus 100 is exemplified.

As shown in FIGS. 56A and 56B, the exposure head holding member 606 is inserted into the drum support member 302 of the cartridge tray 30 in the backward direction B. Then, the first drum guide portion 302a and the second drum guide portion 302b of the drum support member 302 engages with the outer portion of the exposure head holding member 606. With this engagement, the exposure head holding member 606 is guided by the drum support member 302 in the backward direction B.

When the exposure head holding member 606 is inserted in the backward direction B, the inclined portion 606b of the exposure head holding member 606 abuts on the restricting portion 302g of the cartridge tray 30 as shown in FIG. 57A. When the exposure head holding member 606 is further inserted in the backward direction B, the inclined portion 606b is pushed up by the restricting portion 302g, so that the exposure head holding member 606 is lifted upward.

When the exposure head holding member 606 is further inserted in the backward direction B and the inclined portion 606b exceeds the restricting portion 302g as shown in FIG. 57B, the hole portion 606c of the exposure head holding member 606 falls due to the weight of the exposure head holding member 606 such that the restricting portion 302g enters the hole portion 606c of the exposure head holding member 606 and engages with it. A fall of the exposure head holding member 606 due to its own weight produces click feeling and an operational worker can recognize the engagement of the exposure head holding member 606. In the state where the hole portion 606c engages with the restricting portion 302g, the exposure head holding member 606 cannot be inserted into and drawn out from the cartridge tray 30. The position where the hole portion 606c engages with the restricting portion 302g is the first position where the FFC 658 is inserted into and drawn out from the FFC connector 57 of the exposure head 4 held by the exposure head holding member 606. In this configuration, the operation of inserting and drawing out the FFC 658 into/from the exposure head 4 becomes stabilized and simplified.

Next, the engagement of the hole portion of 606c with restricting portion 302g can be released by lifting the exposure head holding member 606 upward as shown in FIG. 57C and the exposure head holding member 606 can be further inserted in the backward direction B. When the above engagement is released and the exposure head holding member 606 is further inserted in the backward direction B, the plane portion 606d of the exposure head holding member 606 rides on the restricting portion 302g.

When the exposure head holding member 606 is further inserted in the backward direction B and the plane portion 606d exceeds the restricting portion 302g, the restricting portion 606e of the exposure head holding member 606 engages with the restricting portion 302g due to the weight of the exposure head holding member 606 as shown in FIG. 57D. In the state where the restricting portion 606e engages with the restricting portion 302g, the exposure head holding member 606 cannot be inserted into or drawn out from the cartridge tray 30. The position where the restricting portion 606e engages with the restricting portion 302g is the second position where the exposure head 4 is attached to and detached from the elevating duct 69. With this configuration, the exposure head holding member 606 is held by the drum support member 302 in the first position where the FFCs 658 are inserted and drawn out and in the second position where the exposure head 4 is attached and detached, so that the operation of attaching the exposure heads can become stabilized and simplified.

Next, the operation of mounting the exposure head 4 on the exposure head holding member 606 is performed. The configuration of engagement of the exposure head 4 with the elevating duct 69 is the same as that of the embodiment 1 and the description thereof is omitted.

The exposure head 4 is drawn in the forward direction F, so that the engagement of the exposure head 4 with the elevating duct 69 is released (See FIG. 25). When the exposure head 4 is further drawn in the forward direction F, the positioning pin 45B of the exposure head 4 abuts on the restricting portion 606f of the exposure head holding member 606 held in the second position and the movement of the exposure head 4 in the forward direction F is restricted as shown in FIG. 58A. In this case, as shown in FIG. 58B, the restricting portion 606g of the exposure head holding member 606 is positioned over the exposure head 4. As a result, even if the exposure head 4 is lifted in the upward direction U, the housing 54 abuts on the restricting portion 606g, so that the movement of the exposure head 4 in the upward direction U is also restricted and the exposure head 4 remains in the predetermined position.

As shown in FIGS. 59A, 59B and 59C in this order, the exposure head 4 is mounted on the seat surface 606h of the exposure head holding member 606 while being rotated in the clockwise direction (direction CW) as viewed from the front side. In this case, the guide portion 606m shown in FIG. 58A restricts the locus of the rotation of the positioning pin 45B and serves as a fulcrum of rotation by the protruding portion 606j shown in FIG. 60 engaging with the opening 55a of the housing support member 55. With this configuration, the exposure head 4 can be stably rotated. The exposure head 4 rotated in this way, is stably held on the exposure head holding member 606 by the restricting portion 606i, the restricting portion 606k, and the restricting portion 606l respectively engage with the housing 54, the positioning pin 45B, and the bottom surface portion 55D of the housing support member 55 as shown in FIG. 60.

As shown in FIGS. 53C and 53D, the seat surfaces 606h the exposure head holding member 606 are constituted of surfaces with height differences in the forward and backward directions and the leftward and rightward directions. Namely, a seat surface 606h in a more back-side position is lower in the upward and downward directions than a seat surface 606h in a more front-side position. Additionally, a seat surface 606h in a more left-side position is lower in the upward and downward directions than a seat surface 606h in a more right-side position. With this configuration, the exposure head 4 rotated in the clockwise direction viewed from the front side of the apparatus is urged to the seat surface 606*h* of the exposure head holding member 606 by its own weight, so that the exposure head 4 is uniquely held on the exposure head holding member 606 as shown in FIG. 61A. Further, owing to the configuration in which a seat surface 606*h* in a more frontside position, which is an operational worker side, is higher in the upward and downward directions than a seat surface 606*h* in a more backside position as shown in FIG. 53C, an operational worker can easily perform the above-described operation of rotation.

The exposure head 4 that is rotated in the clockwise direction and mounted on the seat surface 606*h* of the exposure head holding member 606 is held on the exposure head holding member 606 in the second posture shown in FIGS. 60 and 61A. The second posture is different from the first posture and is the holding posture for exchanging the exposure heads 4. Further, in the second posture, the LED chip 53 is disposed on the right side and the FFC connector 57 is disposed on the left side in the leftward and rightward directions. As shown in FIGS. 61A and 61B, the FFC 658 is connected to the connector 57 of the exposure head 4 held in the second posture such that the contact point 658*a* is disposed on the lower side and the reinforcing plate 658*b* and the protruding portion 658*c* are disposed on the upper side of the contact point 658*a* in the upward and downward directions.

Next, the extra length treatment of the FFCs 658 connected to the exposure head 4 is performed in order to take out the exposure heads 4 held in the second posture by the exposure head holding member 606. One end portion of the FFC 658 is connected to the FFC connector 57 of the exposure head 4 and the other end portion of the FFC 658 is connected to the connector 601 of the circuit board 602 disposed on the right side of the main body of the image forming apparatus 100. As shown in FIG. 62A, the other end portion of the FFC 658Y is detached from the connector 601Y on the circuit board 602 in the image forming portion 1Y for yellow, and the biasing member 604 is detached from the FFC guide 603 to enable the FFC 658Y to be movable. When the FFC 658Y is pushed from the right side to the left side (leftward direction L) in the leftward and rightward directions, the FFC 658Y moves to the right side (leftward direction L) in the FFC guide 603 to pass through the second opening portion 603*b*Y of the FFC guide 603 as shown in FIG. 62B. Since the one end portion of the FFC 658Y is connected to the FFC connector 57Y and its movement is restricted, the FFC 658Y that has passed through the second opening portion 603*b*Y is let out in the space above the developing support member 301 of the cartridge tray 30 as shown in FIG. 62C. The FFC 658Y that has been let out in the space above the developing support member 301 forms a bent portion 658*d* that is largely more bent between the second opening portion 603*b*Y and the FFC connector 57Y than before being let out. In this case, the total length (extra length) Ld of the bent portion 658*d* is a necessary one for the operations of drawing out the exposure head 4 in the forward direction F. The bent portion 658*d* accounts for the part of the FFC 658Y from the position where the FFC 658Y has been just exposed from the cartridge tray 30 after having passed through the second opening portion 603*b*Y to the position of the end portion of the FFC 658Y connected to the FFC connector 57Y.

Next, as shown in FIG. 63A, the FFC holding member 607 is inserted into the developing support member 301 in the backward direction B. In this case, as shown in FIG. 63B, the FFC holding member 607 is inserted such that the guide portion 607*c* of the FFC holding member 607 passes through the inside of the bent portion 658*d* of the FFC 658Y Namely, the guide portion 607*c* of the FFC holding member 607 enters the inside of the bent portion 658*d* of the FFC 658Y between the one end portion and the other end portion of the bent portion 658*d*. The one end portion of the bent portion 658*d* is the end portion of the FFC 658Y connected to the FFC connector 57Y Further, the other end portion of the bent portion of the bent portion 658*d* is the portion, located below the one end portion, that has just been exposed from the cartridge tray 30 after having passed through the second opening portion 603*b*Y Then, the restricting portions 607*e* and 607*f* (See FIGS. 54C and 54D) of the FFC holding member 607 inserted in the backward direction B are guided by engaging with the developing support member 301 to respectively restrict the positions of the FFC holding member 607 in the leftward and right directions and the upward and downward directions. Further, the restricting portion 607*d* of the FFC holding member 607 engages with an engagement portion (not shown) provided on the developing support member 301 to restrict the position of the FFC holding member 607 in the forward and backward directions. In this case, the bottom surface 607*g* of the FFC holding member 607 is disposed overlapping with the toner collecting duct 301*h*, which is a part of the toner conveying path. As a result, the toner collecting duct 301*h* of the cartridge tray 30 is blocked by the FFC holding member 607.

Next, the operations for detaching the FFC 658 from the FFC connector 57 of the exposure head 4 is performed. As shown in FIG. 57D and described before, the restricting portion 606*e* of the exposure head holding member 606 engages with the restricting portion 302*g*, so that the movement in the forward and backward directions of the exposure head holding member 606 at the exposure head attaching and detaching position (second position) is restricted and the exposure head holding member 606 cannot be inserted or drawn out. Therefore, as shown in FIG. 57C, by lifting the exposure head 4 upward, the engagement of the restricting portion 606*e* with the restricting portion 302*g* is released and the exposure head holding member 606 is drawn out in the forward direction F. At this moment, the plane portion 606*d* is placed on the restricting portion 302*g*. When the exposure head holding member 606 is further drawn out from the cartridge tray 30 in the forward direction F and the plane portion 606*d* exceeds the restricting portion 302*g* as shown in FIG. 57B, the exposure head falls due to its own weight and the restricting portion 302*g* enters and engages with the hole portion 606*c*. As described before, the position where the restricting portion 302*g* engages with the hole portion 606*c* is the FFC inserting and drawing out position (first position) where the FFC 658 is inserted into and drawn out from the FFC connector 57 of the exposure head 4, which is shown in FIGS. 64A and 64B.

In the FFC inserting and drawing out position shown in FIGS. 64A and 64B, the movement of the exposure head holding member 606 in the forward and backward directions is restricted by the engagement of restricting portion 302*g* with the hole portion 606*c* and the exposure head holding member 606 is in the state where a part of the exposure head 4 is exposed to the outside of the image forming apparatus 100 in the forward and backward directions. More specifically, the FFC connector 57 of the exposure head 4 held on the exposure head holding member 606 at the FFC inserting and drawing out position is exposed to the outside from the front side plate 100F of the image forming apparatus 100.

In the FFC inserting and drawing out position, the operational worker holds the protruding portion 658*c* provided on the FFC 658 and draws out the FFC 658 from the FFC connector 57 in the leftward direction L. The configuration in which the reinforcing plate 658*b* and the protruding portion 658*c* are disposed on the upper side (in the upward direction U) of the contact point 658*a* as described before makes easy the drawing out operation of the FFC 658 in the leftward direction L. Further, as shown in FIG. 64B, since the FFC connector 57 of the exposure head 4 held on the exposure head holding member 606 is drawn out from the front side plate 100F to the front side, the visibility is improved, so that the FFC inserting and drawing out operation becomes easy. The FFC 658 detached from the exposure head 4 is held by being nipped between the FFC holding portion 607*a* and the FFC holding portion 607*b* of the FFC holding member 607 as shown in FIG. 65. With this configuration, the FFC inserting and drawing out operation can be stabilized and simplified as described above.

Next, the operation for taking out the exposure head 4 from the image forming apparatus 100 is performed. As shown in FIG. 57A, by lifting the exposure head holding member 606 upward, the engagement of restricting portion 302*g* with the hole portion 606*c* can be released, so that the exposure head holding member 606 can be further drawn in the forward direction F. At this moment, the inclined portion 606*b* of the exposure head holding member 606 is pushed and placed on the restricting portion 302*g*. By subsequently drawing out the exposure head holding member 606 in the forward direction F, the exposure head 4 can be taken out from the image forming apparatus 100 together with the exposure head holding member 606 as shown in FIG. 66. With this configuration, the operation of taking out the exposure head can be stabilized and simplified as described above.

(Procedure 2)

Next, the procedure 2 will be described.

When the procedure 1 is completed, as shown in FIG. 62B, the FFC 658Y is held on the FFC holding member 607 and one end portion of the FFC 658Y is exposed to the outside (front side) from the front side plate 100F of the image forming apparatus 100. The FFC 658Y whose one end portion is held is folded over along the guide portion 607*c* in the direction crossing the backward direction B as shown in FIG. 64A, and passes through the inside of the FFC guide 603 via the second opening portion 603*b*Y in the left and right directions as shown in FIG. 62B. Further, the other end portion of the FFC 658Y passes through the first opening portion 603*a* and is exposed to the outside of the FFC guide 603.

Similar to the embodiment 1, the one end portion of the FFC 658Y is detached from the FFC holding portion 607*a* and the FFC holding portion 607*b*. The detached one end portion of the FFC 658 is attached to the FFC holding portion 508*a* of the sheet member 508 to be held as shown in FIGS. 67A, 67B and 67C. The FFC holding portion 508*a* is constituted of the arm portions 508*aa*, 508*ab* and 508*ac*, which are provided in three positions as shown in FIG. 67B. The FFC 658 is nipped and held by the arm portions 508*aa*, 508*ab* and 508*ac* of the FFC holding portion 508*a*, and the base portion 508*c*. The arm portion 508*ac*, which is closest to the tip of the FFC 658, is configured to hold the reinforcing plate 658*b* such that the FFC 658 is not separated from the sheet member 508 as shown in FIG. 67C. Specifically, the arm portion 508*ac*, which is closest to the tip of the FFC 658, holds the reinforcing plate 658*b* such that the arm portion 508*ac* enters between the protruding portion 658*c* and the FFC 658 to be caught between the reinforcing plate 658*b* and the FFC 658 and the FFC 658 is not separated from the sheet member 508. With this configuration, the FFC 658 and the sheet member 508 can move integrally with each other.

Further, as shown in FIG. 67C, the FFC 658 is held by the sheet member 508 such that the contact point 658*a* of the FFC 658 is in contact with the base portion 508*c* of the sheet member 508. As a result, the contact point 658*a* of the FFC 658 is protected by the sheet member 508 such that the contact point 658*a* of the FFC 658 does not slide on another member.

When the FFC 658Y in the state shown in FIG. 62B is drawn out in the rightward direction R, the FFC 658Y and the sheet member 508 are drawn in in the backward direction B shown in FIG. 67A. The FFC 658 and the sheet member 508 are folded over at the guide portion 607*c*, pass through the inside of the FFC guide 603 via the second opening portion 603*b*Y of the FFC guide 603, pass through the first opening portion 603*a*, and as shown in FIG. 68A are drawn out from the right side of the main body. At this moment, the FFC 658Y is held by the sheet member 508 to pass through the inside of the FFC guide 603 as shown in FIG. 68A. Namely, the end portion of the FFC holding portion 508*a* of the sheet member 508 and the end portion of the FFC 658Y have passed through the inside of the FFC guide 603 to be exposed from the first opening portion 603*a*. Further, as shown in FIG. 68C, the protruding portion 508*b* of the sheet member 508 is exposed to the front side of the image forming apparatus 100. Then, the FFC 658Y is detached from the FFC holding portion 508*a* of the sheet member 508. With above operations, the FFC 658 before exchange can be detached from the image forming apparatus 100 and simultaneously the sheet member 508 can be disposed in the image forming apparatus 100.

The thickness and the tensile modulus of the sheet member 508 are already describe in the embodiment 1 and the description thereof is omitted.

The case where an operational worker draws too much the FFC 658Y and the sheet member 508 in the rightward direction (rightward direction R) of the main body is the same as that described in the embodiment 1 except that the direction of drawing is an opposite one.

(Procedure 3)

Next, the procedure 3 will be described.

When the procedure 2 is completed, the sheet member 508 has passed through the first opening portion 603*a* and the first opening portion 603*a* is exposed from the left side of the main body. The new FFC 658 is attached to the FFC holding portion 508*a* of the sheet member 508 as shown in FIG. 68A. As a result, the FFC 658 and the sheet member 508 can be moved integrally with each other. When the sheet member 508 in the state shown in FIG. 68C is drawn in the front side of the main body (in the forward direction F), the FFC 658 and the sheet member 508 is drawn in the leftward direction L shown in FIG. 68A. The FFC 658 and the sheet member 508 pass through the first opening portion 603*a* of the FFC guide 603, travels through the inside of the FFC guide 603, is folded over at the guide portion 607*c* of the FFC holding member 607 while forming a loop with the side of the contact point 658*a* inside, and is drawn out from the front side of the main body as shown in FIG. 67A. In this case, the guide portion 607*c* of the FFC holding member 607 guides the FFC 658 and the sheet member 508 such that the moving direction of the FFC 658 and the sheet member 508 is changed from the leftward and right directions as the first moving direction (leftward direction L) to the forward and backward direction directions as the second moving direction (forward direction F). The guide portion 607*c* has a surface inclined in the leftward and rightward directions and the upward and the downward directions of the image forming apparatus 100. The inclined directions include the direction from the right-upper position to the left-lower position and the direction from the upper-back position to the lower-front position of the image forming apparatus 100. With this configuration, a smooth change of the moving direction can be performed (See FIG. 68C).

The FFC 658Y is held as to travel through the inside of the FFC guide 603 as shown in FIG. 51A. The other end portion of the FFC 658Y is exposed to the right side of the image forming apparatus 100 as shown in FIG. 62B and the one end portion of the FFC 658Y is exposed to the front side of the image forming apparatus 100 as shown in FIG. 67A. Then, the FFC 658 is detached from the FFC holding portion 508*a* of the sheet member 508. The detached FFC 658 is held by being nipped between the FFC holding portions 607*a* and 607*b* of the FFC holding member 607 as shown in FIG. 65. With the above operations, a new FFC 658 can be attached to the image forming apparatus 100, and simultaneously the sheet member 508 can be taken out from the image forming apparatus 100.

(Procedure 4)

Next, the procedure 4 will be described.

First, the exposure head 4 is set on the exposure head holding member 606 as shown in FIG. 60. By the restricting portions 606*i*, 606*k*, and 6061 respectively abut on the housing 54, the positioning pin 45B, the bottom surface portion 55D of the housing support member 55, the exposure head 4 is stably held on the exposure head holding member 606.

Next, like the procedure 1, as shown in FIGS. 56A and 56B, the exposure head holding member 606 is inserted into the drum support member 302 of the cartridge tray 30 in the backward direction B. Then, the exposure head holding member 606 engages with the drum support member 302 and is guided by the drum support member 302 in the backward direction B.

When the exposure head holding member 606 is inserted in the backward direction B, the inclined portion 606*b* of the exposure head holding member 606 abuts on the restricting portion 302*g* of the cartridge tray 30 as shown in FIG. 57A, the exposure head holding member 606 is lifted upward. When the inclined portion 606*b* exceeds the restricting portion 302*g* as shown in FIG. 57B, the hole portion 606*c* of the exposure head holding member 606 falls due to the weight of the exposure head holding member 606 such that the restricting portion 302*g* enters the hole portion 606*c* and engages with it. The position where the hole portion 606*c* engages with the restricting portion 302*g* is the first position where the FFC 658 is inserted into and drawn out from the FFC connector 57 of the exposure head 4 held by the exposure head holding member 606 as shown in FIG. 65.

The operational worker holds the protruding portion 658*c* provided on the FFC 658, detaches the FFC 658 from the FFC holding member 607, and inserts the FFC 658 in the rightward direction R to the FFC connector 57 of the exposure head 4 held in the second posture as shown in FIG. 64A. The configuration in which the protruding portion 658*c* is disposed on the upper side (in the upward direction U) as described before makes easy the inserting operation. Further, since the FFC connector 57 of the exposure head 4 and the end portion of the FFC 658 are drawn out to a more front side than the front side plate 100F of the image forming apparatus 100 as shown in FIG. 64B, the visibility is improved, so that the operation becomes easy. With this configuration, the FFC inserting and drawing out operation can be stabilized and simplified as described above.

Next, the engagement of the hole portion of 606*c* with restricting portion 302*g* can be released by lifting the exposure head holding member 606 upward as shown in FIG. 57C and the exposure head holding member 606 can be further inserted in the backward direction B. When the above engagement is released and the exposure head holding member 606 is further inserted in the backward direction B, the plane portion 606*d* of the exposure head holding member 606 rides on the restricting portion 302*g*.

When the exposure head holding member 606 is further inserted in the backward direction B and the plane portion 606*d* exceeds the restricting portion 302*g*, the restricting portion 606*e* of the exposure head holding member 606 engages with the restricting portion 302*g* due to the weight of the exposure head holding member 606 as shown in FIG. 57D. In the state where the restricting portion 606*e* is engaged with the restricting portion 302*g*, the exposure head holding member 606 cannot be inserted into or drawn out from the cartridge tray 30. As described above, the position where the restricting portion 606*e* engages with the restricting portion 302*g* is the second position where the exposure head 4 is attached to and detached from the elevating duct 69. After the exposure head holding member 606 is disposed in the second position, the engagement of the restricting portion 607*d* of the FFC holding member 607 is released by, for example, elastically deforming the restricting portion 607*d*, and the FFC holding member 607 is drawn in the forward direction F to be taken out from the image forming apparatus 100.

Next, the operation of placing the exposure head 4 on the elevating duct 69 is performed. The operation of placing the exposure head 4 on the elevating duct 69 is the same as that in the embodiment 1 and the description thereof is omitted.

Next, the extra length of the FFC 658 connected to the exposure head 4 is stored. In this case, the extra length of the FFC 658 is one necessary for the operations of drawing out the exposure head 4 in the forward direction F, and accounts for the part of the FFC 658 from the position where the FFC 658 has been just exposed from the cartridge tray 30 after having passed through the second opening portion 603*b*Y to the position of the end portion of the FFC 658 connected to the FFC connector 57Y.

In the state where the exposure head 4 is attached to the elevating duct 69, the extra length of the FFC 658Y is exposed to the space above the developing support member 301 of the cartridge tray 30. In this state, as shown in FIG. 62B, the other end portion of the FFC 658Y is exposed to the outside (left side) from the first opening portion 503*a* on the right side of the main body. Therefore, by drawing the other end portion of the FFC 658Y to the right side of the main body (rightward direction R), the FFC 658Y is moved to the left side of the main body (rightward direction R) in the FFC guide 603. As a result, the extra length of the FFC 658Y exposed to the space above the developing support member 301 is drawn into the inside of the FFC guide 603 from the second opening portion 603*b*Y and is stored in the FFC guide 603 as shown in FIG. 51A. Even if the FFC 658Y is drawn in too much, this movement is restricted since the one end portion of the FFC 658Y is connected to the FFC connector 57Y of the exposure head 4Y.

Next, the operations for taking out the exposure head holding member 606 is performed. As shown in FIG. 57D and described before, the restricting portion 606*e* of the exposure head holding member 606 engages with the restricting portion 302*g*, so that the exposure head holding member 606 cannot be inserted or drawn out. Therefore, as shown in FIG. 57C, by lifting the exposure head holding member 606 upward, the engagement of the restricting portion 606*e* with the restricting portion 302*g* can be released and the exposure head holding member 606 can be drawn out to the front side (in the forward direction F). When the above engagement is released and the exposure head holding member 606 is drawn out to the front side (in the forward direction F), the plane portion 606*d* of the exposure head holding member 606 rides on the restricting portion 302*g*.

When the exposure head holding member 606 is further drawn out in the forward direction F and the plane portion 606*d* exceeds the restricting portion 302*g* as shown in FIG. 57B, the hole portion 606*c* of the exposure head holding member 606 falls due to the weight of the exposure head holding member 606 and the restricting portion 302*g* enters and engages with the hole portion 606*c*. As shown in FIG. 57A, by lifting the exposure head holding member 606 upward, the engagement of the restricting portion 302*g* with the hole portion 606*c* can be released, so that the exposure head holding member 606 can be further drawn out in the forward direction F. When the above engagement is released and the exposure head holding member 606 is further drawn out in the forward direction F, the inclined portion 606*b* is pushed and placed on the restricting portion 302*g*. By further drawing out the exposure head holding member 606 in the forward direction F after the inclined portion 606*b* exceeds the restricting portion 302*g*, the exposure head holding member 606 can be taken out from the cartridge tray 30.

By the above operations, the exchanging operations for exposure head 4 and the FFC 658 are completed.

In this embodiment, the configuration is exemplified in which the exposure head holding member 606 can be inserted and drawn out with the exposure head 4 held by the exposure head holding member 606, but the invention is not limited to this configuration. For example, another configuration can be adopted in which the exposure head 4 is detached from the exposure head holding member 606 with the exposure head holding member 606 attached to the cartridge tray 30, and in this state a new exposure head is mounted on the exposure head holding member 606. With this configuration, the exposure head 4 can be exchanged without inserting and drawing out the exposure head holding member 606 during exchanging operations.

(Effect)

Next, the effect of the present embodiment will be described.

In the image forming apparatus 100 according to the present embodiment, when exchanging the exposure head 4, the FFC 658 is inserted and drawn out after the exposure head 4 is temporarily held by the exposure head holding member 606. Further, by inserting and drawing out the exposure head holding member 606 with the exposure head held 4 by the exposure head holding member 606, the exposure head 4 is exchanged. The FFC 658 detached from the exposure head 4 is temporarily held by the FFC holding portions 607*a* and 607*b* of the FFC holding member 607. Furthermore, during the exchanging operations, the FFC holding member 607 is disposed overlapping with the toner collecting duct 301*h*, which is a part of the toner conveying path, to block the toner collecting duct 301*h*. As configured like this, the exchanging operations for the exposure head can be performed without damaging or polluting the exposure head and the FFC and stably with less burden on the operational worker.

Further, in exchanging the FFC 658, the FFC 658 is inserted and drawn out with the contact point 658*a* of the FFC 658 covered by the sheet member 508, and the FFC 658 and the sheet member 508 are guided by the FFC holding member 607. With this configuration, the exchanging operations for the FFC can be performed without damaging or polluting the FFC 658 and stably with less burden on the operational worker.

Moreover, the FFC 658 is disposed from the right side of the main body (rightward direction R) to the left side of the main body (leftward direction L), and the contact point 658*a* of the FFC 658 is disposed on the right side of the main body (rightward direction R) in the attaching position of the exposure head 4. With this configuration, a loop is formed such that the contact point 658*a* is disposed on the inside of the loop during exchanging operation for the FFC 658, which reduces the possibility of breaking the contact point 658*a*. When the exposure head 4 is exchanged, in the position where the exposure head 4 is held on the exposure head holding member 606, the contact point 658*a* of the FFC 658 is disposed on the lower side (downward direction D) of the main body and the protruding portion 658*c* is disposed on the upper side (upward direction U) of the main body. With this configuration, an operational worker can perform the operations of inserting and drawing out the FFC 658 visually inspect the protruding portion 658*c*. As a result, an operational worker can more easily perform the operations.

As described above, in the second embodiment, the exposure heads 4 and the FFCs 658 can be easily exchanged.

Other Embodiments

The configuration according to the present invention is not limited to the above-described embodiment.

In the above-described embodiment, the four-color full-color printer of the tandem type-intermediate transfer system has been described as an example, but for example, a direct transfer type in which a toner image is transferred from the photosensitive drum 2 to the recording sheet P without using the intermediate transfer belt 9 may be used. Furthermore, a mono-color or full color printer of five or more colors using a spot color toner may be used. In that case, a configuration including the exposure heads 4 corresponding to the number of colors may be used.

Further, the opening portion 61 of the duct unit 60 are connected to the opening portion 64 formed by the cartridge tray 30 and the elevating duct 69, but the present invention is not limited thereto. For example, the opening portion 64 may be eliminated, an opening portion may be provided in the elevating duct 69, and this opening portion may be directly connected to the opening portion of the duct unit 60.

Furthermore, in the above-described embodiment, the configuration in which the cooling duct 75 (see FIG. 18) is formed between the duct unit 60 and the cartridge tray 30 or the elevating duct 69 has been exemplified, but the cooling duct is not necessarily formed by the duct unit 60. In this case, the cooling duct 75 may be formed only by the cartridge tray 30 or the elevating duct 69.

In addition, the vertical direction of the unit and the component has been described according to the arrangement of each unit in the cross-sectional view of the image forming apparatus 100 illustrated in FIG. 2. However, a unit arrangement in which the photosensitive drum 2 is disposed above the intermediate transfer belt 9 and the exposure head 4 is further disposed above the photosensitive drum 2 as in an upper surface exposure method in which the photosensitive drum 2 is exposed from substantially above may be adopted.

In this case, the up and down directions in the description of the embodiment are all reversed.

In the above-described embodiment, the configuration in which the engagement claws 55*b* and 55*c* are provided in the housing support member 55 constituting the exposure head 4 has been exemplified, but the engagement claws may be provided in a component on the image forming apparatus 100 side. In this case, an L-shaped engagement claw may be provided in the elevating duct 69, and the engagement hole to be engaged with the engagement claw may be provided in the housing support member 55.

Further, in the above-described embodiment, the configuration in which the concave portion 55*f* is provided in the housing support member 55 constituting the exposure head 4 has been exemplified, but the concave portion may be provided in a component on the image forming apparatus 100 side. In this case, the concave portion may be provided in the elevating duct 69, and the convex portion engaged with the concave portion may be provided in the housing support member 55.

Further, in the above-described embodiment, the sliding operation for mounting the exposure head 4 is performed from the front side to the back side of the image forming apparatus 100, but may be configured to slide from the back side to the front side. In this case, the shapes of the engagement claws and the engagement holes may be reversed in the front-back direction.

In the above-described embodiment, the exposure head 4 is positioned in the axial direction of the photosensitive drum 2 and grounded by the positioning pin 45F on the front side, but may be positioned by the positioning pin 45B on the back side. Furthermore, in the earth connection, both the front and back positioning pins 45F and 45B may be used.

Although in the above embodiments, the elevating duct is exemplified which has a duct function as the exposure support member, the invention is not limited to this configuration. It is not necessary for the exposure support member to have a duct function if the exposure support member supports the exposure head in the posture in which the connector is disposed thereunder.

According to the present invention, the operability of exchanging the FFCs can be improved and the breakage of the FFCs when exchanging them can be prevented.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-211011, filed Dec. 14, 2023, which is hereby incorporated by reference herein in its entirety.

What is claimed is:

1. An image forming apparatus comprising:
a photosensitive member;
an exposure head configured to expose the photosensitive member, the exposure head including:
  a substrate having an elongated shape extending in axial directions of the photosensitive member;
  multiple light emitting elements mounted on one surface of the substrate, the multiple light emitting elements being arranged in longitudinal directions of the substrate; and
  a connector provided on a surface of the substrate opposite the one surface of the substrate on which multiple light emitting elements are mounted,
a control circuit board;

a flexible flat cable configured to electrically connect the connector to the control circuit board; and
an exposure support member configured to support the exposure head in a posture where the light emitting elements are disposed on an upper side and the connector is disposed on a lower side in upward and downward directions of the image forming apparatus,
wherein the flexible flat cable has a contact point that is provided on the one surface and the contact point is electrically connected to the connector of the exposure head, and
wherein the flexible flat cable is connected to the exposure head held by the exposure support member in the posture such that, when viewing the image forming apparatus from a front side, the contact point is disposed on a surface of a right side in leftward and rightward directions crossing the axial directions.

2. The image forming apparatus according to claim 1,
wherein the flexible flat cable further has a reinforcing portion provided on a surface opposite the one where the contact point is disposed, and the reinforcing portion has a protruding portion that protrudes from the surface opposite the one where the contact point is disposed.

3. The image forming apparatus according to claim 2, further comprising:
an exposure head holding member configured to hold the exposure head in a posture where the light emitting elements are disposed on a right side and the connector is disposed on a left side in the leftward and rightward directions,
wherein the flexible flat cable is connected to the exposure head held by the exposure head holding member in the posture such that the reinforcing portion is disposed on an upper side of the contact point in the upward and downward directions.

4. The image forming apparatus according to claim 1,
wherein the control circuit board is disposed on a right side in the leftward and rightward directions, and
wherein the exposure head is disposed on a left side of the control circuit board in the leftward and rightward directions.

5. The image forming apparatus according to claim 2,
wherein the reinforcing portion has such a shape that the reinforcing portion can be nipped when the flexible flat cable is inserted into and drawn out from the connector.

6. The image forming apparatus according to claim 1,
wherein the exposure head is disposed below the photosensitive member and exposes the photosensitive member from below.

7. The image forming apparatus according to claim 1, further comprising:
a guide portion provided extending in the leftward and rightward directions, the guide portion being configured to support the flexible flat cable along the leftward and rightward directions.

8. The image forming apparatus according to claim 7,
wherein the guide portion is disposed to overlap with the connector in longitudinal directions of the exposure head.

9. An image forming apparatus comprising:
multiple photosensitive members;
multiple exposure heads configured to respectively expose the photosensitive members, each of the exposure heads including:
  a substrate having an elongated shape extending in axial directions of the photosensitive members;

multiple light emitting elements mounted on one sur-
face of the substrate, the multiple light emitting
elements being arranged in longitudinal directions of
the substrate; and a connector provided on a surface of the substrate
opposite the one surface of the substrate on which
multiple light emitting elements are mounted, a control circuit board;

multiple flexible flat cables, each of which is configured
to electrically connect each connector to the control
circuit board; and multiple exposure support members configured to respec-
tively support the exposure heads in a posture where
the light emitting elements are disposed on an upper
side and the connector is disposed on a lower side in
upward and downward directions of the image forming
apparatus, wherein each of the flexible flat cables has a contact point
electrically connected to each connector of the expo-
sure heads and a reinforcing portion provided on a
surface opposite the one where the contact point is
disposed, the reinforcing portion having a protruding
portion that protrudes from the surface opposite the one
where the contact point is disposed, and wherein each flexible flat cable is connected to each
connector of each exposure head held by each exposure
support member in the posture such that each reinforc-
ing portion is disposed on a left side of each contact
point in leftward and rightward directions of the image
forming apparatus crossing the axial directions.

\* \* \* \* \*